US012185002B2

(12) United States Patent
Takada et al.

(10) Patent No.: US 12,185,002 B2
(45) Date of Patent: Dec. 31, 2024

(54) IMAGING DEVICE

(71) Applicant: SONY SEMICONDUCTOR SOLUTIONS CORPORATION, Kanagawa (JP)

(72) Inventors: Tetsuro Takada, Kanagawa (JP); Taiichiro Watanabe, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/356,058

(22) Filed: Jul. 20, 2023

(65) Prior Publication Data

US 2023/0388672 A1 Nov. 30, 2023

Related U.S. Application Data

(63) Continuation of application No. 17/900,611, filed on Aug. 31, 2022, now Pat. No. 11,792,542, which is a (Continued)

(30) Foreign Application Priority Data

Jun. 5, 2018 (JP) ................................ 2018-107724

(51) Int. Cl.
*H04N 25/633* (2023.01)
*H01L 27/146* (2006.01)
(Continued)

(52) U.S. Cl.
CPC ..... *H04N 25/633* (2023.01); *H01L 27/14605* (2013.01); *H01L 27/14623* (2013.01); (Continued)

(58) Field of Classification Search
CPC ...... H04N 25/60; H04N 25/63; H04N 25/633; H04N 25/70; H04N 25/75;
(Continued)

(56) References Cited

U.S. PATENT DOCUMENTS 10,165,211 B1 12/2018 Borthakur et al.
10,547,016 B2 * 1/2020 Tashiro ............... H01L 31/0224
(Continued)

FOREIGN PATENT DOCUMENTS

CN 107146850 A 9/2017
JP 2011135100 A 7/2011
(Continued)

OTHER PUBLICATIONS

International Search Report and Written Opinion for International (PCT) Patent Application No. PCT/JP2019/019700, dated Jul. 16, 2019, 8 pages.

(Continued)

*Primary Examiner* — Lin Ye
*Assistant Examiner* — Chriss S Yoder, III
(74) *Attorney, Agent, or Firm* — Sheridan Ross PC

(57) ABSTRACT

An imaging device includes: an effective pixel region that includes a plurality of imaging elements-A, amplifies signal charges generated by photoelectric conversion, and reads the signal charges into a drive circuit; and an optical black region that includes a plurality of imaging elements-B, surrounds the effective pixel region, and outputs optical black that serves as the reference for black level. In the imaging device, the photoelectric conversion layer forming the plurality of imaging elements-A and the plurality of imaging elements-B is a common photoelectric conversion layer, the common photoelectric conversion layer is located on an outer side of the optical black region, and extends toward an outer edge region surrounding the optical black region, and an outer edge electrode is disposed in the outer edge region.

20 Claims, 69 Drawing Sheets

Related U.S. Application Data continuation of application No. 17/056,607, filed as application No. PCT/JP2019/019700 on May 17, 2019, now Pat. No. 11,477,404.

(51) Int. Cl.
*H04N 25/75* (2023.01)
*H10K 30/80* (2023.01)
*H10K 39/32* (2023.01)

(52) U.S. Cl.
CPC ............. *H04N 25/75* (2023.01); *H10K 30/80* (2023.02); *H10K 39/32* (2023.02)

(58) Field of Classification Search
CPC ......... H01L 27/14605; H01L 27/14609; H01L 27/14623; H01L 27/14647; H01L 27/14667; H10K 30/30; H10K 30/80; H10K 39/32; Y02E 10/549
See application file for complete search history.

(56) References Cited

U.S. PATENT DOCUMENTS

| | | | | |
|---|---|---|---|---|
| 11,477,404 | B2 | 10/2022 | Takada et al. | |
| 2010/0134646 | A1 | 6/2010 | Tamura | |
| 2011/0032391 | A1* | 2/2011 | Cheung | H04N 25/60 348/E5.079 |
| 2011/0228150 | A1 | 9/2011 | Takata | |
| 2012/0326257 | A1 | 12/2012 | Takata | |
| 2013/0093911 | A1* | 4/2013 | Sul | H04N 25/621 348/222.1 |
| 2013/0093932 | A1* | 4/2013 | Choo | H04N 25/709 257/E51.026 |
| 2015/0001503 | A1 | 1/2015 | Hirose | |
| 2016/0037098 | A1* | 2/2016 | Lee | H10K 39/32 257/292 |
| 2023/0076380 | A1 | 3/2023 | Takada et al. | |

FOREIGN PATENT DOCUMENTS

| | | | | |
|---|---|---|---|---|
| JP | 2011-198855 | | 10/2011 | |
| JP | 2011-243945 | | 12/2011 | |
| JP | 2012-114197 | | 6/2012 | |
| JP | 2012114197 | A * | 6/2012 | H01L 27/14623 |
| JP | 2012204402 | A | 10/2012 | |
| JP | 2017-055085 | | 3/2017 | |
| KR | 20170031650 | A | 3/2017 | |
| WO | WO-2012070164 | A1 | 5/2012 | |
| WO | WO 2014/007132 | | 1/2014 | |
| WO | WO-2017150167 | A1 | 9/2017 | |
| WO | WO-2018025540 | A1 | 2/2018 | |

OTHER PUBLICATIONS

Official Action for U.S. Appl. No. 17/056,607, dated Dec. 17, 2021, 12 pages.
Official Action for U.S. Appl. No. 17/056,607, dated Apr. 8, 2022, 12 pages.
Notice of Allowance for U.S. Appl. No. 17/056,607, dated Jun. 10, 2022, 8 pages.
Official Action for U.S. Appl. No. 17/900,611, dated Dec. 15, 2022, 15 pages.
Notice of Allowance for U.S. Appl. No. 17/900,611, dated Jun. 7, 2023, 8 pages.
Notice of Grant for China Patent Application No. 201980033342.4, dated Oct. 21, 2024, 5 pages.

* cited by examiner

IMAGING DEVICE

CROSS REFERENCE TO RELATED APPLICATIONS

This application is a continuation of U.S. patent application Ser. No. 17/900,611, filed Aug. 31, 2022, which is a continuation of U.S. patent application Ser. No. 17/056,607, filed Nov. 18, 2020, now U.S. Pat. No. 11,477,404, which is a national stage application under 35 U.S.C. 371 and claims the benefit of PCT Application No. PCT/JP2019/019700 having an international filing date of May 17, 2019, which designated the United States, which PCT application claimed the benefit of Japanese Patent Application No. 2018-107724 filed Jun. 5, 2018, the entire disclosures of each of which are incorporated herein by reference.

TECHNICAL FIELD

The present disclosure relates to an imaging device.

BACKGROUND ART

An imaging device normally includes an effective pixel region that amplifies signal charges generated by photoelectric conversion and reads the signal charges into a drive circuit, and an optical black region that surrounds the effective pixel region and outputs optical black that serves as the reference for black levels. Note that, for the sake of convenience, the imaging elements included in the effective pixel region of a conventional imaging device are referred to as "imaging elements-a", and the imaging elements included in the optical black region are referred to as "imaging elements-b". Further, to prevent blooming in the imaging elements-a from affecting the imaging elements-b, a dummy imaging element is provided between an imaging element-b and an imaging element-a in the optical black region.

The imaging elements-a and the imaging elements-b each include a photoelectric conversion unit in which a first electrode, a photoelectric conversion layer, and a second electrode are stacked. Here, in a case where the photoelectric conversion layer is formed with an organic semiconductor material, a light blocking film and a buffer film are formed on the light incident side of each imaging element-b so that the photoelectric conversion layer is not damaged, and the image quality is not degraded. This technology is known from WO 2014/007132 A1.

CITATION LIST

Patent Document

Patent Document 1: WO 2014/007132 A1

SUMMARY OF THE INVENTION

Problems to be Solved by the Invention

The technology disclosed in WO 2014/007132 A1 is effective in alleviating film stress on various films provided on the light incident side of an imaging element. Meanwhile, in a case where the photoelectric conversion layer is formed with an organic semiconductor material, the edge portion of the photoelectric conversion layer is often damaged during processing of the photoelectric conversion layer, or specifically, during patterning. As a result, the electric charges generated at the edge portion of the photoelectric conversion layer then enter the imaging elements-b, and might hinder the functions of the optical black region.

Therefore, an object of the present disclosure is to provide an imaging device having a configuration and a structure in which the functions of the optical black region are not easily hindered.

Solutions to Problems

An imaging device according to a first embodiment of the present disclosure for achieving the above object includes:

- an effective pixel region that includes a plurality of imaging elements-A, amplifies signal charges generated by photoelectric conversion, and reads the signal charges into a drive circuit; and
- an optical black region that includes a plurality of imaging elements-B, surrounds the effective pixel region, and outputs optical black that serves as the reference for black levels.

In the imaging device,

- the photoelectric conversion layer forming the plurality of imaging elements-A and the plurality of imaging elements-B is a common photoelectric conversion layer,
- the common photoelectric conversion layer is located on an outer side of the optical black region, and extends toward an outer edge region surrounding the optical black region, and
- an outer edge electrode is disposed in the outer edge region.

An imaging device according to a second embodiment of the present disclosure for achieving the above object includes:

- an effective pixel region that includes a plurality of imaging elements-A, amplifies signal charges generated by photoelectric conversion, and reads the signal charges into a drive circuit;
- an optical black region that includes a plurality of imaging elements-B, surrounds the effective pixel region, and outputs optical black that serves as the reference for black levels; and
- an outer edge region that includes a plurality of imaging elements-C, and surrounds the optical black region.

In the imaging device,

- the photoelectric conversion layer forming the plurality of imaging elements-A, the plurality of imaging elements-B, and the plurality of imaging elements-C is a common photoelectric conversion layer, and
- the imaging elements-C are always in an operating state during an operation of the imaging device.

MODES FOR CARRYING OUT THE INVENTION

Figure 1:
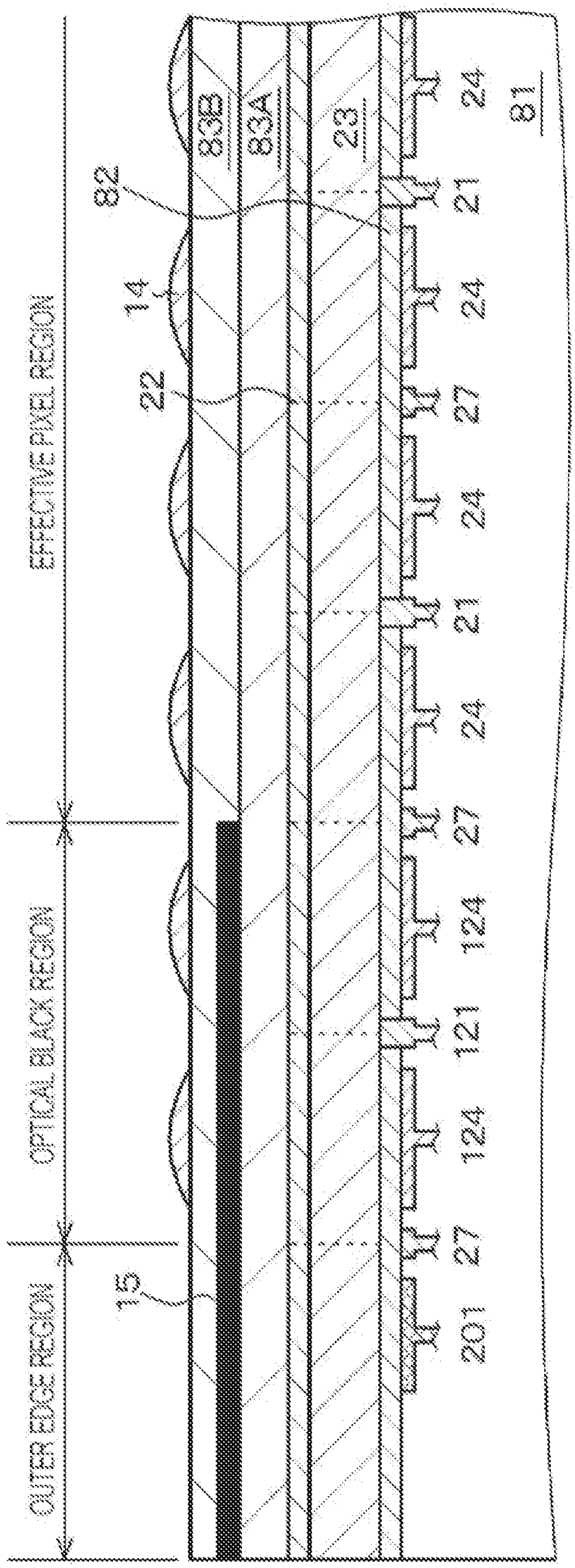
FIG. 1 is a schematic partial cross-sectional view of an imaging device of Example 1.

The following is a description of the present disclosure based on embodiments, with reference to the drawings. However, the present disclosure is not limited to the embodiments, and the various numerical values and materials mentioned in the embodiments are merely examples. Note that explanation will be made in the following order.

1. General description of imaging devices according to first and second embodiments of the present disclosure
2. Example 1 (an imaging device according to the first embodiment of the present disclosure)
3. Example 2 (a modification of Example 1)
4. Example 3 (modifications of Examples 1 and 2)
5. Example 4 (modifications of Examples 1 through 3)
6. Example 5 (modifications of Examples 1 through 4)
7. Example 6 (modifications of Examples 1 through 5)
8. Example 7 (an imaging device according to the second embodiment of the present disclosure)
9. Example 8 (modifications of Examples 1 through 7)
10. Example 9 (a modification of Example 8)
11. Example 10 (modifications of Examples 8 and 9)
12. Example 11 (modifications of Examples 8 through 10)
13. Example 12 (modifications of Examples 8 through 11)
14. Example 13 (modifications of Examples 8 through 12)
15. Example 14 (modifications of Examples 8 through 13, and imaging elements of first and sixth configurations)
16. Example 15 (imaging elements of second and sixth configurations)
17. Example 16 (an imaging element of a third configuration)
18. Example 17 (an imaging element of a fourth configuration)
19. Example 18 (an imaging element of a fifth configuration)
20. Example 19 (an imaging element of the sixth configuration)
21. Other aspects <General Description of Imaging Devices According to First and Second Embodiments of the Present Disclosure>

In an imaging device according to a first embodiment of the present disclosure, an outer edge electrode can be positioned to face a common photoelectric conversion layer via an insulating layer. Further, in this case, a potential with the same sign as that of signal charges can be applied to the outer edge electrode, and a potential with the same sign as that of the signal charges can be constantly applied to the outer edge electrode during an operation of the imaging device.

Alternatively, in the imaging device according to the first embodiment of the present disclosure, the outer edge electrode can be connected to the common photoelectric conversion layer. In this case, a potential with a different sign from that of signal charges can be applied to the outer edge electrode, and further, a potential with a different sign from that of the signal charges can be constantly applied to the outer edge electrode during an operation of the imaging device.

Alternatively, in the imaging device according to the first embodiment of the present disclosure, the outer edge electrode may include a first outer edge electrode positioned to face the common photoelectric conversion layer via an insulating layer, and a second outer edge electrode that is disposed on an outer side of the first outer edge electrode and is connected to the common photoelectric conversion layer.

In the imaging device according to the first embodiment of the present disclosure including the various preferred modes described above, the outer edge electrode can be designed to surround the optical black region. In this case, the outer edge electrode surrounding the optical black region may have a continuous form, or the outer edge electrode surrounding the optical black region may have a discontinuous form.

Further, in the imaging device according to the first embodiment of the present disclosure including the various preferred modes and configurations described above, an imaging element-A and an imaging element-B each include a photoelectric conversion unit in which a first electrode, a photoelectric conversion layer, and a second electrode are stacked, the photoelectric conversion unit further includes a charge storage electrode that is disposed at a distance from the first electrode and is positioned to face the photoelectric conversion layer via an insulating layer, the photoelectric conversion layer forming imaging elements-A and the photoelectric conversion layer forming imaging elements-B are formed with a common photoelectric conversion layer, the second electrode forming the imaging elements-A and the second electrode forming the imaging elements-B are formed with a common second electrode, and light enters from the common second electrode side. Further, in this case, the outer edge electrode may be disposed on the first electrode side with respect to the common photoelectric conversion layer, or the outer edge electrode may be disposed on the second electrode side with respect to the common photoelectric conversion layer.

In an imaging device according to a second embodiment of the present disclosure, an imaging element-A, an imaging element-B, and an imaging element-C each include a photoelectric conversion unit in which a first electrode, a photoelectric conversion layer, and a second electrode are stacked, the photoelectric conversion unit further includes a charge storage electrode that is disposed at a distance from the first electrode and is positioned to face the photoelectric conversion layer via an insulating layer, the photoelectric conversion layer forming imaging elements-A, the photoelectric conversion layer forming imaging elements-B, and the photoelectric conversion layer forming imaging elements-C are formed with a common photoelectric conversion layer, the second electrode forming the imaging elements-A, the second electrode forming the imaging elements-B, and the second electrode forming the imaging elements-C are formed with a common second electrode, during an operation of the imaging device, a potential with a sign that is the opposite of the sign of signal charges is constantly applied to the first electrodes forming the imaging elements-C, and, during an operation of the imaging device, a potential with the same sign as the sign of the signal charges is applied to the charge storage electrodes forming the imaging elements-C.

In the imaging device according to the second embodiment of the present disclosure including the preferred modes described above, the thickness of the insulating layer forming the imaging elements-C can be smaller than the thickness of the insulating layer forming the imaging elements-A and the imaging elements-B.

In the description below, there are cases where the outer edge electrode positioned to face the common photoelectric conversion layer via the insulating layer is referred to as a "first outer edge electrode", and the outer edge electrode connected to the common photoelectric conversion layer is referred to as a "second outer edge electrode". Also, there are cases where the imaging devices according to the first and second embodiments of the present disclosure including the various preferred modes and configurations described above are collectively referred to as "imaging devices or the like of the present disclosure".

The imaging elements-A and the imaging elements-B that constitute an imaging device or the like of the present disclosure may be stacked imaging elements (described later in detail).

Meanwhile, in a case where an organic semiconductor material is used for the photoelectric conversion layer, an imaging element can photoelectrically convert a specific color (wavelength band). In a case where such imaging elements are used in an imaging device, because of such characteristics, it then becomes possible to obtain a structure (a stacked imaging element) in which subpixels are stacked, which is not possible in a conventional imaging device in which an on-chip color filter layer (OCCF) and an imaging element constitute a subpixel, and subpixels are two-dimensionally arranged (see Japanese Patent Application Laid-Open No. 2011-138927, for example). Furthermore, there is an advantage that any false color does not appear, as demosaicing is not required. In the description below, in some cases, an imaging element that is disposed on or above a semiconductor substrate and includes a photoelectric conversion unit may be referred to as a "first-type imaging element" for convenience, the photoelectric conversion units forming a first-type imaging element may be referred to as "first-type photoelectric conversion units" for convenience, the imaging elements disposed in the semiconductor substrate may be referred to as "second-type imaging elements" for convenience, and the photoelectric conversion units forming a second-type imaging element may be referred to as "second-type photoelectric conversion units" for convenience.

In some cases, the material forming the photoelectric conversion layer located above the charge storage electrode may differ from the material forming the photoelectric conversion layer located above the first electrode.

Figure 65:
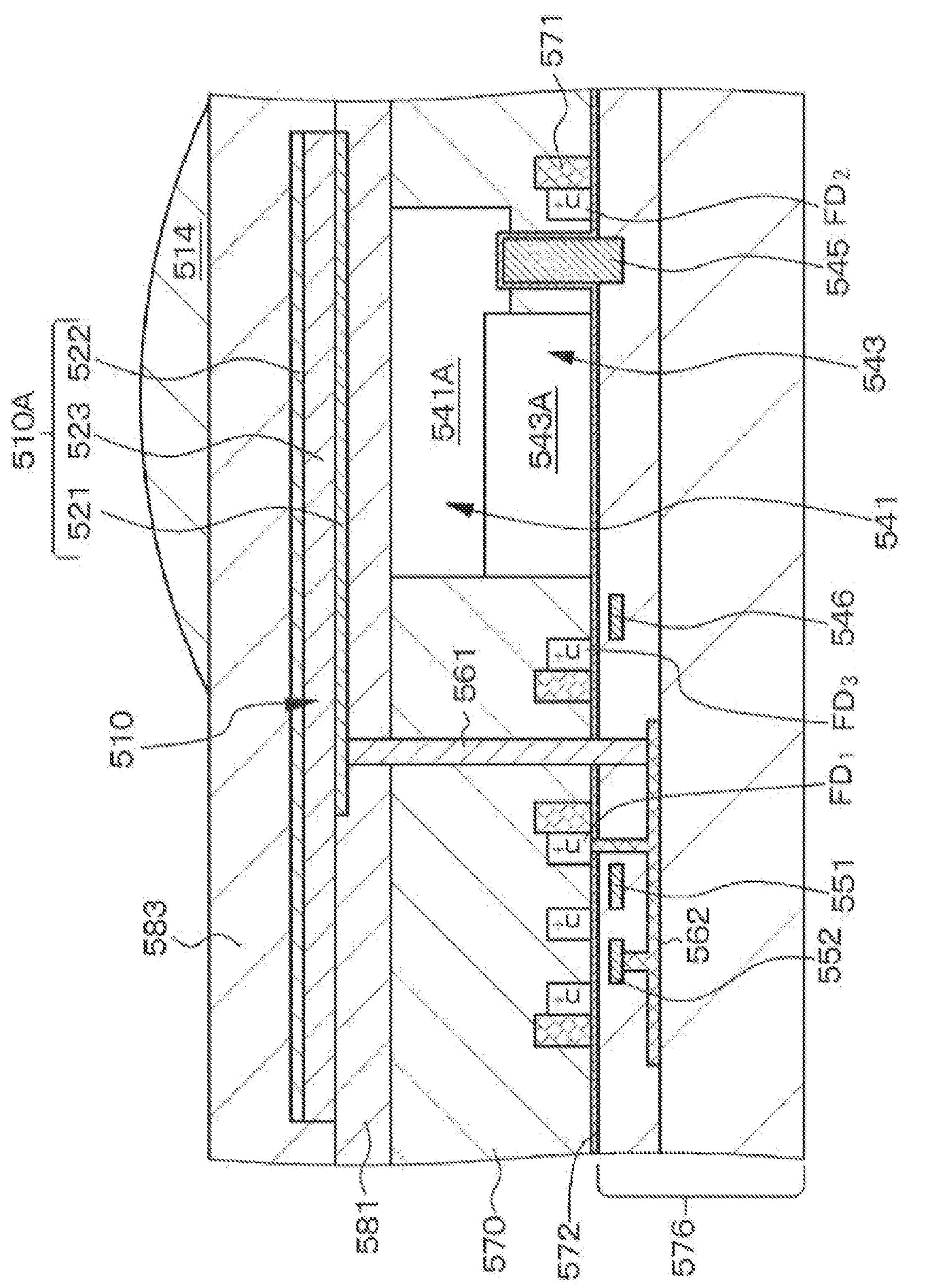
FIG. 65 is a conceptual diagram of a conventional stacked imaging element (a stacked imaging device).

FIG. 65 shows an example configuration of a conventional stacked imaging element (a stacked imaging device). In the example shown in FIG. 65, a third photoelectric conversion unit 543A and a second photoelectric conversion unit 541A that are the second-type photoelectric conversion units forming a third imaging element 543 and a second imaging element 541 that are second-type imaging elements are stacked and formed in a semiconductor substrate 570. Further, a first photoelectric conversion unit 510A that is a first-type photoelectric conversion unit is disposed above the semiconductor substrate 570 (specifically, above the second imaging element 541). Here, the first photoelectric conversion unit 510A includes a first electrode 521, a photoelectric conversion layer 523 formed with an organic material, and a second electrode 522, and forms a first imaging element 510 that is a first-type imaging element. The second photoelectric conversion unit 541A and the third photoelectric conversion unit 543A photoelectrically convert blue light and red light, respectively, for example, depending on a difference in absorption coefficient. Meanwhile, the first photoelectric conversion unit 510A photoelectrically converts green light, for example.

After temporarily stored in the second photoelectric conversion unit 541A and the third photoelectric conversion unit 543A, the electric charges generated through the photoelectric conversion in the second photoelectric conversion unit 541A and the third photoelectric conversion unit 543A are transferred to a second floating diffusion layer $FD_2$ and a third floating diffusion layer $FD_3$ by a vertical transistor (shown as a gate portion 545) and a transfer transistor (shown as a gate portion 546), respectively, and are further output to an external readout circuit (not shown). These transistors and the floating diffusion layers $FD_2$ and $FD_3$ are also formed in the semiconductor substrate 570.

The electric charges generated through the photoelectric conversion in the first photoelectric conversion unit 510A are stored in a first floating diffusion layer $FD_1$ formed in the semiconductor substrate 570, via a contact hole portion 561 and a wiring layer 562. The first photoelectric conversion unit 510A is also connected to a gate portion 552 of an amplification transistor that converts a charge amount into a voltage, via the contact hole portion 561 and the wiring layer 562. Further, the first floating diffusion layer $FD_1$ forms part of a reset transistor (shown as a gate portion 551). Reference numeral 571 indicates a device separation region, reference numeral 572 indicates an oxide film formed on the surface of the semiconductor substrate 570, reference numerals 576 and 581 indicate interlayer insulating layers, reference numeral 583 indicates an insulating layer, and reference numeral 514 indicates an on-chip microlens.

In the conventional imaging element shown in FIG. 65, the electric charges generated through photoelectric conversion in the second photoelectric conversion unit 541A and the third photoelectric conversion unit 543A are temporarily stored in the second photoelectric conversion unit 541A and the third photoelectric conversion unit 543A, and are then transferred to the second floating diffusion layer $FD_2$ and the third floating diffusion layer $FD_3$. Thus, the second photoelectric conversion unit 541A and the third photoelectric conversion unit 543A can be fully depleted. However, the electric charges generated through photoelectric conversion in the first photoelectric conversion unit 510A are stored directly into the first floating diffusion layer $FD_1$. Therefore, it is difficult to fully deplete the first photoelectric conversion unit 510A. As a result of the above, kTC noise might then become larger, random noise might be aggravated, and imaging quality might be degraded.

In an imaging device or the like of the present disclosure, the photoelectric conversion unit includes the charge storage electrode that is disposed at a distance from the first electrode and is positioned to face the photoelectric conversion layer via the insulating layer, as described above. With this arrangement, electric charges can be accumulated in the photoelectric conversion layer when light is emitted onto the photoelectric conversion unit and is photoelectrically converted at the photoelectric conversion unit. Accordingly, at the start of exposure, the charge storage portion can be fully depleted, and the electric charges can be erased. As a result, it is possible to reduce or prevent the occurrence of a phenomenon in which the kTC noise becomes larger, the random noise is aggravated, and the imaging quality is lowered.

An effective pixel region is formed with a plurality of pixels that is regularly arranged in a two-dimensional array.

The imaging device or the like of the present disclosure will be described in detail in Example 1 described later.

Imaging elements in the present disclosure may be CCD elements, CMOS image sensors, contact image sensors (CIS), or signal-amplifying image sensors of a charge modulation device (CMD) type. An imaging device according to the first or second embodiment of the present disclosure, or an imaging device of first or second configuration described later can form a digital still camera, a digital video camera, a camcorder, a surveillance camera, a camera to be mounted in a vehicle, a smartphone camera, a game user interface camera, or a biometric authentication camera, for example.

Example 1

Figure 11A:
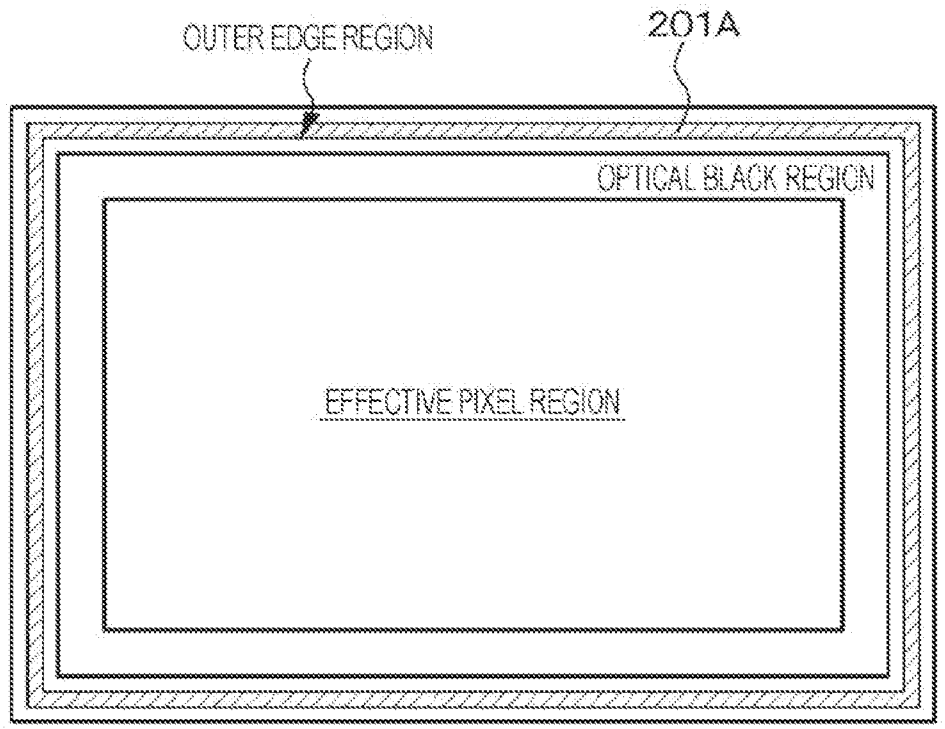
FIG. 11A and FIG. 11B are diagrams schematically showing the arrangement of the components of the imaging device of Example 1 and a modification thereof.
Figure 11B:
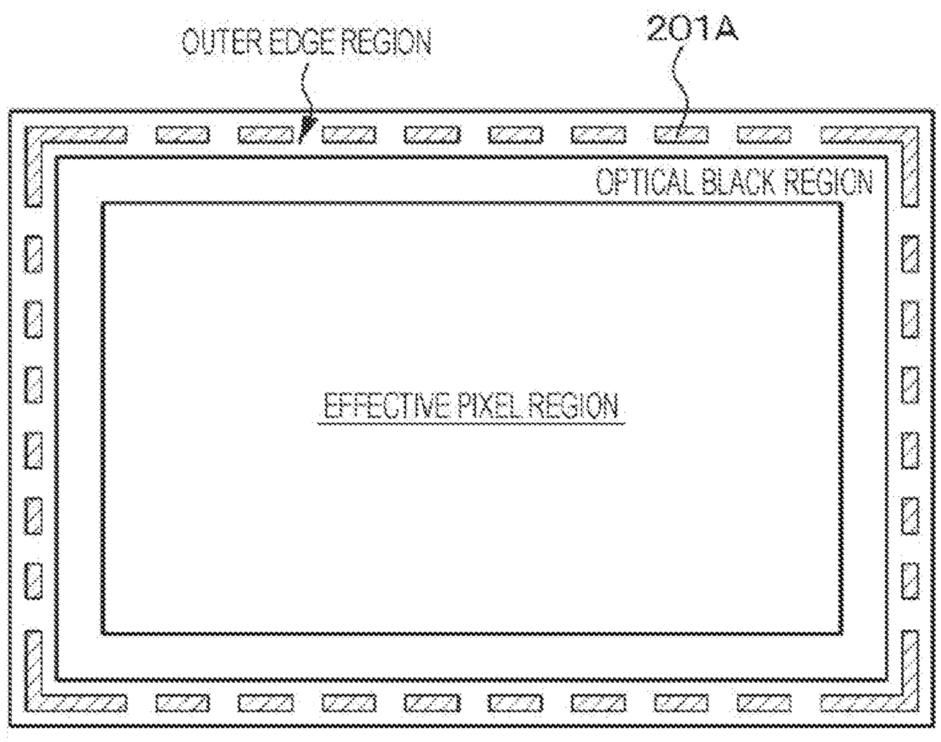
Figure 12A:
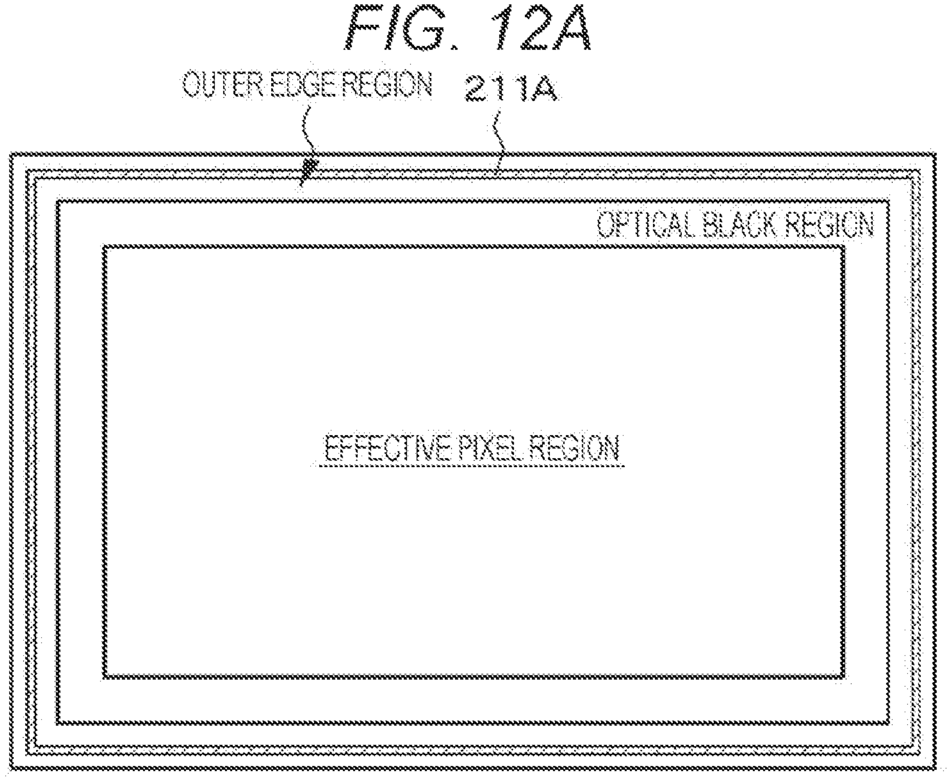
FIG. 12A and FIG. 12B are diagrams schematically showing the arrangement of the components of the imaging device of Example 2 and the imaging device of Example 3.
Figure 12B:
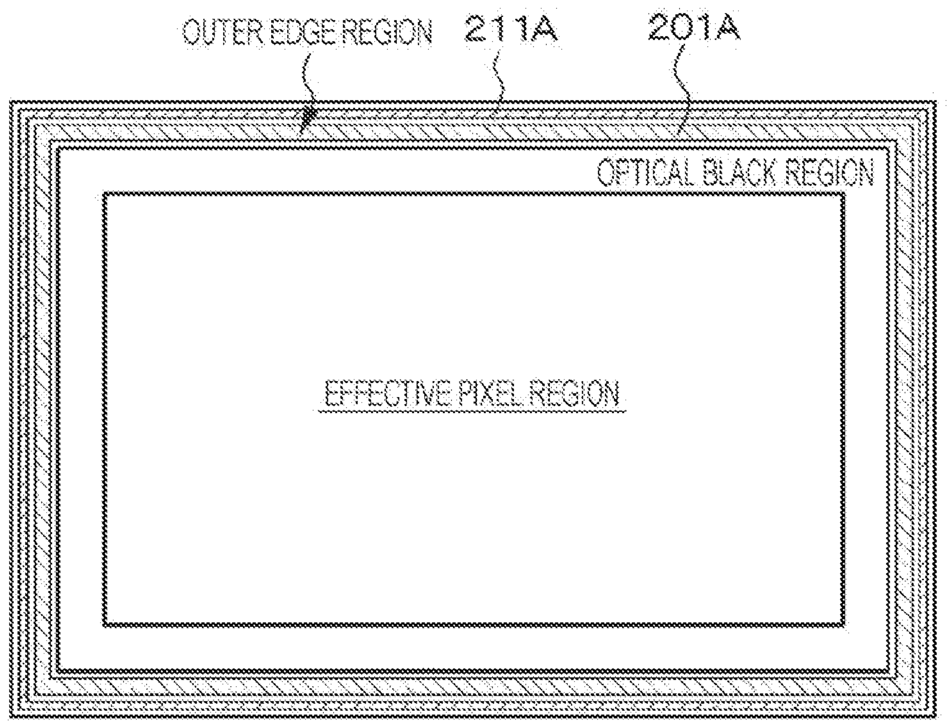
Figure 13:
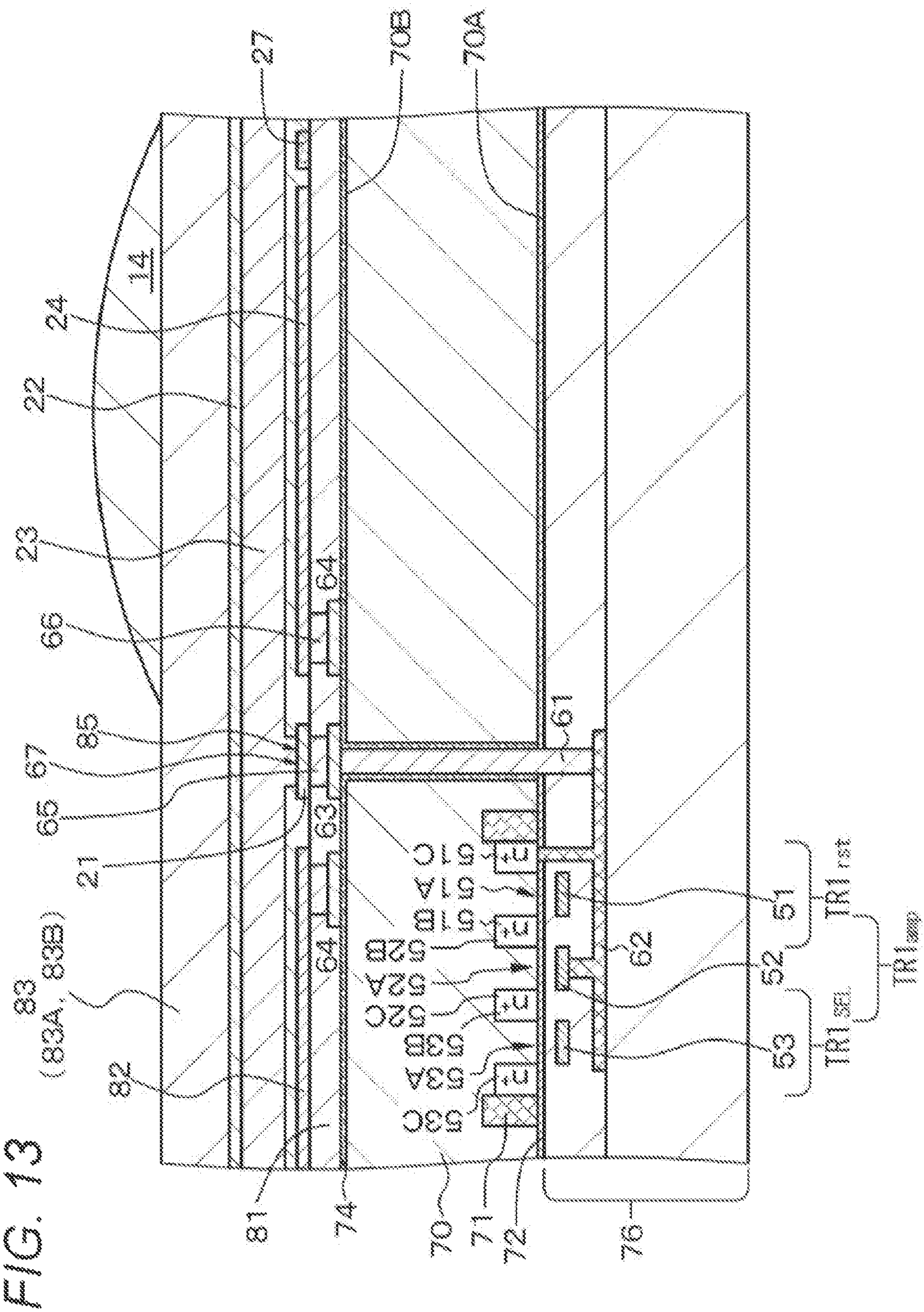
FIG. 13 is a schematic partial cross-sectional view of an imaging element-A included in the imaging device of Example 1.
Figure 14:
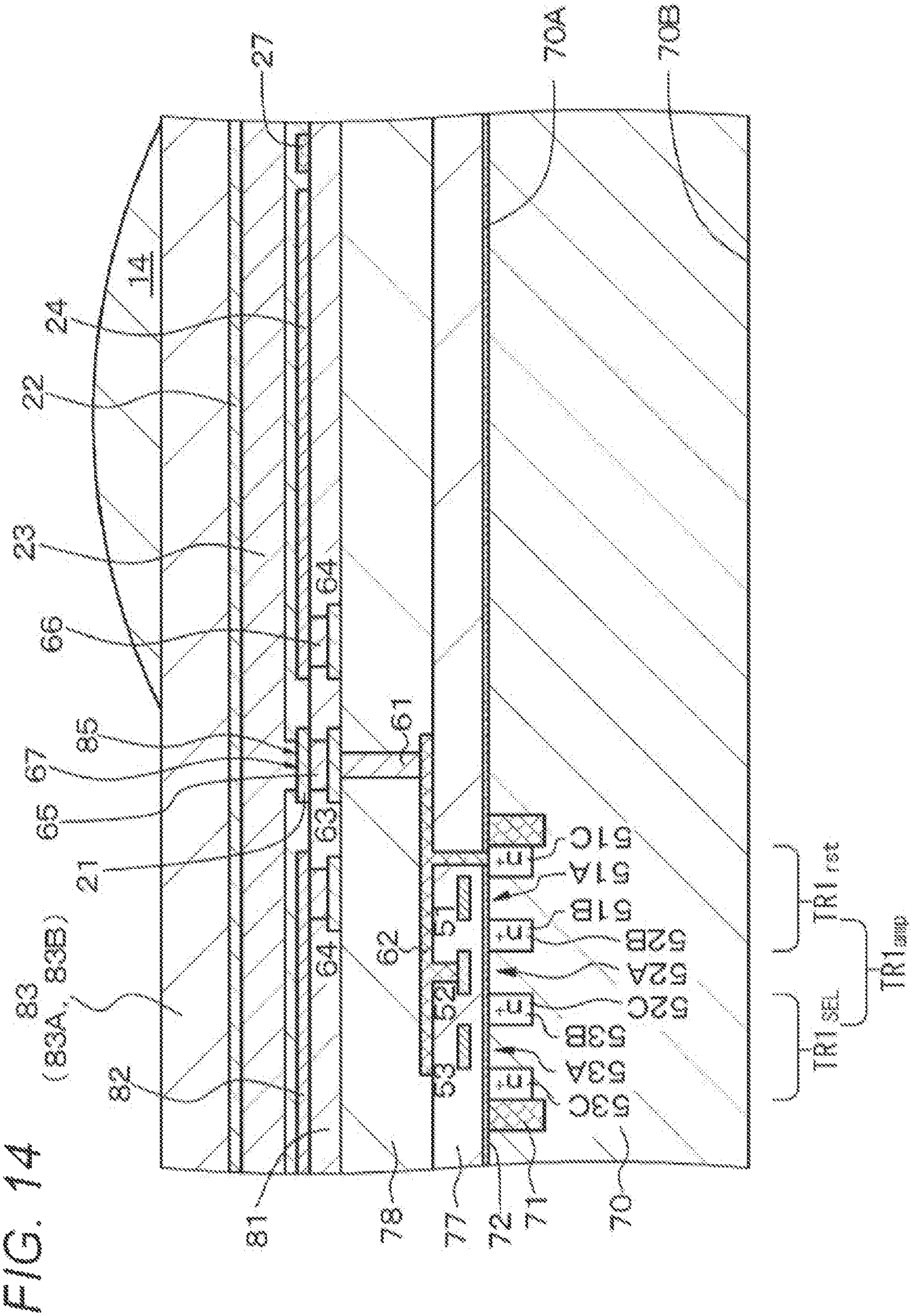
FIG. 14 is a schematic partial cross-sectional view of a modification of an imaging element-A included in the imaging device of Example 1.
Figure 15:
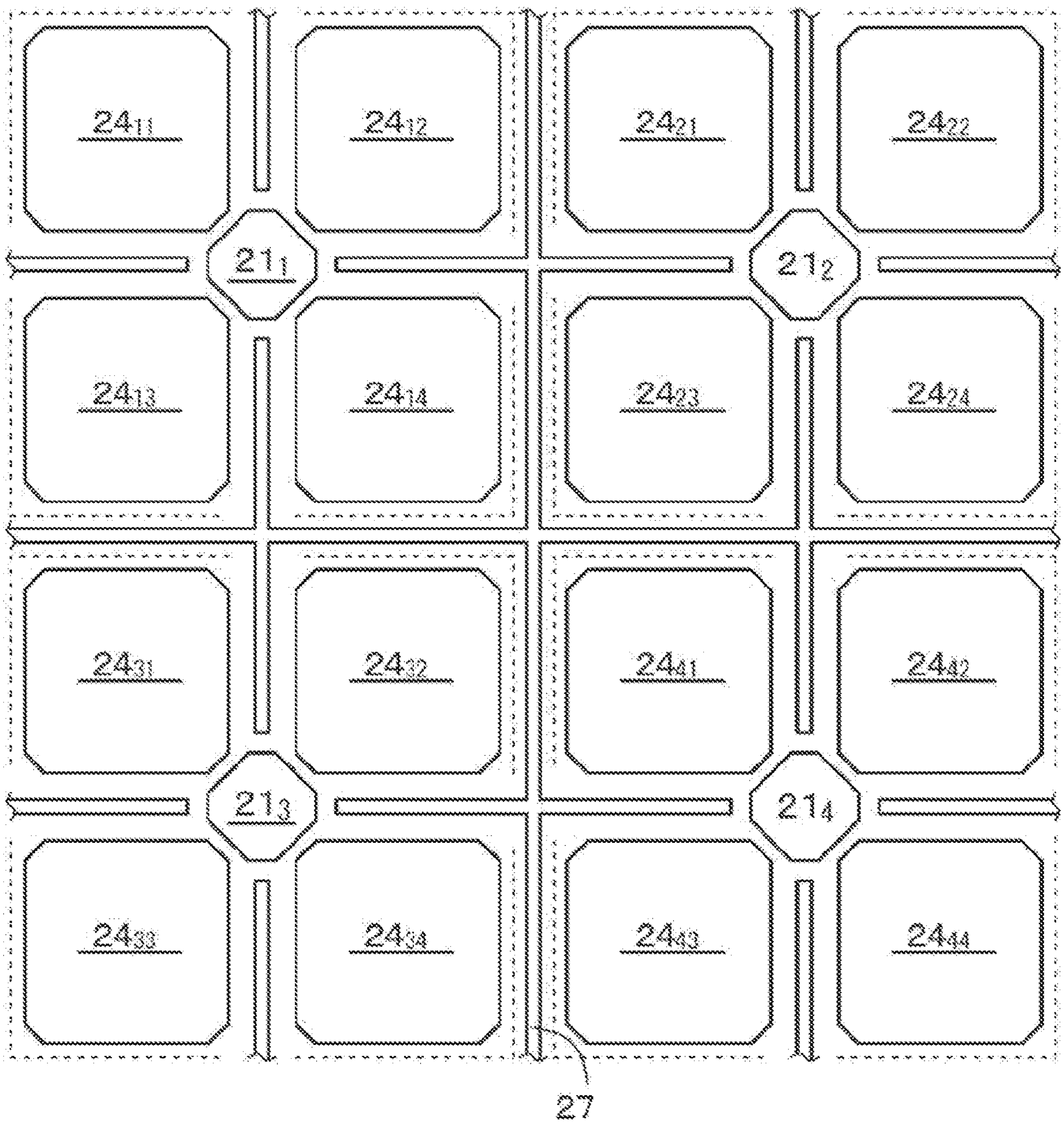
FIG. 15 is a schematic plan view of the arrangement of first electrodes, charge storage electrodes, and the like in the imaging device of Example 1.

Example 1 relates to an imaging device according to the first embodiment of the present disclosure. FIG. 1 is a schematic partial cross-sectional view of an imaging device of Example 1. FIG. 11A schematically shows the arrangement of the components of the imaging device of Example 1. FIGS. 13 and 14 each shows a schematic partial cross-sectional view of an imaging element-A that forms the imaging device of Example 1. FIG. 15 is a schematic plan view of the arrangement of the first electrodes and the charge storage electrodes in the imaging device of Example 1. Note that, in FIGS. 1 through 9, hatching lines are not used to denote the interlayer insulating layer 81, for simplification of the drawings. Further, in FIGS. 11A, 11B, and 12B, the region of an outer edge region in which an outer edge electrode (a third electrode) 201 as an electrode located in an outer edge region is disposed is denoted by reference numeral 201A, and is provided with hatching lines for clarity. In FIGS. 12A and 12B, the region of an outer edge region in which an outer edge electrode 211 is disposed is denoted by reference numeral 211A, and is provided with hatching lines for clarity.

The imaging device of Example 1 includes: an effective pixel region that includes a plurality of imaging elements-A, receives light, amplifies signal charges generated through photoelectric conversion, and reads the signal charges into a drive circuit; and an optical black region (also called a black reference pixel region, an optically black pixel region, or an OPB) that includes a plurality of imaging elements-B, surrounds the effective pixel region, and outputs optical black that serves as the reference for black levels. Further, the photoelectric conversion layer 23 that forms the plurality of imaging elements-A and the imaging elements-B is common between the imaging elements-A and the imaging elements-B, and the common photoelectric conversion layer 23 extends to an outer edge region that is located on an outer side of the optical black region and surrounds the optical black region. The outer edge electrode (third electrode) 201 is disposed in the outer edge region.

Further, the imaging device of Example 1 forms a digital still camera, a digital video camera, a camcorder, a surveillance camera, a camera to be mounted in a vehicle (an in-vehicle camera), a smartphone camera, a game user interface camera, a biometric authentication camera, or the like, for example.

Each imaging element-A disposed in the effective pixel region includes a photoelectric conversion unit in which a first electrode 21 formed with a conductive material, the photoelectric conversion layer 23 formed with an organic material (specifically, an organic semiconductor material), and a second electrode 22 formed with a transparent conductive material are stacked. Each imaging element-B disposed in the optical black region includes a photoelectric conversion unit in which a first electrode 121, the photoelectric conversion layer 23, and the second electrode 22.

The photoelectric conversion layer 23 forming the plurality of imaging elements-A and the plurality of imaging elements-B is common between the imaging elements-A and the imaging elements-B as described above, and the second electrode 22 forming the plurality of imaging elements-A and the plurality of imaging elements-B are also common between the imaging elements-A and the imaging elements-B.

In each imaging element-A, the photoelectric conversion unit further includes an insulating layer 82, and a charge storage electrode 24 that is formed with a conductive material. The charge storage electrode 24 is disposed at a distance from the first electrode 21 and is positioned to face the photoelectric conversion layer 23 via the insulating layer 82. The photoelectric conversion layer 23 includes: a region in contact with the first electrode 21; a region that is in contact with the insulating layer 82 and does not have the charge storage electrode 24 existing under the photoelectric conversion layer 23; and a region that is in contact with the insulating layer 82 and has the charge storage electrode 24 existing under the photoelectric conversion layer 23. Light then enters from the second electrode 22. In Example 1, holes generated in the photoelectric conversion layer 23 by light irradiation flow into the second electrode 22, and electrons eventually flow into the first electrodes 21. In each imaging element-A, an on-chip microlens 14 is provided above the second electrode 22. In FIGS. 1 through 9, the boundaries between the imaging elements are indicated by dotted lines.

In each imaging element-B, the photoelectric conversion unit further includes the insulating layer 82, and a charge storage electrode 124 that is disposed at a distance from the first electrode 121 and is positioned to face the photoelectric conversion layer 23 via the insulating layer 82. The photoelectric conversion layer 23 includes: a region in contact with the first electrode 121; a region that is in contact with the insulating layer 82 and does not have the charge storage electrode 124 existing under the photoelectric conversion layer 23; and a region that is in contact with the insulating layer 82 and has the charge storage electrode 124 existing under the photoelectric conversion layer 23. A light blocking layer 15 is formed above the second electrode 22 on the light incident side closer to the second electrode 22. Further, in each imaging element-B, an on-chip microlens 14 is provided above the second electrode 22. Holes generated in the photoelectric conversion layer 23 flow into the second electrode 22, and electrons eventually flow into the first electrodes 121.

In Example 1, one imaging element block is formed with four imaging elements-A. That is, as shown in FIG. 15, one first electrode 21 for four imaging elements-A is shared. Specifically, a first electrode $\mathbf{21}_1$ is shared among four imaging elements-A including charge storage electrodes $\mathbf{24}_{11}$, $\mathbf{24}_{12}$, $\mathbf{24}_{13}$, and $\mathbf{24}_{14}$, respectively. A first electrode $\mathbf{21}_2$ is shared among four imaging elements-A including charge storage electrodes $\mathbf{24}_{21}$, $\mathbf{24}_{22}$, $\mathbf{24}_{23}$, and $\mathbf{24}_{24}$, respectively. A first electrode $\mathbf{21}_3$ is shared among four imaging elements-A including charge storage electrodes $\mathbf{24}_{31}$, $\mathbf{24}_{32}$, $\mathbf{24}_{33}$, and $\mathbf{24}_{34}$, respectively. A first electrode $\mathbf{21}_4$ is shared among four imaging elements-A including charge storage electrodes $\mathbf{24}_{41}$, $\mathbf{24}_{42}$, $\mathbf{24}_{43}$, and $\mathbf{24}_{44}$, respectively. However, the configuration of an imaging element-A is not limited to such a configuration, and an imaging element-A may include one first electrode 21, or a plurality of imaging elements-A may share one first electrode 21.

Further, a charge transfer control electrode 27 is disposed between an imaging element-A and an imaging element-A. Likewise, a charge transfer control electrode 27 is disposed between an imaging element-B and an imaging element-B. As the charge transfer control electrodes 27 are provided, it is possible to reduce or prevent, without fail, transfer of electric charges between imaging elements-A sandwiching a charge transfer control electrode 27, transfer of electric charges between imaging elements-B sandwiching a charge transfer control electrode 27, and transfer of electric charges between an imaging element-A and an imaging element-B sandwiching a charge transfer control electrode 27. Note that, where the potential to be applied to a charge transfer control electrode 27 is represented by $V_{17}$, it is only required to satisfy $V_{12}>V_{17}$. $V_{12}$ will be described later.

In Example 1, the outer edge electrode 201 functions as a potential barrier forming electrode. Further, the outer edge electrode 201 is disposed to face the common photoelectric conversion layer 23 via the insulating layer 82. In this case, a potential (a negative potential in Example 1) with the same sign as signal charges (electrons in Example 1) is applied to the outer edge electrode 201. Further, during an operation of the imaging device, a potential with the same sign as signal charges continues to be constantly applied to the outer edge electrode 201. The outer edge electrode 201 surrounds the optical black region in a frame-like manner (see FIG. 11A). Furthermore, the outer edge electrode 201 is disposed on the first electrode side with respect to the common photoelectric conversion layer 23. Specifically, the outer edge electrode 201 is disposed on the interlayer insulating layer 81 at the same level as the first electrodes 21.

In the effective pixel region, the optical black region, and the outer edge region, upper insulating layers 83 (83A and 83B) are formed on the second electrode 22, and the light blocking layer 15 is formed between the upper insulating layer 83A and the upper insulating layer 83B in the optical black region and the outer edge region. The first electrodes 21 and 121, the charge storage electrodes 24 and 124, the charge transfer control electrodes 27, and the outer edge electrode 201 are formed on the interlayer insulating layer 81, and the charge storage electrodes 24 and 124, the charge transfer control electrodes 27, and the outer edge electrode 201 are covered with the insulating layer 82.

In the description below, imaging elements-A will be explained with reference to FIG. 13 or 14. Meanwhile, the imaging elements-B have configurations and structures substantially similar to those of the imaging elements-A, and therefore, the configurations and structures of the imaging elements-B will not be explained below.

As shown in FIG. 13, an imaging element-A of Example 1 is a back-illuminated imaging element, and is formed with a first-type imaging element. Alternatively, as shown in a schematic partial cross-sectional view in FIG. 14, a modification of an imaging element of Example 1 is a front-illuminated imaging element, and is formed with a first-type imaging element. Here, the imaging elements-A are formed with three kinds of imaging elements: imaging elements that absorb red light, imaging elements that absorb green light, and imaging elements that absorb blue light. Further, a plurality of these imaging elements constitutes an imaging device. The plurality of these imaging elements may be arranged in a Bayer array. On the light incident side of each imaging element, a color filter layer for performing blue, green, or red spectral separation may be disposed as necessary.

Each imaging element-A further includes a semiconductor substrate (more specifically, a silicon semiconductor layer) 70, and the photoelectric conversion unit is disposed above the semiconductor substrate 70. Moreover, a control unit is further provided in the semiconductor substrate 70, and the control unit includes a drive circuit to which the first electrode 21, the second electrode 22, and the outer edge electrode 201 or 211 are connected. Here, the light incidence face of the semiconductor substrate 70 is the upper side, and the opposite side of the semiconductor substrate 70 is the lower side. A wiring layer 62 formed with a plurality of wiring lines is provided below the semiconductor substrate 70.

In each imaging element-A, the first electrode 21 and the charge storage electrode 24 are formed at a distance from each other on the interlayer insulating layer 81. The interlayer insulating layer 81 and the charge storage electrode 24 are covered with the insulating layer 82. The photoelectric conversion layer 23 is formed on the insulating layer 82, and the second electrode 22 is formed on the photoelectric conversion layer 23. The upper insulating layers 83 (83A and 83B) are formed on the entire surface including the second electrode 22, and the on-chip microlens 14 is provided on the upper insulating layers 83. Any color filter layer is not provided. The interlayer insulating layer 81, the insulating layer 82, and the upper insulating layers 83 are formed with a known insulating material ($SiO_2$ or SiN, for example). The photoelectric conversion layer 23 and the first electrode 21 are connected by a connecting portion 67 formed in the insulating layer 82. The photoelectric conversion layer 23 extends in the connecting portion 67. In other words, the photoelectric conversion layer 23 extends in an opening 85 formed in the insulating layer 82, and is connected to the first electrode 21.

The size of the charge storage electrode 24 is larger than that of the first electrode 21. Where the area of the charge storage electrode 24 is represented by $S_1'$, and the area of the first electrode 21 is represented by $S_1$, it is preferable to satisfy $$4 \leq S_1'/S_1,$$

which is not restrictive though.

In Example 1, $$S1'/S1=8, \text{ for example,}$$

which is not restrictive though. Note that, in Examples 13 through 17 described later, three photoelectric conversion unit segments $\mathbf{10'}_1$, $\mathbf{10'}_2$, and $\mathbf{10'}_3$ have the same size, and also have the same planar shape.

The charge storage electrode 24 is connected to the drive circuit. Specifically, the charge storage electrode 24 is connected to a vertical drive circuit 312 (described later) forming the drive circuit, via a connecting hole 66, a pad portion 64, and a wiring line $V_{OA}$ provided in the interlayer insulating layer 81. Likewise, the outer edge electrode 201 is also connected to the drive circuit.

In the semiconductor substrate 70, at least a floating diffusion layer $FD_1$ and an amplification transistor $TR1_{amp}$ that form the control unit are provided, and the first electrode 21 is connected to the floating diffusion layer $FD_1$ and the gate portion of the amplification transistor $TR1_{amp}$. In the semiconductor substrate 70, a reset transistor $TR1_{rst}$ and a selection transistor $TR1_{sel}$ that form the control unit are further provided. The floating diffusion layer $FD_1$ is connected to one of the source/drain regions of the reset transistor $TR1_{rst}$, one of the source/drain regions of the amplification transistor $TR1_{amp}$ is connected to one of the source/drain regions of the selection transistor $TR1_{sel}$, and the other one of the source/drain regions of the selection transistor $TR1_{sel}$ is connected to a signal line $VSL_1$. The amplification transistor $TR1_{amp}$, the reset transistor $TR1_{rst}$, and the selection transistor $TR1_{sel}$ constitute the drive circuit.

More specifically, a device separation region 71 is formed on the side of a first surface (front surface) 70A of the semiconductor substrate 70, and an oxide film 72 is also formed on the first surface 70A of the semiconductor substrate 70. Further, on the first surface side of the semiconductor substrate 70, the reset transistor $TR1_{rst}$, the amplification transistor $TR1_{amp}$, and the selection transistor $TR1_{sel}$ constituting the control unit of the imaging element-A are provided, and the first floating diffusion layer $FD_1$ is also provided.

The reset transistor $TR1_{rst}$ includes a gate portion 51, a channel formation region 51A, and source/drain regions 51B and 51C. The gate portion 51 of the reset transistor $TR1_{rst}$ is connected to a reset line $RST_1$, one source/drain region 51C of the reset transistor $TR1_{rst}$ also serves as the first floating diffusion layer $FD_1$, and the other source/drain region 51B is connected to a power supply VDD.

The first electrode 21 is connected to one source/drain region 51C (the first floating diffusion layer $FD_1$) of the reset transistor $TR1_{rst}$, via a connecting hole 65 and a pad portion 63 provided in the interlayer insulating layer 81, a contact hole portion 61 formed in the semiconductor substrate 70 and the interlayer insulating layer 76, and the wiring layer 62 formed in the interlayer insulating layer 76.

The amplification transistor $TR1_{amp}$ includes a gate portion 52, a channel formation region 52A, and source/drain regions 52B and 52C. The gate portion 52 is connected to the first electrode 21 and one source/drain region 51C (the first floating diffusion layer $FD_1$) of the reset transistor $TR1_{rst}$, via the wiring layer 62. Further, one source/drain region 52B is connected to the power supply VDD.

The selection transistor $TR1_{sel}$ includes a gate portion 53, a channel formation region 53A, and source/drain regions 53B and 53C. The gate portion 53 is connected to a selection line $SEL_1$. Further, one source/drain region 53B shares a region with the other source/drain region 52C forming the amplification transistor $TR1_{amp}$, and the other source/drain region 53C is connected to a signal line (a data output line) $VSL_1$ (317).

The reset line $RST_1$ and the selection line $SEL_1$ are connected to a vertical drive circuit 312 that forms the drive circuit, and the signal line (data output line) $VSL_1$ is connected to a column signal processing circuit 313 that forms the drive circuit.

In the interlayer insulating layer 76, wiring lines are formed across a plurality of layers, but are not shown in the drawings. A $HfO_2$ film 74 is formed on the back surface 70B of the semiconductor substrate 70 and in the formation portion of the contact hole portion 61 in the semiconductor substrate 70.

The $HfO_2$ film 74 is a film having a negative fixed electric charge. As such a film is included, generation of dark current can be reduced. Instead of a $HfO_2$ film, it is possible to use an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, an europium oxide ($Eu_2O_3$) film, a gadolinium oxide ($Gd_2O_3$) film, a terbium oxide ($Tb_2O_3$) film, a dysprosium oxide ($Dy_2O_3$) film, a holmium oxide ($Ho_2O_3$) film, a thulium oxide ($Tm_2O_3$) film, a ytterbium oxide ($Yb_2O_3$) film, a lutetium oxide ($Lu_2O_3$) film, a yttrium oxide ($Y_2O_3$) film, a hafnium nitride film, an aluminum nitride film, a hafnium oxynitride film, or an aluminum oxynitride film. These films may be formed by a CVD method, a PVD method, or an ALD method, for example.

Figure 16A:
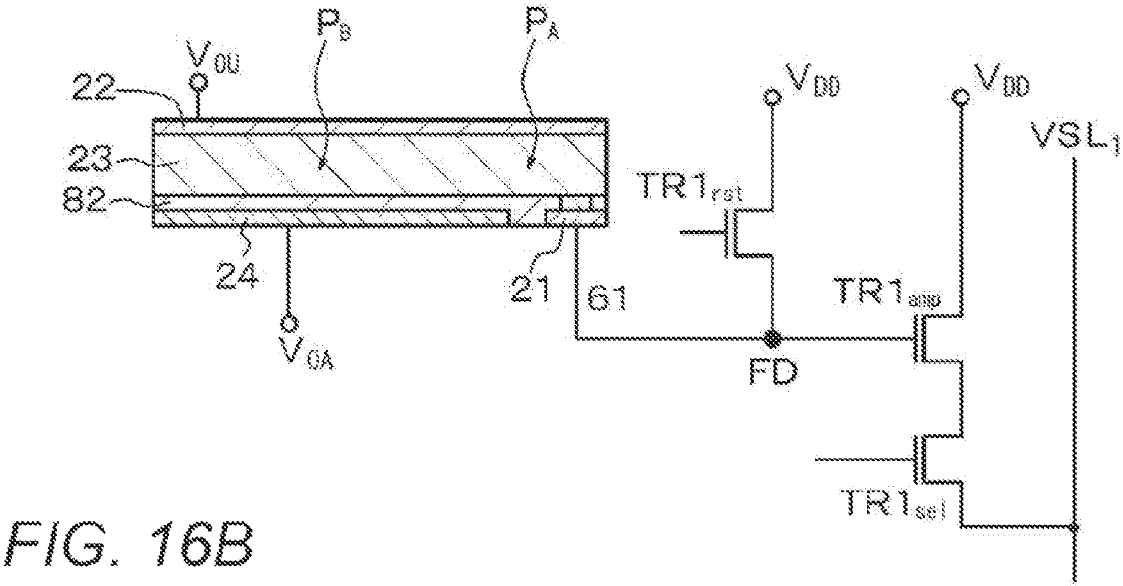
FIGS. 16A, 16B, and 16C are equivalent circuit diagrams of imaging elements-A of Example 1, Example 11, and Example 13, for explaining respective portions shown in FIG. 17 (Example 1), FIGS. 33 and 34 (Example 11), and FIGS. 45 and 46 (Example 13).
Figure 17:
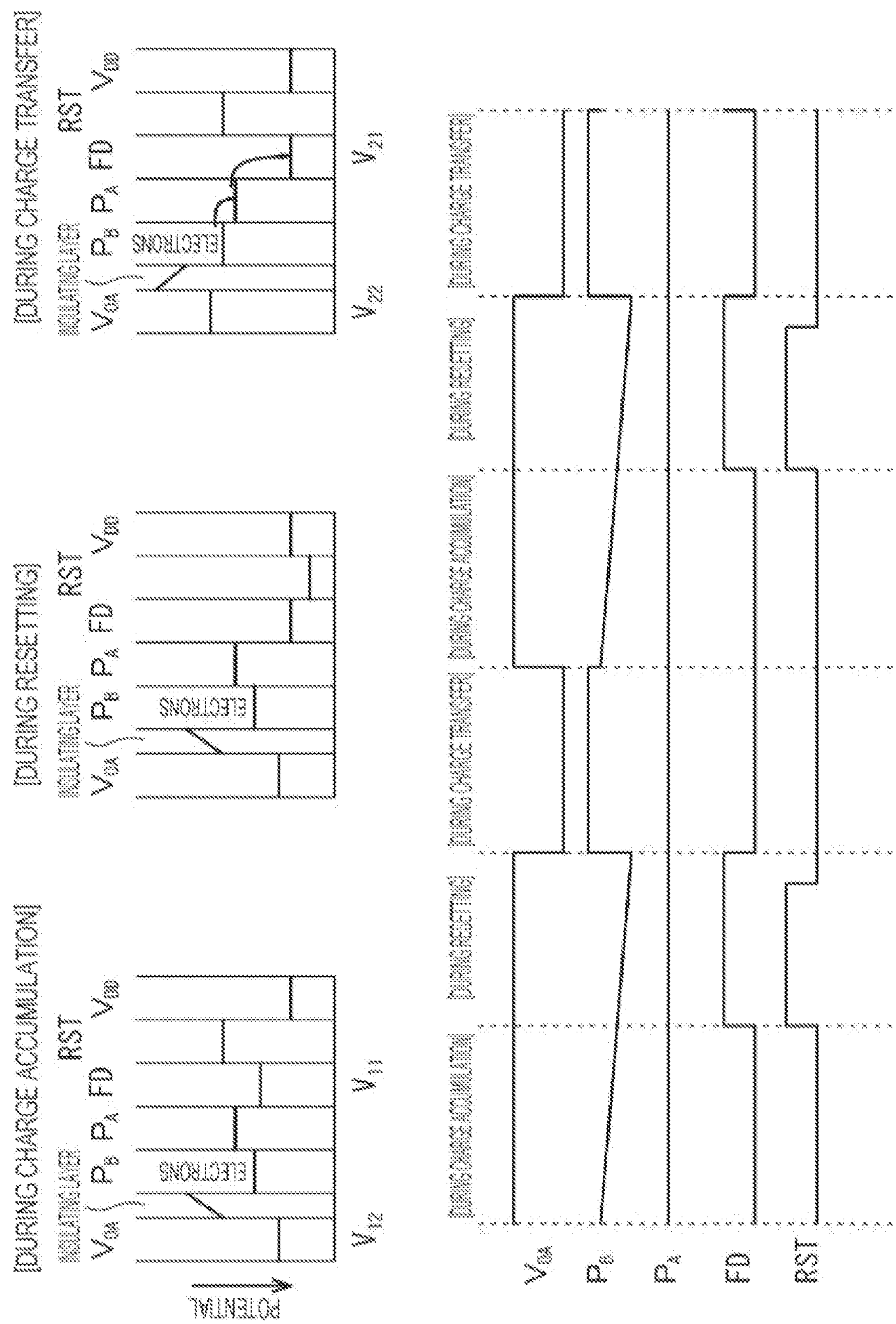
FIG. 17 is a diagram schematically showing the states of the potentials at respective portions during an operation of an imaging element-A included in the imaging device of Example 1.

In the description below, operation of an imaging element including the charge storage electrode of Example 1 is described with reference to FIGS. 16A and 17. Here, the potential of the first electrode 21 is higher than the potential of the second electrode 22. Specifically, the first electrode 21 has a positive potential, the second electrode 22 has a negative potential, and electrons generated through photoelectric conversion in the photoelectric conversion layer 23 are read into the floating diffusion layer, for example. The same applies to the other Examples. Also, in the description below, operation of an imaging element-A will be explained, but operation of an imaging element-B can be substantially similar to the operation of the imaging element-A, except that there is no light irradiation. Therefore, explanation of the operation of the imaging element-B will not be made below.

Figure 33:
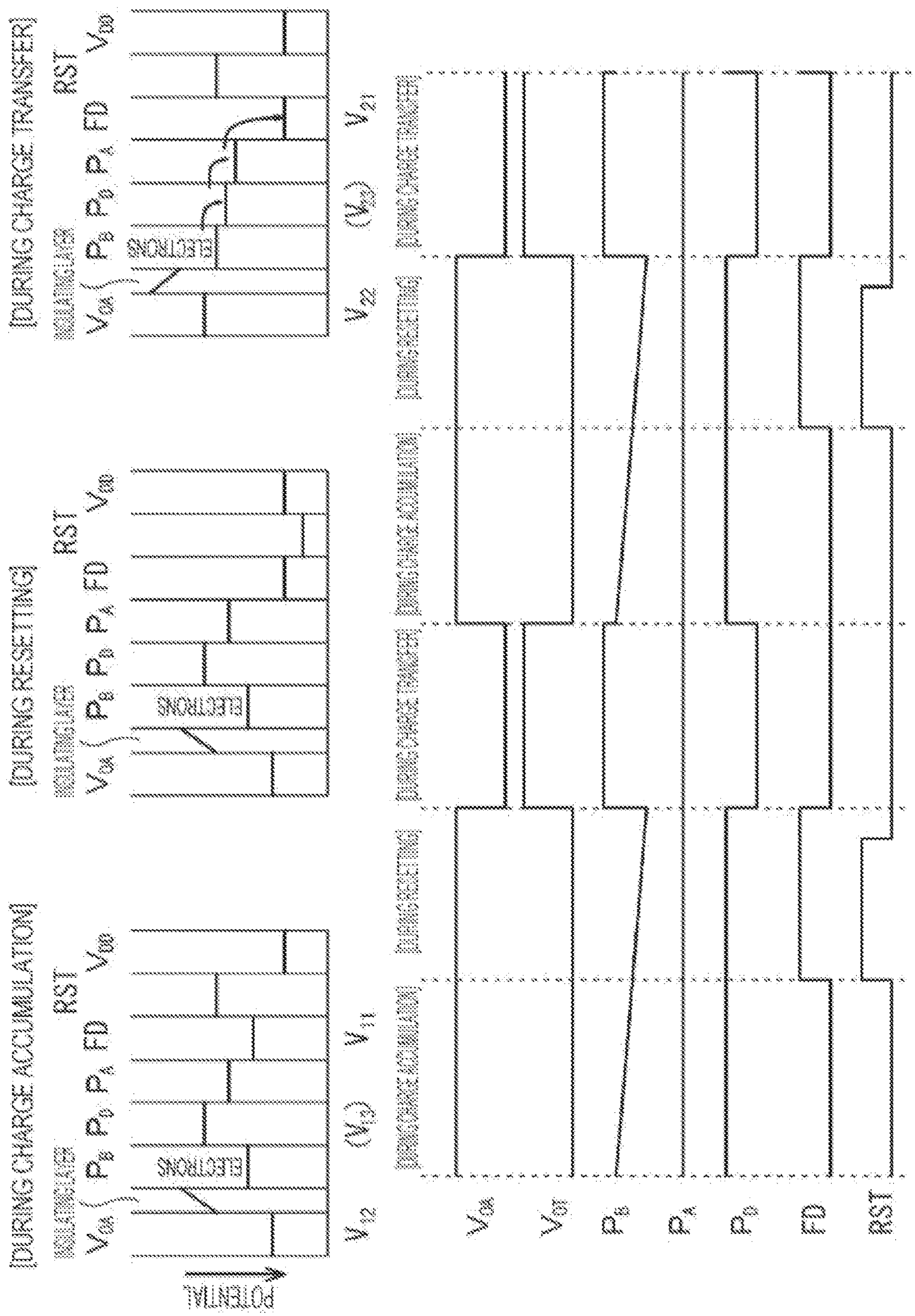
FIG. 33 is a diagram schematically showing the states of the potentials at respective portions during an operation of an imaging element-A included in the imaging device of Example 11.
Figure 34:
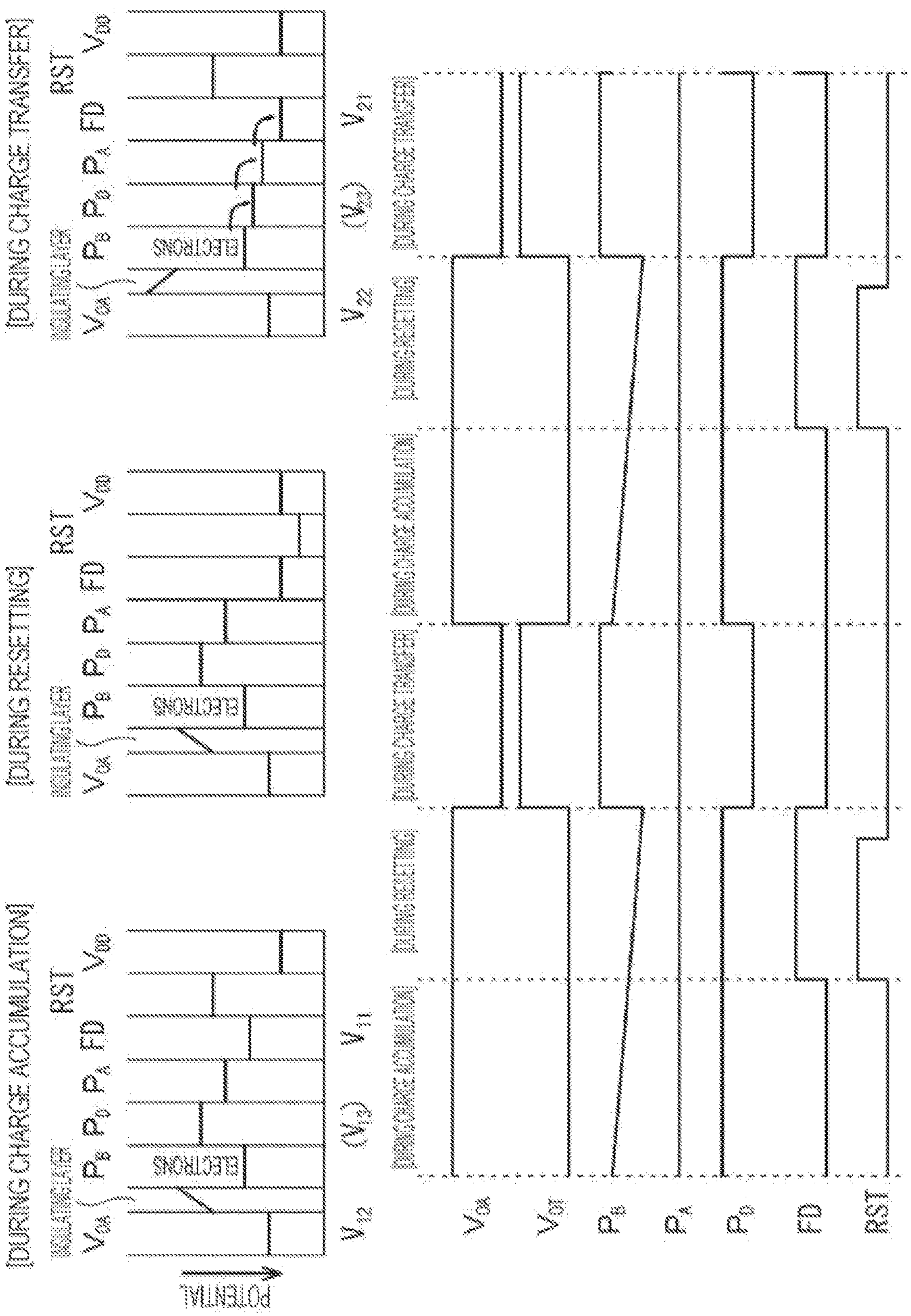
FIG. 34 is a diagram schematically showing the states of the potentials at respective portions during another operation of an imaging element-A included in the imaging device of Example 11.

The symbols used in FIG. 17, in FIGS. 33 and 34 for Example 11 described later, and in FIGS. 45 and 46 for Example 13 described later are as follows.

$P_A$ The potential at a point $P_A$ in the photoelectric conversion layer 23 facing a region located between the charge storage electrode 24 or a transfer control electrode (charge transfer electrode) 25 and the first electrode 21

$P_B$ The potential at a point $P_B$ in a region of the photoelectric conversion layer 23 facing the charge storage electrode 24

$P_{C1}$ The potential at a point $P_{C1}$ in a region of the photoelectric conversion layer 23 facing a charge storage electrode segment 24A $P_{C2}$ The potential at a point $P_{C2}$ in a region of the photoelectric conversion layer 23 facing a charge storage electrode segment 24B $P_{C3}$ The potential at a point $P_{C3}$ in a region of the photoelectric conversion layer 23 facing a charge storage electrode segment 24C $P_D$ The potential at a point $P_D$ in a region of the photoelectric conversion layer 23 facing the transfer control electrode (charge transfer electrode) 25

FD The potential in the first floating diffusion layer $FD_1$ $V_{OA}$ The potential at the charge storage electrode 24

$V_{OA-A}$ The potential at the charge storage electrode segment 24A $V_{OA-B}$ The potential at the charge storage electrode segment 24B $V_{OA-C}$ The potential at the charge storage electrode segment 24C $V_{OT}$ The potential at the transfer control electrode (charge transfer electrode) 25

RST The potential at the gate portion 51 of the reset transistor $\mathbf{TR1}_{rst}$ $V_{DO}$ The potential at the power supply $VSL_1$ The signal line (data output line) $VSL_1$ $\mathbf{TR1}_{rst}$ Reset transistor $\mathbf{TR1}_{rst}$ $\mathbf{TR1}_{amp}$ Amplification transistor $\mathbf{TR1}_{amp}$ $\mathbf{TR1}_{sel}$ Selection transistor $\mathbf{TR1}_{sel}$ In a charge accumulation period, the drive circuit applies a potential $V_{11}$ to the first electrode 21, and a potential $V_{12}$ to the charge storage electrode 24. Light that has entered the photoelectric conversion layer 23 causes photoelectric conversion in the photoelectric conversion layer 23. Holes generated by the photoelectric conversion are sent from the second electrode 22 to the drive circuit via a wiring line $V_{OU}$. Meanwhile, since the potential of the first electrode 21 is higher than the potential of the second electrode 22, or a positive potential is applied to the first electrode 21 while a negative potential is applied to the second electrode 22, for example, $V_{12} \geq V_{11}$, or preferably, $V_{12} > V_{11}$. As a result, electrons generated by the photoelectric conversion are attracted to the charge storage electrode 24, and stay in the region of the photoelectric conversion layer 23 facing the charge storage electrode 24. In other words, electric charges are accumulated in the photoelectric conversion layer 23. Since $V_{12} > V_{11}$, electrons generated in the photoelectric conversion layer 23 will not move toward the first electrode 21. With the passage of time for photoelectric conversion, the potential in the region of the photoelectric conversion layer 23 facing the charge storage electrode 24 becomes a more negative value.

A reset operation is performed in the latter period in the charge accumulation period. As a result, the potential of the first floating diffusion layer $FD_1$ is reset, and the potential of the first floating diffusion layer $FD_1$ becomes equal to the potential VDD of the power supply.

After completion of the reset operation, the electric charges are read out. In other words, in a charge transfer period, the drive circuit applies a potential $V_{21}$ to the first electrode 21, and a potential $V_{22}$ to the charge storage electrode 24. Here, $V_{22} < V_{21}$. As a result, the electrons remaining in the region of the photoelectric conversion layer 23 facing the charge storage electrode 24 are read into the first electrode 21 and further into the first floating diffusion layer $FD_1$. In other words, the electric charges accumulated in the photoelectric conversion layer 23 are read into the control unit.

In the above manner, a series of operations including charge accumulation, reset operation, and charge transfer is completed.

The outer edge electrode 201 is also connected to the drive circuit. As described above, a potential (a negative potential in Example 1) with the same sign as signal charges (electrons in Example 1) is applied to the outer edge electrode 201. Further, during an operation of the imaging device, a potential with the same sign as signal charges continues to be constantly applied to the outer edge electrode 201. Specifically, where the potential to be applied to the outer edge electrode 201 is represented by $V_{201}$, the value of $V_{201}$ is only required to be always lower than $V_{12}$. As a result, during a series of operations such as charge accumulation, a reset operation, and charge transfer, the electrons generated in the outer edge region cannot go beyond the potential barrier generated by the outer edge electrode 201, and the electrons generated in the outer edge region do not flow into the optical black region.

The operations of the amplification transistor $\mathbf{TR1}_{amp}$ and the selection transistor $\mathbf{TR1}_{sel}$ after the electrons are read into the first floating diffusion layer $FD_1$ are the same as the operations of conventional amplification and selection transistors. Further, a series of operations including charge accumulation, reset operation, and charge transfer to be performed in the second imaging element and the third imaging element described later is also similar to the series of conventional operations including charge accumulation, a reset operation, and charge transfer. Further, the reset noise in the first floating diffusion layer $FD_1$ can be eliminated by a correlated double sampling (CDS) process as in conventional operations.

Figure 63:
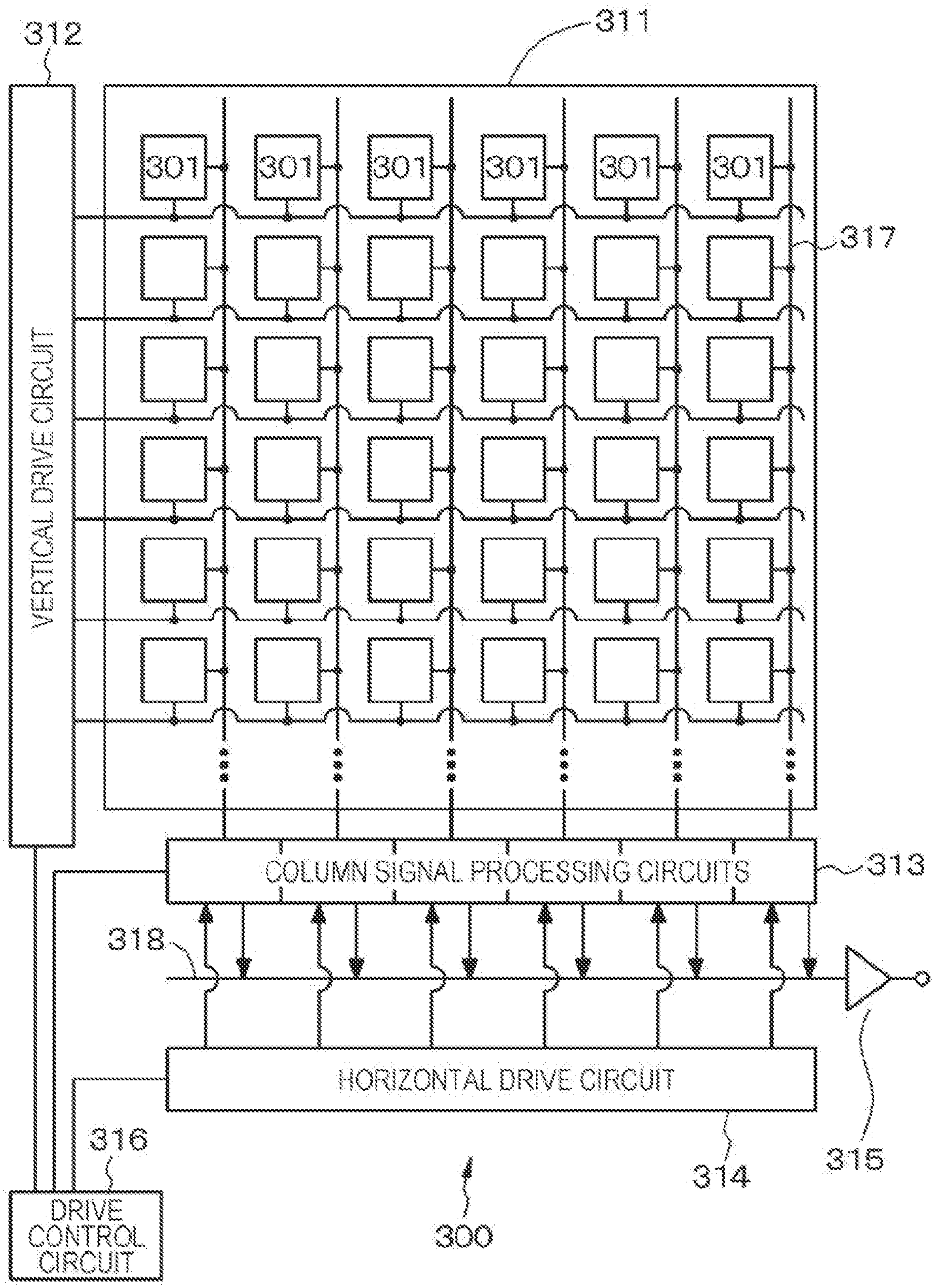
FIG. 63 is a conceptual diagram of the imaging device (a solid-state imaging device) of Example 1.

FIG. 63 is a conceptual diagram of an imaging device of Example 1. An imaging device 300 of Example 1 includes an imaging region (the effective pixel region) 311 in which imaging devices 301 are arranged in a two-dimensional array, the vertical drive circuit 312 as the drive circuit (a peripheral circuit) for the imaging elements 301, the column signal processing circuits 313, a horizontal drive circuit 314, an output circuit 315, a drive control circuit 316, and the like. These circuits may be formed with known circuits, or may of course be formed with other circuit configurations (various circuits that are used in conventional CCD imaging devices or CMOS imaging devices, for example). In FIG. 63, reference numeral "301" for the imaging elements 301 is only shown in one row.

On the basis of a vertical synchronization signal, a horizontal synchronization signal, and a master clock, the drive control circuit 316 generates a clock signal and a control signal that serve as the references for operations of the vertical drive circuit 312, the column signal processing circuits 313, and the horizontal drive circuit 314. The generated clock signal and control signal are then input to the vertical drive circuit 312, the column signal processing circuits 313, and the horizontal drive circuit 314.

The vertical drive circuit 312 is formed with a shift register, for example, and selectively scans the respective imaging elements 301 in the imaging region 311 sequentially in the vertical direction row by row. A pixel signal (an image signal) based on the current (signal) generated in accordance with the amount of light received in each imaging element 301 is then sent to the column signal processing circuit 313 via a signal line (a data output line) 317 and a VSL.

The column signal processing circuits 313 are provided for the respective columns of the imaging elements 301, for example, and perform signal processing such as noise removal and signal amplification on the image signals output from the imaging elements 301 of one row in accordance with a signal from a black reference pixel (formed around an effective pixel region, though not shown) for each imaging element. Horizontal select switches (not shown) are provided between and connected to the output stages of the column signal processing circuits 313 and a horizontal signal line 318.

The horizontal drive circuit 314 is formed with a shift register, for example. The horizontal drive circuit 314 sequentially selects the respective column signal processing circuits 313 by sequentially outputting horizontal scan pulses, and causes the respective column signal processing circuits 313 to output signals to the horizontal signal line 318.

The output circuit 315 performs signal processing on signals sequentially supplied from the respective column signal processing circuits 313 through the horizontal signal line 318, and outputs the processed signals.

As described above, in the imaging device of Example 1, the outer edge electrode is disposed in the outer edge region. Accordingly, electric charges generated at the edge of the photoelectric conversion layer are prevented from moving toward the imaging elements-B and entering the imaging elements-B. Thus, any problem that hinders the functions of the optical black region does not occur. As described above, in Example 1, the charge storage electrode is disposed at a distance from the first electrode, and is positioned to face the photoelectric conversion layer via the insulating layer. Accordingly, when light is emitted onto the photoelectric conversion layer, and photoelectric conversion is performed in the photoelectric conversion layer, a kind of capacitor is formed by the photoelectric conversion layer, the insulating layer, and the charge storage electrode, and electric charges can be stored in the photoelectric conversion layer. Accordingly, at the start of exposure, the charge storage portion can be fully depleted, and the electric charges can be erased. As a result, it is possible to reduce or prevent the occurrence of a phenomenon in which the kTC noise becomes larger, the random noise is aggravated, and the imaging quality is lowered. Further, all the pixels can be reset simultaneously, a so-called global shutter function can be achieved.

As shown in a schematic layout diagram of the components of a modification of the imaging device of Example 1 in FIG. 11B, the outer edge electrode 201 (or the outer edge electrode 211 described later) surrounding the optical black region can be formed in a discontinuous manner. Further, although not shown in the drawings, the outer edge electrode 201 (or the outer edge electrode 211 described later) may be formed along a partial region in the optical black region (or may be formed along one side, two sides, or three sides of the optical black region having a rectangular planar external shape, for example).

The imaging elements-A and imaging elements-B constituting the imaging device or the like of the present disclosure will be comprehensively explained in detail in Example 7 and Example 8.

Example 2

Figure 2:
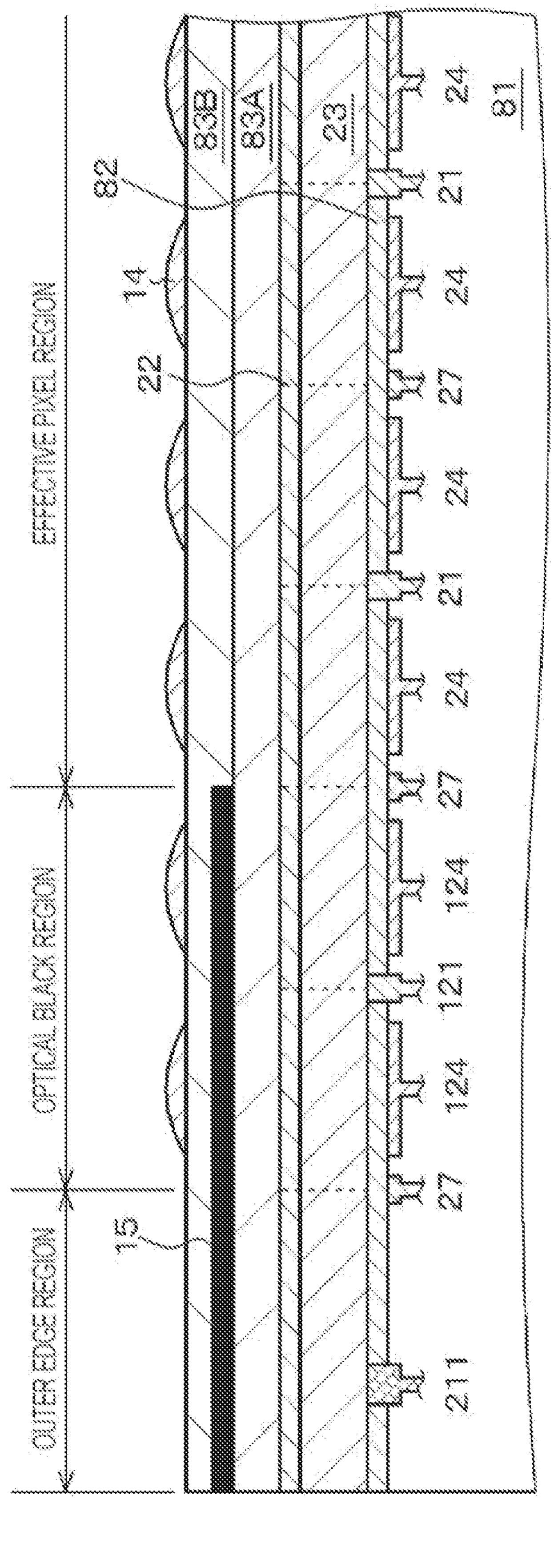
FIG. 2 is a schematic partial cross-sectional view of an imaging device of Example 2.

Example 2 is a modification of Example 1. FIG. 2 is a schematic partial cross-sectional view of an imaging device, and FIG. 12A schematically shows the arrangement of the components of the imaging device. As shown in FIGS. 2 and 12A, in an imaging device of Example 2, the outer edge electrode (a fourth electrode) 211 that is an electrode located in the outer edge region is connected to the common photoelectric conversion layer 23. The outer edge electrode 211 functions as a charge emission electrode. A potential (specifically, a positive potential) with a different sign from signal charges is applied to the outer edge electrode 211, and further, a potential (specifically, a positive potential) with a different sign from signal charges continues to be constantly applied to the outer edge electrode 211 during an operation of the imaging device. Specifically, where the potential to be applied to the outer edge electrode 211 is represented by $V_{211}$, the value of $V_{211}$ is only required to be always higher than $V_{12}$.

As a result, during a series of operations such as charge accumulation, a reset operation, and charge transfer, the electrons generated in the outer edge region flow into the outer edge electrode, and the electrons generated in the outer edge region do not flow into the optical black region. Moreover, as the charge transfer control electrode is provided in the optical black region, it is possible to more reliably prevent the electrons generated in the outer edge region from flowing into the optical black region.

Except for the above aspects, the configuration and the structure of the imaging device of Example 2 can be similar to the configuration and the structure of the imaging device of Example 1, and therefore, detailed explanation thereof is not made herein.

Example 3

Figure 3:
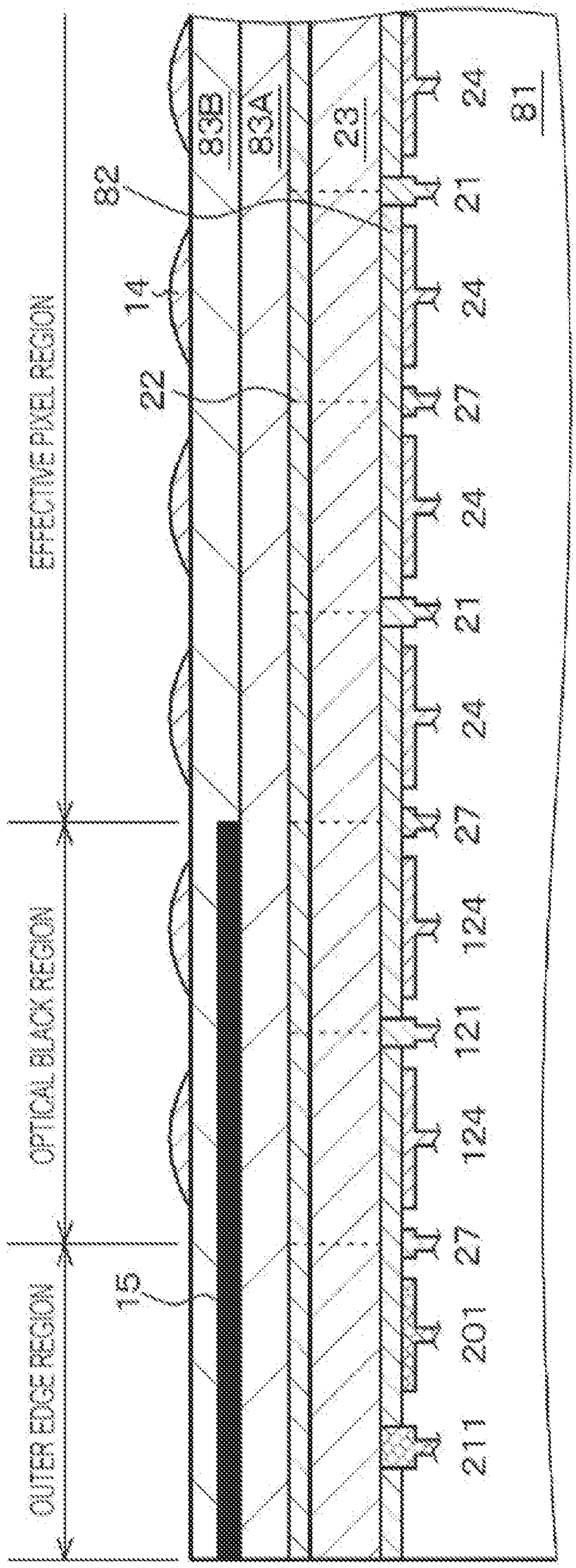
FIG. 3 is a schematic partial cross-sectional view of an imaging device of Example 3.

Example 3 is modifications of Examples 1 and 2. FIG. 3 shows a schematic partial cross-sectional view of an imaging device, and FIG. 12B schematically shows the arrangement of the components of the imaging device. As shown in FIGS. 3 and 12B, in an imaging device of Example 3, the outer edge electrode is formed with a first outer edge electrode (the third electrode) 201 (the outer edge electrode 201 in Example 1) disposed to face the common photoelectric conversion layer via the insulating layer 82, and a second outer edge electrode (the fourth electrode) 211 (the outer edge electrode 211 in Example 2) that is disposed on the outer side of the first outer edge electrode 201 and is connected to the common photoelectric conversion layer 23.

Except for the above aspects, the configuration and the structure of the imaging device of Example 3 can be similar to the configuration and the structure of the imaging devices of Examples 1 and 2, and therefore, detailed explanation thereof is not made herein.

Example 4

Figure 4:
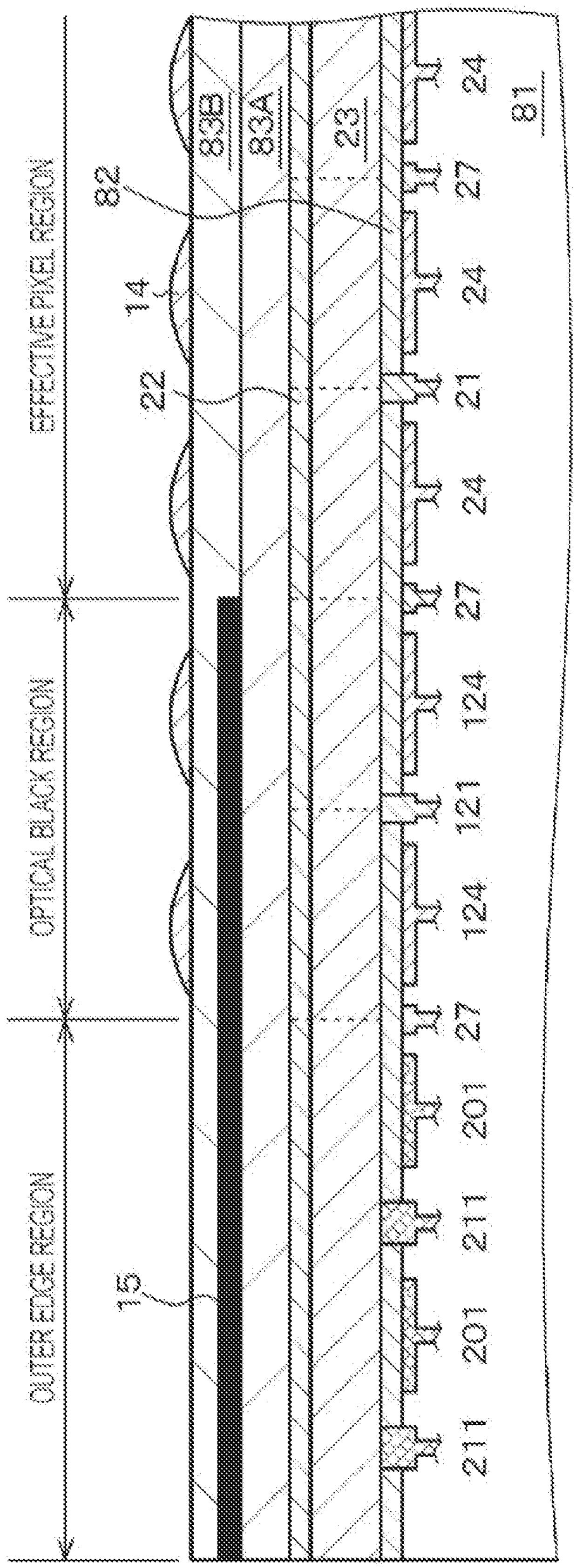
FIG. 4 is a schematic partial cross-sectional view of an imaging device of Example 4.
Figure 5:
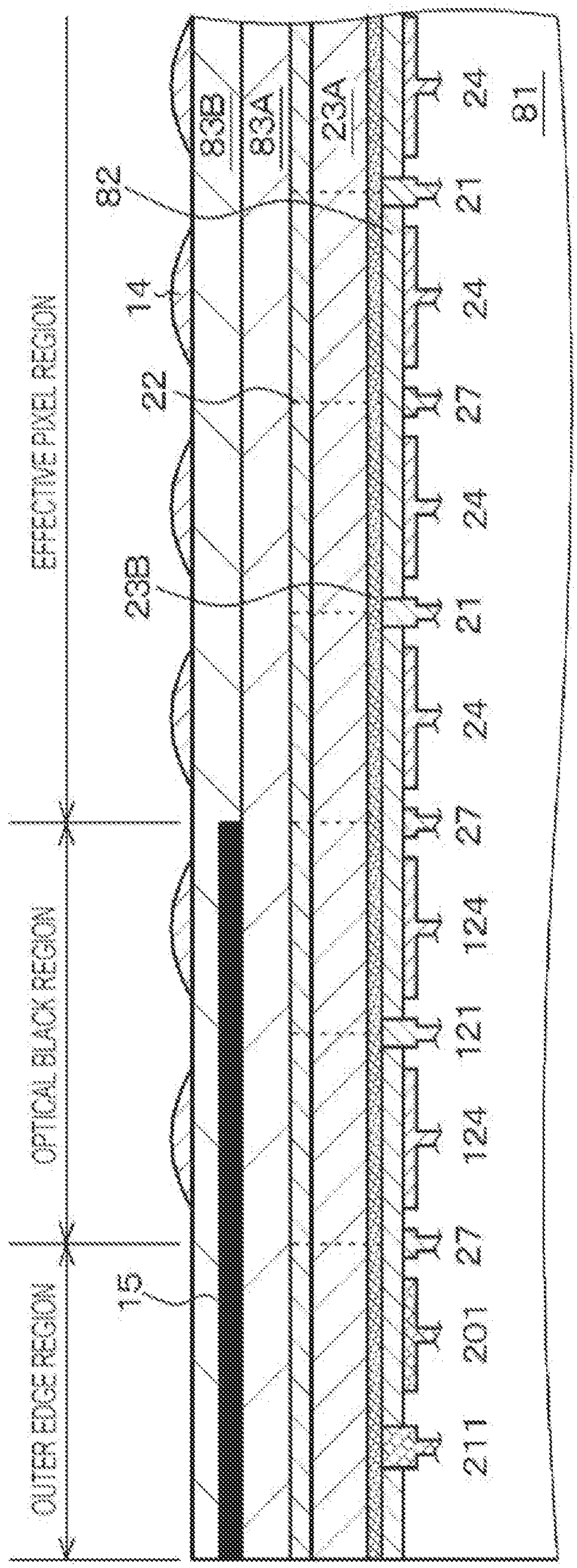
FIG. 5 is a schematic partial cross-sectional view of an imaging device of Example 5.

Example 4 is modifications of Examples 1 through 3. As shown in FIG. 4, which is a schematic partial cross-sectional view of a modification of the imaging device of Example 3, in an imaging device of Example 4, a first outer edge electrode (the third electrode) 201 (the outer edge electrode 201 in Example 1) disposed to face the common photoelectric conversion layer via the insulating layer 82, and a second outer edge electrode (the fourth electrode) 211 (the outer edge electrode 211 in Example 2) that is disposed on the outer side of the first outer edge electrode 201 and is connected to the common photoelectric conversion layer 23 forms one pair, and two of such pairs are provided. However, the number of these pairs is not necessarily two, but may be three or more, or may be the same number as or a different number from the number of the first outer edge electrodes 201 and the number of the second outer edge electrodes 211. Alternatively, zero or one first outer edge electrode 201 may be provided, and two or more second outer edge electrodes 211 may be provided. Zero or one second outer edge electrode 211 may be provided, and two or more first outer edge electrodes 201 may be provided.

Further, the width of the plurality of first outer edge electrodes 201 may be varied, the space between the first outer edge electrodes 201 may be varied, the width of the plurality of second outer edge electrodes 211 may be varied, the space between the second outer edge electrodes 211 may be varied, or the space between a first outer edge electrode 201 and a second outer edge electrode 211 may be varied. The potential to be applied to each of the first outer edge electrodes 201 may be varied for each first outer edge electrode 201, and the potential to be applied to each of the second outer edge electrodes 211 may be varied for each second outer edge electrode 211.

Except for the above aspects, the configuration and the structure of the imaging device of Example 4 can be similar to the configuration and the structure of the imaging devices of Examples 1 and 2, and therefore, detailed explanation thereof is not made herein.

Example 5

Example 5 is modifications of Examples 1 through 4. As shown in a schematic partial cross-sectional view of an imaging device in FIG. 5, in an imaging device of Example 5, the photoelectric conversion layer 23 has a two-layer configuration that includes an organic semiconductor material layer 23A and an oxide semiconductor material layer 23B formed with IGZO or the like. The work function of the oxide semiconductor material layer 23B differs from the work function of the first electrodes 21. Further, the LUMO value $E_1$ of the material forming a portion of the organic semiconductor material layer 23A located in the vicinity of the oxide semiconductor material layer 23B, and the LUMO value $E_2$ of the material forming the oxide semiconductor material layer 23B preferably satisfy the following expression:

$$E_2-E_1\geq 0.1\text{ eV},$$

or more preferably satisfy the following expression:

$E_2-E_1>0.1$ eV As the photoelectric conversion layer is made to have a two-layer structure as above, recoupling at the time of charge accumulation can be prevented, the efficiency of transfer of the electric charges stored in the photoelectric conversion layer to the first electrodes can be increased, and generation of dark current can be reduced.

Figure 6:
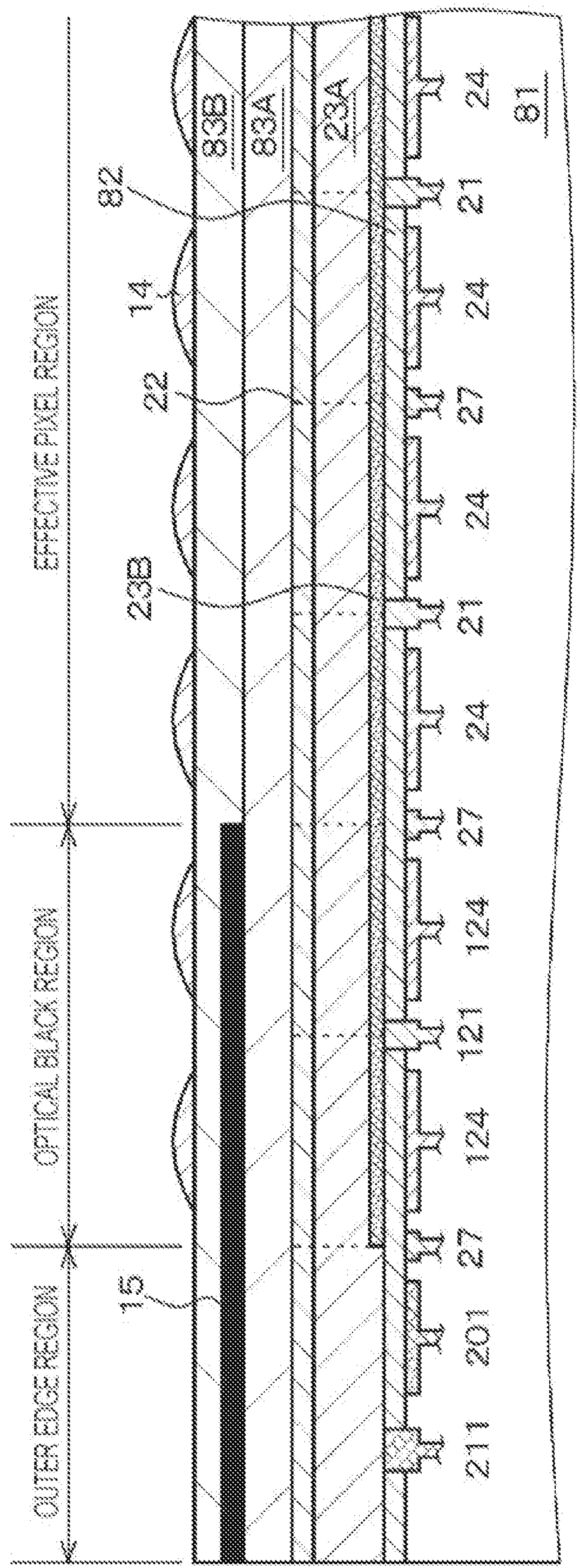
FIG. 6 is a schematic partial cross-sectional view of a modification of the imaging device of Example 5.

Further, as shown in FIG. 6, which is a schematic partial cross-sectional view of an imaging device, in a modification of the imaging device of Example 5, the photoelectric conversion layer 23 in the effective pixel region and the optical black region has a two-layer configuration that includes the organic semiconductor material layer 23A and the oxide semiconductor material layer 23B, and the photoelectric conversion layer 23 in the outer edge region has a single-layer configuration formed with the organic semiconductor material layer 23A. With this arrangement, movement of electrons in the photoelectric conversion layer 23 in the outer edge region to the first outer edge electrode 201 and the second outer edge electrode 211 can be made slower than movement of electrons in the photoelectric conversion layer 23 in the effective pixel region and the optical black region to the first electrodes 22 and 122. Thus, movement of electrons from the outer edge region to the optical black region can be more effectively reduced or prevented.

Except for the above aspects, the configuration and the structure of the imaging device of Example 5 can be similar to the configuration and the structure of the imaging devices of Examples 1 through 4, and therefore, detailed explanation thereof is not made herein.

Example 6

Figure 7:
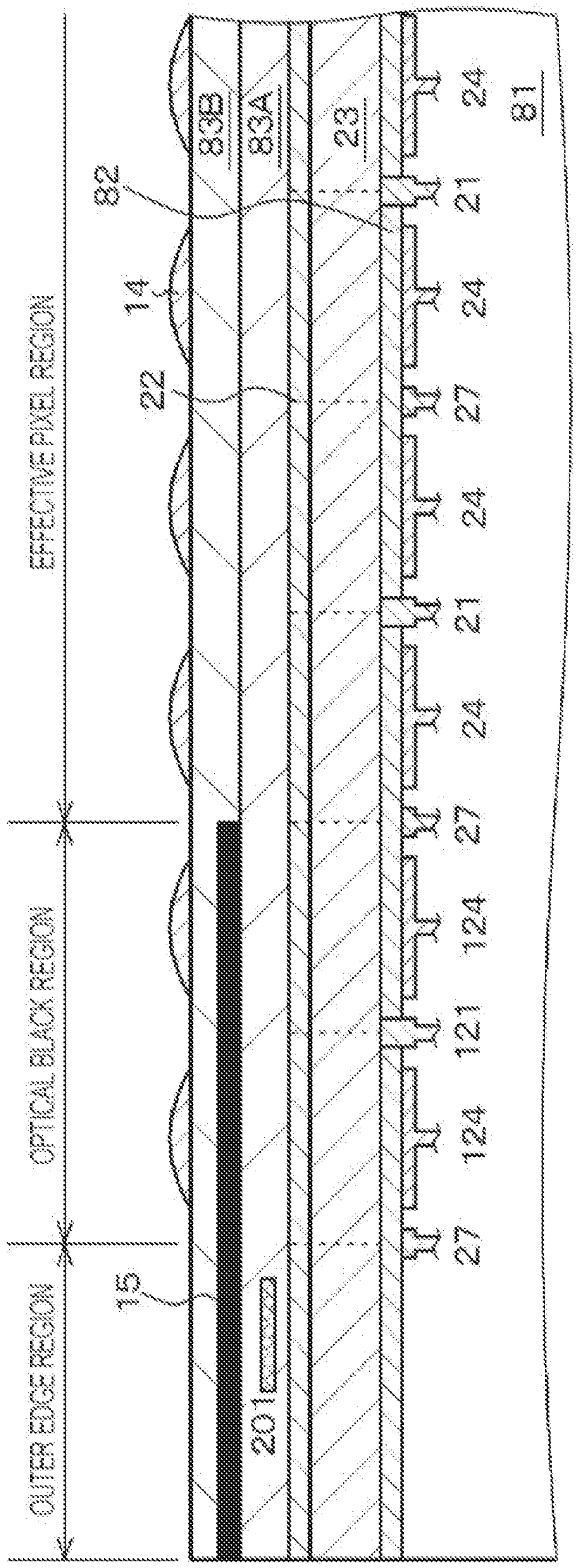
FIG. 7 is a schematic partial cross-sectional view of an imaging device of Example 6.
Figure 8:
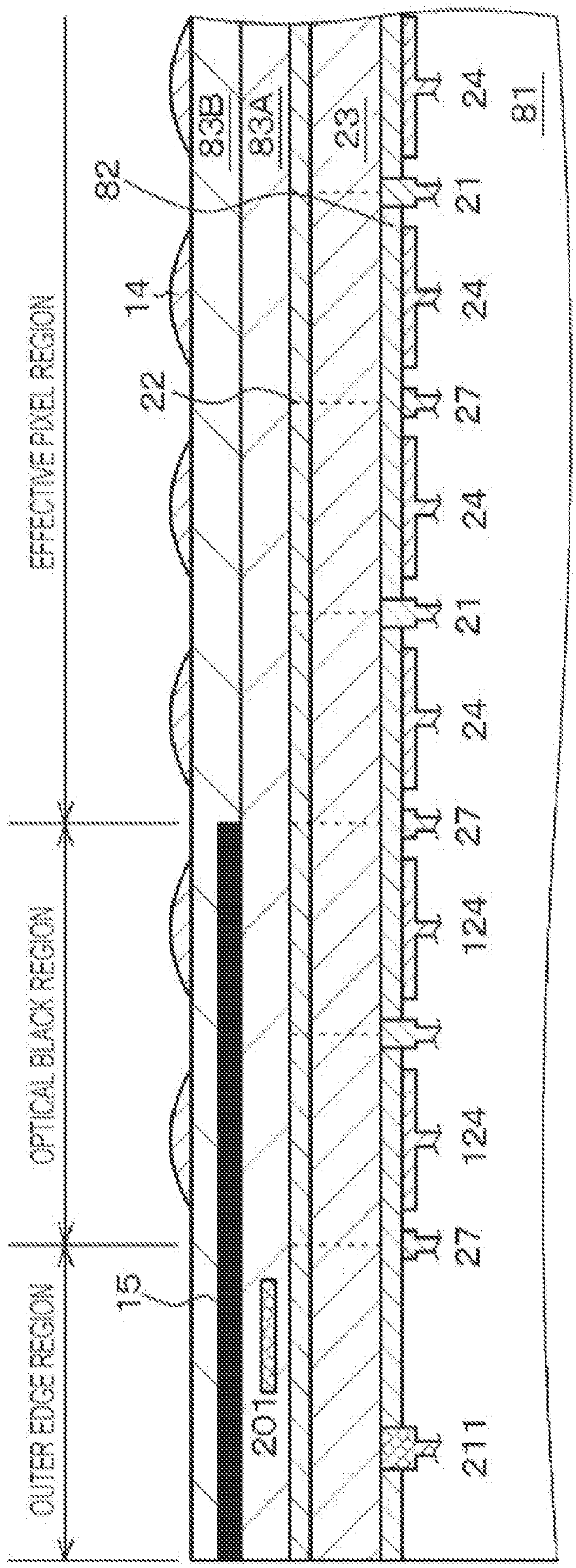
FIG. 8 is a schematic partial cross-sectional view of a modification of the imaging device of Example 6.

Example 6 is modifications of Examples 1 through 5. As shown in FIG. 7, which is a schematic partial cross-sectional view of a modification of the imaging device of Example 1, in an imaging device of Example 6 as a modification of Example 1, the outer edge electrode (the third electrode) 201 is disposed on the second electrode side with respect to the common photoelectric conversion layer 23. Further, as shown in FIG. 8, which is a schematic partial cross-sectional view of an imaging device, in a modification of the imaging device of Example 6 as a modification of Example 3, the outer edge electrode 201 is disposed on the second electrode side with respect to the common photoelectric conversion layer 23. The outer edge electrode (the fourth electrode) 211 is disposed on the first electrode side with respect to the common photoelectric conversion layer 23. Alternatively, although not shown in any drawing, in a modification of the imaging device of Example 6 as a modification of Example 2, the outer edge electrode 211 may be disposed on the second electrode side with respect to the common photoelectric conversion layer 23. Alternatively, the outer edge electrode 201 may be disposed on the second electrode side with respect to the common photoelectric conversion layer 23, the outer edge electrode 211 may be disposed on the second electrode side with respect to the common photoelectric conversion layer 23, the outer edge electrode 201 may be disposed on the first electrode side with respect to the common photoelectric conversion layer 23, and the outer edge electrode 211 may be disposed on the second electrode side with respect to the common photoelectric conversion layer 23.

Except for the above aspects, the configuration and the structure of the imaging device of Example 6 can be similar to the configuration and the structure of the imaging devices of Examples 1 through 5, and therefore, detailed explanation thereof is not made herein.

Example 7

Example 7 relates to an imaging device according to the second embodiment of the present disclosure.

Figure 9:
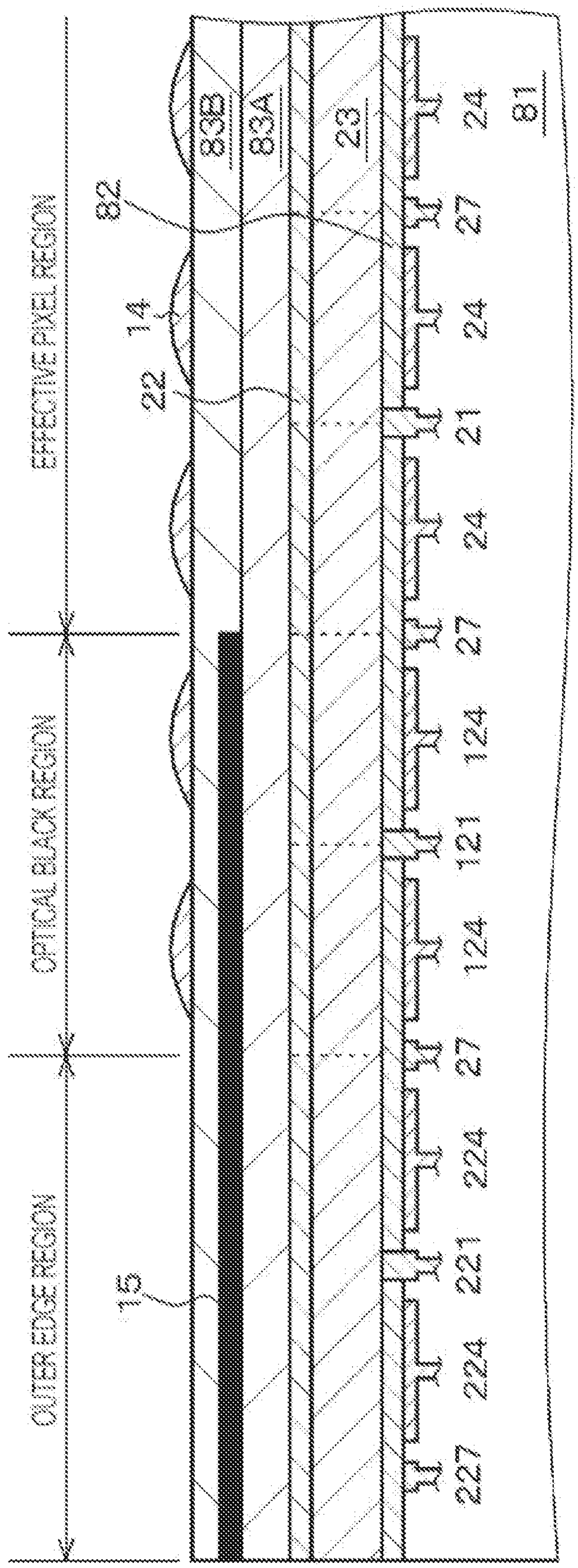
FIG. 9 is a schematic partial cross-sectional view of an imaging device of Example 7.

As shown in a schematic partial cross-sectional view in FIG. 9, an imaging device of Example 7 includes: an effective pixel region that includes a plurality of imaging elements-A, amplifies signal charges generated through photoelectric conversion, and reads the signal charges into a drive circuit; an optical black region that includes a plurality of imaging elements-B, surrounds the effective pixel region, and outputs optical black that serves as the reference for black levels; and an outer edge region that includes a plurality of imaging elements-C and surrounds the optical black region. Further, the photoelectric conversion layer 23 that forms the plurality of imaging elements-A, the plurality of imaging elements-B, and the plurality of imaging elements-C is a common photoelectric conversion layer, and the imaging elements-C are always in an operating state during an operation of the imaging device.

In the imaging device according to the second embodiment of the present disclosure, each imaging element-A includes a photoelectric conversion unit formed by stacking a first electrode 21, the photoelectric conversion layer 23, and the second electrode 22, and the photoelectric conversion unit further includes a charge storage electrode 24 that is disposed at a distance from the first electrode 21 and is positioned to face the photoelectric conversion layer 23 via the insulating layer 82. Each imaging element-B includes a photoelectric conversion unit formed by stacking a first electrode 121, the photoelectric conversion layer 23, and the second electrode 22, and the photoelectric conversion unit further includes a charge storage electrode 124 that is disposed at a distance from the first electrode 121 and is positioned to face the photoelectric conversion layer 23 via the insulating layer 82. Each imaging element-C includes a photoelectric conversion unit formed by stacking a first electrode 221, the photoelectric conversion layer 23, and the second electrode 22, and the photoelectric conversion unit further includes a charge storage electrode 224 that is disposed at a distance from the first electrode 221 and is positioned to face the photoelectric conversion layer 23 via the insulating layer 82.

Further, a charge transfer control electrode 27 is disposed between an imaging element-A and an imaging element-A. Likewise, a charge transfer control electrode 27 is provided between an imaging element-B and an imaging element-B, and a charge transfer control electrode 27 is provided between an imaging element-C and an imaging element-B. Further, a charge transfer control electrode 227 is also provided between an imaging element-C and an imaging element-C. As the charge transfer control electrodes 22 and 227 are provided, it is possible to reduce or prevent, without fail, transfer of electric charges between imaging elements-A sandwiching a charge transfer control electrode 27, transfer of electric charges between imaging elements-B sandwiching a charge transfer control electrode 27, transfer of electric charges between an imaging element-A and an imaging element-B sandwiching a charge transfer control electrode 27, transfer of electric charges between an imaging element-B and an imaging element-C sandwiching a charge transfer control electrode 27, transfer of electric charges between imaging elements-C sandwiching a charge transfer control electrode 227, and the like. Note that, where the potential to be applied to a charge transfer control electrode 27 or 227 is represented by $V_{17}$, it is only required to satisfy $V_{12}>V_{17}$. $V_{12}$ will be described later.

Further, the photoelectric conversion layer forming the imaging elements-A, the photoelectric conversion layer forming the imaging elements-B, and the photoelectric conversion layer forming the imaging elements-C are formed with the common photoelectric conversion layer 23, and the second electrode forming the imaging elements-A, the second electrode forming the imaging elements-B, and the second electrode forming the imaging elements-C are formed with the common second electrode 22.

A potential (specifically, a positive potential) with a sign that is the opposite of the sign of signal charges is constantly applied to the first electrode 221 forming the imaging elements-C during an operation of the imaging device, and, further, a potential (specifically, a negative potential) with the same sign as signal charges is constantly applied to the charge storage electrodes 224 forming the imaging elements-C during an operation of the imaging device. Specifically, where the potential to be applied to the first electrode 221 is represented by $V_{221}$, the value of $V_{221}$ is only required to be always higher than $V_{21}$, for example. Where the potential to be applied to the charge storage electrodes 224 is represented by $V_{224}$, the value of $V_{224}$ is only required to be always lower than $V_{22}$, for example. Note that operations of the imaging elements-A and the imaging elements-B can be similar to the operations of the imaging elements-A and the imaging elements-B described in Example 1. Further, the configurations and the structures of the imaging elements-A and the imaging elements-B can be similar to the configurations and the structures of the imaging elements-A and the imaging elements-B described in Example 1, and the configuration and the structure of the imaging elements-C can be substantially similar to the configuration and the structure of the imaging elements-A or the imaging elements-B described in Example 1. Therefore, detailed explanation thereof is not made herein.

Figure 10:
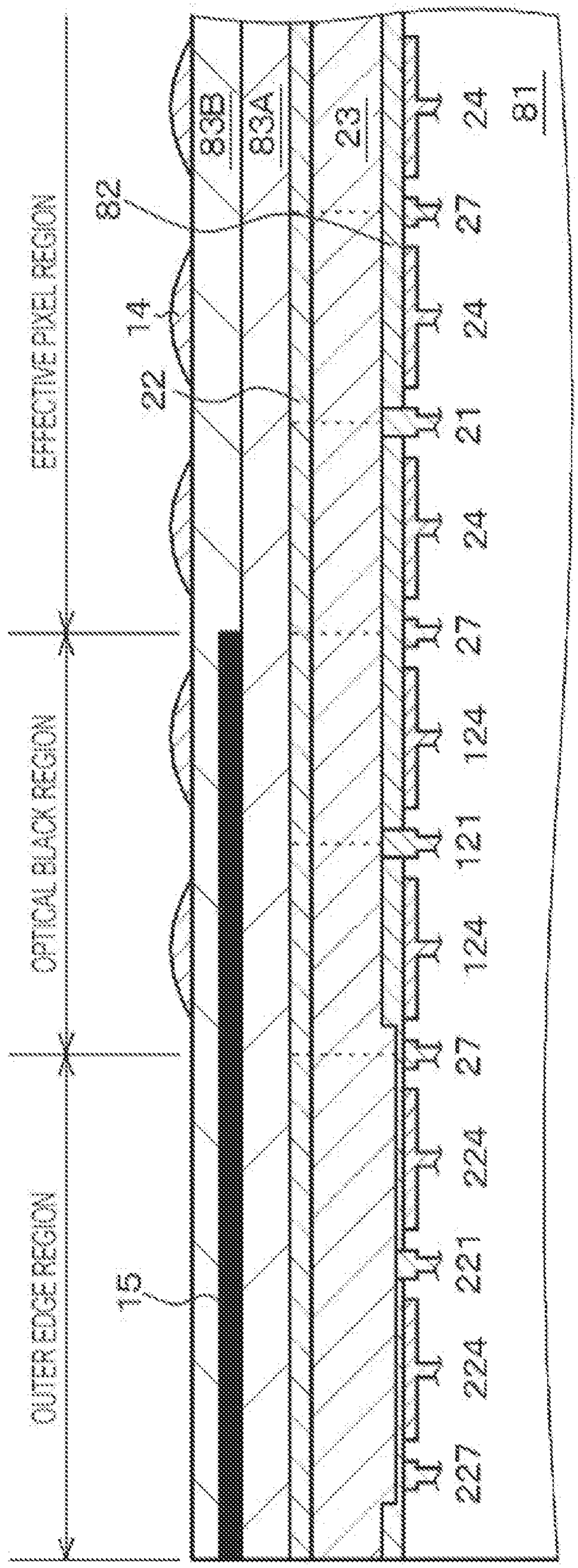
FIG. 10 is a schematic partial cross-sectional view of a modification of the imaging device of Example 7.

As shown in a schematic partial cross-sectional view in FIG. 10, in a modification of the imaging device of Example 7, the thickness of the insulating layer 82 forming the imaging elements-C can be smaller than the thickness of the insulating layer 82 forming the imaging elements-A and the imaging elements-B. In this manner, the electric field to be generated in the imaging elements-C can differ from the electric field to be generated in the imaging elements-A and the imaging elements-B.

Further, the distance between the imaging element-B and the imaging element-C is appropriately selected, so that electric charge transfer can be optimized. Specifically, the distance between the imaging element-B and the imaging element-C is only required to be longer than the distance between the imaging element-A and the imaging element-B, for example. Alternatively, the size of the imaging elements-B may differ from the size of the imaging elements-C.

In the imaging device of Example 7, the imaging elements-C are provided in the outer edge region surrounding the optical black region, and these imaging elements-C are always in an operating state during an operation of the imaging device. Accordingly, electric charges generated at the edge of the photoelectric conversion layer move to the imaging elements-C but do not enter the imaging elements-B. Thus, any problem that hinders the functions of the optical black region does not occur.

In the description below, the imaging elements-A, the imaging elements-B, and the imaging elements-C (imaging elements) that constitute the imaging device or the like of the present disclosure will be comprehensively explained in detail. Note that the imaging elements-A, the imaging elements-B, and the imaging elements-C may be collectively referred to simply as "imaging elements" in some cases.

An imaging device or the like of the present disclosure may further include a semiconductor substrate, and a photoelectric conversion unit may be disposed above the semiconductor substrate. Note that a first electrode, a charge storage electrode, and a second electrode are connected to a drive circuit.

Further, in an imaging device or the like of the present disclosure including the various modes and configurations described above, the first electrode may extend in an opening formed in an insulating layer, and be connected to the photoelectric conversion layer. Alternatively, the photoelectric conversion layer may extend in an opening formed in the insulating layer and be connected to the first electrode.

In this case, the edge portion of the top surface of the first electrode may be covered with the insulating layer, the first electrode may be exposed through the bottom surface of the opening, and, where the surface of the insulating layer in contact with the top surface of the first electrode is a first surface, and the surface of the insulating layer in contact with the portion of the photoelectric conversion layer facing the charge storage electrode is a second surface, a side surface of the opening may be a slope spreading from the first surface toward the second surface, and further, the side surface of the opening having the slope spreading from the first surface toward the second surface may be located on the charge storage electrode side. Note that this includes an embodiment in which another layer is formed between the photoelectric conversion layer and the first electrode (for example, an embodiment in which a material layer suitable for charge accumulation is formed between the photoelectric conversion layer and the first electrode).

Further, in an imaging device or the like of the present disclosure including the various preferred modes and configurations described above, a control unit that is disposed in the semiconductor substrate, and includes a drive circuit may be further provided, the first electrode and the charge storage electrode may be connected to the drive circuit, in a charge accumulation period, the drive circuit may apply a potential $V_{11}$ to the first electrode, and a potential $V_{12}$ to the charge storage electrode, to accumulate electric charges in the photoelectric conversion layer, and, in a charge transfer period, the drive circuit may apply a potential $V_{21}$ to the first electrode, and a potential $V_{22}$ to the charge storage electrode, to read the electric charges accumulated in the photoelectric conversion layer into the control unit via the first electrode. However, in a case where the potential of the first electrode is higher than the potential of the second electrode, $V_{12} \geq V_{11}$, and $V_{22} < V_{21}$, and, in a case where the potential of the first electrode is lower than the potential of the second electrode, $V_{12} \leq V_{11}$, and $V_{22} > V_{21}$.

Moreover, an imaging device or the like of the present disclosure including the various preferred modes and configurations described above may further include a transfer control electrode (a charge transfer electrode) that is provided between the first electrode and the charge storage electrode, is disposed at a distance from the first electrode and the charge storage electrode, and is positioned to face the photoelectric conversion layer via the insulating layer. An imaging device or the like of the present disclosure of such a mode is also referred to as an "imaging device or the like of the present disclosure including a transfer control electrode", for convenience.

Further, in an imaging device or the like of the present disclosure including a transfer control electrode, a control unit that is disposed in the semiconductor substrate and includes a drive circuit may be further provided, the first electrode, the charge storage electrode, and the transfer control electrode may be connected to the drive circuit, in a charge accumulation period, the drive circuit may apply a potential $V_{11}$ to the first electrode, a potential $V_{12}$ to the charge storage electrode, and a potential $V_{13}$ to the transfer control electrode, to accumulate electric charges in the photoelectric conversion layer, and, in a charge transfer period, the drive circuit may apply a potential $V_{21}$ to the first electrode, a potential $V_{22}$ to the charge storage electrode, and a potential $V_{23}$ to the transfer control electrode, to read the electric charges accumulated in the photoelectric conversion layer into the control unit via the first electrode. However, in a case where the potential of the first electrode is higher than the potential of the second electrode, $V_{12} > V_{13}$, and $V_{22} \leq V_{23} \leq V_{21}$, and, in a case where the potential of the first electrode is lower than the potential of the second electrode, $V_{12} < V_{13}$, and $V_{22} \geq V_{23} \geq V_{21}$.

Moreover, an imaging device or the like of the present disclosure including the various preferred modes and configurations described above may further include a charge emission electrode that is connected to the photoelectric conversion layer, and is disposed at a distance from the first electrode and the charge storage electrode. An imaging device or the like of the present disclosure of such a mode is also referred to as an "imaging device or the like of the present disclosure including a charge emission electrode", for convenience. Further, in an imaging device or the like of the present disclosure including a charge emission electrode, the charge emission electrode may be positioned to surround the first electrode and the charge storage electrode (in other words, like a frame). The charge emission electrode may be shared (made common) by a plurality of imaging elements. Further, in this case, the photoelectric conversion layer may extend in a second opening formed in the insulating layer, and be connected to the charge emission electrode, the edge portion of the top surface of the charge emission electrode may be covered with the insulating layer, the charge emission electrode may be exposed through the bottom surface of the second opening, and a side surface of the second opening may be a slope spreading from a third surface toward a second surface, the third surface being the surface of the insulating layer in contact with the top surface of the charge emission electrode, the second surface being the surface of the insulating layer in contact with the portion of the photoelectric conversion layer facing the charge storage electrode.

Furthermore, in an imaging device or the like of the present disclosure including a charge emission electrode, a control unit that is disposed in the semiconductor substrate and includes a drive circuit may be further provided, the first electrode, the charge storage electrode, and the charge emission electrode may be connected to the drive circuit, in a charge accumulation period, the drive circuit may apply a potential $V_{11}$ to the first electrode, a potential $V_{12}$ to the charge storage electrode, and a potential $V_{14}$ to the charge emission electrode, to accumulate electric charges in the photoelectric conversion layer, and, in a charge transfer period, the drive circuit may apply a potential $V_{21}$ to the first electrode, a potential $V_{22}$ to the charge storage electrode, and a potential $V_{24}$ to the charge emission electrode, to read the electric charges accumulated in the photoelectric conversion layer into the control unit via the first electrode. However, in a case where the potential of the first electrode is higher than the potential of the second electrode, $$V_{14}>V_{11}, \text{ and } V_{24}<V_{21}, \text{ and,}$$

in a case where the potential of the first electrode is lower than the potential of the second electrode, $$V_{14}<V_{11}, \text{ and } V_{24}>V_{21}.$$

Further, in the various preferred modes and configurations described above in an imaging device or the like of the present disclosure, the charge storage electrode may be formed with a plurality of charge storage electrode segments. An imaging device or the like of the present disclosure of such a mode is also referred to as an "imaging device or the like of the present disclosure including a plurality of charge storage electrode segments", for convenience. The number of charge storage electrode segments is only required to be two or larger. Further, in an imaging device or the like including a plurality of charge storage electrode segments of the present disclosure, in a case where a different potential is applied to each charge storage electrode segment in the plurality (N) of charge storage electrode segments, in a case where the potential of the first electrode is higher than the potential of the second electrode, the potential to be applied to the charge storage electrode segment (the first photoelectric conversion unit segment) located closest to the first electrode may be higher than the potential to be applied to the charge storage electrode segment (the Nth photoelectric conversion unit segment) located farthest from the first electrode during a charge transfer period, and, in a case where the potential of the first electrode is lower than the potential of the second electrode, the potential to be applied to the charge storage electrode segment (the first photoelectric conversion unit segment) located closest to the first electrode may be lower than the potential to be applied to the charge storage electrode segment (the Nth photoelectric conversion unit segment) located farthest from the first electrode during a charge transfer period.

In an imaging device or the like of the present disclosure including the various preferred modes and configurations described above, at least a floating diffusion layer and an amplification transistor that constitute the control unit may be disposed in the semiconductor substrate, and the first electrode may be connected to the floating diffusion layer and the gate portion of the amplification transistor. Furthermore, in this case, a reset transistor and a selection transistor that constitute the control unit may be further disposed in the semiconductor substrate, the floating diffusion layer may be connected to one source/drain region of the reset transistor, and one source/drain region of the amplification transistor may be connected to one source/drain region of the selection transistor, and the other source/drain region of the selection transistor may be connected to a signal line.

Further, in an imaging device or the like of the present disclosure including the various preferred modes and configurations described above, the size of the charge storage electrode may be larger than that of the first electrode. Where the area of the charge storage electrode is represented by $S_1'$, and the area of the first electrode is represented by $S_1$, it is preferable, but is not necessary, to satisfy $$4 \leq S_1'/S_1.$$

Alternatively, modifications of an imaging device or the like of the present disclosure including the various preferred modes described above may include imaging elements of first through sixth configurations described below. Specifically, in imaging elements of the first through sixth configurations in imaging devices or the like of the present disclosure including the various preferred modes described above, the photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments in imaging elements of the first through third configurations, the charge storage electrode is formed with N charge storage electrode segments that are disposed at a distance from one another in imaging elements of the fourth and fifth configurations, the nth (n=1, 2, 3, . . . , N) photoelectric conversion unit segment includes the nth charge storage electrode segment, the nth insulating layer segment, and the nth photoelectric conversion layer segment, and a photoelectric conversion unit segment having a greater value as n is located farther away from the first electrode.

Further, in an imaging element of the first configuration, the thicknesses of the insulating layer segments gradually vary from the first photoelectric conversion unit segment to the Nth photoelectric conversion unit segment. Meanwhile, in an imaging element of the second configuration, the thicknesses of the photoelectric conversion layer segments gradually vary from the first photoelectric conversion unit segment to the Nth photoelectric conversion unit segment. Note that, in the photoelectric conversion layer segments, the thickness of a portion of the photoelectric conversion layer may be varied, and the thickness of another portion of the photoelectric conversion layer may be made constant, so that the thicknesses of the photoelectric conversion layer segments vary. The thickness of a portion of the photoelectric conversion layer may be varied, and the thickness of another portion of the photoelectric conversion layer may be varied, so that the thicknesses of the photoelectric conversion layer segments vary. Further, in an imaging element of the third configuration, the material forming the insulating layer segment differs between adjacent photoelectric conversion unit segments. Further, in an imaging element of the fourth configuration, the material forming the charge storage electrode segment differs between adjacent photoelectric conversion unit segments. Further, in an imaging element of the fifth configuration, the areas of the charge storage electrode segments become gradually smaller from the first photoelectric conversion unit segment to the Nth photoelectric conversion unit segment. The areas may become smaller continuously or in a stepwise manner.

Alternatively, in an imaging element of the sixth configuration in an imaging device or the like of the present disclosure including the various preferred modes described above, the cross-sectional area of the stacked portion of the charge storage electrode, the insulating layer, and the photoelectric conversion layer taken along a Y-Z virtual plane varies depending on the distance from the first electrode, where the stacking direction of the charge storage electrode, the insulating layer, and the photoelectric conversion layer is the Z direction, and the direction away from the first electrode is the X direction. The change in the cross-sectional area may be continuous or stepwise.

In the imaging elements of the first and second configurations, the N photoelectric conversion layer segments are continuously arranged, the N insulating layer segments are also continuously arranged, and the N charge storage electrode segments are also continuously arranged. In the imaging elements of the third through fifth configurations, the N photoelectric conversion layer segments are continuously arranged. Further, in the imaging elements of the fourth and fifth configurations, the N insulating layer segments are continuously arranged. In the imaging element of the third configuration, on the other hand, the N insulating layer segments are provided for the respective photoelectric conversion unit segments in one-to-one correspondence. Further, in the imaging elements of the fourth and fifth configurations, and in the imaging element of the third configuration in some cases, N charge storage electrode segments are provided for the respective photoelectric conversion unit segments in one-to-one correspondence. Further, in the imaging elements of the first through sixth configurations, the same potential is applied to all of the charge storage electrode segments. Alternatively, in the imaging elements of the fourth and fifth configurations, and in the imaging element of the third configuration in some cases, a different potential may be applied to each of the N charge storage electrode segments.

In imaging devices or the like of the present disclosure formed with imaging elements of the first through sixth configurations, the thickness of each insulating layer segment is specified, the thickness of each photoelectric conversion layer segment is specified, the materials forming the insulating layer segments vary, the materials forming the charge storage electrode segments vary, the area of each charge storage electrode segment is specified, or the cross-sectional area of each stacked portion is specified. Accordingly, a kind of charge transfer gradient is formed, and thus, the electric charges generated through photoelectric conversion can be more easily and reliably transferred to the first electrode. As a result, generation of a residual image and generation of a transfer residue are then prevented.

In the imaging elements of the first through fifth configurations, a photoelectric conversion unit segment having a greater value as n is located farther away from the first electrode, and whether or not a photoelectric conversion unit segment is located far from the first electrode is determined on the basis of the X direction. Further, in the imaging element of the sixth configuration, the direction away from the first electrode is the X direction. However, the "X direction" is defined as follows. Specifically, a pixel region in which a plurality of imaging elements or stacked imaging elements is arranged is formed with a plurality of pixels arranged regularly in a two-dimensional array, or in the X direction and the Y direction. In a case where the planar shape of each pixel is a rectangular shape, the direction in which the side closest to the first electrode extends is set as the Y direction, and a direction orthogonal to the Y direction is set as the X direction. Alternatively, in a case where the planar shape of each pixel is a desired shape, a general direction including the line segment or the curved line closest to the first electrode is set as the Y direction, and a direction orthogonal to the Y direction is set as the X direction.

In the description below, imaging elements of the first through sixth configurations in cases where the potential of the first electrode is higher than the potential of the second electrode are described.

In an imaging element of the first configuration, the thicknesses of the insulating layer segments gradually vary from the first photoelectric conversion unit segment to the Nth photoelectric conversion unit segment. However, the thicknesses of the insulating layer segments preferably become gradually greater, and a kind of charge transfer gradient is formed by this variation. Further, when $|V_{12}| \geq |V_{11}|$ in a charge accumulation period, the nth photoelectric conversion unit segment can store more electric charges than the (n+1)th photoelectric conversion unit segment, and a strong electric field is applied so that electric charges can be reliably prevented from flowing from the first photoelectric conversion unit segment toward the first electrode. Furthermore, when $|V_{22}| < |V_{21}|$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging element of the second configuration, the thicknesses of the photoelectric conversion layer segments gradually vary from the first photoelectric conversion unit segment to the Nth photoelectric conversion unit segment. However, the thicknesses of the photoelectric conversion layer segments preferably become gradually greater, and a kind of charge transfer gradient is formed by this variation. Further, when $V_{12} \geq V_{11}$ in a charge accumulation period, a stronger electric field is applied to the nth photoelectric conversion unit segment than to the (n+1)th photoelectric conversion unit segment, so that electric charges can be reliably prevented from flowing from the first photoelectric conversion unit segment toward the first electrode. Furthermore, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging element of the third configuration, the material forming the insulating layer segment differ between adjacent photoelectric conversion unit segments, and because of this, a kind of charge transfer gradient is formed. However, the values of the relative dielectric constants of the materials forming the insulating layer segments preferably become gradually smaller from the first photoelectric conversion unit segment to the Nth photoelectric conversion unit segment. As such a configuration is adopted, when $V_{12} \geq V_{11}$ in a charge accumulation period, the nth photoelectric conversion unit segment can then store more electric charges than the (n+1)th photoelectric conversion unit segment. Furthermore, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging element of the fourth configuration, the material forming the charge storage electrode segment differ between adjacent photoelectric conversion unit segments, and because of this, a kind of charge transfer gradient is formed. However, the values of the work functions of the materials forming the insulating layer segments preferably become gradually greater from the first photoelectric conversion unit segment to the Nth photoelectric conversion unit segment. As such a configuration is adopted, it then becomes possible to form a potential gradient that is advantageous for signal charge transfer, regardless of whether the voltage is positive or negative.

In an imaging element of the fifth configuration, the areas of the charge storage electrode segments become gradually smaller from the first photoelectric conversion unit segment to the Nth photoelectric conversion unit segment, and because of this, a kind of charge transfer gradient is formed. Accordingly, when $V_{12} \geq V_{11}$ in a charge accumulation period, the nth photoelectric conversion unit segment can store more electric charges than the (n+1)th photoelectric conversion unit segment. Furthermore, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging element of the sixth configuration, the cross-sectional area of the stacked portion varies depending on the distance from the first electrode, and because of this, a kind of charge transfer gradient is formed. Specifically, in a configuration in which the thicknesses of cross-sections of the stacked portion are made uniform while the width of a cross-section of the stacked portion is smaller at a position farther away from the first electrode, when $V_{12} \geq V_{11}$ in a charge accumulation period, a region closer to the first electrode can accumulate more electric charges than a region farther away from the first electrode, as in the above described imaging element of the fifth configuration. Accordingly, when $V_{22} < V_{21}$ in a charge transfer period, it is possible to reliably secure the flow of electric charges from a region closer to the first electrode toward the first electrode, and the flow of electric charges from a farther region toward a closer region. On the other hand, in a configuration in which the widths of cross-sections of the stacked portion are made uniform while the thicknesses of cross-sections of the stacked portion, or specifically, the thicknesses of the insulating layer segments, are gradually increased, when $V_{12} \geq V_{11}$ in a charge accumulation period, a region closer to the first electrode can accumulate more electric charges than a region farther away from the first electrode, and a stronger electric field is applied to the closer region. Thus, it is possible to reliably prevent the flow of electric charges from the region closer to the first electrode toward the first electrode, as in the above described imaging element of the first configuration. When $V_{22} < V_{21}$ in a charge transfer period, it then becomes possible to reliably secure the flow of electric charges from a region closer to the first electrode toward the first electrode, and the flow of electric charges from a farther region toward a closer region. Further, in a configuration in which the thicknesses of the photoelectric conversion layer segments are gradually increased, when $V_{12} \geq V_{11}$ in a charge accumulation period, a stronger electric field is applied to a region closer to the first electrode than to a region farther away from the first electrode, and it is possible to reliably prevent the flow of electric charges from the region closer to the first electrode toward the first electrode, as in the above described imaging element of the second configuration. When $V_{22} < V_{21}$ in a charge transfer period, it then becomes possible to reliably secure the flow of electric charges from a region closer to the first electrode toward the first electrode, and the flow of electric charges from a farther region toward a closer region.

A modification of an imaging device according to the first or second embodiment of the present disclosure may be an imaging device that includes a plurality of imaging elements of any of the first through sixth configurations, an imaging element block is formed with a plurality of imaging elements, and a first electrode is shared by the plurality of imaging elements constituting the imaging element block. An imaging device having such a configuration is referred to as an "imaging device of the first configuration", for convenience. Alternatively, a modification of an imaging device according to the first or second embodiment of the present disclosure may be an imaging device that includes a plurality of imaging elements of any of the first through sixth configurations, or a plurality of stacked imaging elements including at least one imaging element of any of the first through sixth configurations, an imaging element block is formed with a plurality of imaging elements or stacked imaging elements, and a first electrode is shared by the plurality of imaging elements or stacked imaging elements constituting the imaging element block. An imaging device having such a configuration is referred to as an "imaging device of the second configuration", for convenience. Further, in a case where a first electrode is shared by the plurality of imaging elements constituting an imaging element block as above, the configuration and the structure in the pixel region in which a plurality of imaging elements is arranged can be simplified and miniaturized.

In imaging devices of the first and second configurations, one floating diffusion layer is provided for a plurality of imaging elements (or one imaging element block). Here, the plurality of imaging elements provided for one floating diffusion layer may be formed with a plurality of imaging elements of the first type, or may be formed with at least one imaging element of the first type and one or more imaging elements of the second type. The timing of a charge transfer period is then appropriately controlled, so that the plurality of imaging elements can share the one floating diffusion layer. The plurality of imaging elements is operated in conjunction with one another, and is connected as an imaging element block to the drive circuit. In other words, a plurality of imaging elements constituting an imaging element block is connected to one drive circuit. However, charge storage electrode control is performed for each imaging element. Further, a plurality of imaging elements can share one contact hole portion. As for the layout relationship between the first electrode being shared by a plurality of imaging elements and the charge storage electrodes of the respective imaging elements, the first electrode may be disposed adjacent to the charge storage electrodes of the respective imaging elements in some cases. Alternatively, the first electrode is disposed adjacent to the charge storage electrode of one imaging element of the plurality of imaging elements, and is not adjacent to the charge storage electrodes of the plurality of remaining imaging elements. In such a case, electric charges are transferred from the plurality of remaining imaging elements to the first electrode via the one imaging element of the plurality of imaging elements. To ensure electric charge transfer from each imaging element to the first electrode, the distance (called the "distance A", for convenience) between a charge storage electrode of an imaging element and a charge storage electrode of another imaging element is preferably longer than the distance (called the "distance B", for convenience) between the first electrode and the charge storage electrode in the imaging element adjacent to the first electrode. Further, the value of the distance A is preferably greater for an imaging element located farther away from the first electrode.

Two or more types of the imaging elements of the first through sixth configurations described above may be combined as desired.

Furthermore, in an imaging device or the like of the present disclosure including the various preferred modes and configurations described above, light may enter from the second electrode side, and a light blocking film may be formed on a light incident side closer to the second electrode. Alternatively, light may enter from the second electrode side, while light does not enter the first electrode (or the first electrode and the transfer control electrode in some cases). Further, in this case, a light blocking film may be formed on a light incident side closer to the second electrode and above the first electrode (or the first electrode and the transfer control electrode in some cases). Alternatively, an on-chip microlens may be provided above the charge storage electrode and the second electrode, and light that enters the on-chip microlens may be gathered to the charge storage electrode. Here, the light blocking film may be disposed above the surface of the second electrode on the light incident side, or may be disposed on the surface of the second electrode on the light incident side. In some cases, the light blocking film may be formed in the second electrode. Examples of the material that forms the light blocking film include chromium (Cr), copper (Cu), aluminum (Al), tungsten (W), and resin (polyimide resin, for example) that does not transmit light. The light blocking layer formed in the optical black region may have the configuration and structure similar to those of the light blocking film.

Further, in imaging devices of the first and second configurations, one on-chip microlens may be disposed above one imaging device or the like of the present disclosure. Alternatively, an imaging element block may be formed with two imaging devices or the like of the present disclosure, and one on-chip microlens may be disposed above the imaging element block.

Specific examples of imaging devices or the like of the present disclosure include: an imaging element (referred to as a "blue-light imaging element of the first type", for convenience) that includes a photoelectric conversion layer or a photoelectric conversion unit (referred to as a "blue-light photoelectric conversion layer of the first type" or a "blue-light photoelectric conversion unit of the first type", for convenience) that absorbs blue light (light of 425 nm to 495 nm), and has sensitivity to blue light; an imaging element (referred to as a "green-light imaging element of the first type", for convenience) that includes a photoelectric conversion layer or a photoelectric conversion unit (referred to as a "green-light photoelectric conversion layer of the first type" or a "green-light photoelectric conversion unit of the first type", for convenience) that absorbs green light (light of 495 nm to 570 nm), and has sensitivity to green light; and an imaging element (referred to as a "red-light imaging element of the first type", for convenience) that includes a photoelectric conversion layer or a photoelectric conversion unit (referred to as a "red-light photoelectric conversion layer of the first type" or a "red-light photoelectric conversion unit of the first type", for convenience) that absorbs red light (light of 620 nm to 750 nm), and has sensitivity to red light. Further, of conventional imaging elements not including any charge storage electrode, an imaging element having sensitivity to blue light is referred to as a "blue-light imaging element of the second type", for convenience, an imaging element having sensitivity to green light is referred to as a "green-light imaging element of the second type", for convenience, an imaging element having sensitivity to red light is referred to as a "red-light imaging element of the second type", for convenience, a photoelectric conversion layer or a photoelectric conversion unit forming a blue-light imaging element of the second type is referred to as a "blue-light photoelectric conversion layer of the second type" or a "blue-light photoelectric conversion unit of the second type", for convenience, a photoelectric conversion layer or a photoelectric conversion unit forming a green-light imaging element of the second type is referred to as a "green-light photoelectric conversion layer of the second type" of a "green-light photoelectric conversion unit of the second type", for convenience, and a photoelectric conversion layer or a photoelectric conversion unit forming a red-light imaging element of the second type is referred to as a "red-light photoelectric conversion layer of the second type" or a "red-light photoelectric conversion unit of the second type", for convenience.

A stacked imaging element according to the present disclosure includes at least one imaging element (a photoelectric conversion element) according to the present disclosure, and specifically has

[A] a configuration and a structure in which a blue-light photoelectric conversion unit of the first type, a green-light photoelectric conversion unit of the first type, and a red-light photoelectric conversion unit of the first type are stacked in a vertical direction, and the respective control units of a blue-light imaging element of the first type, a green-light imaging element of the first type, and a red-light imaging element of the first type are disposed in a semiconductor substrate;

[B] a configuration and a structure in which a blue-light photoelectric conversion unit of the first type and a green-light photoelectric conversion unit of the first type are stacked in a vertical direction, a red-light photoelectric conversion unit of the second type is disposed below these two photoelectric conversion units of the first type, and the respective control units of a blue-light imaging element of the first type, a green-light imaging element of the first type, and a red-light imaging element of the second type are disposed in a semiconductor substrate;

[C] a configuration and a structure in which a blue-light photoelectric conversion unit of the second type and a red-light photoelectric conversion unit of the second type are disposed below a green-light photoelectric conversion unit of the first type, and the respective control units of a green-light imaging element of the first type, a blue-light imaging element of the second type, and a red-light imaging element of the second type are disposed in a semiconductor substrate; or

[D] a configuration and a structure in which a green-light photoelectric conversion unit of the second type and a red-light photoelectric conversion unit of the second type are disposed below a blue-light photoelectric conversion unit of the first type, and the respective control units of a blue-light imaging element of the first type, a green-light imaging element of the second type, and a red-light imaging element of the second type are disposed in a semiconductor substrate, for example. The arrangement sequence of the photoelectric conversion units of these imaging elements in a vertical direction is preferably as follows: a blue-light photoelectric conversion unit, a green-light photoelectric conversion unit, and a red-light photoelectric conversion unit from the light incident direction, or a green-light photoelectric conversion unit, a blue-light photoelectric conversion unit, and a red-light photoelectric conversion unit from the light incident direction. This is because light of a shorter wavelength is more efficiently absorbed on the incident surface side. Since red has the longest wavelength among the three colors, it is preferable to dispose a red-light photoelectric conversion unit in the lowermost layer when viewed from the light incidence face. A stack structure formed with these imaging elements forms one pixel. Further, a near-infrared light photoelectric conversion unit (or an infrared-light photoelectric conversion unit) of the first type may be included. Here, the photoelectric conversion layer of the infrared-light photoelectric conversion unit of the first type includes an organic material, for example, and is preferably disposed in the lowermost layer of a stack structure of imaging elements of the first type, and above imaging elements of the second type. Alternatively, a near-infrared light photoelectric conversion unit (or an infrared-light photoelectric conversion unit) of the second type may be disposed below a photoelectric conversion unit of the first type.

In an imaging element of the first type, the first electrode is formed on an interlayer insulating layer provided on the semiconductor substrate, for example. An imaging element formed on the semiconductor substrate may be of a back-illuminated type or of a front-illuminated type.

In a case where a photoelectric conversion layer includes an organic material, the photoelectric conversion layer may have one of the following four modes:

(1) formed with a p-type organic semiconductor, (2) formed with an n-type organic semiconductor, (3) formed with a stack structure of a p-type organic semiconductor layer and an n-type organic semiconductor layer, formed with a stack structure of a p-type organic semiconductor layer, a mixed layer (a bulk heterostructure) of a p-type organic semiconductor and an n-type organic semiconductor, and an n-type organic semiconductor layer, formed with a stack structure of a p-type organic semiconductor layer, and a mixed layer (a bulk heterostructure) of a p-type organic semiconductor and an n-type organic semiconductor, or formed with a stack structure of an n-type organic semiconductor layer, and a mixed layer (a bulk heterostructure) of a p-type organic semiconductor and an n-type organic semiconductor, and (4) formed with a mixed layer (a bulk heterostructure) of p-type organic semiconductor and n-type organic semiconductor. However, the stacking order may be changed as appropriate in each configuration.

Examples of p-type organic semiconductors include naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothienobenzothiophene derivatives, triallylamine derivatives, carbazole derivatives, perylene derivatives, picene derivatives, chrysene derivatives, fluoranthene derivatives, phthalocyanine derivatives, subphthalocyanine derivatives, subporphyrazine derivatives, metal complexes having a heterocyclic compound as a ligand, polythiophene derivatives, polybenzothiadiazole derivatives, polyfluorene derivatives, and the like. Examples of n-type organic semiconductors include fullerenes, fullerene derivatives (fullerenes (higher-order fullerenes) such as C60, C70, and C74, and endohedral fullerenes, for example) or fullerene derivatives (fullerene fluorides, PCBM fullerene compounds, and fullerene multimers, for example), organic semiconductors with greater (deeper) HOMO and LUMO than p-type organic semiconductors, and transparent inorganic metallic oxides. Specific examples of n-type organic semiconductors include heterocyclic compounds containing nitrogen atom, oxygen atom, and sulfur atom, such as pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, imidazole derivatives, benzoimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, polybenzothiadiazole derivatives, organic molecules containing polyfluorene derivatives or the like as part of the molecular backbone, organometallic complexes, and subphthalocyanine derivatives. Examples of groups contained in fullerene derivatives include: halogen atom; a linear, branched, or cyclic alkyl group or phenyl group; a group containing a linear or fused aromatic compound; a group containing a halide; a partial fluoroalkyl group; a perfluoroalkyl group; a silyl alkyl group; a silyl alkoxy group; an aryl silyl group; an aryl sulfanyl group; an alkyl sulfanyl group; an aryl sulfonyl group; an alkyl sulfonyl group; an aryl sulfide group: an alkyl sulfide group; an amino group; an alkylamino group; an arylamino group; a hydroxy group; an alkoxy group; an acylamino group: an acyloxy group; a carbonyl group; a carboxy group; a carboxoamide group; a carboalkoxy group; an acyl group; a sulfonyl group; a cyano group; a nitro group; a group containing chalcogenide; a phosphine group;

a phosphonate group; and derivatives of these materials. The thickness of a photoelectric conversion layer formed with an organic material (also referred to as an "organic photoelectric conversion layer" in some cases) is not limited to any particular value, but may be $1\times10^{-8}$ m to $5\times10^{-7}$ m, preferably $2.5\times10^{-8}$ m to $3\times10^{-7}$ m, more preferably $2.5\times10^{-8}$ m to $2\times10^{-7}$ m, or even more preferably $1\times10^{-7}$ m to $1.8\times10^{-7}$ m, for example. Note that organic semiconductors are often classified into the p-type and the n-type. The p-type means that holes can be easily transported, and the n-type means that electrons can be easily transported. Unlike an inorganic semiconductor, an organic semiconductor is not interpreted as containing holes or electrons as majority carriers for thermal excitation.

Alternatively, examples of the material forming an organic photoelectric conversion layer that photoelectrically converts green light include rhodamine dyes, merocyanine dyes, quinacridone derivatives, subphthalocyanine dyes (subphthalocyanine derivatives), and the like. Examples of the material forming an organic photoelectric conversion layer that photoelectrically converts blue light include coumaric acid dyes, tris-8-hydroxyquinolyl aluminum (Alq3), merocyanine dyes, and the like. Examples of the material forming an organic photoelectric conversion layer that photoelectrically converts red light include phthalocyanine dyes and a subphthalocyanine pigments (subphthalocyanine derivatives).

Alternatively, examples of an inorganic material forming a photoelectric conversion layer include crystalline silicon, amorphous silicon, microcrystalline silicon, crystalline selenium, amorphous selenium, and compound semiconductors such as CIGS (CuInGaSe), CIS ($CuInSe_2$), $CuInS_2$, $CuAlS_2$, $CuAlSe_2$, $CuGaS_2$, $CuGaSe_2$, $AgAlS_2$, $AgAlSe_2$, $AgInS_2$, and $AgInSe_2$, which are chalcopyrite compounds, GaAs, InP, AlGaAs, InGaP, AlGaInP, and InGaAsP, which are III-V compounds, and further, CdSe, CdS, $In_2Se_3$, $In_2S_3$, $Bi_2Se_3$, $Bi_2S_3$, ZnSe, ZnS, PbSe, and PbS. In addition to that, it is also possible to use quantum dots including these materials for a photoelectric conversion layer.

Alternatively, a photoelectric conversion layer may have a stack structure formed with a lower semiconductor layer and an upper photoelectric conversion layer. As the lower semiconductor layer is provided, recoupling at the time of charge accumulation can be prevented, the efficiency of transfer of the electric charges stored in the photoelectric conversion layer to the first electrode can be increased, and generation of dark current can be reduced. The material forming the upper photoelectric conversion layer is only required to be selected as appropriate from the above various materials that can form a photoelectric conversion layer. On the other hand, the material forming the lower semiconductor layer is preferably a material that has a great bandgap value (a bandgap value of 3.0 eV or greater, for example), and also has a higher mobility than the material forming the photoelectric conversion layer. Specific examples thereof include oxide semiconductor materials such as IGZO; transition metal dichalcogenides; silicon carbide; diamond; graphene; carbon nanotubes; and organic semiconductor materials such as condensed polycyclic hydrocarbon compounds and condensed heterocyclic compounds. Alternatively, in a case where the electric charges to be accumulated are electrons, the material forming the lower semiconductor layer may be a material having a higher ionization potential than the ionization potential of the material forming the photoelectric conversion layer. In a case where the electric charges to be accumulated are holes, the material forming the lower semiconductor layer may be a material having a lower electron affinity than the electron affinity of the material forming the photoelectric conversion layer. Alternatively, the impurity concentration in the material forming the lower semiconductor layer is preferably equal to or lower than $1\times10^{18}$ $cm^{-3}$. The lower semiconductor layer may have a single-layer configuration or a multilayer configuration. Further, the material forming a lower semiconductor layer located above a charge storage electrode may differ from the material forming a lower semiconductor layer located above a first electrode.

A single-panel color imaging device can be formed with an imaging device according to the first or second embodiment of the present disclosure.

An imaging device or the like of the present disclosure including stacked imaging elements differs from an imaging device including Bayer-array imaging elements (in other words, blue, green, and red color separation is not performed with color filter layers). In such an imaging device, imaging elements having sensitivity to light of a plurality of kinds of wavelengths are stacked in the light incident direction in the same pixel, to form one pixel. Thus, sensitivity can be increased, and the pixel density per unit volume can also be increased. Further, an organic material has a high absorption coefficient. Accordingly, the thickness of an organic photoelectric conversion layer can be made smaller than that of a conventional Si-based photoelectric conversion layer. Thus, light leakage from adjacent pixels, and restrictions on light incident angle are reduced. Furthermore, in a conventional Si-based imaging element, false color occurs because an interpolation process is performed among pixels of three colors to create color signals. In an imaging device according to the second embodiment of the present disclosure including stacked imaging elements, on the other hand, generation of false color is reduced. Since an organic photoelectric conversion layer also functions as a color filter layer, color separation is possible without any color filter layer.

Meanwhile, in an imaging device or the like of the present disclosure including imaging elements that are not stacked imaging elements, the use of a color filter layer can alleviate the requirement for the spectral characteristics of blue, green, and red, and achieves a high mass productivity. Examples of the array of imaging elements include not only a Bayer array but also an interlined array, a G-striped RB-checkered array, a G-striped RB-completely-checkered array, a checkered complementary color array, a striped array, an obliquely striped array, a primary color difference array, a field color difference sequence array, a frame color difference sequence array, a MOS-type array, an improved MOS-type array, a frame interleaved array, and a field interleaved array. Here, one pixel (or a subpixel) is formed with one imaging element.

The color filter layer (a wavelength selecting means) may be a filter layer that transmits not only red, green, and blue, but also specific wavelengths of cyan, magenta, yellow, and the like in some cases, for example. The color filter layer is not necessarily formed with an organic material-based color filter layer using an organic compound such as a pigment or a dye, but may be formed with photonic crystal, a wavelength selection element using plasmon (a color filter layer having a conductor grid structure provided with a grid-like hole structure in a conductive thin film; see Japanese Patent Application Laid-Open No. 2008-177191, for example), or a thin film including an inorganic material such as amorphous silicon.

In an imaging device or the like of the present disclosure including the various preferred embodiments and configurations described above, light is received, photoelectric conversion occurs in the photoelectric conversion layer, and carriers are separated into holes and electrons. The electrode from which holes are extracted is then set as the anode, and the electrode from which electrons are extracted is set as the cathode. The first electrode may form the anode while the second electrode forms the cathode in some embodiments and conversely, the first electrode may form the cathode while the second electrode forms the anode in some embodiments.

In a case where a stacked imaging element is formed, the first electrode, the charge storage electrode, the transfer control electrode, the charge emission electrode, and the second electrode may be formed with a transparent conductive material. In some cases, the first electrode, the charge storage electrode, the transfer control electrode, and the charge emission electrode are collectively referred to as the "first electrode and the like". Alternatively, in a case where an imaging device or the like of the present disclosure has a planar arrangement such as a Bayer array, for example, the second electrode may be formed with a transparent conductive material, and the first electrode and the like may be formed with a metallic material. In this case, specifically, the second electrode located on the light incident side may be formed with a transparent conductive material, and the first electrode and the like may be formed with Al—Nd (an alloy of aluminum and neodymium) or ASC (an alloy of aluminum, samarium, and copper), for example. In some cases, an electrode formed with a transparent conductive material is referred to as a "transparent electrode". Here, the bandgap energy of the transparent conductive material is preferably 2.5 eV or higher, or more preferably, 3.1 eV or higher. Examples of the transparent conductive material forming the transparent electrode include conductive metallic oxides. Specifically, these examples include indium oxide, indium-tin oxides (including ITO, indium tin oxide, Sn-doped $In_2O_3$, crystalline ITO, and amorphous ITO), indium-zinc oxides (IZO, indium zinc oxide) in which indium is added as a dopant to zinc oxide, indium gallium oxides (IGO) in which indium is added as a dopant to gallium oxide, indium-gallium-zinc oxides (IGZO, $In—GaZnO_4$) in which indium and gallium are added as a dopant to zinc oxide, indium-tin-zinc oxides (ITZO) in which indium and tin are added as a dopant to zinc oxide, IFO (F-doped $In_2O_3$), tin oxide ($SnO_2$), ATO (Sb-doped $SnO_2$), FTO (F-doped $SnO_2$), zinc oxides (including ZnO doped with other elements), aluminum-zinc oxides (AZO) in which aluminum is added as a dopant to zinc oxide, gallium-zinc oxides (GZO) in which gallium is added as a dopant to zinc oxide, titanium oxide ($TiO_2$), niobium-titanium oxide (TNO) in which niobium is added as a dopant to titanium oxide, antimony oxide, spinel-type oxides, and oxides each having a $YbFe_2O_4$ structure. Alternatively, the transparent electrode may have a base layer including gallium oxide, titanium oxide, niobium oxide, nickel oxide, or the like. The thickness of the transparent electrode may be $2\times10^{-8}$ m to $2\times10^{-7}$ m, or preferably, $3\times10^{-8}$ m to $1\times10^{-7}$ m. In a case where the first electrode is required to be transparent, the charge emission electrode is preferably also formed with a transparent conductive material, from the viewpoint of simplification of the manufacturing process.

Alternatively, in a case where transparency is not required, the conductive material forming the anode having a function as the electrode for extracting holes is preferably a conductive material having a high work function ($\phi$=4.5 eV to 5.5 eV, for example), and specific examples of the conductive material include gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te). On the other hand, the conductive material forming the cathode having a function as the electrode for extracting electrons is preferably a conductive material having a low work function ($\phi$=3.5 eV to 4.5 eV, for example), and specific examples of the conductive material include alkali metals (such as Li, Na, and K, for example) and fluorides or oxides thereof, alkaline-earth metals (such as Mg and Ca, for example) and fluorides or oxides thereof, aluminum (Al), zinc (Zn), tin (Sn), thallium (TI), sodium-potassium alloys, aluminum-lithium alloys, magnesium-silver alloys, and rare earth metals such as indium and ytterbium or alloys thereof. Alternatively, examples of the material forming the anode or the cathode include metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), molybdenum (Mo), alloys containing these metallic elements, conductive particles including these metals, conductive particles containing an alloy of these metals, polysilicon containing impurities, carbon-based materials, oxide semiconductor materials, carbon nanotubes, and conductive materials such as graphene. The cathode may also be formed with a stack structure containing these elements. Further, the material forming the anode or the cathode may be an organic material (conductive polymer) such as poly(3,4-ethylenedioxythiophene)/polystyrene sulfonate (PEDOT/PSS). Alternatively, any of these conductive materials may be mixed with a binder (polymer), to form a paste or ink, and the paste or ink may be then cured to be used as an electrode.

The film formation method for forming the first electrode and the like, and the second electrode (the anode or the cathode) may be a dry method or a wet method. Examples of dry methods include physical vapor deposition methods (PVD methods) and chemical vapor deposition methods (CVD methods). Examples of film formation methods using the principles of PVD methods include a vacuum vapor deposition method using resistance heating or high frequency heating, an EB (electron beam) vapor deposition method, various sputtering methods (a magnetron sputtering method, an RF-DC coupled bias sputtering method, an ECR sputtering method, a facing target sputtering method, and a radio-frequency sputtering method), an ion plating method, a laser ablation method, a molecular beam epitaxy method, and a laser transfer method. Further, examples of CVD methods include a plasma CVD method, a thermal CVD method, a metalorganic (MO) CVD method, and an optical CVD method. Meanwhile, examples of wet methods include an electrolytic plating method, an electroless plating method, a spin coating method, an inkjet method, a spray coating method, a stamp method, a microcontact printing method, a flexographic printing method, an offset printing method, a gravure printing method, a dip method, and the like. Examples of patterning methods include a shadow mask technique, laser transfer, chemical etching such as photolithography, and physical etching using ultraviolet light, laser, and the like. The planarization technique for the first electrode and the like, and the second electrode may be a laser planarization method, a reflow method, a chemical mechanical polishing (CMP) method, or the like.

Examples of materials forming the insulating layer include not only inorganic materials that are typically metallic oxide high-dielectric insulating materials such as: silicon oxide materials; silicon nitride ($SiN_y$); and aluminum oxide ($Al_2O_3$), but also organic insulating materials (organic polymers) that are typically straight-chain hydrocarbons having a functional group capable of binding to a control electrode at one end, such as: polymethyl methacrylate (PMMA); polyvinyl phenol (PVP); polyvinyl alcohol (PVA); polyimide; polycarbonate (PC); polyethylene terephthalate (PET); polystyrene; silanol derivatives (silane coupling agents) such as N-2 (aminoethyl) 3-aminopropyltrimethoxysilane (AEAPTMS), 3-mercaptopropyltrimethoxysilane (MPTMS), and octadecyltrichlorosilane (OTS); novolac-type phenolic resins; fluorocarbon resins; octadecanethiol; and dodecylisocyanate. Combinations of these materials may also be used. Examples of silicon oxide materials include silicon oxide ($SiO_x$), BPSG, PSG, BSG, AsSG, PbSG, silicon oxynitride (SiON), spin-on glass (SOG), and low-dielectric-constant insulating materials (polyarylethers, cycloperfluorocarbon polymers, benzocyclobutene, cyclic fluorine resin, polytetrafluoroethylene, fluorinated aryl ether, fluorinated polyimide, amorphous carbon, and organic SOG, for example). The insulating layer may be formed with a single layer or a plurality of layers (two layers, for example) that are stacked. In the latter case, an insulating/under layer is formed at least on the charge storage electrode and in a region between the charge storage electrode and the first electrode, and a planarization process is performed on the insulating/under layer. In this manner, the insulating/under layer is left in the region between the charge storage electrode and the first electrode, and an insulating/top layer is formed over the remaining insulating/under layer and the charge storage electrode. Thus, the insulating layer can be planarized without fail. Materials forming the various inter-layer insulating layers, upper insulating layers, and insulating material films are only required to be selected from these materials as appropriate.

The configurations and the structures of the floating diffusion layer, the amplification transistor, the reset transistor, and the selection transistor that constitute the control unit may be similar to the configurations and the structures of a conventional floating diffusion layer, a conventional amplification transistor, a conventional reset transistor, and a conventional selection transistor. The drive circuit may also have a known configuration and structure.

The first electrode is connected to the floating diffusion layer and the gate portion of the amplification transistor, but a contact hole portion is only required to be formed to connect the first electrode to the floating diffusion layer and the gate portion of the amplification transistor. Examples of the material forming the contact hole portion include polysilicon doped with impurities, high-melting-point metals such as tungsten, Ti, Pt, Pd, Cu, TiW, TiN, TiNW, $WSi_2$, $MoSi_2$, metal silicides, and stack structures formed with these materials (Ti/TiN/W, for example).

A first carrier blocking layer may be provided between the organic photoelectric conversion layer and the first electrode, or a second carrier blocking layer may be provided between the organic photoelectric conversion layer and the second electrode. Further, a first charge injection layer may be provided between the first carrier blocking layer and the first electrode, or a second charge injection layer may be provided between the second carrier blocking layer and the second electrode. For example, the material forming an electron injection layer may be an alkali metal such as lithium (Li), sodium (Na), or potassium (K), a fluoride or oxide of such an alkali metal, an alkaline-earth metal such as magnesium (Mg) or calcium (Ca), or a fluoride or oxide of such an alkaline-earth metal.

Examples of film formation methods for forming the various organic layers include dry film formation methods and wet film formation methods. Examples of dry film formation methods include resistance heating or radio-frequency heating, a vacuum vapor deposition method using electron beam heating, a flash vapor deposition method, a plasma vapor deposition method, an EB vapor deposition method, various sputtering methods (a bipolar sputtering method, a direct-current sputtering method, a direct-current magnetron sputtering method, a radio-frequency sputtering method, a magnetron sputtering method, an RF-DC coupled bias sputtering method, an ECR sputtering method, a facing target sputtering method, a radio-frequency sputtering method, and an ion beam sputtering method), a direct current (DC) method, an RF method, a multiple cathode method, an activation reaction method, an electric field deposition method, various ion plating methods such as a radio-frequency ion plating method and a reactive ion plating method, a laser ablation method, a molecular beam epitaxy method, a laser transfer method, and a molecular beam epitaxy method (MBE method). Further, examples of CVD methods include a plasma CVD method, a thermal CVD method, a MOCVD method, and an optical CVD method. Meanwhile, specific examples of wet methods include various printing methods such as: a spin coating method; an immersion method; a casting method; a micro-contact printing method; a drop casting method; a screen printing method; an inkjet printing method; an offset printing method; a gravure printing method; and a flexographic printing method, and various coating methods such as: a stamp method; a spray method; an air doctor coating method; a blade coating method; a rod coating method; a knife coating method; a squeeze coating method; a reverse roll coating method; a transfer roll coating method; a gravure coating method; a kiss coating method; a cast coating method; a spray coating method; a slit orifice coating method; and a calendar coating method. In a coating method, non-polar or low-polarity organic solvent such as toluene, chloroform, hexane, or ethanol may be used as the solvent, for example. Examples of patterning methods include a shadow mask technique, laser transfer, chemical etching such as photolithography, and physical etching using ultraviolet light, laser, and the like. The planarization technique for the various organic layers may be a laser planarization method, a reflow method, or the like.

As described above, in imaging elements or an imaging device, on-chip microlenses and light blocking layers may be provided as needed, and a drive circuit and wiring lines for driving the imaging elements are provided. If necessary, a shutter for controlling light entering the imaging elements may be provided, and the imaging device may include an optical cut filter, depending on its purpose.

For example, in a case where an imaging device and a readout integrated circuit (ROIC) are stacked, a drive substrate on which the readout integrated circuit and a connecting portion including copper (Cu) are formed, and an imaging element on which a connecting portion are formed are stacked so that the connecting portions are brought into contact with each other, and the connecting portions are joined to each other. In this manner, the imaging device and the readout integrated circuit can be stacked, and the connecting portions can be joined to each other with solder bumps or the like.

Meanwhile, in a method for driving an imaging device according to the first or second embodiment of the present disclosure can be a method for driving an imaging device by repeating each of the following steps:

in all the imaging elements, the electric charges in the first electrodes are simultaneously released out of the system, while electric charges are accumulated in the photoelectric conversion layers;

after that, in all the imaging elements, the electric charges accumulated in the photoelectric conversion layers are simultaneously transferred to the first electrodes, and, after the transfer is completed, the electric charges transferred to the first electrode are sequentially read out in each of the imaging elements.

In such a method for driving an imaging device, each imaging element has a structure in which light that has entered from the second electrode side does not enter the first electrode, and the electric charges in the first electrodes are released out of the system while electric charges are accumulated in the photoelectric conversion layers in all the imaging elements. Thus, the first electrodes can be reliably reset at the same time in all the imaging elements. After that, the electric charges accumulated in the photoelectric conversion layers are simultaneously transferred to the first electrodes in all the imaging elements, and, after the transfer is completed, the electric charges transferred to the first electrode are sequentially read out in each imaging element. Thus, a so-called global shutter function can be easily achieved.

Example 8

Figure 18:
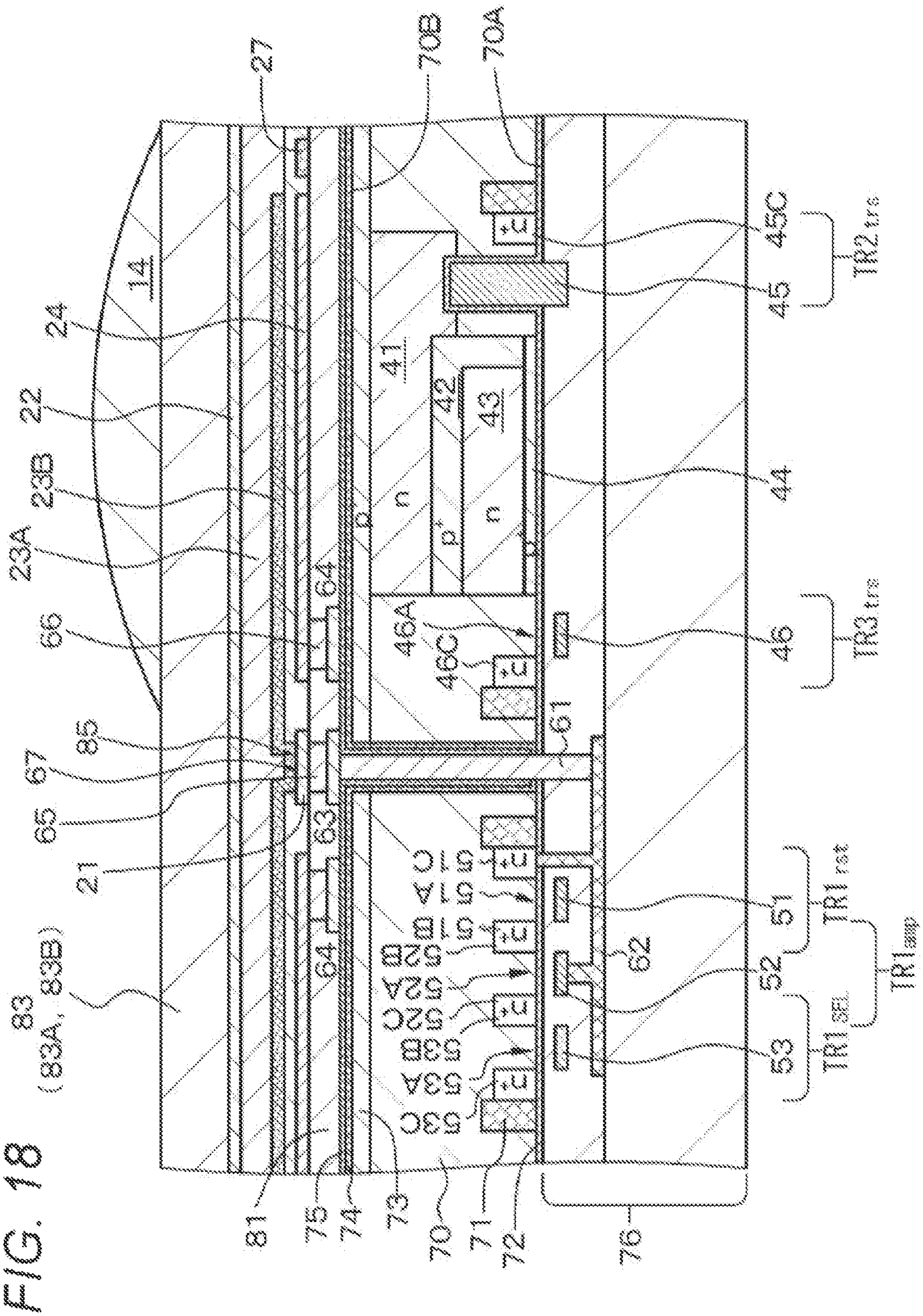
FIG. 18 is a schematic partial cross-sectional view of an imaging element-A included in an imaging device of Example 8.
Figure 19:
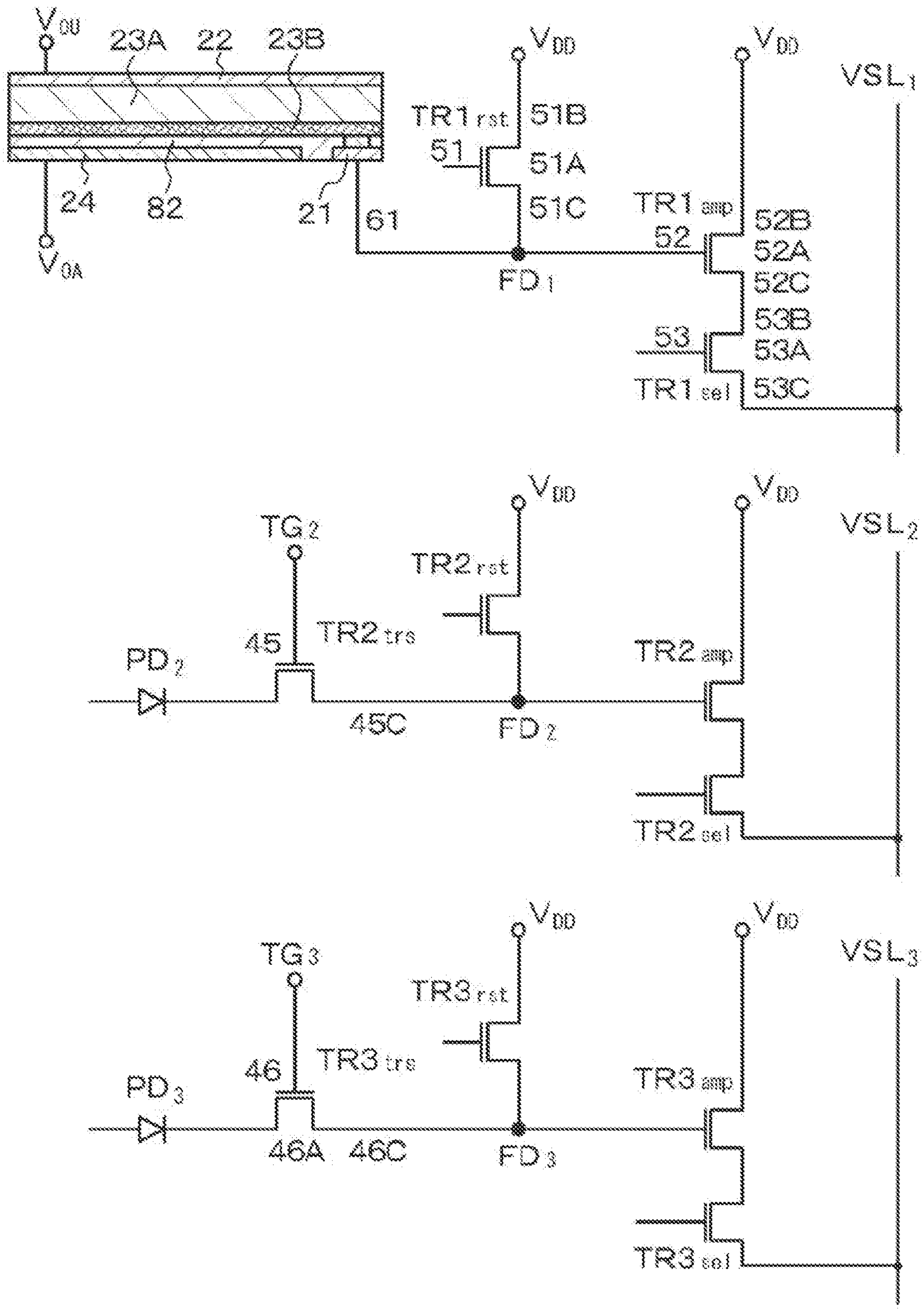
FIG. 19 is an equivalent circuit diagram of an imaging element-A included in the imaging device of Example 8.
Figure 20:
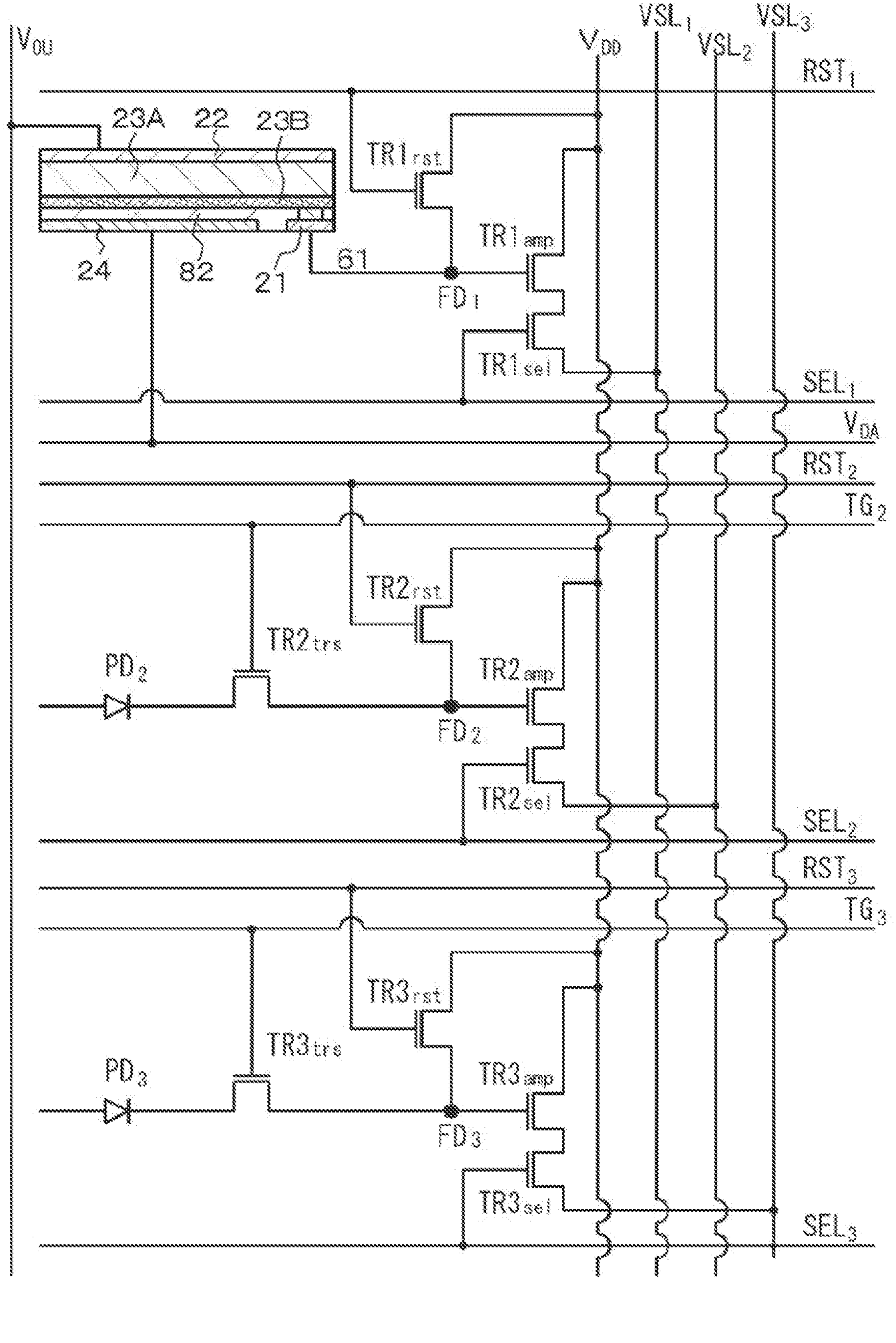
FIG. 20 is an equivalent circuit diagram of an imaging element-A included in the imaging device of Example 8.
Figure 21:
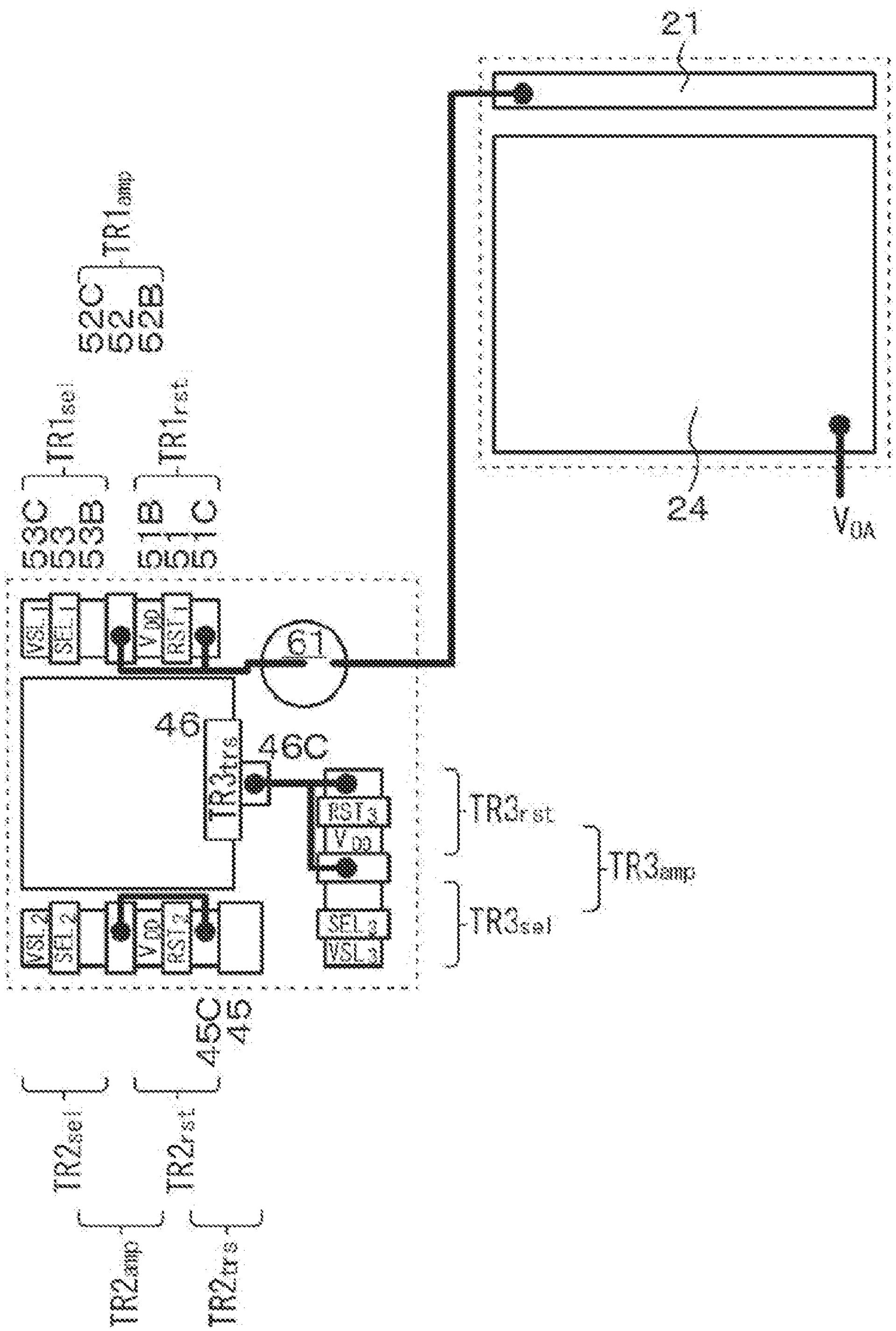
FIG. 21 is a schematic layout diagram of a first electrode, a charge storage electrode, and the transistors constituting a control unit in an imaging element-A included in the imaging device of Example 8.
Figure 22:
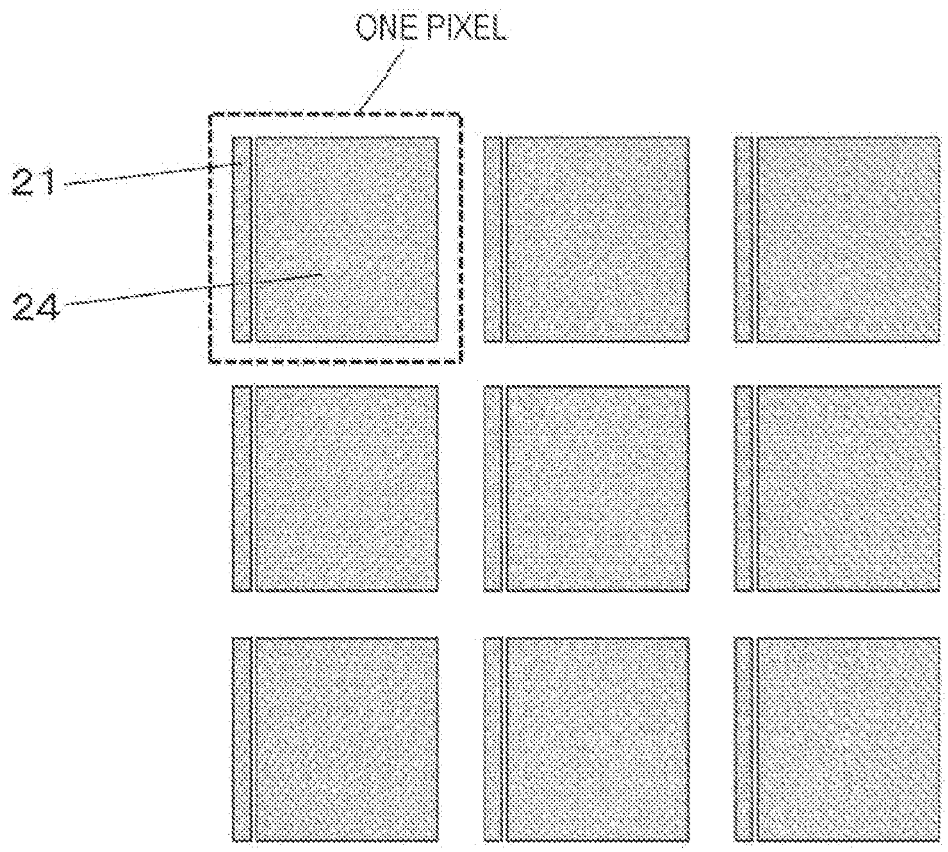
FIG. 22 is a schematic layout diagram of first electrodes and charge storage electrodes in the imaging elements-A constituting the imaging device of Example 8.
Figure 23:
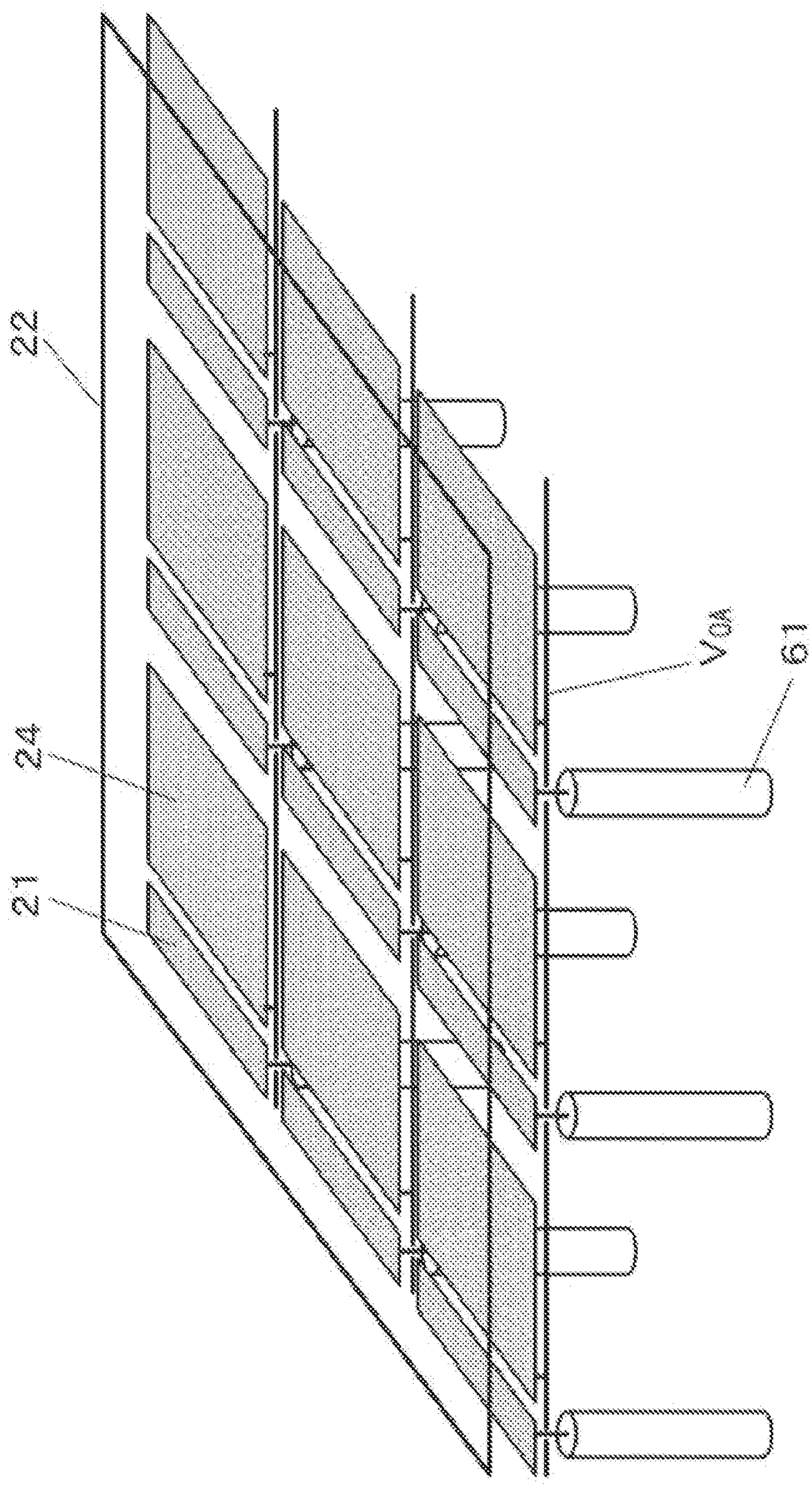
FIG. 23 is a schematic perspective view of first electrodes, charge storage electrodes, second electrodes, and contact hole portions in the imaging elements-A constituting the imaging device of Example 8.

Example 8 is modifications of Examples 1 through 7. FIG. 18 shows a schematic partial cross-sectional view of an imaging element-A included in an imaging device of Example 8. FIG. 19 and FIG. 20 show equivalent circuit diagrams of imaging elements-A included in the imaging device of Example 8. FIG. 21 shows a schematic layout diagram of the first electrode, the charge storage electrode, and the transistors constituting a control unit in the imaging element-A included in the imaging device of Example 8. Further, FIG. 22 shows a schematic layout diagram of the first electrodes and the charge storage electrodes in imaging elements-A included in the imaging device of Example 8. FIG. 23 shows a schematic perspective view of the first electrodes, the charge storage electrodes, the second electrode, and the contact hole portions in imaging elements-A included in the imaging device of Example 8. Note that imaging elements-B and imaging elements-C have configurations and structures substantially similar to those of the imaging elements-A. In the description below, the imaging elements-A, the imaging elements-B, and the imaging elements-C will be collectively referred to as "imaging elements".

Specifically, an imaging element of Example 8 is a back-illuminated imaging element, and has a structure in which three imaging elements are stacked. The three imaging elements are: a green-light imaging element of Example 1 of a first type that includes a green-light photoelectric conversion layer of the first type that absorbs green light, and has sensitivity to green light (this imaging element will be hereinafter referred to as the "first imaging element"); a conventional blue-light imaging element of a second type that includes a blue-light photoelectric conversion layer of the second type that absorbs blue light, and has sensitivity to blue light (this imaging element will be hereinafter referred to as the "second imaging element"); and a conventional red-light imaging element of the second type that includes a red-light photoelectric conversion layer of the second type that absorbs red light, and has sensitivity to red light (this imaging element will be hereinafter referred to as the "third imaging element"). Here, the red-light imaging element (the third imaging element) and the blue-light imaging element (the second imaging element) are disposed in the semiconductor substrate 70, and the second imaging element is located closer to the light incident side than the third imaging element is. Further, the green-light imaging element (the first imaging element) is disposed above the blue-light imaging element (the second imaging element). One pixel is formed with the stack structure of the first imaging element, the second imaging element, and the third imaging element. Any color filter layer is not provided.

In Example 8 or Example 9 and the examples that follow, the photoelectric conversion layer 23 in the effective pixel region and the optical black region has a two-layer configuration formed with the organic semiconductor material layer 23A and the oxide semiconductor material layer 23B, as in Example 5. However, the photoelectric conversion layer 23 in the effective pixel region and the optical black region does not necessarily have such a configuration, but may have a single-layer configuration formed with an organic semiconductor material layer. The configuration and the structure of the first imaging element are substantially similar the configuration and the structure of each imaging element-A described in Example 1, and therefore, explanation of the configuration and the structure of the first imaging element is not made herein. The photoelectric conversion layer 23 is formed with a layer containing a known organic photoelectric conversion material (an organic material such as a rhodamine dye, a merocyanine dye, or quinacridone, for example) having sensitivity to at least green light.

In Example 8, the first imaging element is formed with an imaging element explained in Example 1, as described above. Further, a $p^+$-layer 44 is provided between an n-type semiconductor region 43 and the front surface 70A of the semiconductor substrate 70, to reduce generation of dark current. A $p^+$-layer 42 is formed between an n-type semiconductor region 41 and the n-type semiconductor region 43, and, further, part of a side surface of the n-type semiconductor region 43 is surrounded by the $p^+$-layer 42. A $p^+$-layer 73 is formed on the side of the back surface 70B of the semiconductor substrate 70, and a $HfO_2$ film 74 and an insulating material film 75 are formed in the portion extending from the $p^+$-layer 73 to the formation region of the contact hole portion 61 in the semiconductor substrate 70.

The second imaging element includes a photoelectric conversion layer that is the n-type semiconductor region 41 provided in the semiconductor substrate 70. The gate portion 45 of a transfer transistor $TR\mathbf{2}_{trs}$ formed with a vertical transistor extends to the n-type semiconductor region 41, and is connected to a transfer gate line $TG_2$. Further, a second floating diffusion layer $FD_2$ is disposed in a region 45C near the gate portion 45 of the transfer transistor $TR\mathbf{2}t_rs$ in the semiconductor substrate 70. The electric charges stored in the n-type semiconductor region 41 are read into the second floating diffusion layer $FD_2$ via a transfer channel formed along the gate portion 45.

In the second imaging element, a reset transistor $TR\mathbf{2}_{rst}$, an amplification transistor $TR\mathbf{2}_{amp}$, and a selection transistor $TR\mathbf{2}_{sel}$ that constitute the control unit of the second imaging element are further disposed on the first surface side of the semiconductor substrate 70.

The reset transistor $TR\mathbf{2}_{rst}$ includes a gate portion, a channel formation region, and source/drain regions. The gate portion of the reset transistor $TR\mathbf{2}_{rst}$ is connected to a reset line $RST_2$, one of the source/drain regions of the reset transistor $TR\mathbf{2}_{rst}$ is connected to the power supply $V_{DD}$, and the other one of the source/drain regions also serves as the second floating diffusion layer $FD_2$.

The amplification transistor $TR2_{amp}$ includes a gate portion, a channel formation region, and source/drain regions. The gate portion is connected to the other one of the source/drain regions (the second floating diffusion layer $FD_2$) of the reset transistor $TR2_{rst}$. Further, one of the source/drain regions is connected to the power supply $V_{DD}$.

The selection transistor $TR2_{sel}$ includes a gate portion, a channel formation region, and source/drain regions. The gate portion is connected to a selection line $SEL_2$. Further, one of the source/drain regions shares a region with the other one of the source/drain regions forming the amplification transistor $TR2_{amp}$, and the other one of the source/drain regions is connected to a signal line (a data output line) $VSL_2$.

The third imaging element includes a photoelectric conversion layer that is the n-type semiconductor region 43 provided in the semiconductor substrate 70. The gate portion 46 of a transfer transistor $TR3_{trs}$ is connected to a transfer gate line $TG_3$. Further, a third floating diffusion layer $FD_3$ is disposed in the region 46C near the gate portion 46 of the transfer transistor $TR3_{trs}$ in the semiconductor substrate 70. The electric charges stored in the n-type semiconductor region 43 are read into the third floating diffusion layer $FD_3$ via a transfer channel 46A formed along the gate portion 46.

In the third imaging element, a reset transistor $TR3_{rst}$, an amplification transistor $TR3_{amp}$, and a selection transistor $TR3_{sel}$ that constitute the control unit of the third imaging element are further disposed on the first surface side of the semiconductor substrate 70.

The reset transistor $TR3_{rst}$ includes a gate portion, a channel formation region, and source/drain regions. The gate portion of the reset transistor $TR3_{rst}$ is connected to a reset line $RST_3$, one of the source/drain regions of the reset transistor $TR3_{rst}$ is connected to the power supply $V_{DD}$, and the other one of the source/drain regions also serves as the third floating diffusion layer $FD_3$.

The amplification transistor $TR3_{amp}$ includes a gate portion, a channel formation region, and source/drain regions. The gate portion is connected to the other one of the source/drain regions (the third floating diffusion layer $FD_3$) of the reset transistor $TR3_{rst}$. Further, one of the source/drain regions is connected to the power supply $V_{DD}$.

The selection transistor $TR3_{sel}$ includes a gate portion, a channel formation region, and source/drain regions. The gate portion is connected to a selection line $SEL_3$. Further, one of the source/drain regions shares a region with the other one of the source/drain regions forming the amplification transistor $TR3_{amp}$, and the other one of the source/drain regions is connected to a signal line (a data output line) $VSL_3$.

The reset lines $RST_1$, $RST_2$, and $RST_3$, the selection lines $SEL_1$, $SEL_2$, and $SEL_3$, and the transfer gate lines $TG_2$ and $TG_3$ are connected to the vertical drive circuit 312 that forms the drive circuit, and the signal lines (data output lines) $VSL_1$, $VSL_2$, and $VSL_3$ are connected to a column signal processing circuit 313 that forms the drive circuit.

Figure 24:
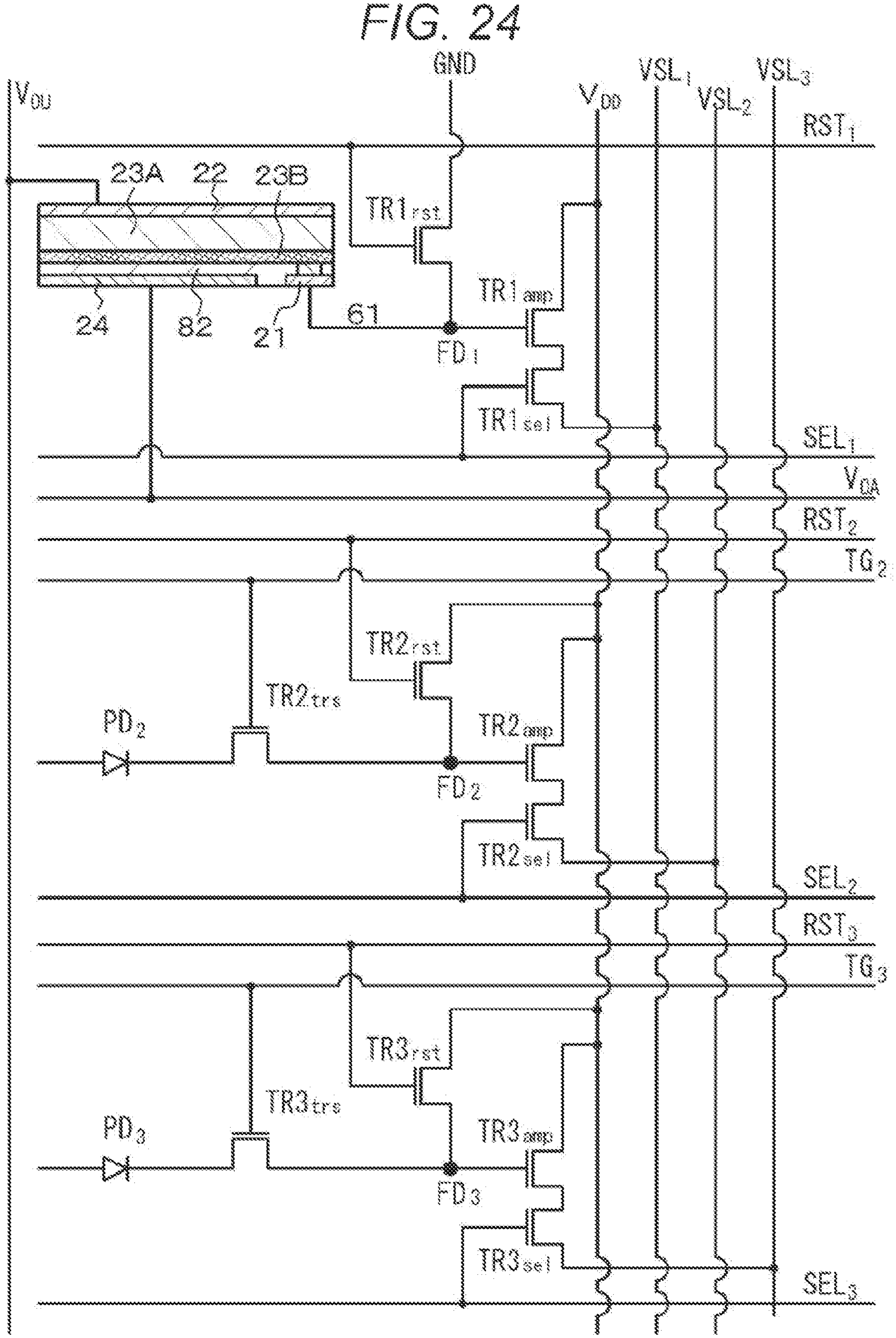
FIG. 24 is an equivalent circuit diagram of a modification of an imaging element-A included in the imaging device of Example 8.
Figure 25:
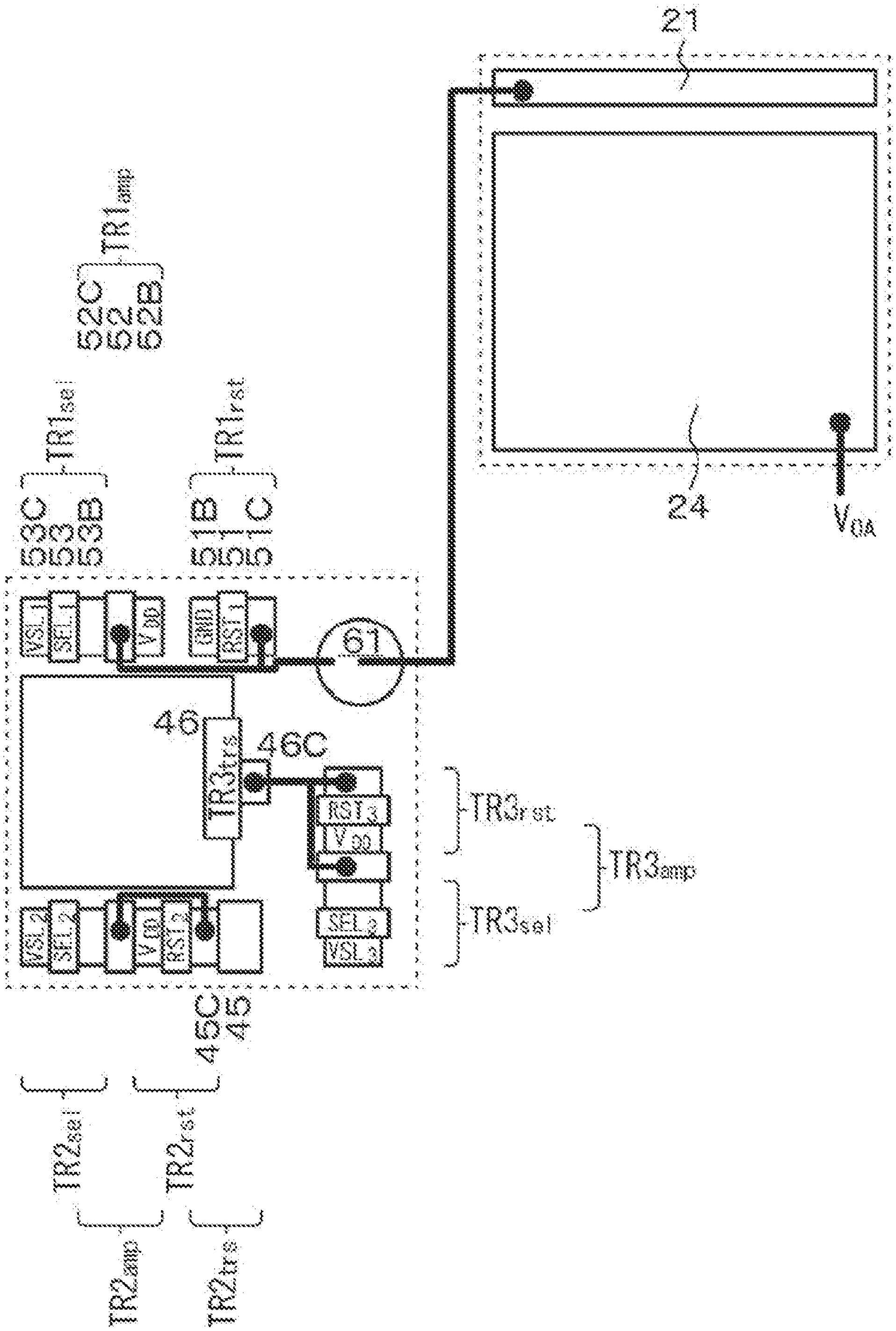
FIG. 25 is a schematic layout diagram of a first electrode, a charge storage electrode, and the transistors constituting a control unit in the modification of an imaging element-A included in the imaging device of Example 8 shown in FIG. 24.

FIG. 24 shows an equivalent circuit diagram of a modification of an imaging element-A included in the imaging device of Example 8, and FIG. 25 shows a schematic layout diagram of the first electrode, the charge storage electrode, and the transistors constituting the control unit. As shown in FIGS. 24 and 25, the other source/drain region 51B of the reset transistor $TR1_{rst}$ may be grounded, instead of being connected to the power supply $V_{DD}$.

Imaging elements of Example 8 can be manufactured by the method described below, for example. Specifically, an SOI substrate is first prepared. A first silicon layer is then formed on the surface of the SOI substrate by an epitaxial growth method, and the $p^+$-layer 73 and the n-type semiconductor region 41 are formed in the first silicon layer. A second silicon layer is then formed on the first silicon layer by an epitaxial growth method, and the device separation region 71, the oxide film 72, the $p^+$-layer 42, the n-type semiconductor region 43, and the $p^+$-layer 44 are formed in the second silicon layer. Further, various transistors and the like that constitute the control units of the imaging element are formed in the second silicon layer, and the wiring layer 62, the interlayer insulating layer 76, and various wiring lines are formed thereon. After that, the interlayer insulating layer 76 and a support substrate (not shown) are bonded to each other. After that, the SOI substrate is removed, to expose the first silicon layer. The surface of the second silicon layer corresponds to the front surface 70A of the semiconductor substrate 70, and the surface of the first silicon layer corresponds to the back surface 70B of the semiconductor substrate 70. Also, the first silicon layer and the second silicon layer are collectively referred to as the semiconductor substrate 70. The opening for forming the contact hole portion 61 is then formed on the side of the back surface 70B of the semiconductor substrate 70, and the $HfO_2$ film 74, the insulating material film 75, and the contact hole portion 61 are formed. Further, the pad portions 63 and 64, the interlayer insulating layer 81, the connecting holes 65 and 66, the first electrodes 21, the charge storage electrodes 24, and the insulating layer 82 are formed. An opening is then formed in the connecting portion 67, and the oxide semiconductor material layer 23B, the organic semiconductor material layer 23A, the second electrode 22, the upper insulating layers 83 (83A and 83B), the light blocking layer 15, and the on-chip microlenses 14 are formed. In this manner, imaging elements of Example 8 can be obtained.

Further, although not shown in any of the drawings, the insulating layer 82 may have a two-layer configuration including an insulating/under layer and an insulating/top layer. That is, the insulating/under layer is formed at least on the charge storage electrode 24 and in a region between the charge storage electrode 24 and the first electrode 21 (more specifically, the insulating/under layer is formed on the interlayer insulating layer 81 including the charge storage electrode 24), and a planarization process is performed on the insulating/under layer. After that, the insulating/top layer is formed over the insulating/under layer and the charge storage electrode 24. Thus, the insulating layer 82 can be planarized without fail. An opening is then formed in the thus obtained insulating layer 82, so that the connecting portion 67 is formed.

Example 9

Figure 26:
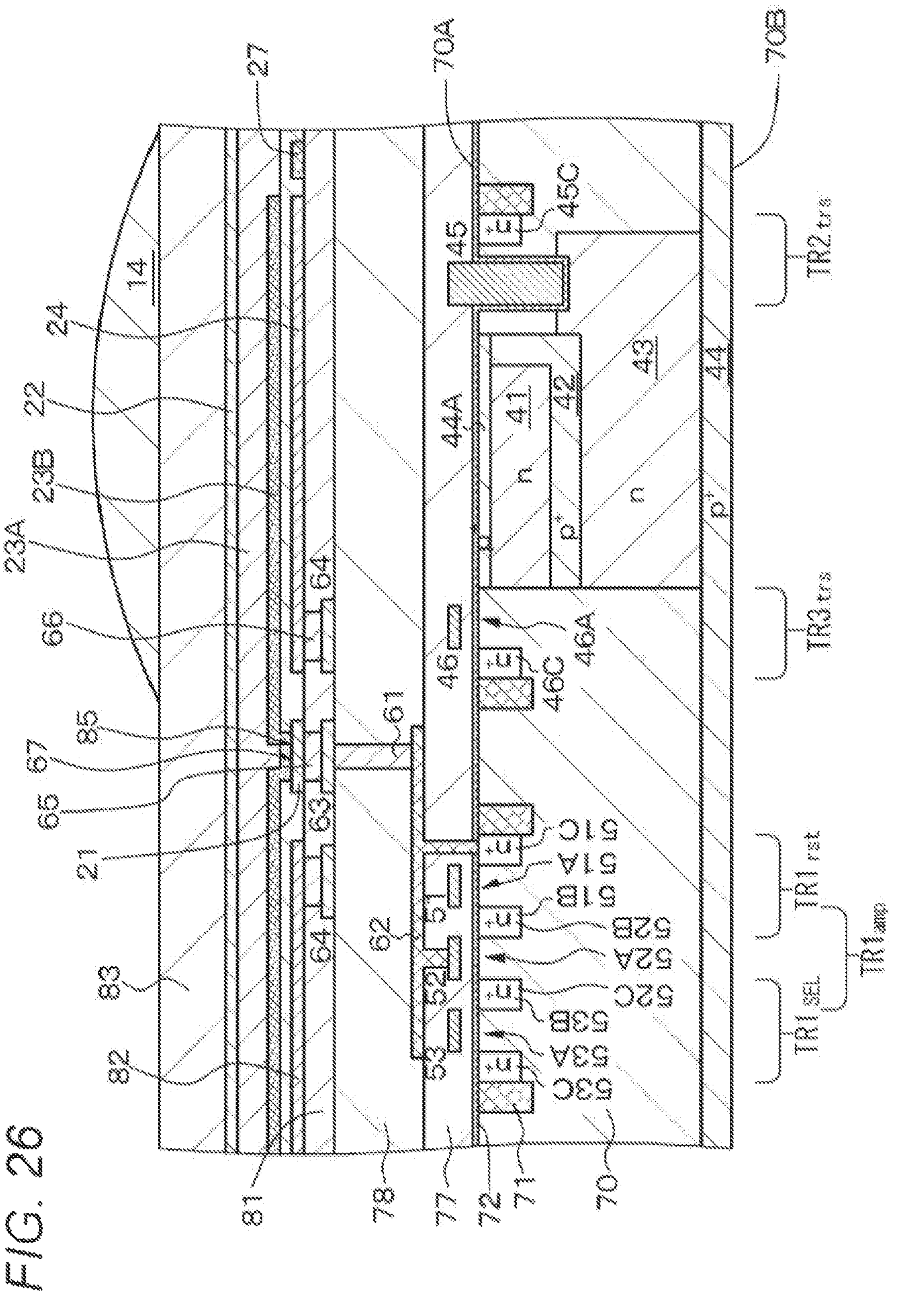
FIG. 26 is a schematic partial cross-sectional view of an imaging element-A included in an imaging device of Example 9.

Example 9 is a modification of Example 8. FIG. 26 shows a schematic partial cross-sectional view of an imaging element-A included in an imaging device of Example 9. An imaging element of Example 9 is a front-illuminated imaging element, and has a structure in which three imaging elements are stacked. The three imaging elements are: a green-light imaging element of Example 8 of a first type (a first imaging element) that includes a green-light photoelectric conversion layer of the first type that absorbs green light, and has sensitivity to green light; a conventional blue-light imaging element of a second type (a second imaging element) that includes a blue-light photoelectric conversion layer of the second type that absorbs blue light, and has sensitivity to blue light; and a conventional red-light imaging element of the second type (a third imaging element) that includes a red-light photoelectric conversion layer of the second type that absorbs red light, and has sensitivity to red light. Here, the red-light imaging element (the third imaging element) and the blue-light imaging element (the second imaging element) are disposed in the semiconductor substrate 70, and the second imaging element is located closer to the light incident side than the third imaging element is. Further, the green-light imaging element (the first imaging element) is disposed above the blue-light imaging element (the second imaging element).

On the side of the front surface 70A of the semiconductor substrate 70, various transistors that constitute the control unit are provided, as in Example 8. These transistors may have configurations and structures substantially similar to those of the transistors described in Example 8. Further, the second imaging element and the third imaging element are provided in the semiconductor substrate 70, and these imaging elements may have configurations and structures substantially similar to those of the second imaging element and the third imaging element described in Example 8.

The interlayer insulating layer 81 is formed above the front surface 70A of the semiconductor substrate 70, and the photoelectric conversion unit (the first electrode 21, the oxide semiconductor material layer 23B, the organic semiconductor material layer 23AA, the second electrode 22, the charge storage electrode 24, and the like) including the charge storage electrode forming the imaging element of Example 8 is provided above the interlayer insulating layer 81.

As described above, except for being of the front-illuminated type, the configuration and the structure of an imaging element of Example 9 can be similar to the configuration and the structure of an imaging element of Example 8, and therefore, detailed explanation thereof is not made herein.

Example 10

Example 10 is modifications of Examples 8 and 9.

Figure 27:
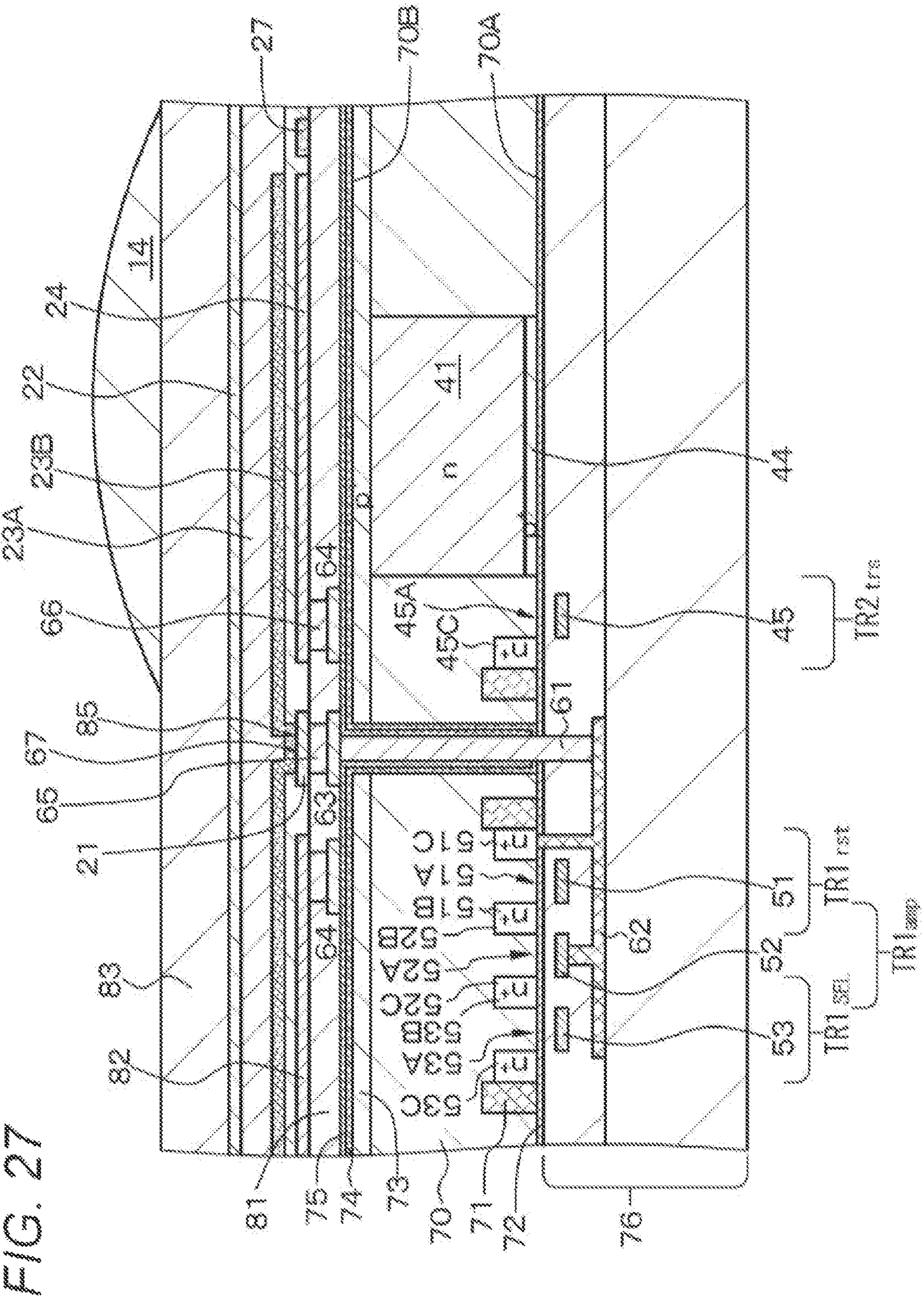
FIG. 27 is a schematic partial cross-sectional view of an imaging element-A included in an imaging device of Example 10.
Figure 28:
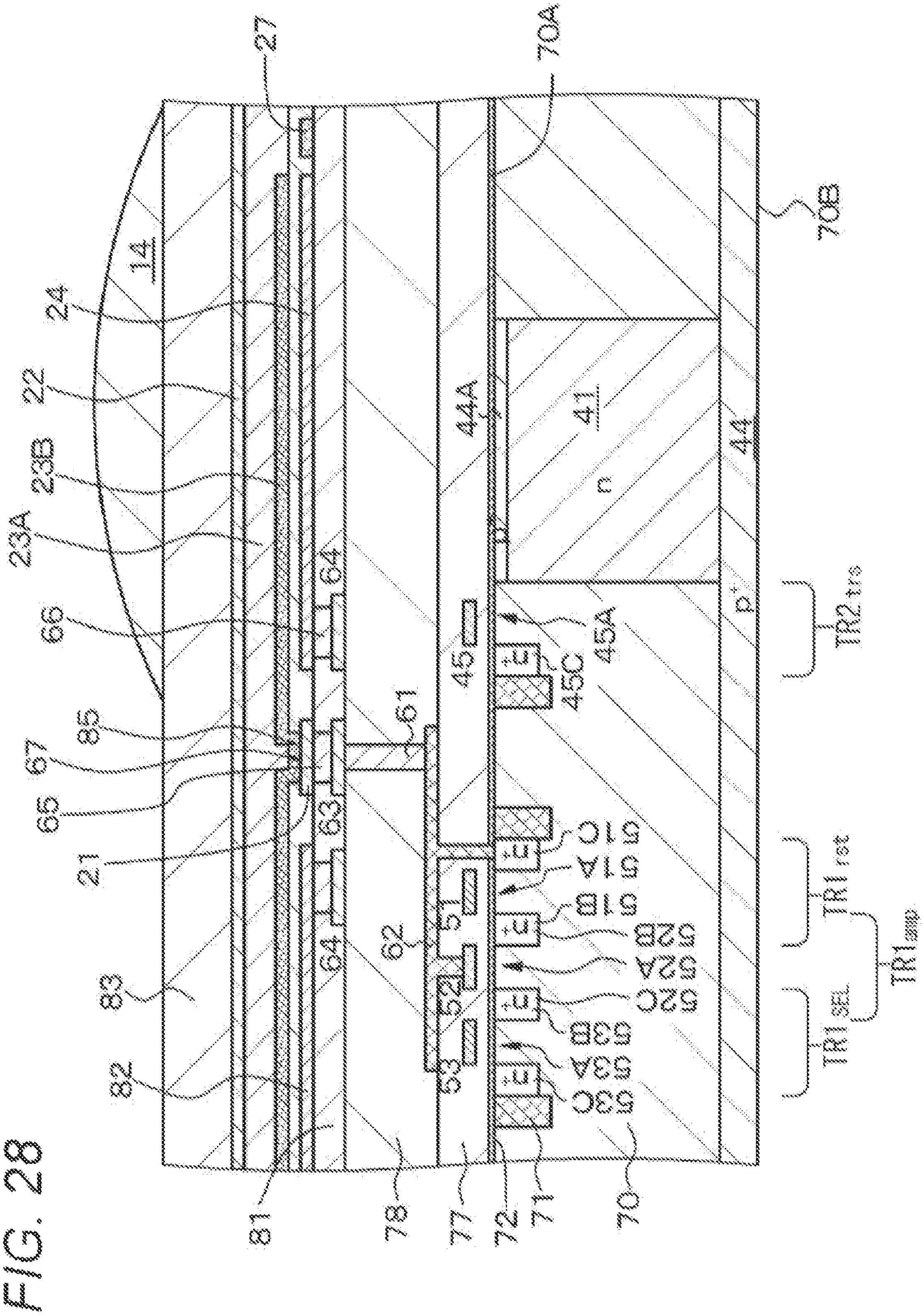
FIG. 28 is a schematic partial cross-sectional view of a modification of an imaging element-A included in the imaging device of Example 10.

FIG. 27 shows a schematic partial cross-sectional view of a back-illuminated imaging element of Example 10. This imaging element has a structure in which the two imaging elements that are the first imaging element of the first type of Example 8 and the second imaging element of the second type are stacked. Further, FIG. 28 shows a schematic partial cross-sectional view of a modification of the imaging element of Example 10. This modification is a front-illuminated imaging element, and has a structure in which the two imaging elements that are the first imaging element of the first type of Example 8 and the second imaging element of the second type are stacked. Here, the first imaging element absorbs primary color light, and the second imaging element absorbs complementary color light. Alternatively, the first imaging element absorbs white light, and the second imaging element absorbs infrared rays.

Instead of one photoelectric conversion unit including a charge storage electrode of the first type of Example 8, two photoelectric conversion units may be stacked (in other words, two photoelectric conversion units each including a charge storage electrode may be stacked, and the control units for the two photoelectric conversion units may be provided in the semiconductor substrate). Alternatively, three photoelectric conversion units may be stacked (in other words, three photoelectric conversion units each including a charge storage electrode may be stacked, and the control units for the three photoelectric conversion units may be provided in the semiconductor substrate). Examples of stack structures formed with imaging elements of the first type and imaging elements of the second type are shown in the table below.

| | First type | Second type |
|---|---|---|
| Back-illuminated type and front-illuminated type | 1<br>Green | 2<br>Blue + red |
| | 1<br>Primary color | 1<br>Complementary color |
| | 1<br>White | 1<br>Infrared rays |
| | 1<br>Blue, green, or red | 0 |
| | 2<br>Green + infrared light | 2<br>Blue + red |
| | 2<br>Green + blue | 1<br>Red |
| | 2<br>White + infrared light | 0 |
| | 3<br>Green + blue + red | 2<br>Blue-green (emerald) + infrared light |
| | 3<br>Green + blue + red | 1<br>Infrared light |
| | 3<br>Blue + green + red | 0 |

Example 11

Figure 16B:
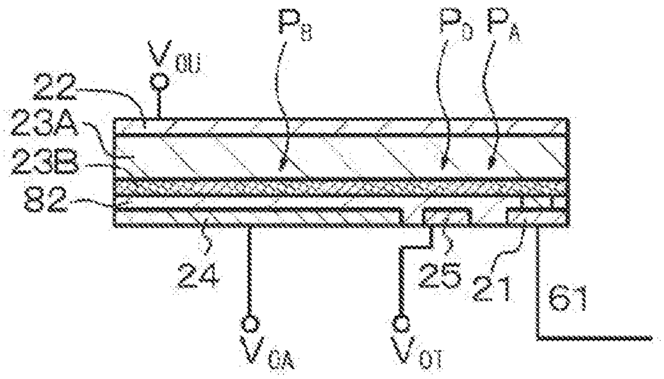
Figure 29:
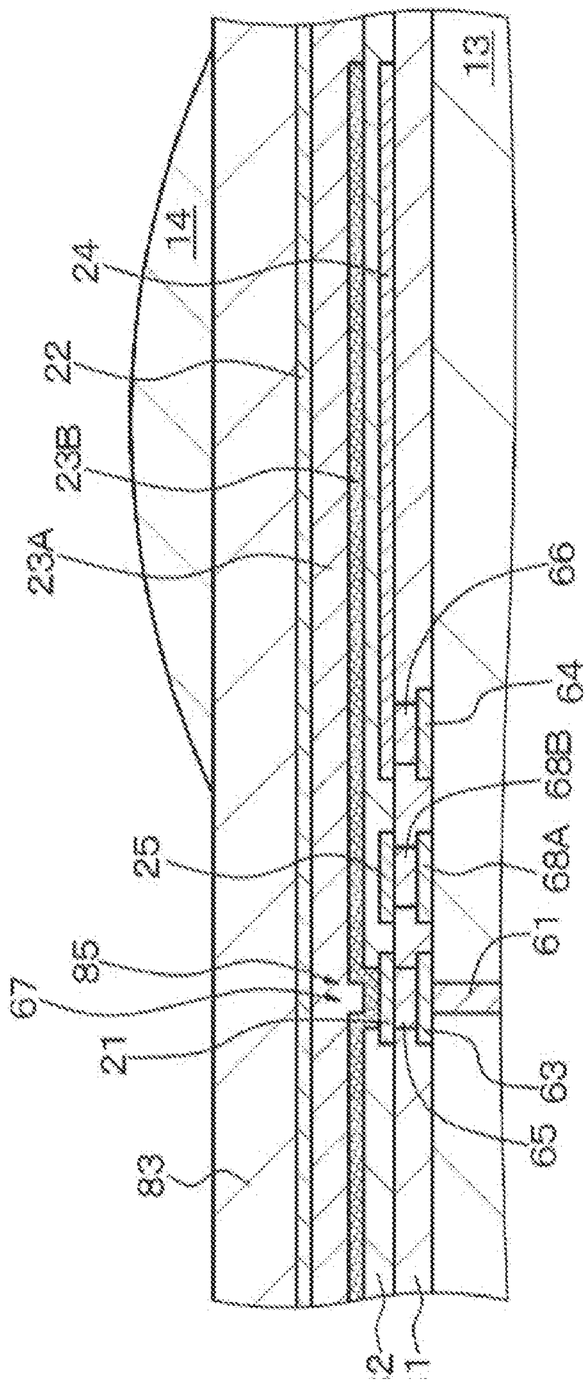
FIG. 29 is a schematic partial cross-sectional view of part of an imaging element-A included in an imaging device of Example 11.
Figure 30:
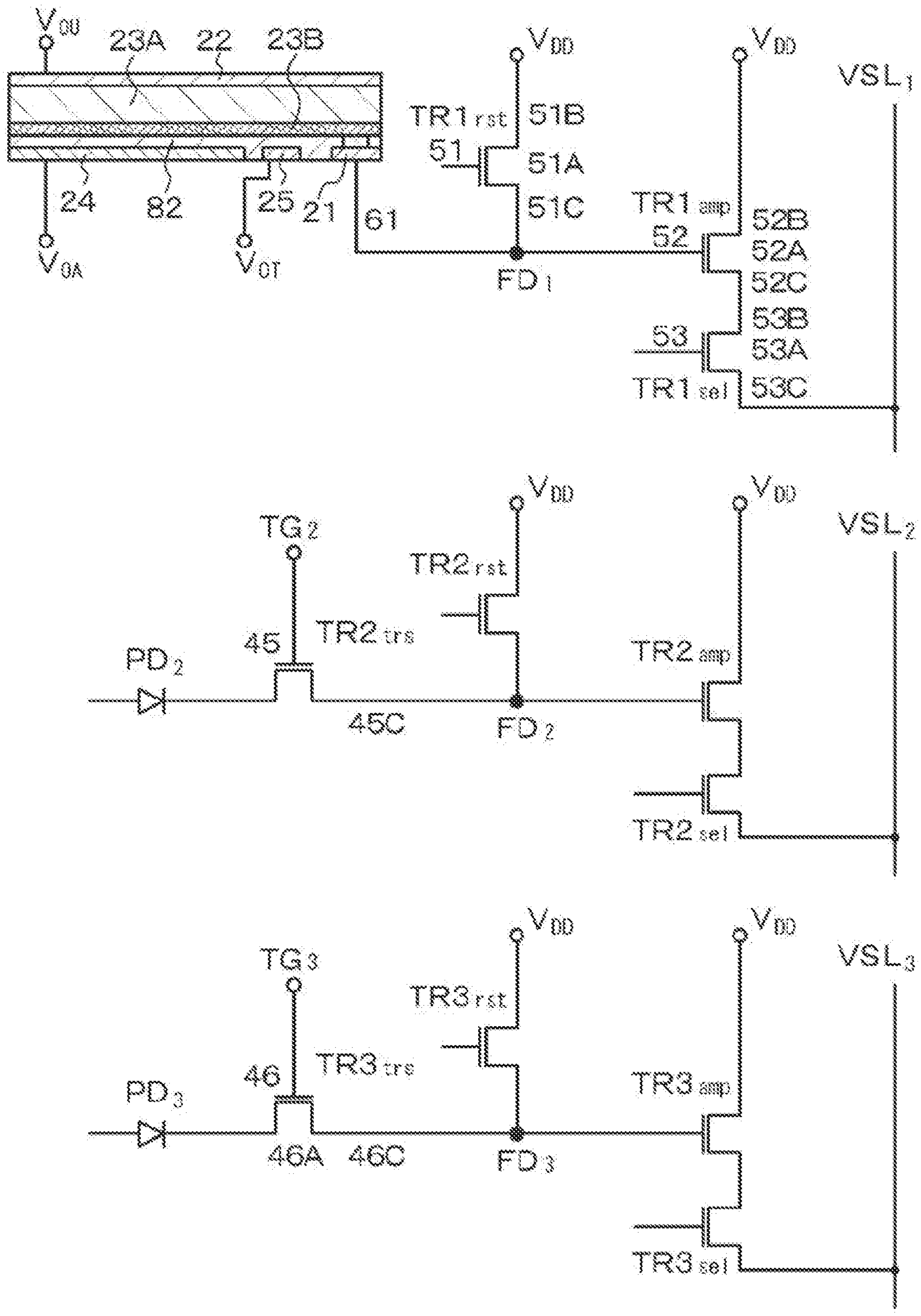
FIG. 30 is an equivalent circuit diagram of an imaging element-A included in the imaging device of Example 11.
Figure 31:
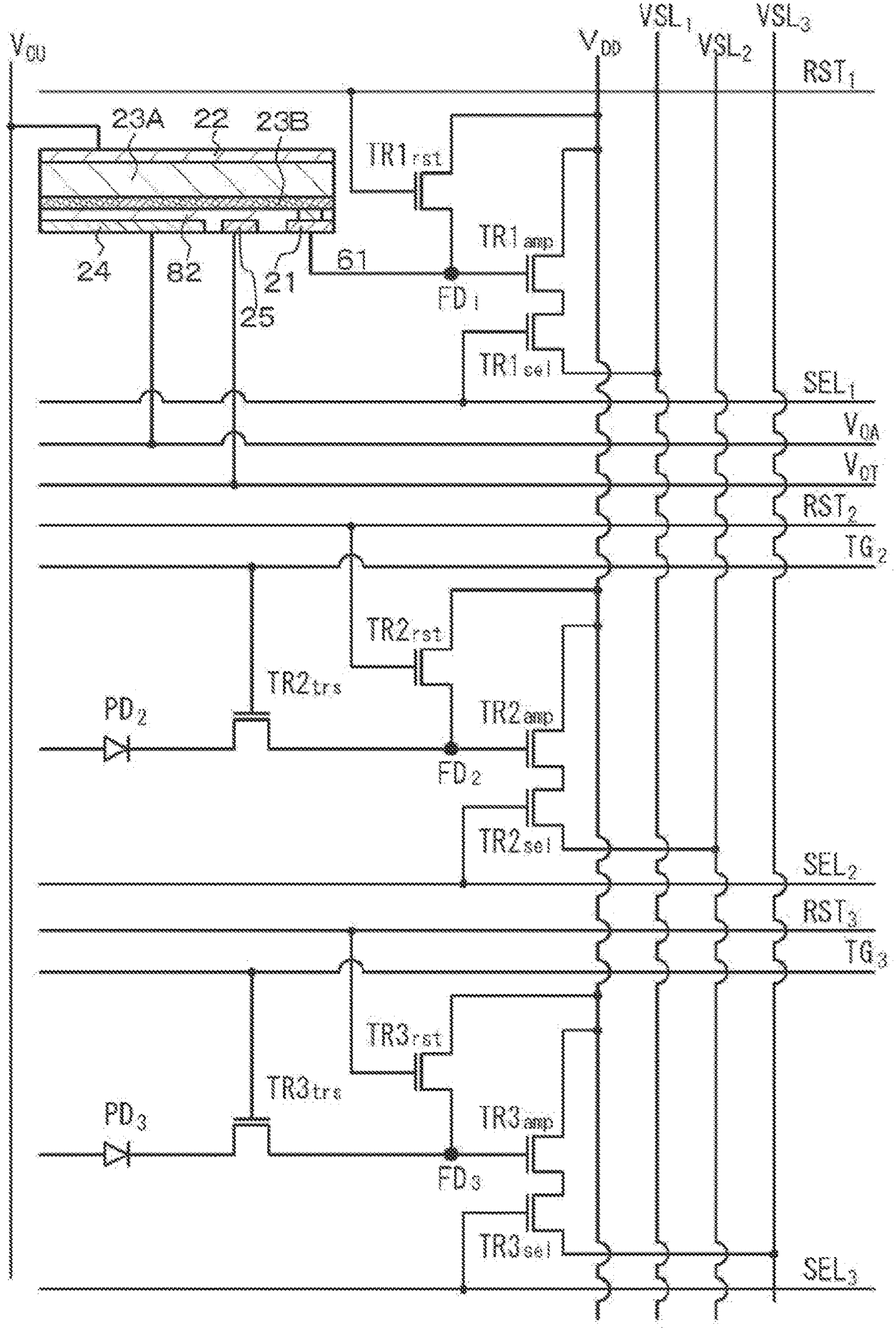
FIG. 31 is an equivalent circuit diagram of an imaging element-A included in the imaging device of Example 11.
Figure 32:
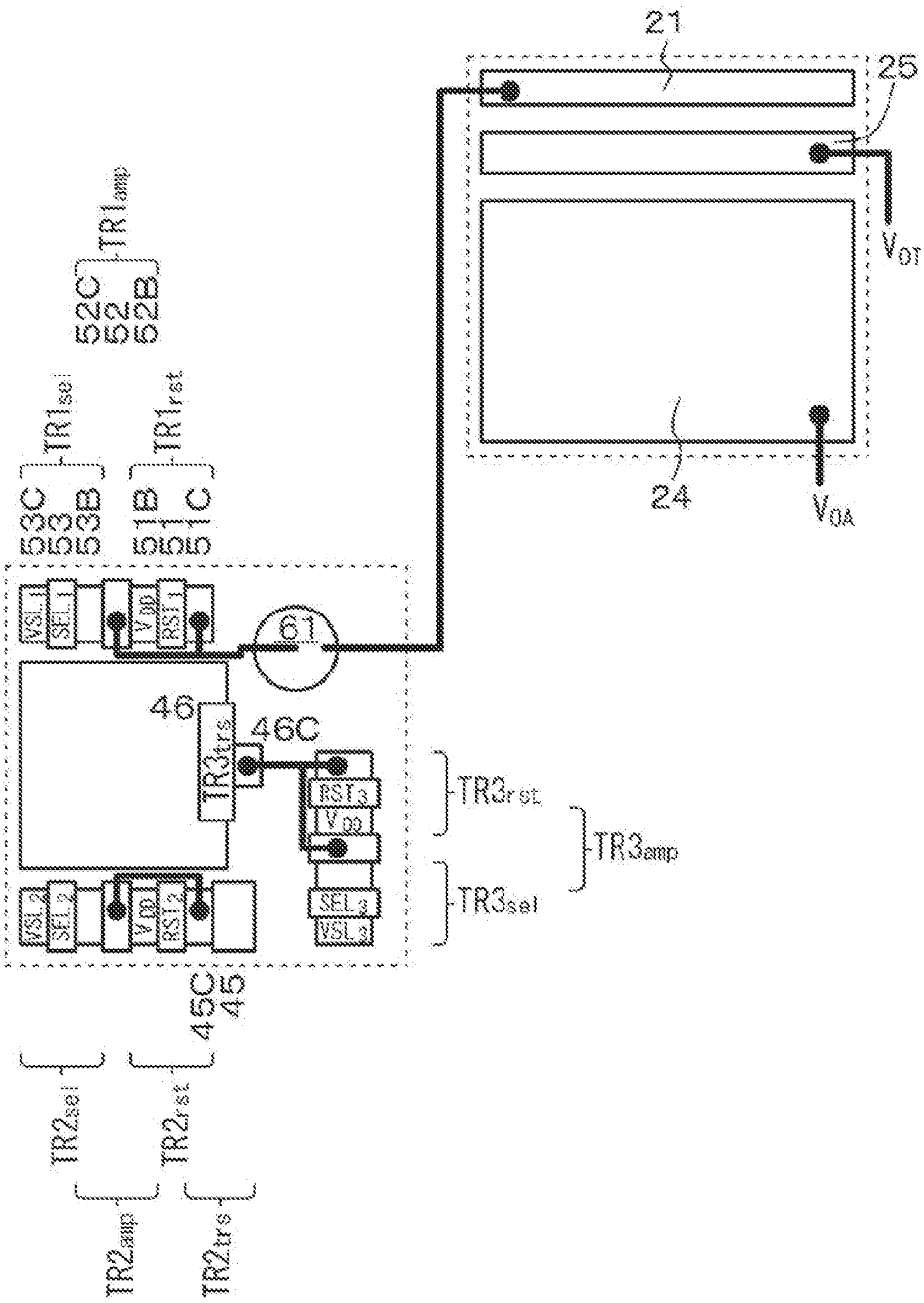
FIG. 32 is a schematic layout diagram of a first electrode, a transfer control electrode, a charge storage electrode, and the transistors constituting a control unit in an imaging element-A included in the imaging device of Example 11.
Figure 35:
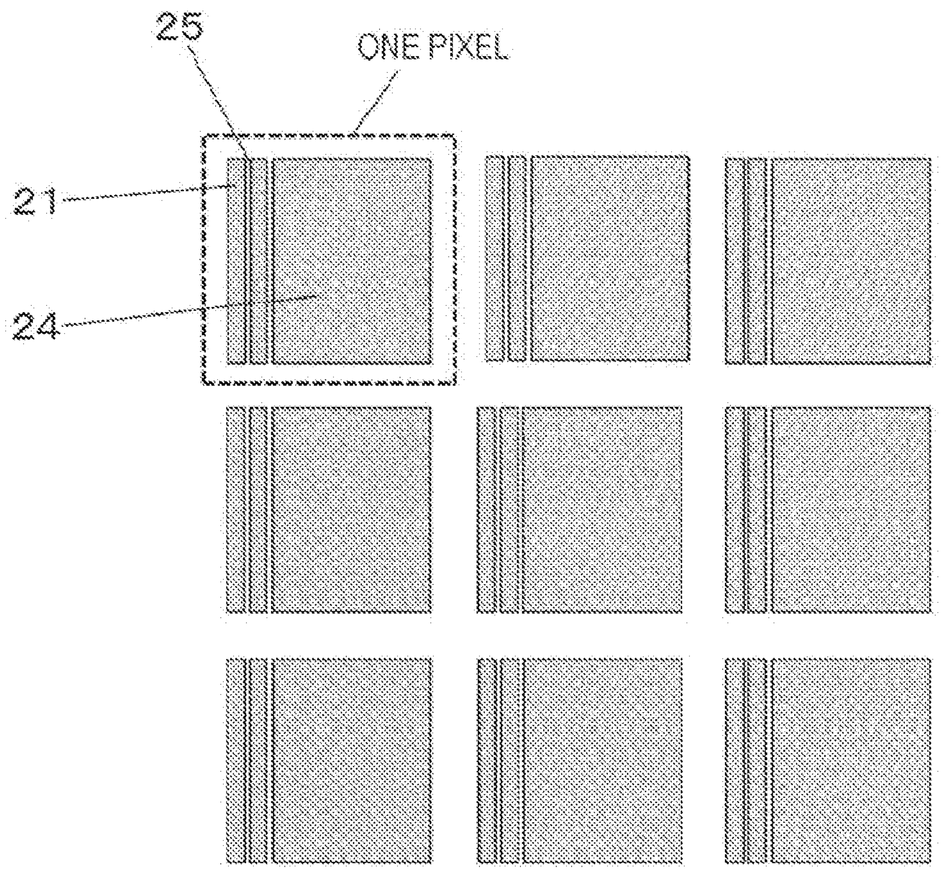
FIG. 35 is a schematic layout diagram of first electrodes, transfer control electrodes, and charge storage electrodes in the imaging elements-A constituting the imaging device of Example 11.
Figure 36:
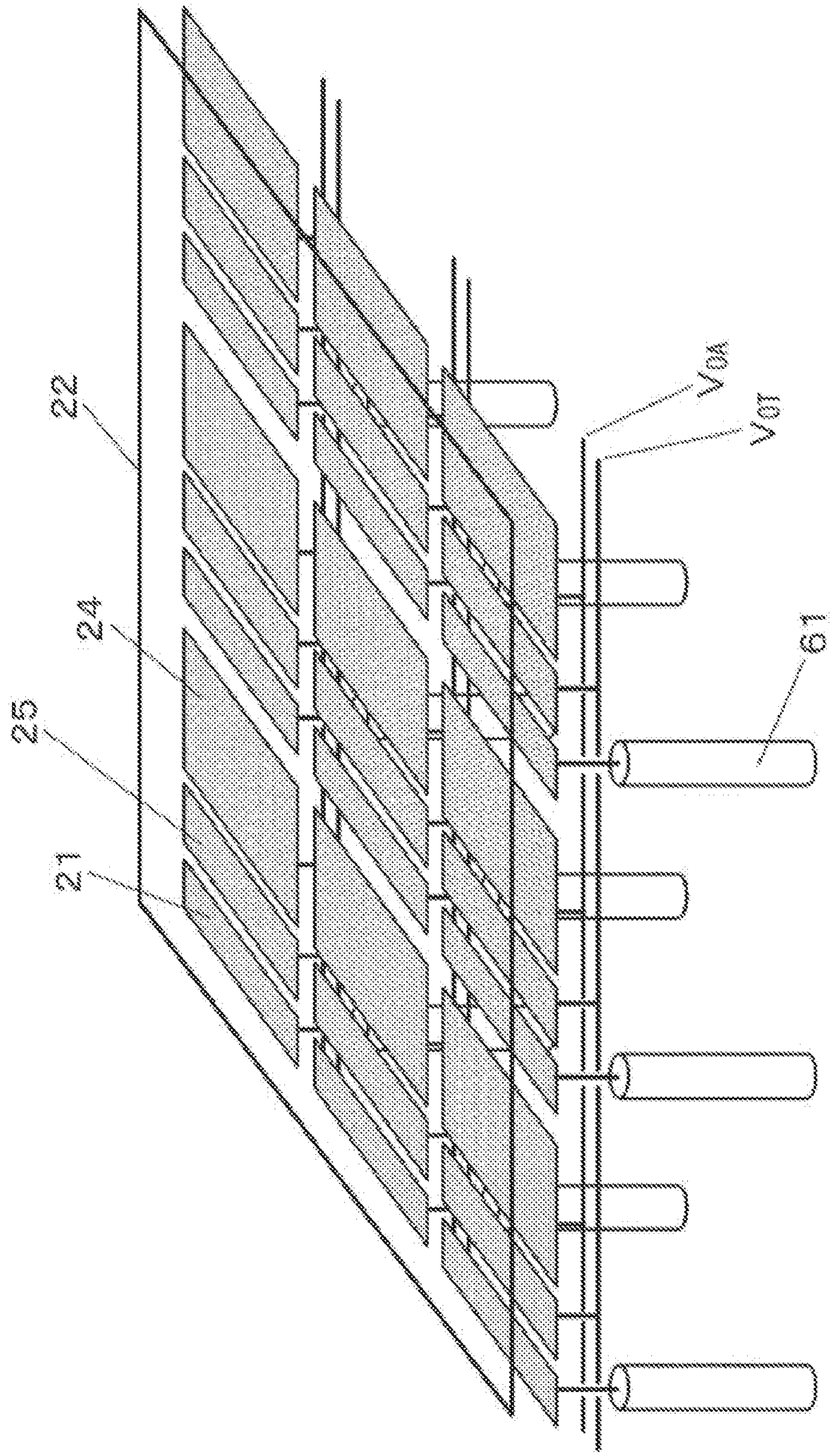
FIG. 36 is a schematic perspective view of first electrodes, transfer control electrodes, charge storage electrodes, second electrodes, and contact hole portions in the imaging elements-A constituting the imaging device of Example 11.

Example 11 is modifications of Examples 8 through 10, and relates to an imaging device or the like including a transfer control electrode (a charge transfer electrode). FIG. 29 shows a schematic partial cross-sectional view of part of an imaging element of Example 11. FIGS. 30 and 31 show equivalent circuit diagrams of imaging elements of Example 11. FIG. 32 shows a schematic layout diagram of a first electrode, a transfer control electrode, and a charge storage electrode that constitute a photoelectric conversion unit of the imaging element of Example 11, and the transistors that constitute a control unit. FIGS. 33 and 34 schematically show the states of the potentials at respective portions during an operation of the imaging element of Example 11. FIG. 16B shows an equivalent circuit diagram for explaining the respective portions of the imaging element of Example 11. Further, FIG. 35 shows a schematic layout diagram of the first electrode, the transfer control electrode, and the charge storage electrode that constitute the photoelectric conversion unit of the imaging element of Example 11. FIG. 36 shows a schematic perspective view of the first electrode, the transfer control electrode, the charge storage electrode, a second electrode, and a contact hole portion.

In the imaging element of Example 11, a transfer control electrode (a charge transfer electrode) 25 is further provided between the first electrode 21 and the charge storage electrode 24. The transfer control electrode 25 is disposed at a distance from the first electrode 21 and the charge storage electrode 24, and is positioned to face the oxide semiconductor material layer 23B via the insulating layer 82. The transfer control electrode 25 is connected to the pixel drive circuit that forms a drive circuit, via a connecting hole 68B, a pad portion 68A, and a wiring line $V_{OT}$ that are formed in the interlayer insulating layer 81. Note that, to simplify the drawings, the various imaging element components located below the interlayer insulating layer 81 are collectively denoted by reference numeral 13 for the sake of convenience.

In the description below, operation of the imaging element (a first imaging element) of Example 11 is described, with reference to FIGS. 33 and 34. Note that the value of the potential to be applied to the charge storage electrode 24 and the value of the potential at point $P_D$ are different between FIGS. 33 and 34.

In a charge accumulation period, the drive circuit applies a potential $V_{11}$ to the first electrode 21, a potential $V_{12}$ to the charge storage electrode 24, and a potential $V_{13}$ to the transfer control electrode 25. Light that has entered the organic semiconductor material layer 23A causes photoelectric conversion in the organic semiconductor material layer 23A. Holes generated by the photoelectric conversion are sent from the second electrode 22 to the drive circuit via a wiring line $V_{OU}$. Meanwhile, since the potential of the first electrode 21 is higher than the potential of the second electrode 22, or a positive potential is applied to the first electrode 21 while a negative potential is applied to the second electrode 22, for example, $V_{12}>V_{13}$ ($V_{12}>V_{11}>V_{13}$, or $V_1>V_{12}>V_{13}$, for example). As a result, electrons generated by the photoelectric conversion are attracted to the charge storage electrode 24, and stay in the region of the oxide semiconductor material layer 23B and the like facing the charge storage electrode 24. That is, electric charges are accumulated in the oxide semiconductor material layer 23B and the like. Since $V_{12}>V_{13}$, electrons generated in the organic semiconductor material layer 23A can be reliably prevented from moving toward the first electrode 21. With the passage of time for photoelectric conversion, the potential in the region of the oxide semiconductor material layer 23B and the like facing the charge storage electrode 24 becomes a more negative value.

A reset operation is performed in the latter period in the charge accumulation period. As a result, the potential of the first floating diffusion layer $FD_1$ is reset, and the potential of the first floating diffusion layer $FD_1$ becomes equal to the potential $V_{DD}$ of the power supply.

After completion of the reset operation, the electric charges are read out. In other words, in a charge transfer period, the drive circuit applies a potential $V_{21}$ to the first electrode 21, a potential $V_{22}$ to the charge storage electrode 24, and a potential $V_{23}$ to the transfer control electrode 25. Here, $V_{22}\leq V_{23}\leq V_{21}$ (preferably, $V_{22}<V_{23}<V_{21}$). In a case where the potential $V_{13}$ is applied to the transfer control electrode 25, it is only required to satisfy $V_{22}\leq V_{13}\leq V_{21}$ (preferably, $V_{22}<V_{13}<V_{21}$). As a result, the electrons remaining in the region of the oxide semiconductor material layer 23B and the like facing the charge storage electrode 24 are read into the first electrode 21 and further into the first floating diffusion layer $FD_1$ without fail. In other words, the electric charges accumulated in the oxide semiconductor material layer 23B and the like are read into the control unit.

In the above manner, a series of operations including charge accumulation, reset operation, and charge transfer is completed.

The operations of the amplification transistor $TR1_{amp}$ and the selection transistor $TR1_{sel}$ after the electrons are read into the first floating diffusion layer $FD_1$ are the same as the operations of conventional amplification and selection transistors. Further, a series of operations including charge accumulation, reset operation, and charge transfer to be performed in a second imaging element and a third imaging element is similar to a series of conventional operations including charge accumulation, reset operation, and charge transfer, for example.

Figure 37:
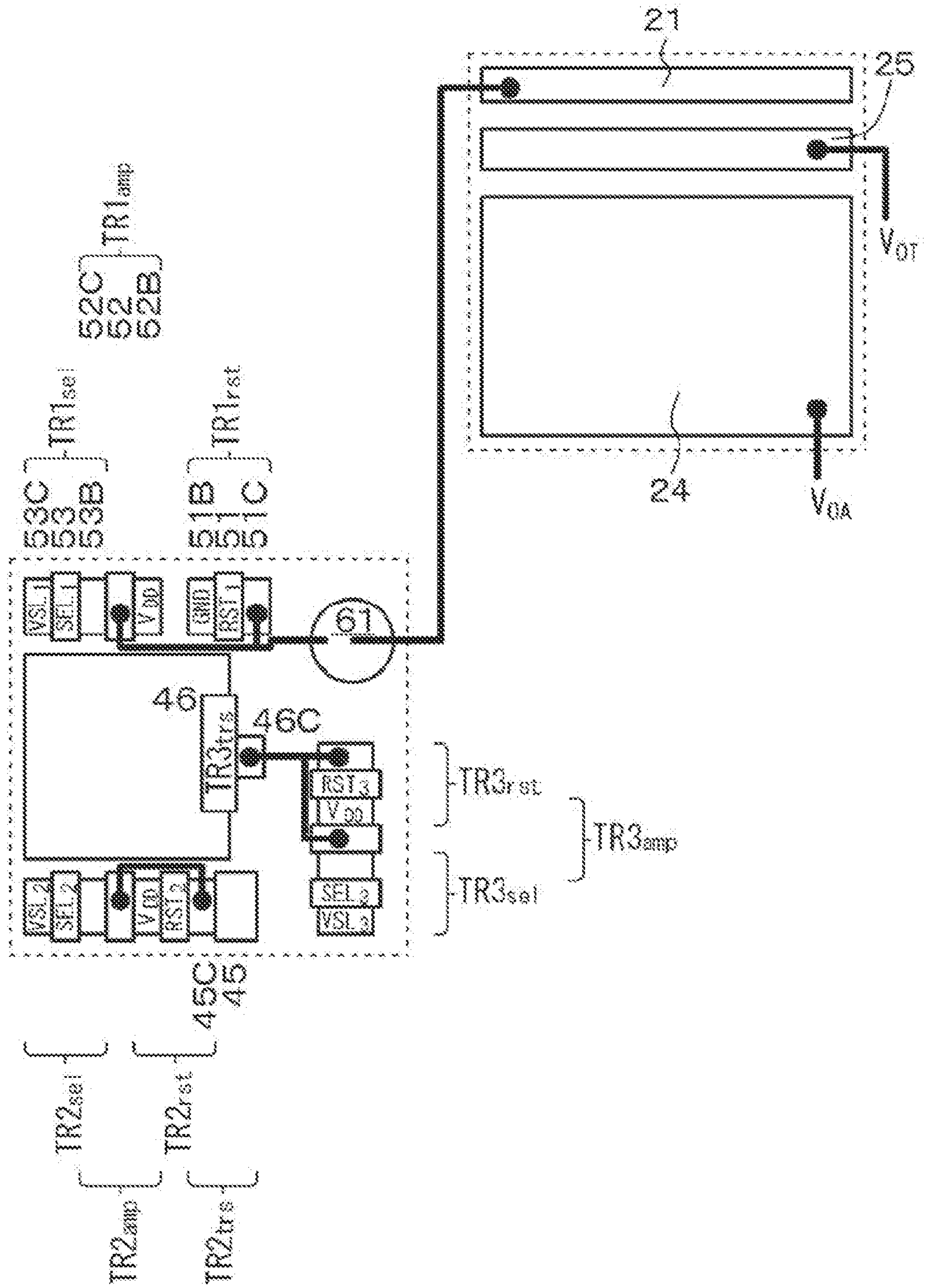
FIG. 37 is a schematic layout diagram of a first electrode, a transfer control electrode, a charge storage electrode, and the transistors constituting a control unit in a modification of an imaging element-A included in the imaging device of Example 11.

FIG. 37 shows a schematic layout diagram of the first electrode, the charge storage electrode, and the transistors constituting the control unit of a modification of the imaging element of Example 11. As shown in FIG. 37, the other source/drain region 51B of the reset transistor $TR1_{rst}$ may be grounded, instead of being connected to the power supply $V_{DD}$.

Example 12

Figure 38:
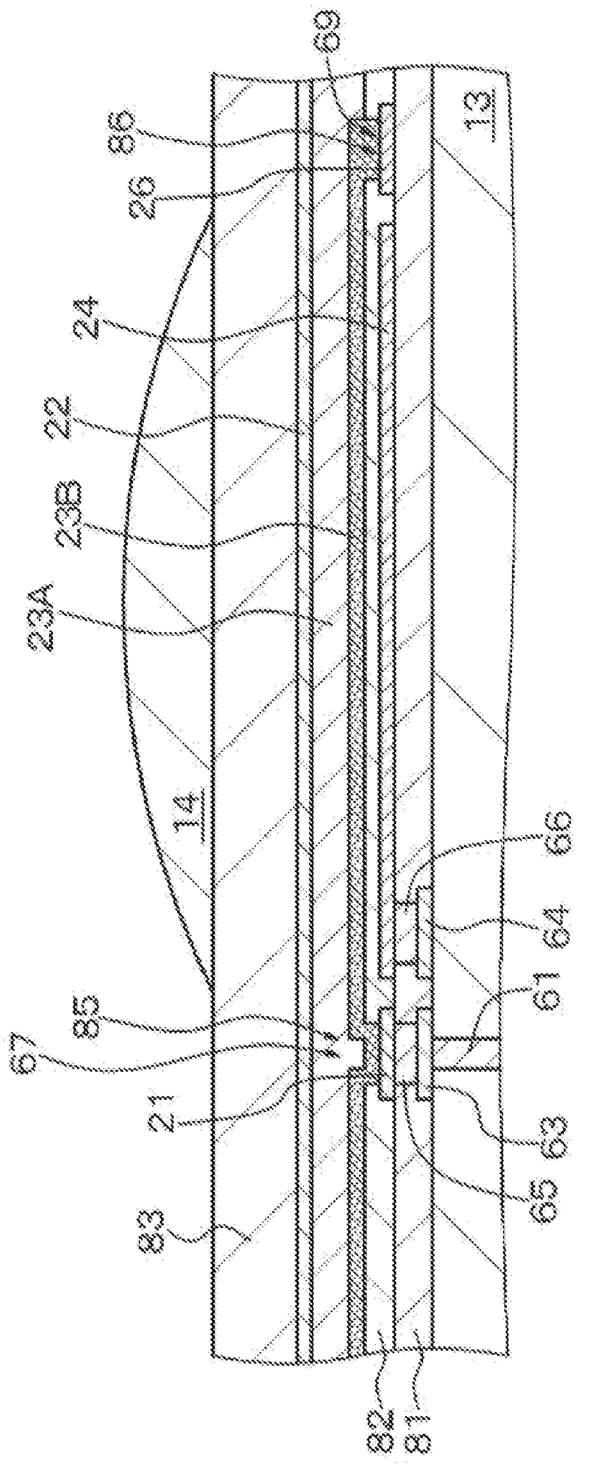
FIG. 38 is a schematic partial cross-sectional view of part of an imaging element-A included in an imaging device of Example 12.
Figure 39:
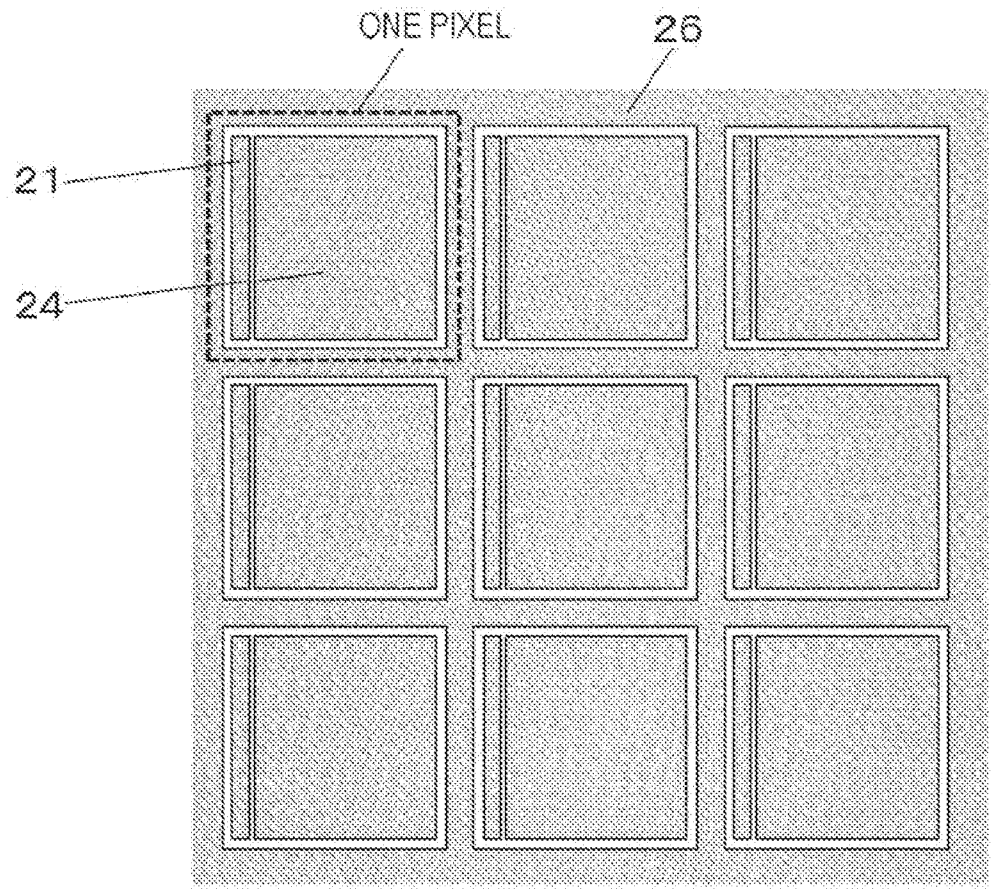
FIG. 39 is a schematic layout diagram of first electrodes, charge storage electrodes, and charge emission electrodes in the imaging elements-A constituting the imaging device of Example 12.
Figure 40:
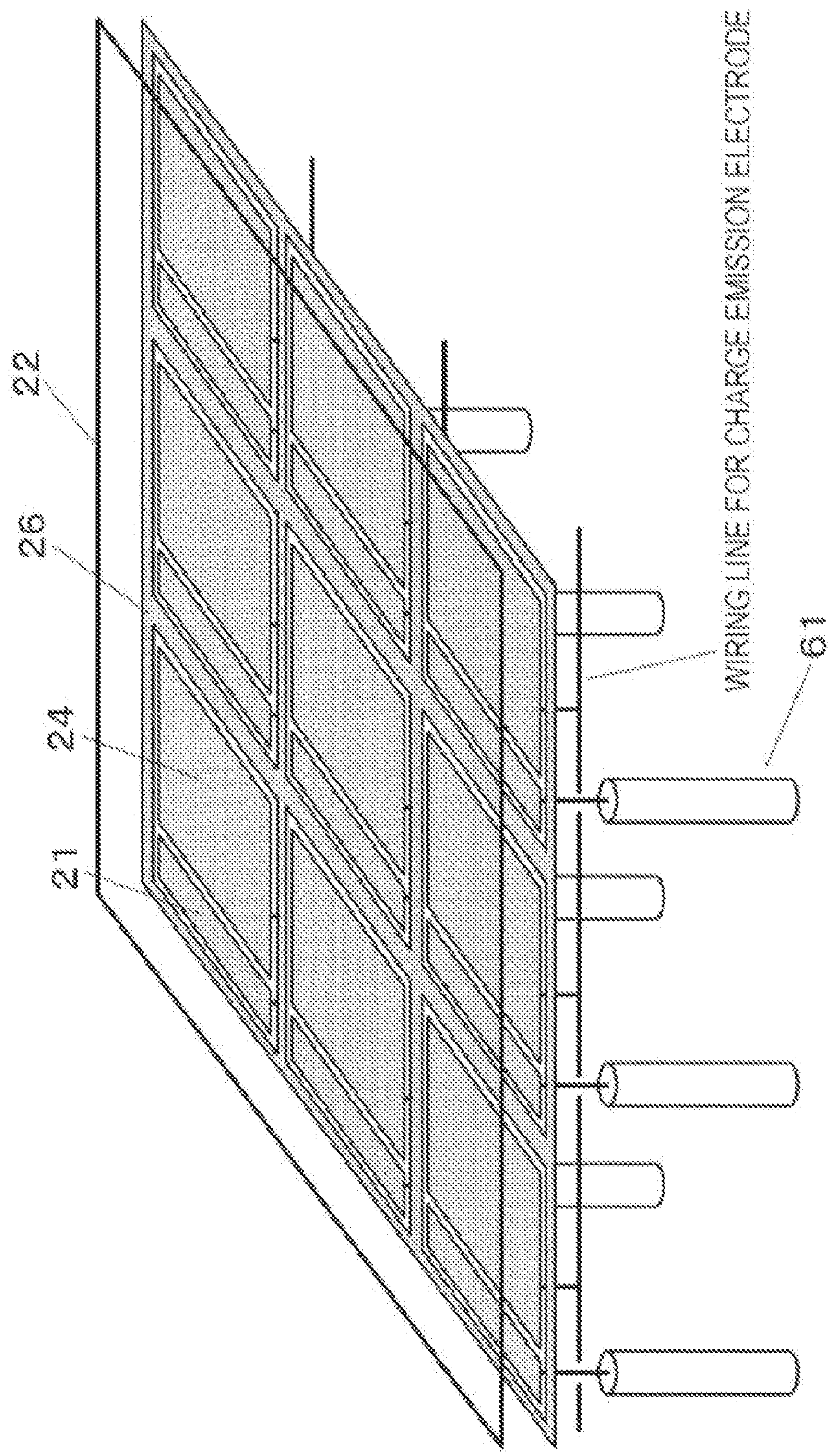
FIG. 40 is a schematic perspective view of first electrodes, charge storage electrodes, charge emission electrodes, second electrodes, and contact hole portions in the imaging elements-A constituting the imaging device of Example 12.

Example 12 is modifications of Examples 8 through 11, and relates to an imaging device or the like including a charge emission electrode. FIG. 38 shows a schematic partial cross-sectional view of part of an imaging element of Example 12. FIG. 39 shows a schematic layout diagram of the first electrode, the charge storage electrode, and the charge emission electrode that constitute the photoelectric conversion unit including the charge storage electrode of the imaging element of Example 12. FIG. 40 shows a schematic perspective view of the first electrode, the charge storage electrode, the charge emission electrode, the second electrode, and the contact hole portion.

In the imaging element of Example 12, a charge emission electrode 26 is further provided. The charge emission electrode 26 is connected to the oxide semiconductor material layer 23B via a connecting portion 69, and is disposed at a distance from the first electrode 21 and the charge storage electrode 24. Here, the charge emission electrode 26 is disposed so as to surround the first electrode 21 and the charge storage electrode 24 (or like a frame). The charge emission electrode 26 is connected to a pixel drive circuit that forms a drive circuit. The oxide semiconductor material layer 23B extends in the connecting portion 69. In other words, the oxide semiconductor material layer 23B extends in a second opening 86 formed in the insulating layer 82, and is connected to the charge emission electrode 26. The charge emission electrode 26 is shared (made common) by a plurality of imaging elements.

In Example 12, in a charge accumulation period, the drive circuit applies a potential $V_{11}$ to the first electrode 21, a potential $V_{12}$ to the charge storage electrode 24, and a potential $V_{14}$ to the charge emission electrode 26, and electric charges are accumulated in the oxide semiconductor material layer 23B and the like. Light that has entered the organic semiconductor material layer 23A causes photoelectric conversion in the organic semiconductor material layer 23A. Holes generated by the photoelectric conversion are sent from the second electrode 22 to the drive circuit via a wiring line $V_{OU}$.

Meanwhile, since the potential of the first electrode 21 is higher than the potential of the second electrode 22, or a positive potential is applied to the first electrode 21 while a negative potential is applied to the second electrode 22, for example, $V_{14}>V_{11}$ ($V_{12}>V_{14}>V_{11}$, for example). As a result, electrons generated by the photoelectric conversion are attracted to the charge storage electrode 24, and stay in the region of the oxide semiconductor material layer 23B and the like facing the charge storage electrode 24. Thus, the electrons can be reliably prevented from moving toward the first electrode 21. However, electrons not sufficiently attracted by the charge storage electrode 24, or electrons not accumulated in the oxide semiconductor material layer 23B and the like (so-called overflowed electrons) are sent to the drive circuit via the charge emission electrode 26.

A reset operation is performed in the latter period in the charge accumulation period. As a result, the potential of the first floating diffusion layer $FD_1$ is reset, and the potential of the first floating diffusion layer $FD_1$ becomes equal to the potential $V_{DD}$ of the power supply.

After completion of the reset operation, the electric charges are read out. In other words, in a charge transfer period, the drive circuit applies a potential $V_{21}$ to the first electrode 21, a potential $V_{22}$ to the charge storage electrode 24, and a potential $V_{24}$ to the charge emission electrode 26. Here, $V_{24}<V_{21}$ ($V_{24}<V_{22}<V_{21}$, for example). As a result, the electrons remaining in the region of the oxide semiconductor material layer 23B and the like facing the charge storage electrode 24 are read into the first electrode 21 and further into the first floating diffusion layer $FD_1$ without fail. In other words, the electric charges accumulated in the oxide semiconductor material layer 23B and the like are read into the control unit.

In the above manner, a series of operations including charge accumulation, reset operation, and charge transfer is completed.

The operations of the amplification transistor $TR1_{amp}$ and the selection transistor $TR1_{sel}$ after the electrons are read into the first floating diffusion layer $FD_1$ are the same as the operations of conventional amplification and selection transistors. Further, a series of operations including charge accumulation, reset operation, and charge transfer to be performed in a second imaging element and a third imaging element is similar to a series of conventional operations including charge accumulation, reset operation, and charge transfer, for example.

In Example 12, so-called overflowed electrons are sent to the drive circuit via the charge emission electrode 26, so that leakage into the charge storage portions of the adjacent pixels can be reduced, and blooming can be prevented. As a result, the imaging performance of the imaging element can be improved.

Example 13

Example 13 is modifications of Examples 8 through 12, and relates to an imaging device or the like including a plurality of charge storage electrode segments.

Figure 16C:
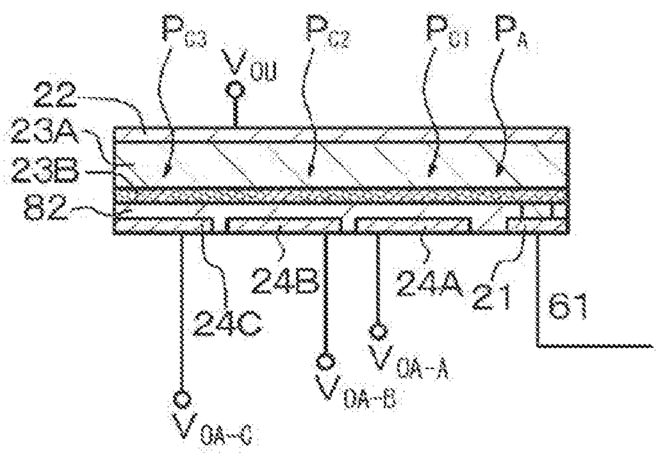
Figure 41:
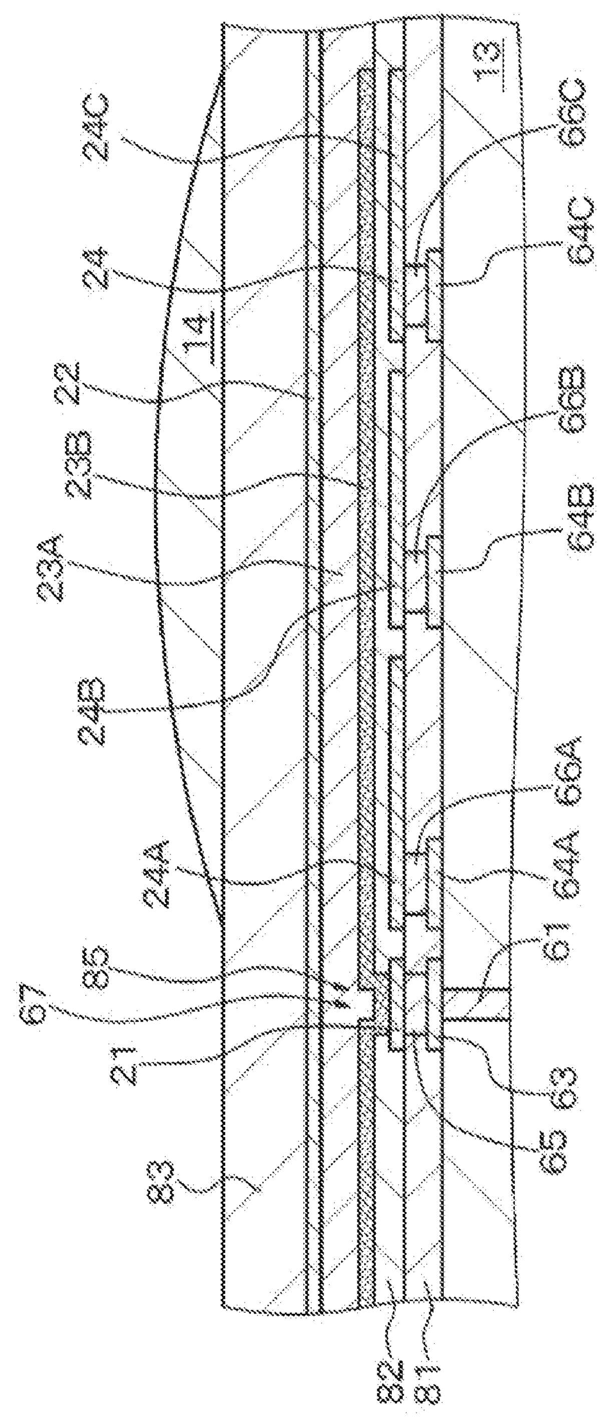
FIG. 41 is a schematic partial cross-sectional view of an imaging element-A included in an imaging device of Example 13.
Figure 42:
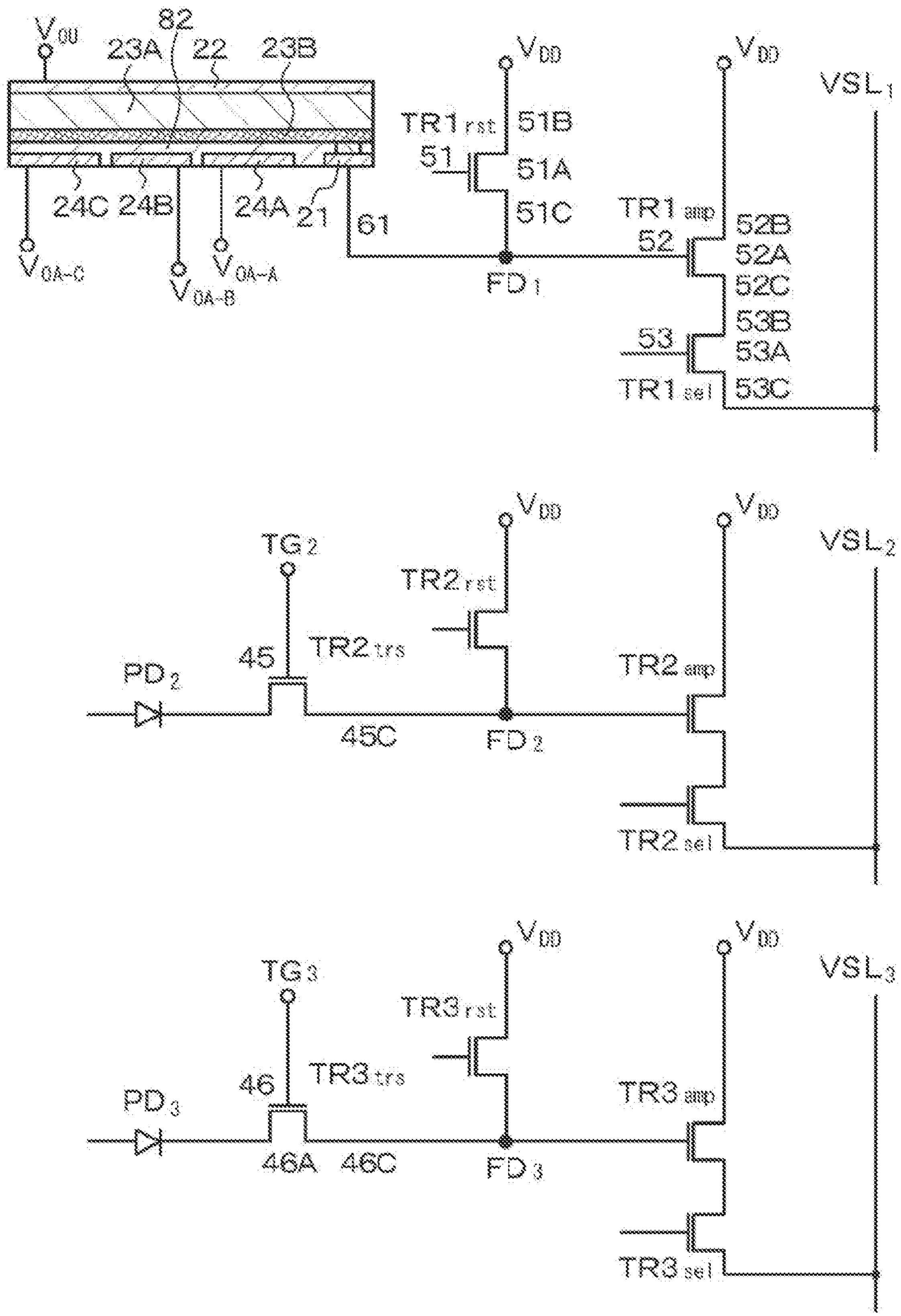
FIG. 42 is an equivalent circuit diagram of an imaging element-A included in the imaging device of Example 13.
Figure 43:
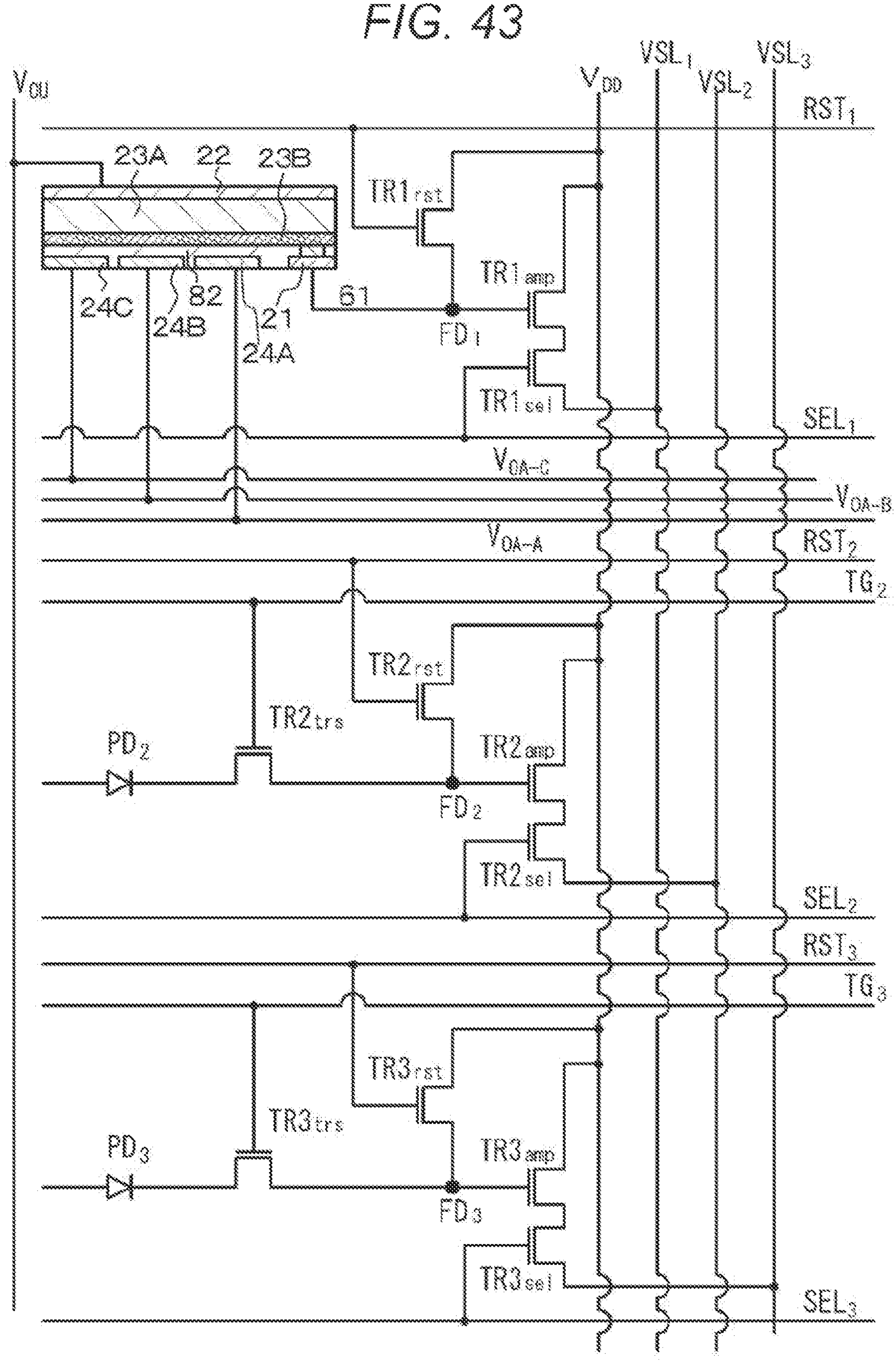
FIG. 43 is an equivalent circuit diagram of an imaging element-A included in the imaging device of Example 13.
Figure 44:
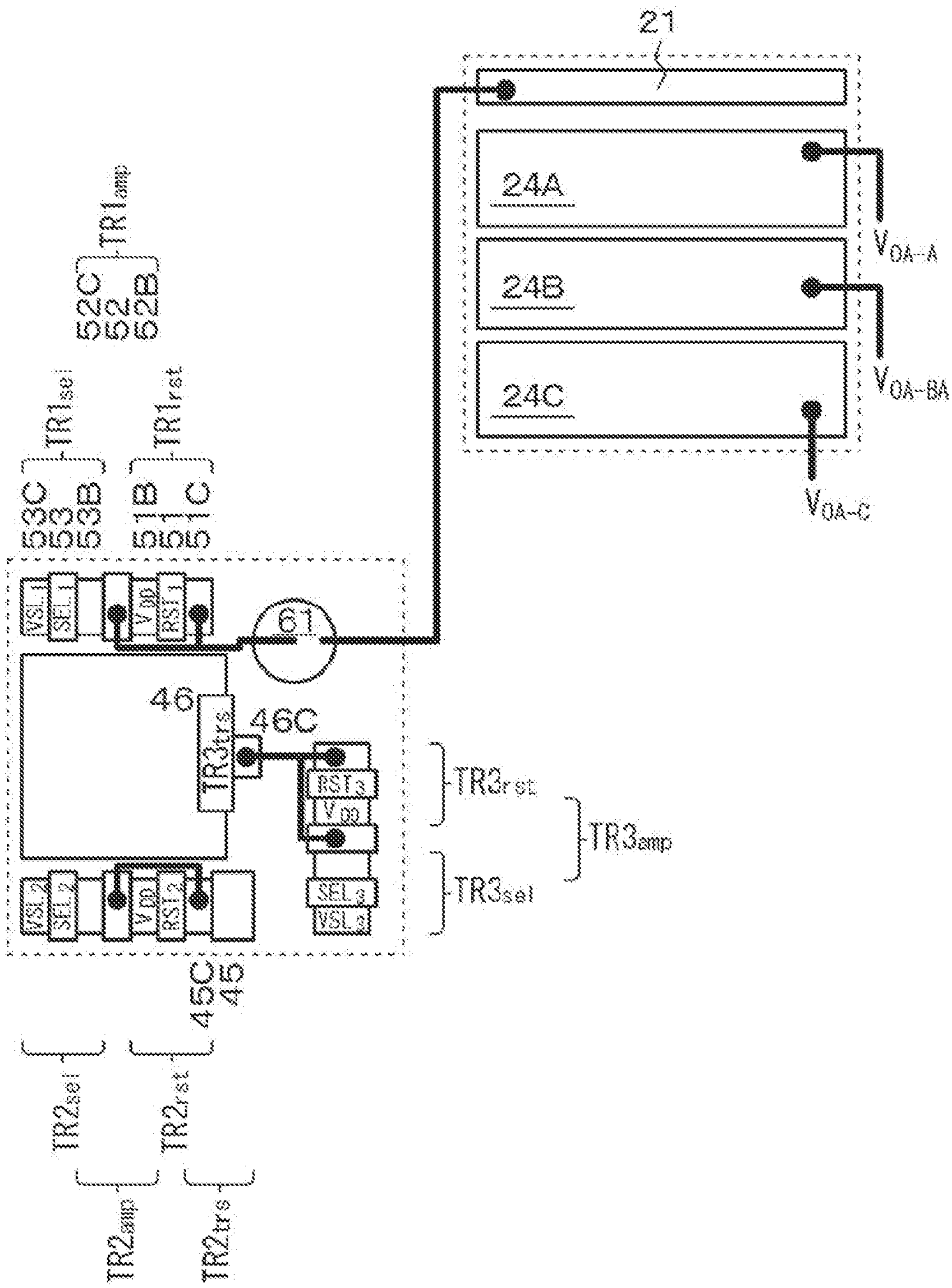
FIG. 44 is a schematic layout diagram of a first electrode, charge storage electrodes, and the transistors constituting a control unit in an imaging element-A included in the imaging device of Example 13.
Figure 46:
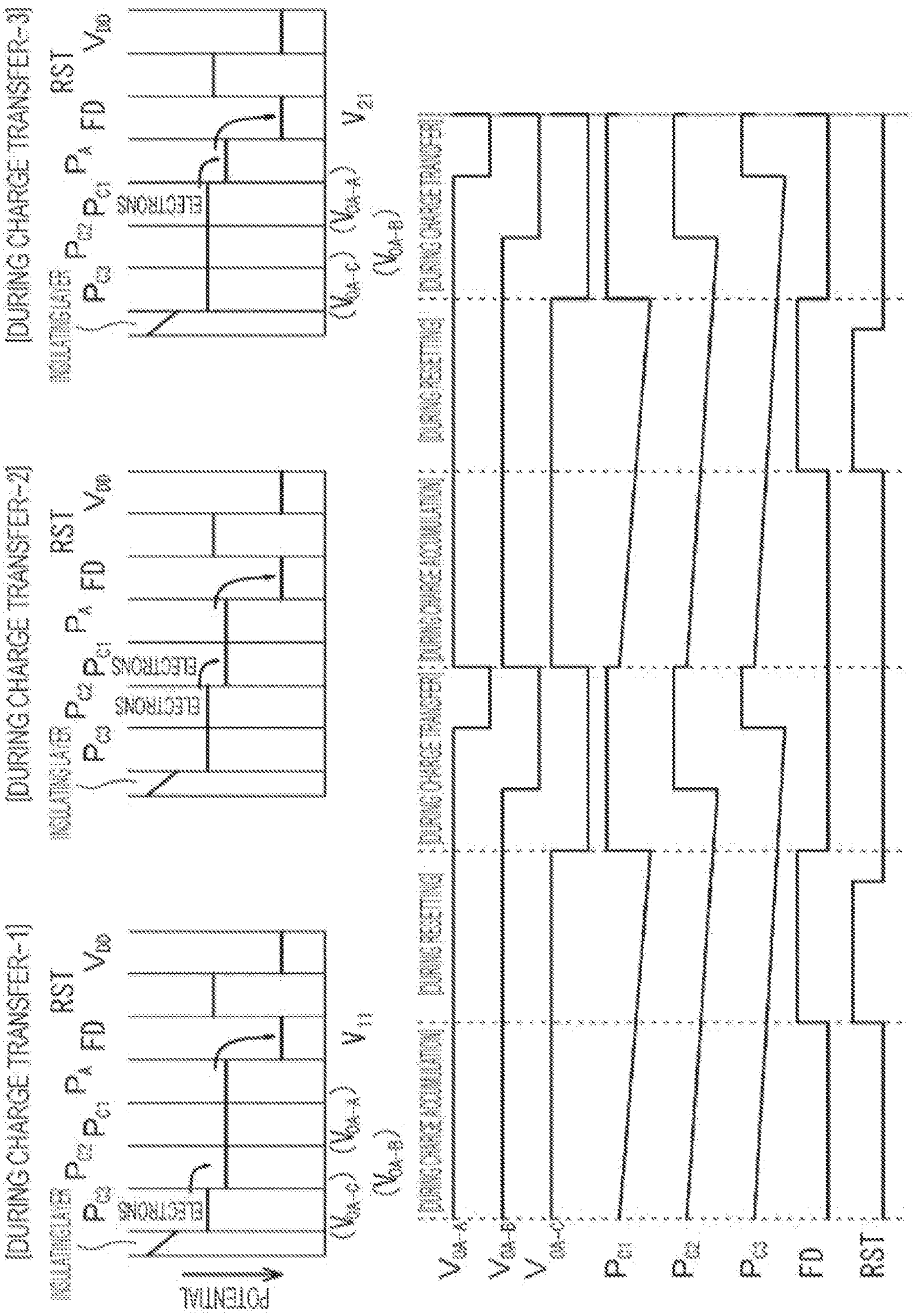
FIG. 46 is a diagram schematically showing the states of the potentials at respective portions during another operation (during a transfer operation) of an imaging element-A included in the imaging device of Example 13.
Figure 47:
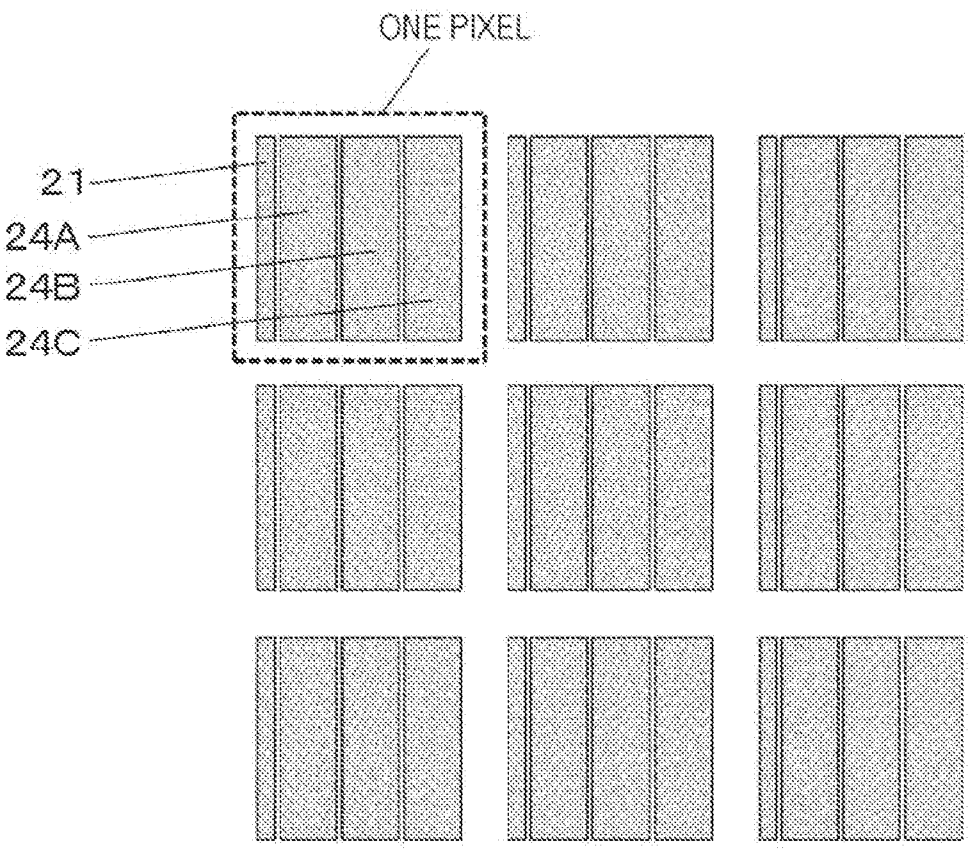
FIG. 47 is a schematic layout diagram of first electrodes and charge storage electrodes in the imaging elements-A constituting the imaging device of Example 13.
Figure 48:
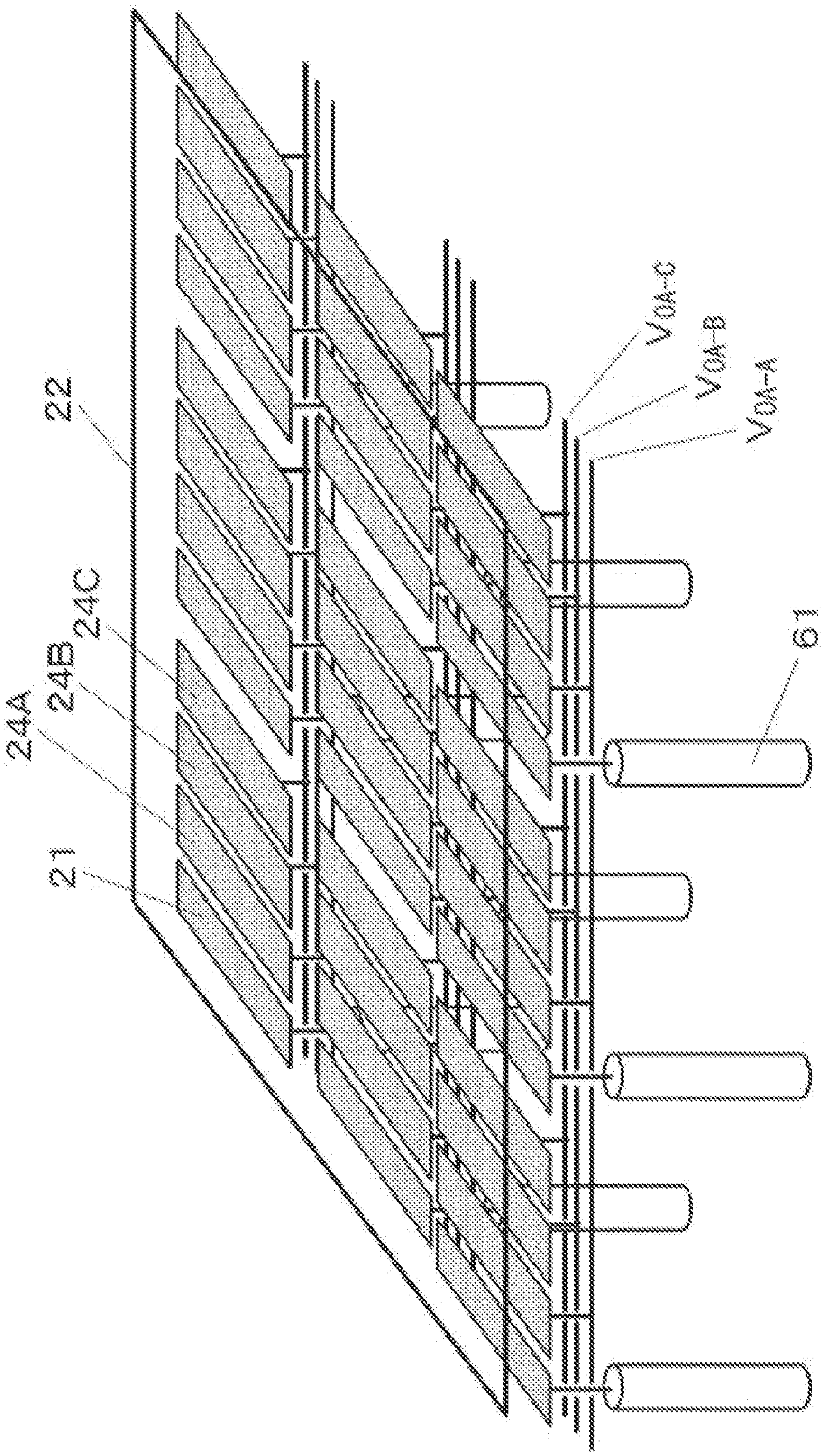
FIG. 48 is a schematic perspective view of first electrodes, charge storage electrodes, second electrodes, and contact hole portions in the imaging elements-A constituting the imaging device of Example 13.

FIG. 41 shows a schematic partial cross-sectional view of part of an imaging element of Example 13. FIGS. 42 and 43 show equivalent circuit diagrams of imaging elements of Example 13. FIG. 44 shows a schematic layout diagram of a first electrode and a charge storage electrode that constitute a photoelectric conversion unit including the charge storage electrode of the imaging element of Example 13, and the transistors that constitute a control unit. FIGS. 45 and 46 schematically show the states of the potentials at respective portions during an operation of the imaging element of Example 13. FIG. 16C shows an equivalent circuit diagram for explaining the respective portions of the imaging element of Example 13. Further, FIG. 47 shows a schematic layout diagram of the first electrode and the charge storage electrode that constitute the photoelectric conversion unit including the charge storage electrode of the imaging element of Example 13. FIG. 48 shows a schematic perspective view of the first electrode, the charge storage electrode, the second electrode, and the contact hole portion.

In Example 13, the charge storage electrode 24 is formed with a plurality of charge storage electrode segments 24A, 24B, and 24C. The number of charge storage electrode segments is only required to be two or larger, and is "three" in Example 13. Further, in the imaging element of Example 13, the potential of the first electrode 21 is higher than the potential of the second electrode 22, or a positive potential is applied to the first electrode 21 while a negative potential is applied to the second electrode 22, for example. Further, in a charge transfer period, the potential to be applied to the charge storage electrode segment 24A located closest to the first electrode 21 is higher than the potential to be applied to the charge storage electrode segment 24C located farthest from the first electrode 21. As such a potential gradient is formed in the charge storage electrode 24, electrons remaining in the region of the oxide semiconductor material layer 23B and the like facing the charge storage electrode 24 are read into the first electrode 21 and further into the first floating diffusion layer $FD_1$ with higher reliability. In other words, the electric charges accumulated in the oxide semiconductor material layer 23B and the like are read into the control unit.

Figure 45:
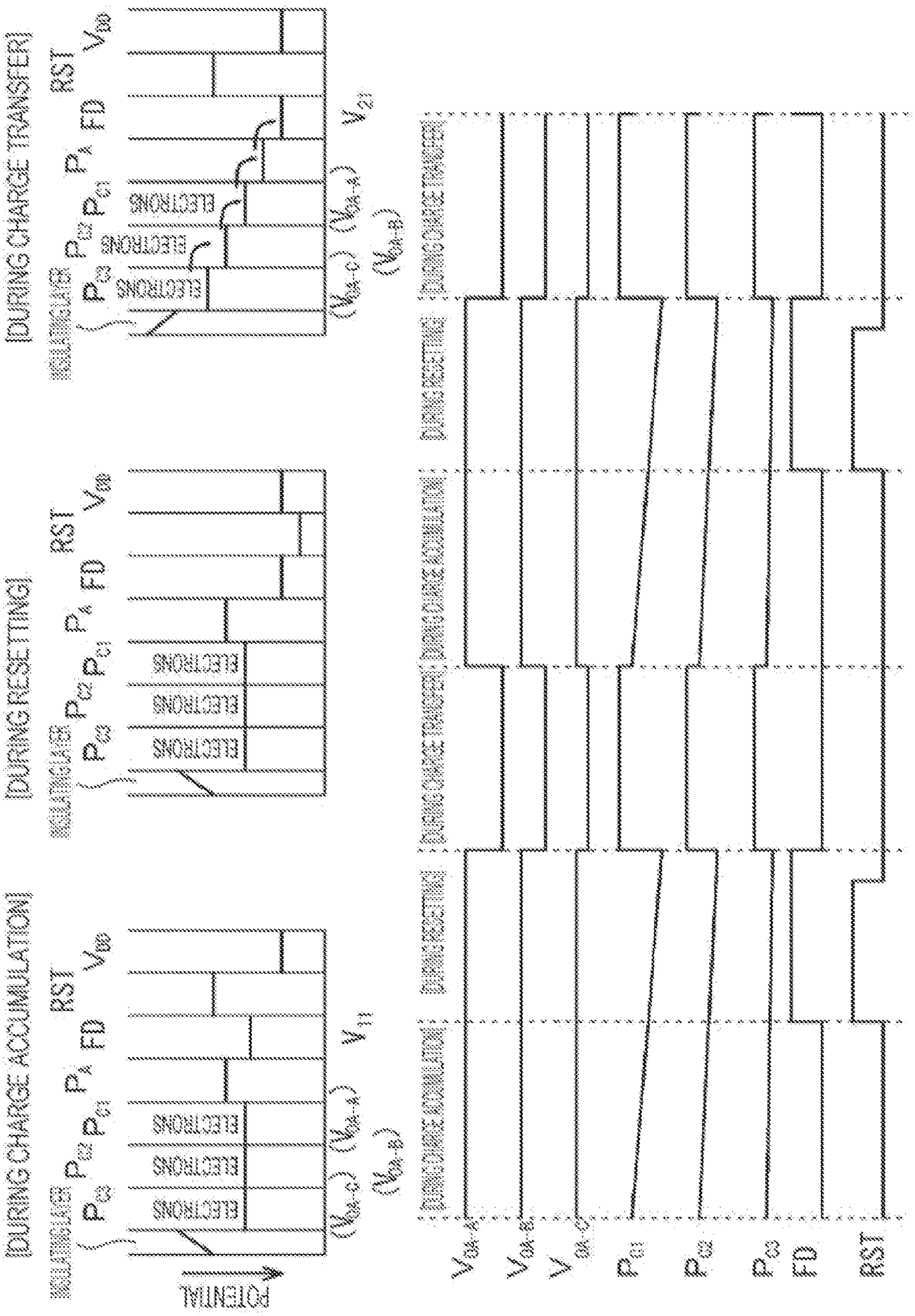
FIG. 45 is a diagram schematically showing the states of the potentials at respective portions during an operation of an imaging element-A included in the imaging device of Example 13.

In an example shown in FIG. 45, in a charge transfer period, the potential of the charge storage electrode segment 24C <the potential of the charge storage electrode segment 24B <the potential of the charge storage electrode segment 24A. With this arrangement, the electrons remaining in the region of the oxide semiconductor material layer 23B and the like are simultaneously read into the first floating diffusion layer $FD_1$. In an example shown in FIG. 46, on the other hand, in a charge transfer period, the potential of the charge storage electrode segment 24C, the potential of the charge storage electrode segment 24B, and the potential of the charge storage electrode segment 24A are gradually varied (in other words, varied in a stepwise or slope-like manner). With this arrangement, the electrons remaining in the region of the oxide semiconductor material layer 23B and the like facing the charge storage electrode segment 24C are moved to the region of the oxide semiconductor material layer 23B and the like facing the charge storage electrode segment 24B, the electrons remaining in the region of the oxide semiconductor material layer 23B and the like facing the charge storage electrode segment 24B are then moved to the region of the oxide semiconductor material layer 23B and the like facing the charge storage electrode segment 24A, and the electrons remaining in the region of the oxide semiconductor material layer 23B and the like facing the charge storage electrode segment 24A are then read into the first floating diffusion layer $FD_1$ without fail.

Figure 49:
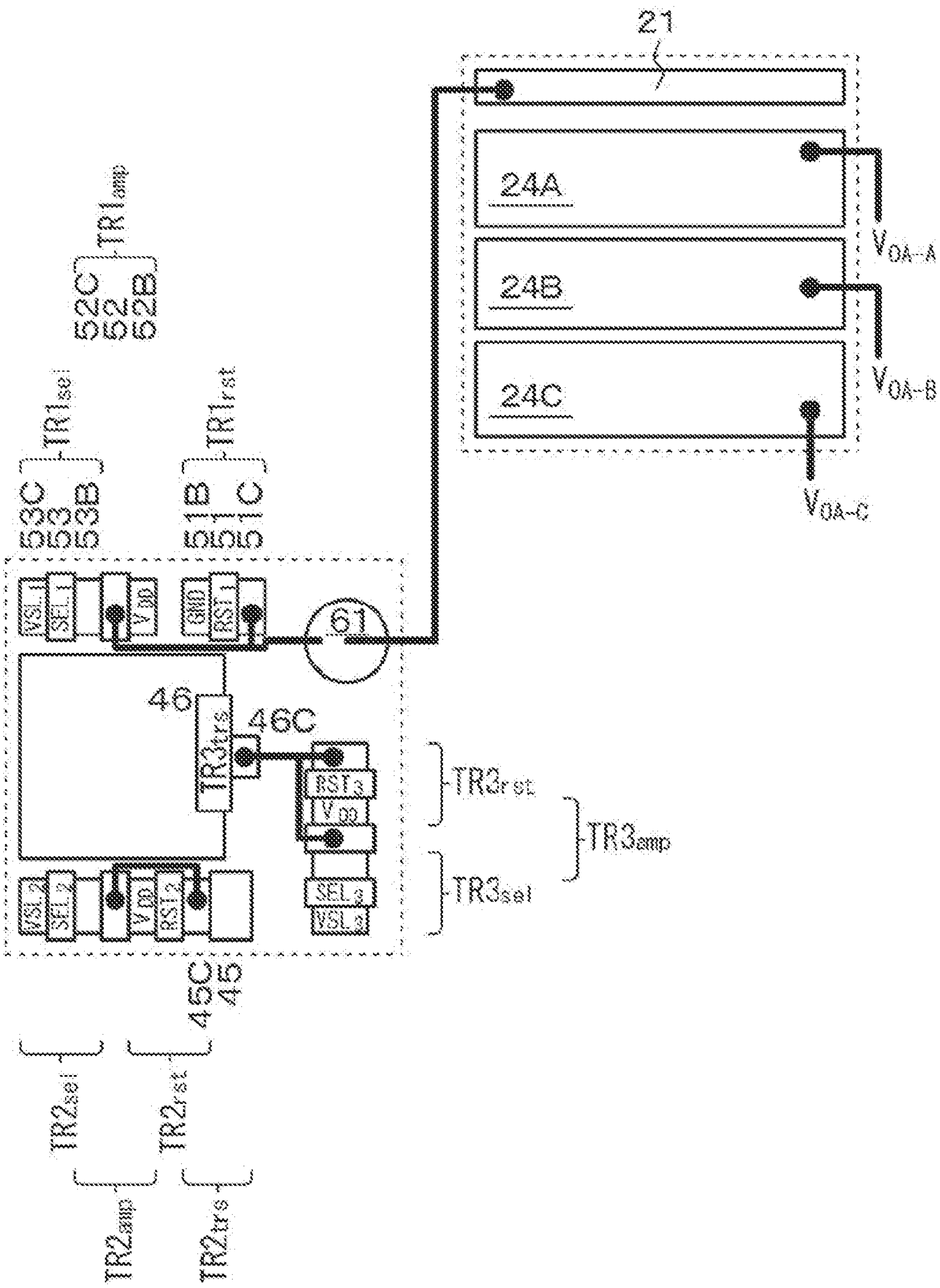
FIG. 49 is a schematic layout diagram of a first electrode and charge storage electrodes in a modification of an imaging element-A included in the imaging device of Example 13.

FIG. 49 shows a schematic layout diagram of the first electrode, the charge storage electrode, and the transistors constituting the control unit of a modification of the imaging element of Example 13. As shown in FIG. 49, the other source/drain region 51B of the reset transistor $TR1_{rst}$ may be grounded, instead of being connected to the power supply $V_{DD}$.

Example 14

Example 14 is modifications of Examples 8 through 13, and relates to imaging elements of the first configuration and the sixth configuration.

Figure 50:
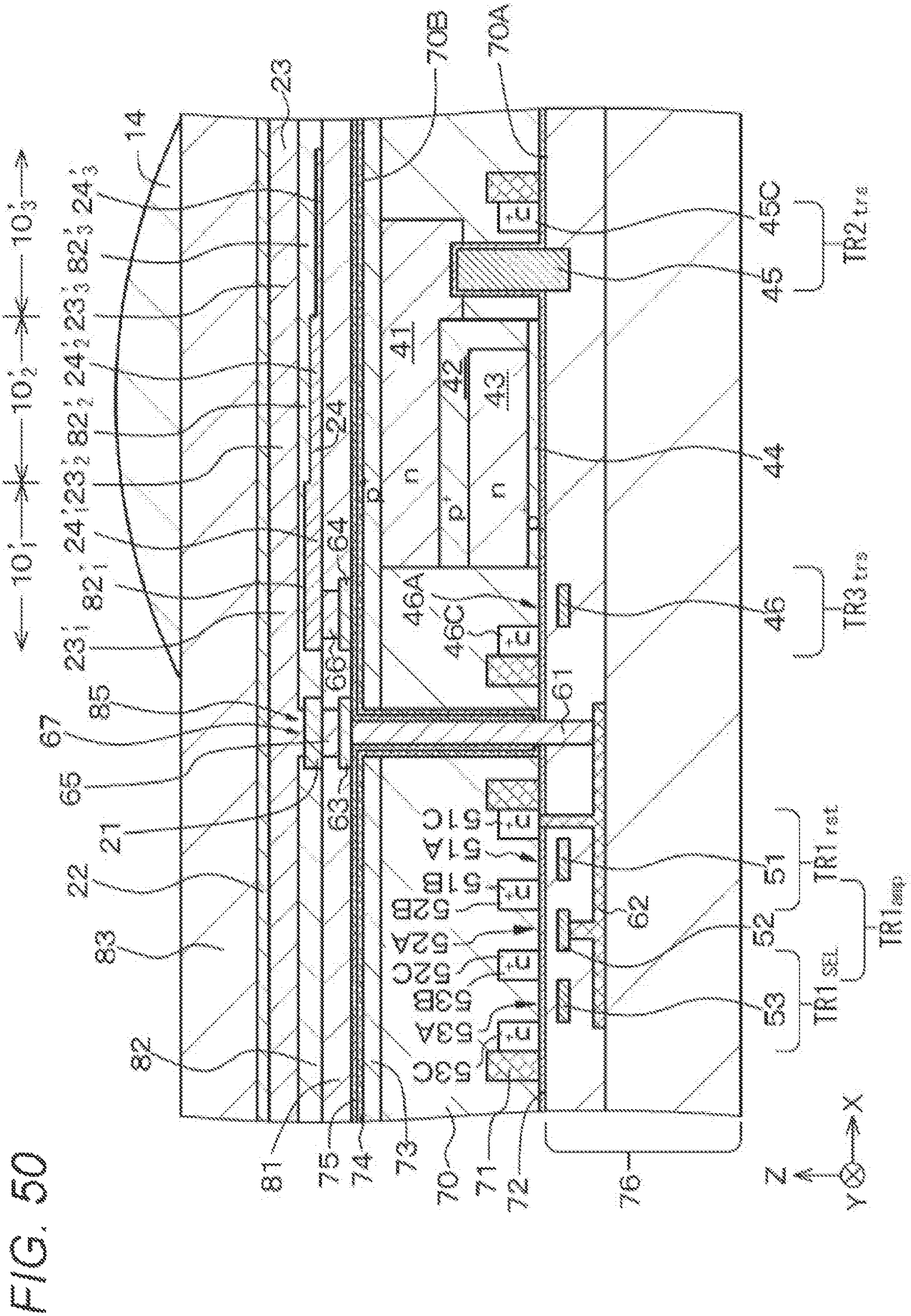
FIG. 50 is a schematic partial cross-sectional view of an imaging element-A included in an imaging device of Example 14.
Figure 51:
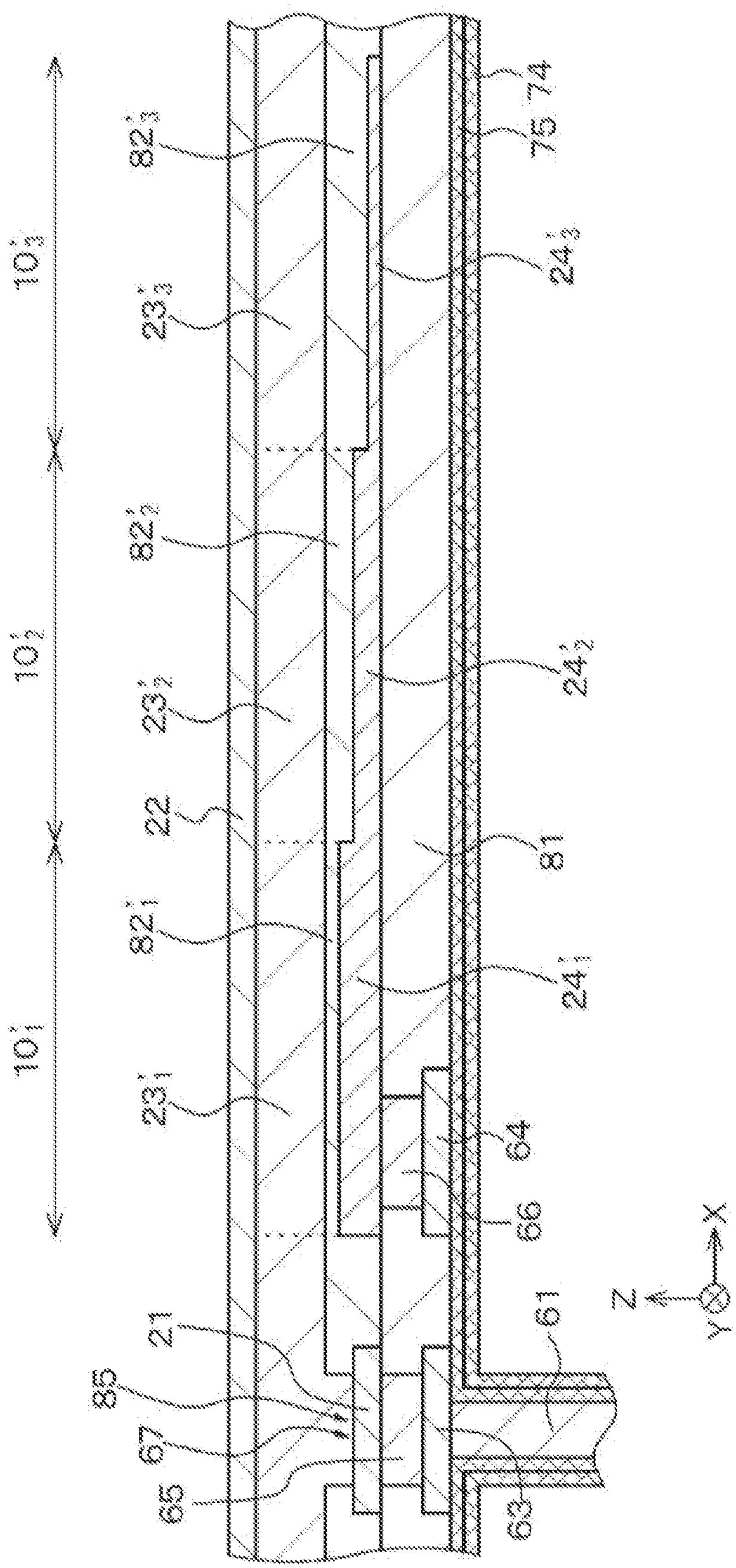
FIG. 51 is a schematic partial cross-sectional view showing an enlarged view of the portion in which a charge storage electrode, a photoelectric conversion layer, and a second electrode are stacked in an imaging element-A included in the imaging device of Example 14.

FIG. 50 shows a schematic partial cross-sectional view of an imaging element of Example 14. FIG. 51 shows a schematic partial enlarged cross-sectional view of a portion in which a charge storage electrode, an inorganic oxide semiconductor material layer, an organic semiconductor material layer, and a second electrode are stacked. An equivalent circuit diagram of an imaging element of Example 14 is similar to the equivalent circuit diagram of an imaging element of Example 8 described with reference to FIGS. 19 and 20. A schematic layout diagram of the first electrode and the charge storage electrode constituting the photoelectric conversion unit including the charge storage electrode, and the transistors constituting the control unit of an imaging element of Example 14 is similar to that of an imaging element of Example 8 described with reference to FIG. 21. Further, operation of an imaging element (a first imaging element) of Example 14 is substantially similar to operation of an imaging element of Example 8.

Here, in an imaging element of Example 14 or in each imaging element of Examples 15 through 19 described later,

- a photoelectric conversion unit is formed with N (N≥2) photoelectric conversion unit segments (specifically, three photoelectric conversion unit segments $\mathbf{10'}_1$, $\mathbf{10'}_2$, and $\mathbf{10'}_3$),
- the oxide semiconductor material layer 23B and the organic semiconductor material layer 23A are formed with N photoelectric conversion layer segments (specifically, three photoelectric conversion layer segments $\mathbf{23'}_1$, $\mathbf{23'}_2$, and $\mathbf{23'}_3$), and
- the insulating layer 82 is formed with N insulating layer segments (specifically, three insulating layer segments $\mathbf{82'}_1$, $\mathbf{82'}_2$, and $\mathbf{82'}_3$).

In Examples 14 through 16, the charge storage electrode 24 is formed with N charge storage electrode segments (specifically, three charge storage electrode segments $\mathbf{24'}_1$, $\mathbf{24'}_2$, and $\mathbf{24'}_3$ in each of these Example).

In Examples 17 and 18, and in Example 16 in some cases, the charge storage electrode 24 is formed with N charge storage electrode segments (specifically, three charge storage electrode segments $\mathbf{24'}_1$, $\mathbf{24'}_2$, and $\mathbf{24'}_3$) that are disposed at a distance from one another,

- the nth (n=1, 2, 3, . . . N) photoelectric conversion unit segment $\mathbf{10'}_n$ is formed with the nth charge storage electrode segment $\mathbf{24'}_n$, the nth insulating layer segment $\mathbf{82'}_n$, and the nth photoelectric conversion layer segment $\mathbf{23'}_n$, and
- a photoelectric conversion unit segment having a larger value for n is located farther away from the first electrode 21. Here, the photoelectric conversion layer segments $\mathbf{23'}_1$, $\mathbf{23'}_2$, and $\mathbf{23'}_3$ refer to segments formed by stacking an organic semiconductor material layer and an inorganic oxide semiconductor material layer, but are shown as one layer in the drawings, for simplification. The same applies in the description below.

Note that, in the photoelectric conversion layer segments, the thickness of the portion of the photoelectric conversion layer may be varied, and the thickness of the portion of the inorganic oxide semiconductor material layer may be made constant, so that the thicknesses of the photoelectric conversion layer segments vary. The thickness of the portion of the photoelectric conversion layer may be made constant, and the thickness of the portion of the inorganic oxide semiconductor material layer may be varied, so that the thicknesses of the photoelectric conversion layer segments vary. The thickness of the portion of the photoelectric conversion layer may be varied, and the thickness of the portion of the inorganic oxide semiconductor material layer may be varied, so that the thicknesses of the photoelectric conversion layer segments vary.

Alternatively, an imaging element of Example 14, or in an imaging element of Example 15 or Example 18 described later further includes

- a photoelectric conversion unit in which the first electrode 21, the oxide semiconductor material layer 23B, the organic semiconductor material layer 23A, and the second electrode 22 are stacked.

The photoelectric conversion unit further includes the charge storage electrode 24 that is disposed at a distance from the first electrode 21, and is positioned to face the oxide semiconductor material layer 23B via the insulating layer 82.

Where the stacking direction of the charge storage electrode 24, the insulating layer 82, the oxide semiconductor material layer 23B, and the organic semiconductor material layer 23A is the Z direction, and the direction away from the first electrode 21 is the X direction, cross-sectional areas of the stacked portions of the charge storage electrode 24, the insulating layer 82, the oxide semiconductor material layer 23B, and the organic semiconductor material layer 23A taken along a Y-Z virtual plane vary depending on the distance from the first electrode.

Further, in an imaging element of Example 14, the thicknesses of the insulating layer segments gradually vary from the first photoelectric conversion unit segment $\mathbf{10'}_1$ to the Nth photoelectric conversion unit segment $\mathbf{10'}_N$. Specifically, the thicknesses of the insulating layer segments are made gradually greater. Alternatively, in an imaging element of Example 14, the widths of cross-sections of the stacked portions are constant, and the thickness of a cross-section of a stacked portion, or specifically, the thickness of an insulating layer segment gradually increases depending on the distance from the first electrode 21. Note that the thicknesses of the insulating layer segments are increased stepwise. The thickness of the insulating layer segment $\mathbf{82'}_n$ in the nth photoelectric conversion unit segment $\mathbf{10'}_n$ is constant. Where the thickness of the insulating layer segment $\mathbf{82'}_n$ in the nth photoelectric conversion unit segment $\mathbf{10'}_n$ is "1", the thickness of the insulating layer segment $\mathbf{82'}_{(n+1)}$ in the (n+1)th photoelectric conversion unit segment $\mathbf{10'}_{(n+1)}$ may be 2 to 10, for example, but is not limited to such values. In Example 14, the thicknesses of the charge storage electrode segments $\mathbf{24'}_1$, $\mathbf{24'}_2$, and $\mathbf{24'}_3$ are made to become gradually smaller, so that the thicknesses of the insulating layer segments $\mathbf{82'}_1$, $\mathbf{82'}_2$, and $\mathbf{82'}_3$ become gradually greater. The thicknesses of the photoelectric conversion layer segments $\mathbf{23'}_1$, $\mathbf{23'}_2$, and $\mathbf{23'}_3$ are uniform.

In the description below, operation of the imaging element of Example 14 is described.

In a charge accumulation period, the drive circuit applies a potential $V_{11}$ to the first electrode 21, and a potential $V_{12}$ to the charge storage electrode 24. Light that has entered the organic semiconductor material layer 23A causes photoelectric conversion in the organic semiconductor material layer 23A. Holes generated by the photoelectric conversion are sent from the second electrode 22 to the drive circuit via a wiring line $V_{OU}$. Meanwhile, since the potential of the first electrode 21 is higher than the potential of the second electrode 22, or a positive potential is applied to the first electrode 21 while a negative potential is applied to the second electrode 22, for example, $V_{12} \geq V_{11}$, or preferably, $V_{12} > V_{11}$. As a result, electrons generated by the photoelectric conversion are attracted to the charge storage electrode 24, and stay in the region of the oxide semiconductor material layer 23B and the like facing the charge storage electrode 24. That is, electric charges are accumulated in the oxide semiconductor material layer 23B and the like. Since $V_{12} > V_{11}$, electrons generated in the organic semiconductor material layer 23A will not move toward the first electrode 21. With the passage of time for photoelectric conversion, the potential in the region of the oxide semiconductor material layer 23B and the like facing the charge storage electrode 24 becomes a more negative value.

The imaging element of Example 14 has a configuration in which the thicknesses of the insulating layer segments gradually increase. Accordingly, in a charge accumulation period, when $V_{12} \geq V_{11}$, the nth photoelectric conversion unit segment $\mathbf{10'}_n$ can store more electric charges than the (n+1)th photoelectric conversion unit segment $\mathbf{10'}_{(n+1)}$, and a strong electric field is applied so that electric charges can be reliably prevented from flowing from the first photoelectric conversion unit segment 10'$_1$ toward the first electrode 21.

A reset operation is performed in the latter period in the charge accumulation period. As a result, the potential of the first floating diffusion layer $FD_1$ is reset, and the potential of the first floating diffusion layer $FD_1$ becomes equal to the potential $V_{DD}$ of the power supply.

After completion of the reset operation, the electric charges are read out. In other words, in a charge transfer period, the drive circuit applies a potential $V_{21}$ to the first electrode 21, and a potential $V_{22}$ to the charge storage electrode 24. Here, $V_{21}>V_{22}$. As a result, the electrons remaining in the region of the oxide semiconductor material layer 23B and the like facing the charge storage electrode 24 are read into the first electrode 21 and further into the first floating diffusion layer $FD_1$. In other words, the electric charges accumulated in the oxide semiconductor material layer 23B and the like are read into the control unit.

More specifically, when $V_{21}>V_{22}$ in a charge transfer period, it is possible to reliably secure the flow of electric charges from the first photoelectric conversion unit segment 10'$_1$ toward the first electrode 21, and the flow of electric charges from the (n+1)th photoelectric conversion unit segment 10'$_{(n+1)}$ toward the nth photoelectric conversion unit segment 10'$_n$.

In the above manner, a series of operations including charge accumulation, reset operation, and charge transfer is completed.

In the imaging element of Example 14, a kind of charge transfer gradient is formed, and the electric charges generated through photoelectric conversion can be transferred more easily and reliably, because the thicknesses of the insulating layer segments gradually vary from the first photoelectric conversion unit segment to the Nth photoelectric conversion unit segment, or because the cross-sectional areas of the stacked portions of the charge storage electrode, the insulating layer, the inorganic oxide semiconductor material layer, and the organic semiconductor material layer taken along the Y-Z virtual plane vary depending on the distance from the first electrode.

Imaging elements of Example 14 can be manufactured by a method substantially similar to the method for manufacturing imaging elements of Example 8, and therefore, detailed explanation thereof is not made herein.

Note that, in an imaging element of Example 14, to form the first electrode 21, the charge storage electrode 24, and the insulating layer 82, a conductive material layer for forming the charge storage electrode 24'$_3$ is first formed on the interlayer insulating layer 81, and patterning is performed on the conductive material layer, to leave the conductive material layer in the regions in which the photoelectric conversion unit segments 10'$_1$, 10'$_2$, and 10'$_3$ and the first electrode 21 are to be formed. In this manner, part of the first electrode 21 and the charge storage electrode 24'$_3$ can be obtained. An insulating layer for forming the insulating layer segment 82'$_3$ is then formed on the entire surface, patterning is performed on the insulating layer, and a planarization process is performed, to obtain the insulating layer segment 82'$_3$. A conductive material layer for forming the charge storage electrode 24'$_2$ is then formed on the entire surface, and patterning is performed on the conductive material layer, to leave the conductive material layer in the regions in which the photoelectric conversion unit segments 10'$_1$ and 10'$_2$ and the first electrode 21 are to be formed. In this manner, part of the first electrode 21 and the charge storage electrode 24'$_2$ can be obtained. An insulating layer for forming the insulating layer segment 82'$_2$ is then formed on the entire surface, patterning is performed on the insulating layer, and a planarization process is performed, to obtain the insulating layer segment 82'$_2$. A conductive material layer for forming the charge storage electrode 24'$_1$ is then formed on the entire surface, and patterning is performed on the conductive material layer, to leave the conductive material layer in the regions in which the photoelectric conversion unit segment 10'$_1$ and the first electrode 21 are to be formed. In this manner, the first electrode 21 and the charge storage electrode 24'$_1$ can be obtained. An insulating layer is then formed on the entire surface, and a planarization process is performed, to obtain the insulating layer segment 82'$_1$ (the insulating layer 82). The oxide semiconductor material layer 23B and the organic semiconductor material layer 23A are then formed on the insulating layer 82. Thus, the photoelectric conversion unit segments 10'$_1$, 10'$_2$, and 10'$_3$ can be obtained.

Figure 52:
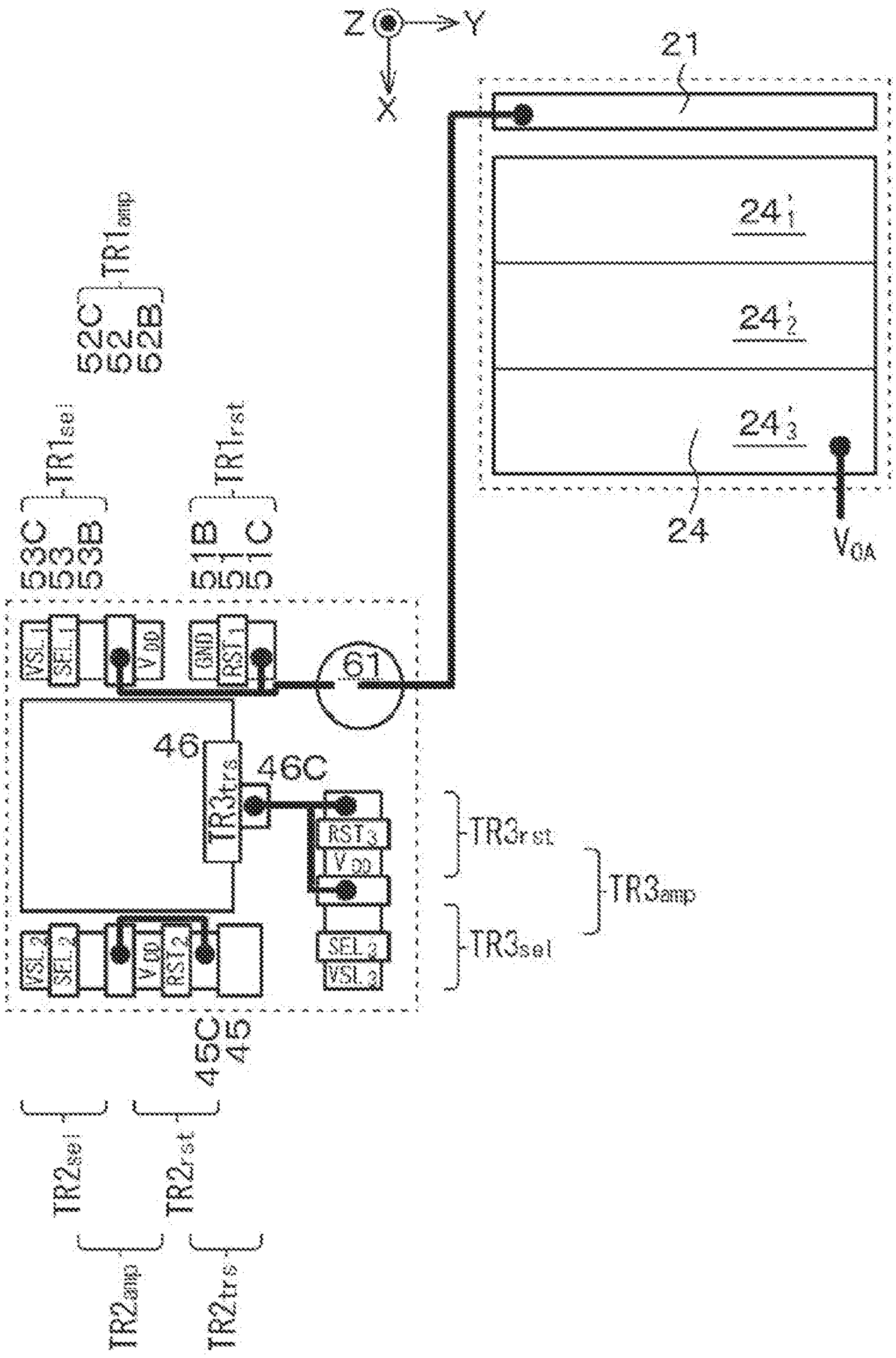
FIG. 52 is a schematic layout diagram of a first electrode, charge storage electrodes, and the transistors constituting a control unit in a modification of an imaging element-A included in the imaging device of Example 14.

FIG. 52 shows a schematic layout diagram of the first electrode, the charge storage electrode, and the transistors constituting the control unit of a modification of the imaging element of Example 14. As shown in FIG. 52, the other source/drain region 51B of the reset transistor $TR1_{rst}$ may be grounded, instead of being connected to the power supply $V_{DD}$.

Example 15

Figure 53:
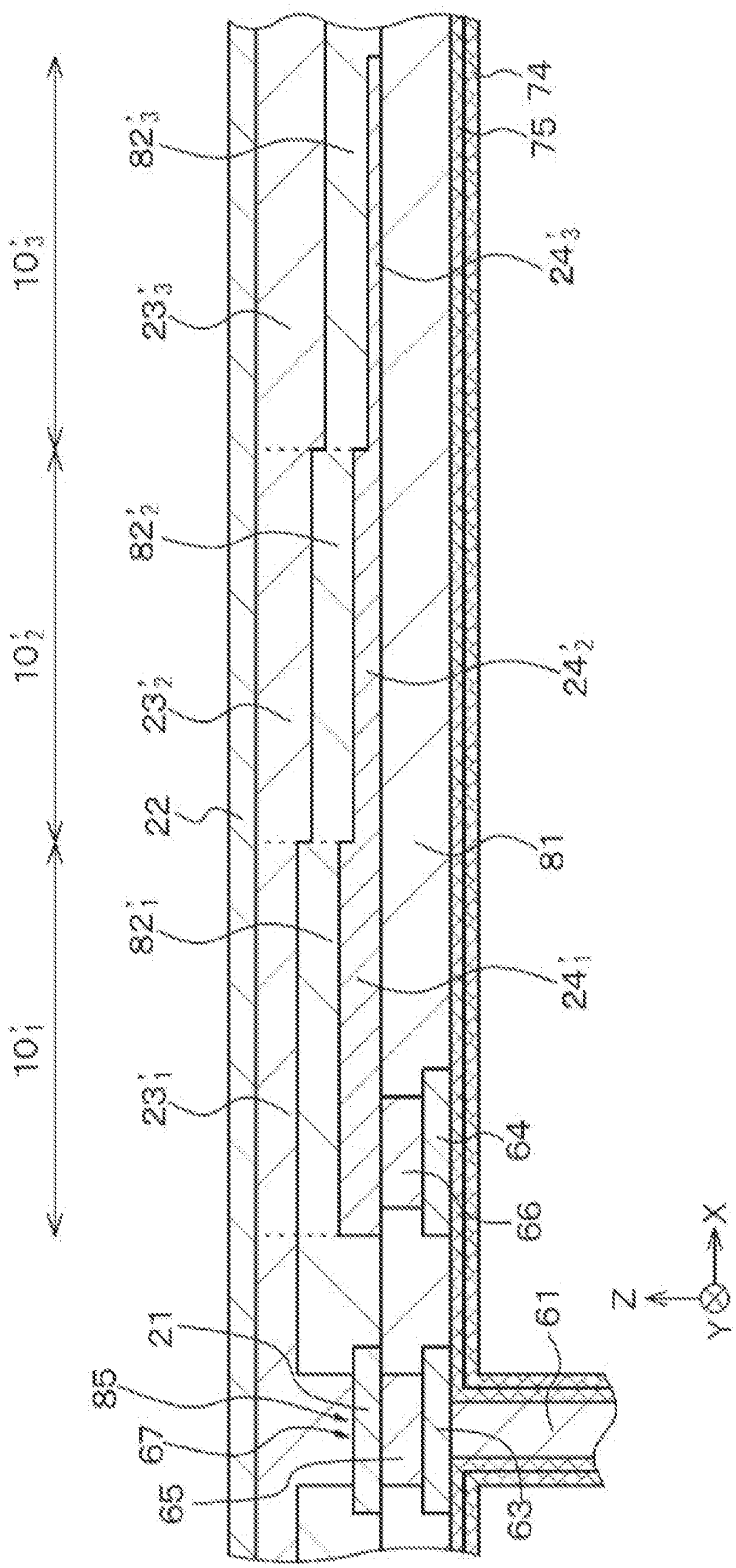
FIG. 53 is a schematic partial cross-sectional view showing an enlarged view of the portion in which a charge storage electrode, a photoelectric conversion layer, and a second electrode are stacked in an imaging element-A included in an imaging device of Example 15.

An imaging element of Example 15 relate to imaging elements of the second configuration and the sixth configuration according to the present disclosure. FIG. 53 is a schematic partial cross-sectional view showing an enlarged view of the portion in which the charge storage electrode, the inorganic oxide semiconductor material layer, the organic semiconductor material layer, and the second electrode are stacked. As shown in FIG. 53, in an imaging element of Example 15, the thicknesses of the photoelectric conversion layer segments gradually vary from the first photoelectric conversion unit segment 10'$_1$ to the Nth photoelectric conversion unit segment 10'$_N$. Alternatively, in an imaging element of Example 15, the widths of cross-sections of stacked portions are constant, and the thickness of a cross-section of a stacked portion, or specifically, the thickness of a photoelectric conversion layer segment, gradually increases depending on the distance from the first electrode 21. More specifically, the thicknesses of the photoelectric conversion layer segments are gradually increased. Note that the thicknesses of the photoelectric conversion layer segments are increased stepwise. The thickness of the photoelectric conversion layer segment 23'$_n$ in the nth photoelectric conversion unit segment 10'$_n$ is constant. Where the thickness of the photoelectric conversion layer segment 23'$_n$ in the nth photoelectric conversion unit segment 10'$_n$ is "1", the thickness of the photoelectric conversion layer segment 23'$_{(n+1)}$ in the (n+1)th photoelectric conversion unit segment 10'$_{(n+1)}$ may be 2 to 10, for example, but is not limited to such values. In Example 15, the thicknesses of the charge storage electrode segments 24'$_1$, 24'$_2$, and 24'$_3$ are made to become gradually smaller, so that the thicknesses of the photoelectric conversion layer segments 23'$_1$, 23'$_2$, and 23'$_3$ become gradually greater. The thicknesses of the insulating layer segments 82'$_1$, 82'$_2$, and 82'$_3$ are uniform. Further, in the photoelectric conversion layer segments, the thicknesses of the photoelectric conversion layer portions may be varied while the thicknesses of the inorganic oxide semiconductor material layer portions are constant, for example. In this manner, the thicknesses of the photoelectric conversion layer segments may be varied.

In the imaging element of Example 15, the thicknesses of the photoelectric conversion layer segments gradually increase. Accordingly, in a charge accumulation period, when $V_{12} \geq V_{11}$, a stronger electric field is applied to the nth photoelectric conversion unit segment 10'$_n$ than to the (n+1)th photoelectric conversion unit segment 10'$_{(n+1)}$, and electric charges can be reliably prevented from flowing from the first photoelectric conversion unit segment 10'$_1$ toward the first electrode 21. Further, when $V_{22} < V_{21}$ in a charge transfer period, it is possible to reliably secure the flow of electric charges from the first photoelectric conversion unit segment 10'$_1$ toward the first electrode 21, and the flow of electric charges from the (n+1)th photoelectric conversion unit segment 10'$_{(n+1)}$ toward the nth photoelectric conversion unit segment 10'$_n$.

As described above, in an imaging element of Example 15, a kind of charge transfer gradient is formed, and the electric charges generated through photoelectric conversion can be transferred more easily and reliably, because the thicknesses of the photoelectric conversion layer segments gradually vary from the first photoelectric conversion unit segment to the Nth photoelectric conversion unit segment, or because cross-sectional areas of the stacked portions of the charge storage electrode, the insulating layer, the inorganic oxide semiconductor material layer, and the organic semiconductor material layer taken along the Y-Z virtual plane vary depending on the distance from the first electrode.

In an imaging element of Example 15, to form the first electrode 21, the charge storage electrode 24, the insulating layer 82, the oxide semiconductor material layer 23B, and the organic semiconductor material layer 23A, a conductive material layer for forming the charge storage electrode 24'$_3$ is first formed on the interlayer insulating layer 81, and patterning is performed on the conductive material layer, to leave the conductive material layer in the regions in which the photoelectric conversion unit segments 10'$_1$, 10'$_2$, and 10'$_3$ and the first electrode 21 are to be formed. In this manner, part of the first electrode 21 and the charge storage electrode 24'$_3$ can be obtained. A conductive material layer for forming the charge storage electrode 24'$_2$ is then formed on the entire surface, and patterning is performed on the conductive material layer, to leave the conductive material layer in the regions in which the photoelectric conversion unit segments 10'$_1$ and 10'$_2$ and the first electrode 21 are to be formed. In this manner, part of the first electrode 21 and the charge storage electrode 24'$_2$ can be obtained. A conductive material layer for forming the charge storage electrode 24'$_1$ is then formed on the entire surface, and patterning is performed on the conductive material layer, to leave the conductive material layer in the regions in which the photoelectric conversion unit segment 10'$_1$ and the first electrode 21 are to be formed. In this manner, the first electrode 21 and the charge storage electrode 24'$_1$ can be obtained. The insulating layer 82 is then formed conformally on the entire surface. The oxide semiconductor material layer 23B and the organic semiconductor material layer 23A are then formed on the insulating layer 82, and a planarization process is performed on the organic semiconductor material layer 23A. Thus, the photoelectric conversion unit segments 10'$_1$, 10'$_2$, and 10'$_3$ can be obtained.

Example 16

Figure 54:
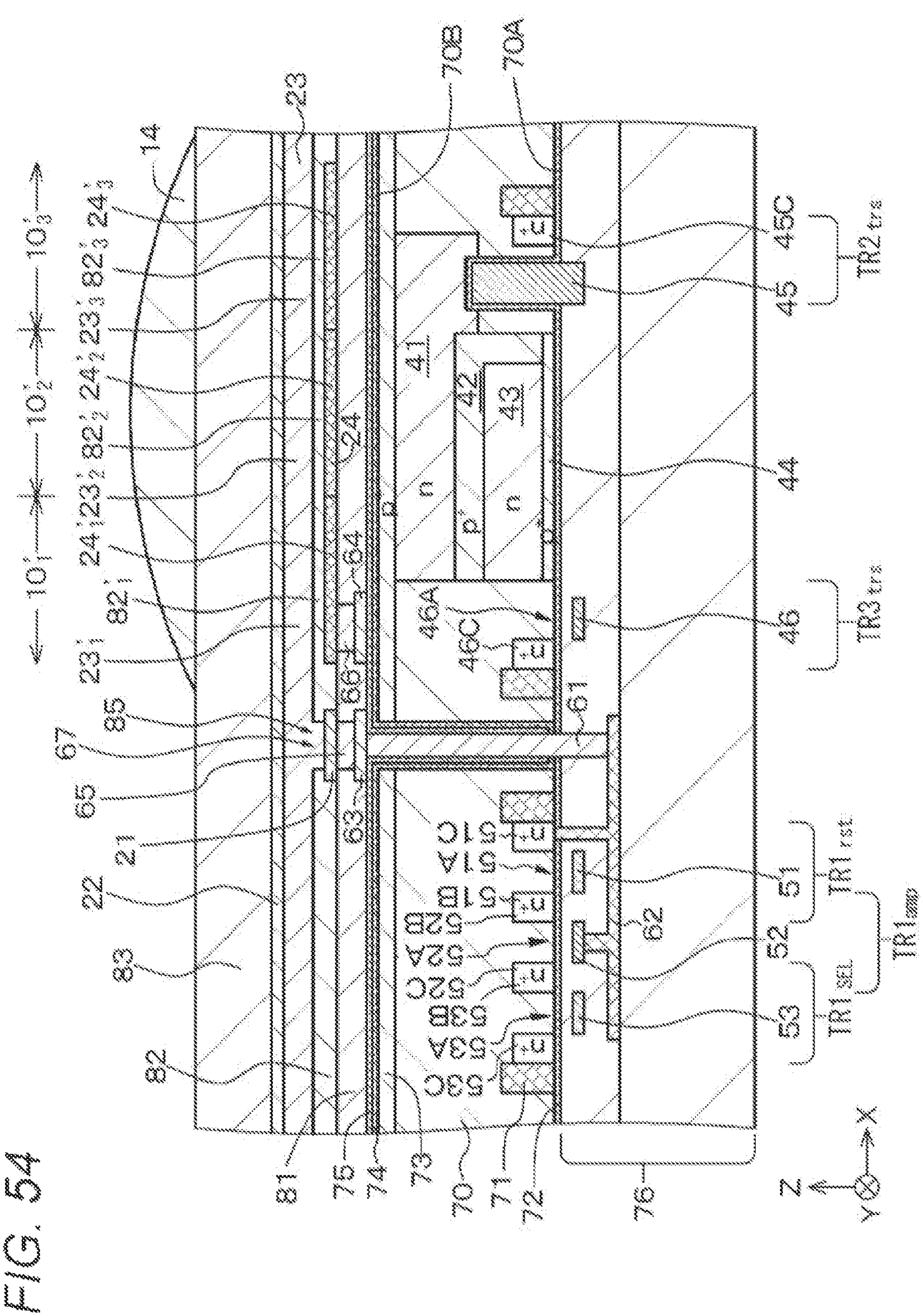
FIG. 54 is a schematic partial cross-sectional view of an imaging element-A included in an imaging device of Example 16.

Example 16 relates to an imaging element of the third configuration. FIG. 54 shows a schematic partial cross-sectional view of an imaging element of Example 16. In an imaging element of Example 16, the material forming the insulating layer segment is different between adjacent photoelectric conversion unit segments. Here, the values of the relative dielectric constants of the materials forming the insulating layer segments are gradually reduced from the first photoelectric conversion unit segment 10'$_1$ to the Nth photoelectric conversion unit segment 10'$_N$. In an imaging element of Example 16, the same potential may be applied to all of the N charge storage electrode segments, or different potentials may be applied to the respective N charge storage electrode segments. In the latter case, the charge storage electrode segments 24'$_1$, 24'$_2$, and 24'$_3$ that are disposed at a distance from one another are only required to be connected to the vertical drive circuit 312 forming the drive circuit, via pad portions 64$_1$, 64$_2$, and 64$_3$, in a manner similar to that described later in Example 17.

As such a configuration is adopted, a kind of charge transfer gradient is then formed, and, when $V_{12} \geq V_{11}$ in a charge accumulation period, the nth photoelectric conversion unit segment can store more electric charges than the (n+1)th photoelectric conversion unit segment. Further, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

Example 17

Figure 55:
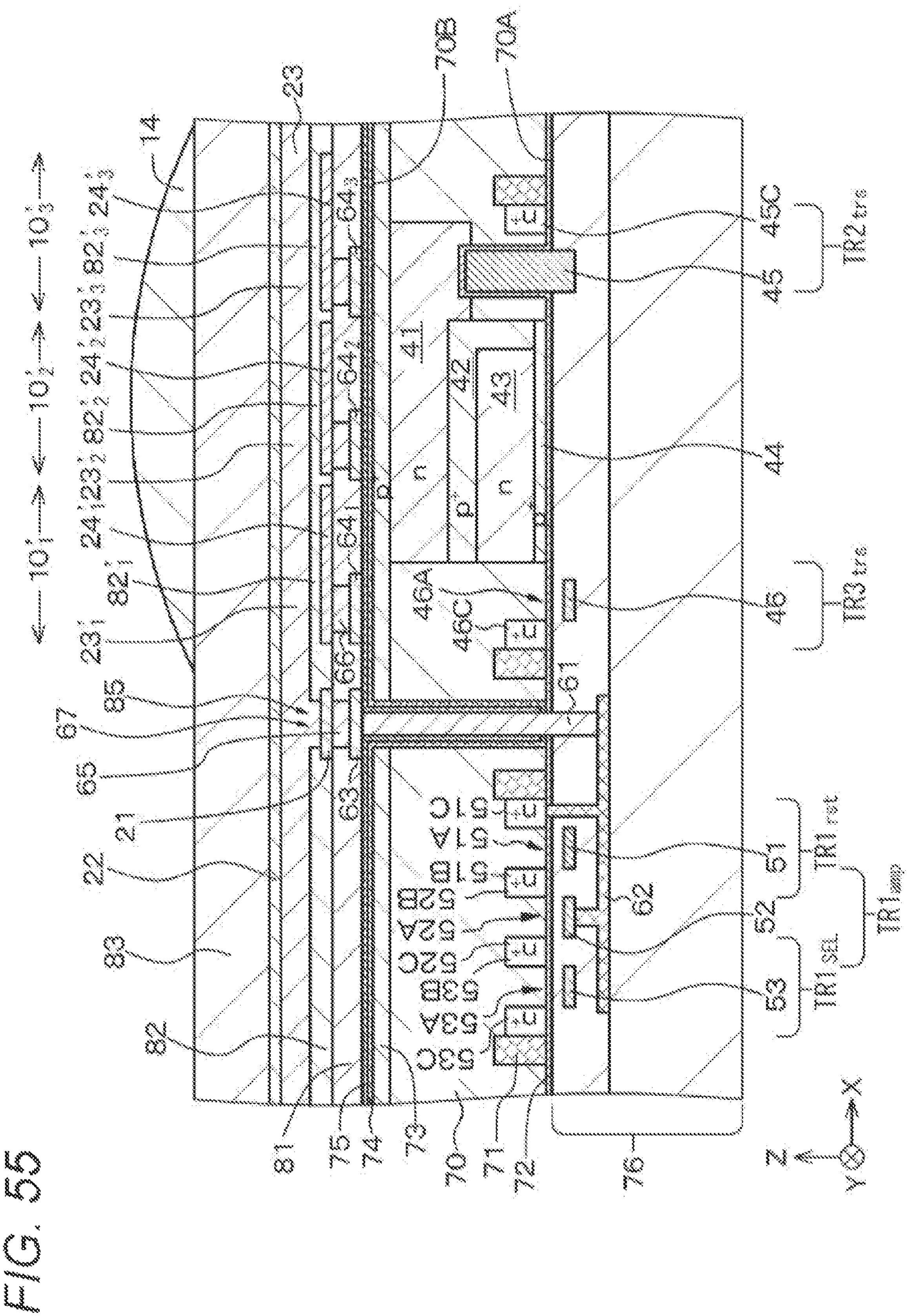
FIG. 55 is a schematic partial cross-sectional view of an imaging element-A included in imaging devices of Example 17 and Example 18.
Figure 56A:
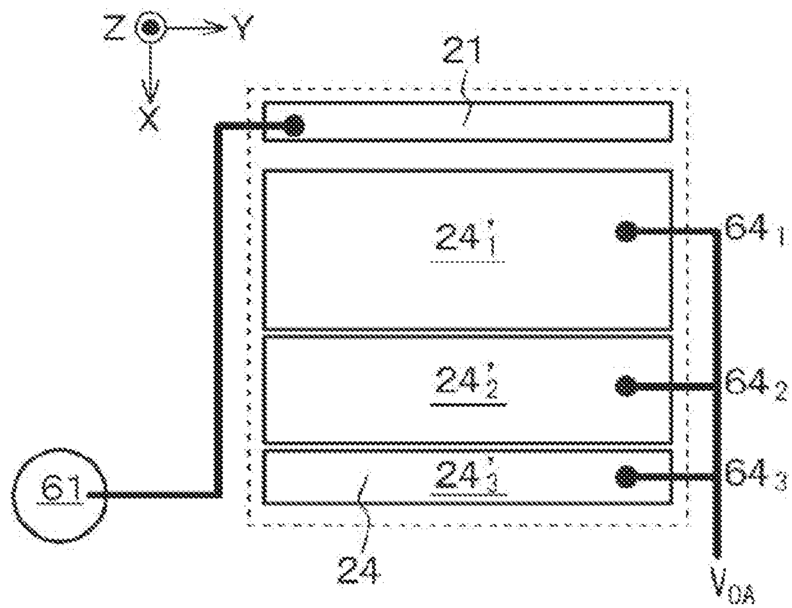
FIGS. 56A and 56B are schematic plan views of charge storage electrode segments in an imaging element-A included in the imaging device of Example 18.
Figure 56B:
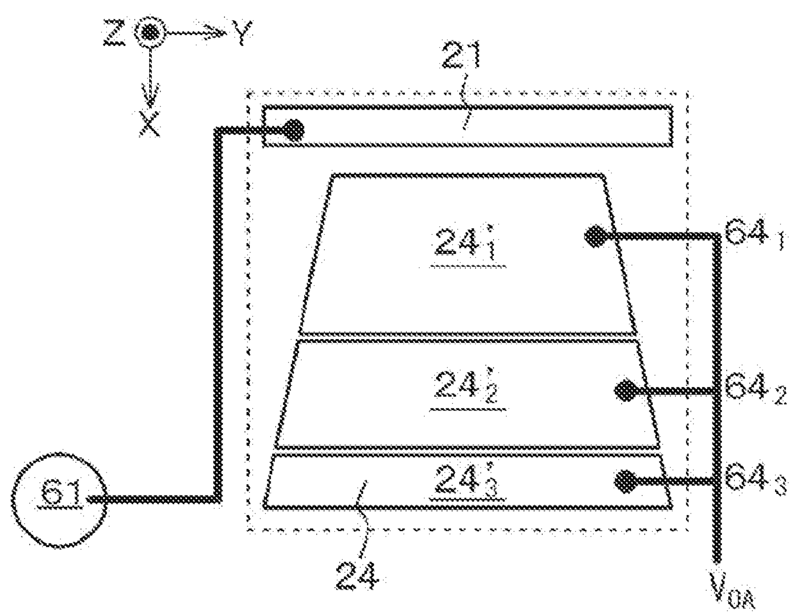
Figure 57A:
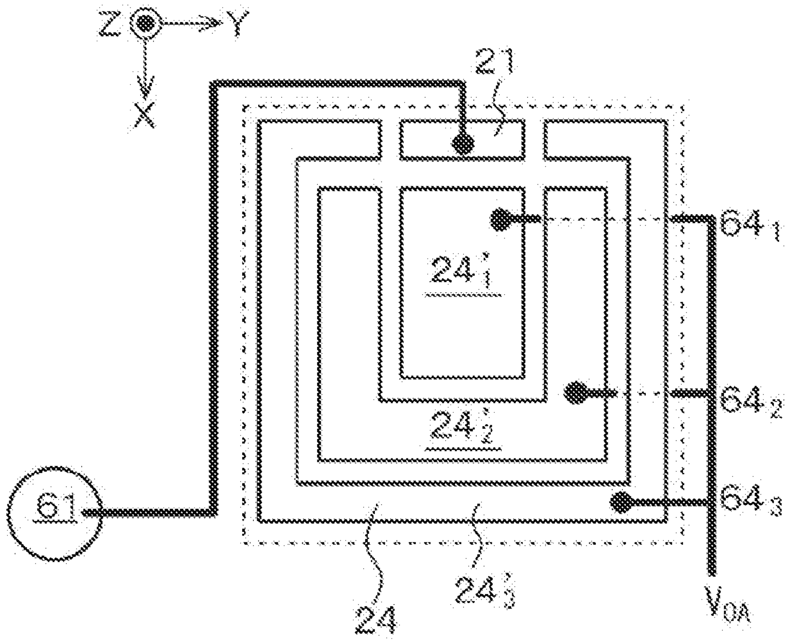
FIGS. 57A and 57B are schematic plan views of charge storage electrode segments in an imaging element-A included in the imaging device of Example 18.
Figure 57B:
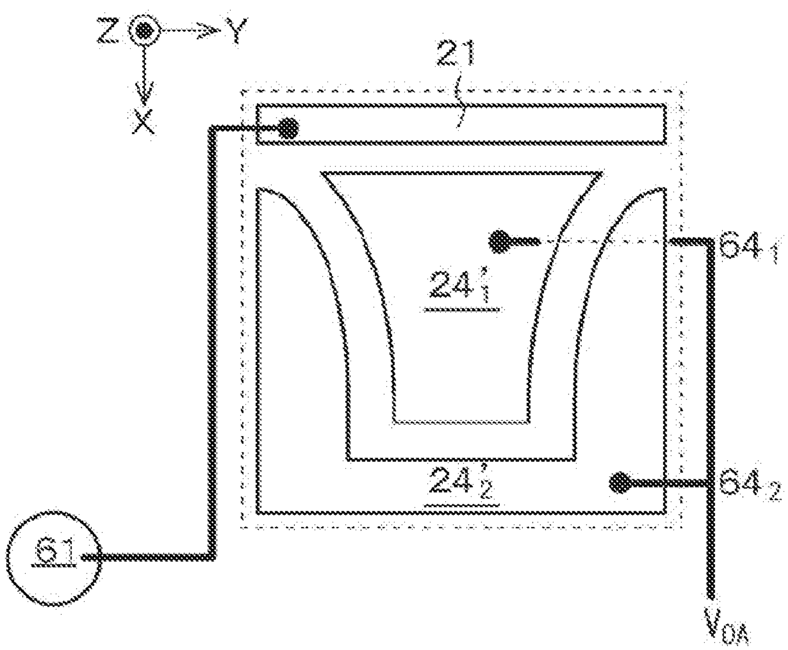

Example 17 relates to an imaging element of the fourth configuration. FIG. 55 shows a schematic partial cross-sectional view of an imaging element of Example 17. In an imaging element of Example 17, the material forming the charge storage electrode segment is different between adjacent photoelectric conversion unit segments. Here, the values of the work functions of the materials forming the insulating layer segments are gradually increased from the first photoelectric conversion unit segment 10'$_1$ to the Nth photoelectric conversion unit segment 10'$_N$. In an imaging element of Example 17, the same potential may be applied to all of the N charge storage electrode segments, or different potentials may be applied to the respective N charge storage electrode segments. In the latter case, the charge storage electrode segments 24'$_1$, 24'$_2$, and 24'$_3$ are connected to the vertical drive circuit 312 forming the drive circuit, via pad portions 64$_1$, 64$_2$, and 64$_3$.

Example 18

Figure 58:
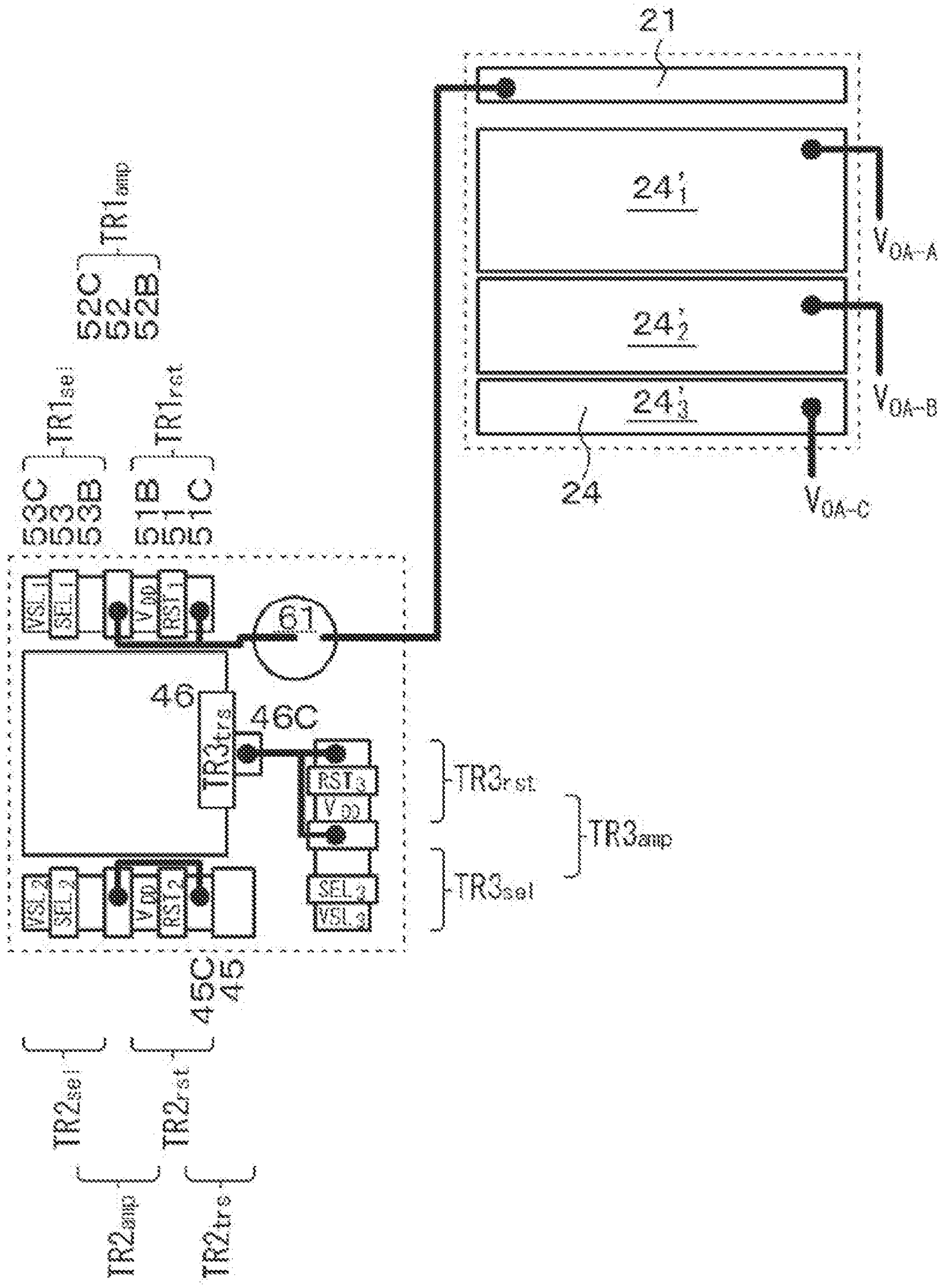
FIG. 58 is a schematic layout diagram of a first electrode, charge storage electrodes, and the transistors constituting a control unit in an imaging element-A included in the imaging device of Example 18.

An imaging element of Example 18 relates to an imaging element of the fifth configuration. FIGS. 56A, 56B, 57A, and 57B show schematic plan views of charge storage electrode segments in Example 18. FIG. 58 shows a schematic layout diagram of the first electrode and the charge storage electrode that constitute the photoelectric conversion unit including the charge storage electrode of an imaging element of Example 18, and the transistors that constitute the control unit. A schematic partial cross-sectional view of an imaging element of Example 18 is similar to that shown in FIG. 55 or 60. In an imaging element of Example 18, the areas of the charge storage electrode segments are gradually reduced from the first photoelectric conversion unit segment 10'$_1$ to the Nth photoelectric conversion unit segment 10'$_N$. In an imaging element of Example 18, the same potential may be applied to all of the N charge storage electrode segments, or different potentials may be applied to the respective N charge storage electrode segments. Specifically, the charge storage electrode segments 24'$_1$, 24'$_2$, and 24'$_3$ that are disposed at a distance from one another are only required to be connected to the vertical drive circuit 312 forming the drive circuit, via pad portions 64$_1$, 64$_2$, and 64$_3$, in a manner similar to that described in Example 17.

In Example 18, the charge storage electrode 24 is formed with a plurality of charge storage electrode segments 24'$_1$, and 24'$_2$, and 24'$_3$. The number of charge storage electrode segments is only required to be two or larger, and is "three" in Example 18. Further, in an imaging element of Example 18, the potential of the first electrode 21 is higher than the potential of the second electrode 22, or a positive potential is applied to the first electrode 21 while a negative potential is applied to the second electrode 22, for example. Therefore, in a charge transfer period, the potential to be applied to the charge storage electrode segment 24'$_1$ located closest to the first electrode 21 is higher than the potential to be applied to the charge storage electrode segment 24'$_3$ located farthest from the first electrode 21. As such a potential gradient is formed in the charge storage electrode 24, electrons remaining in the region of the oxide semiconductor material layer 23B and the like facing the charge storage electrode 24 are read into the first electrode 21 and further into the first floating diffusion layer $FD_1$ with higher reliability. In other words, the electric charges accumulated in the oxide semiconductor material layer 23B and the like are read into the control unit.

Further, in a charge transfer period, the potential of the charge storage electrode segment 24'$_3$<the potential of the charge storage electrode segment 24'$_2$<the potential of the charge storage electrode segment 24'$_1$. With this arrangement, the electrons remaining in the region of the oxide semiconductor material layer 23B and the like are simultaneously read into the first floating diffusion layer $FD_1$. Alternatively, in a charge transfer period, the potential of the charge storage electrode segment 24'$_3$, the potential of the charge storage electrode segment 24'$_2$, and the potential of the charge storage electrode segment 24'$_1$ are gradually varied (in other words, varied in a stepwise or slope-like manner). With this arrangement, the electrons remaining in the region of the oxide semiconductor material layer 23B and the like facing the charge storage electrode segment 24'$_3$ are moved to the region of the oxide semiconductor material layer 23B and the like facing the charge storage electrode segment 24'$_2$, the electrons remaining in the region of the oxide semiconductor material layer 23B and the like facing the charge storage electrode segment 24'$_2$ are then moved to the region of the oxide semiconductor material layer 23B and the like facing the charge storage electrode segment 24'$_1$, and, after that, the electrons remaining in the region of the oxide semiconductor material layer 23B and the like facing the charge storage electrode segment 24'$_1$ can be read into the first floating diffusion layer $FD_1$ without fail.

Figure 59:
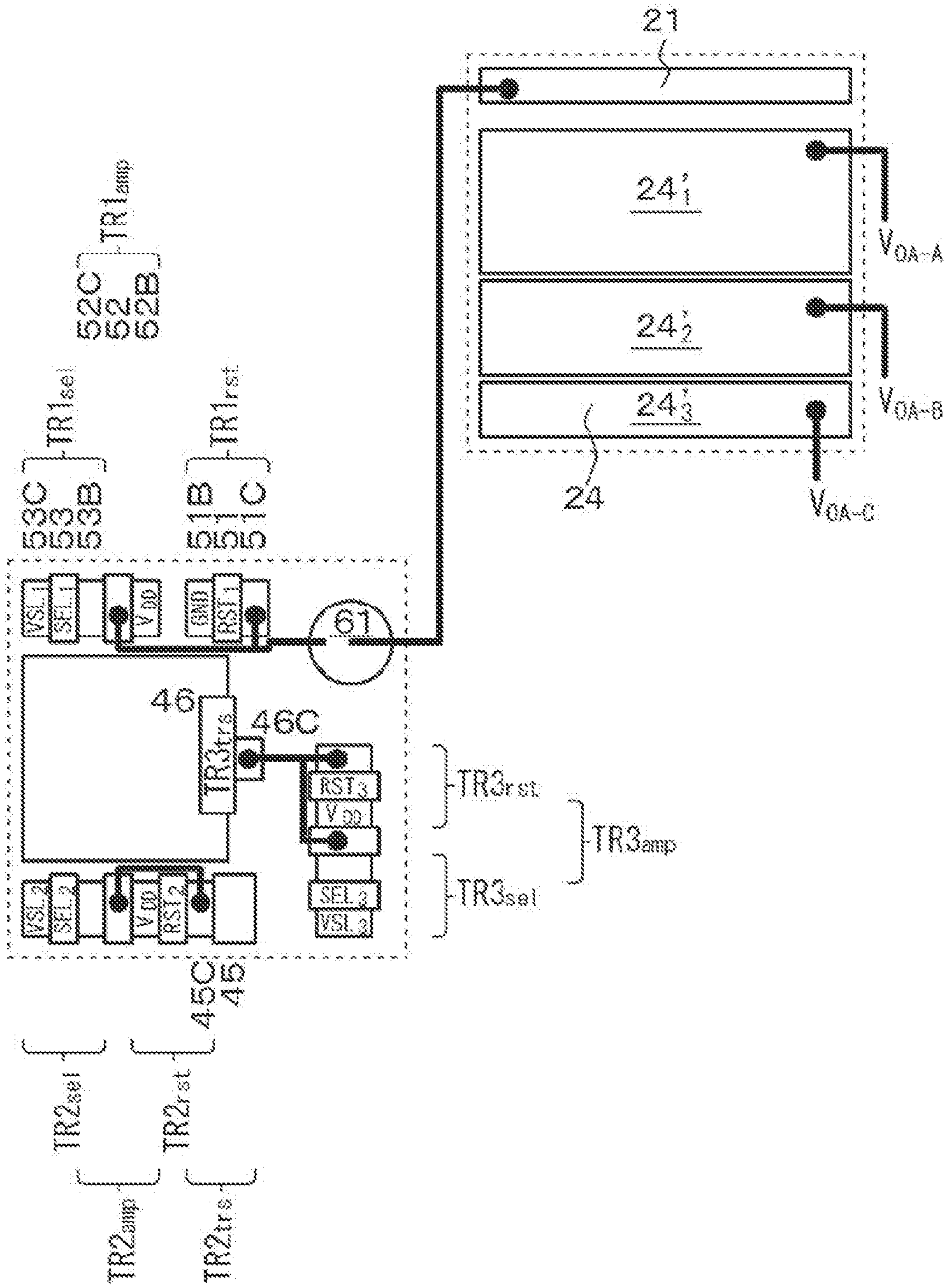
FIG. 59 is a schematic layout diagram of a first electrode and charge storage electrodes in a modification of an imaging element-A included in the imaging device of Example 18.

FIG. 59 shows a schematic layout diagram of the first electrode, the charge storage electrode, and the transistors constituting the control unit of a modification of the imaging element of Example 18. As shown in FIG. 59, the other source/drain region 51B of the reset transistor $TR3_{rst}$ may be grounded, instead of being connected to the power supply $V_{DD}$.

In an imaging element of Example 18, such a configuration is adopted, so that a kind of charge transfer gradient is also formed. In other words, the areas of the charge storage electrode segments gradually decrease from the first photoelectric conversion unit segment 10'$_1$ to the Nth photoelectric conversion unit segment 10'$_N$. Accordingly, when $V_{12} \geq V_{11}$ in a charge accumulation period, the nth photoelectric conversion unit segment can store more electric charges than the (n+1)th photoelectric conversion unit segment. Further, when $V_{22}<V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

Example 19

Figure 60:
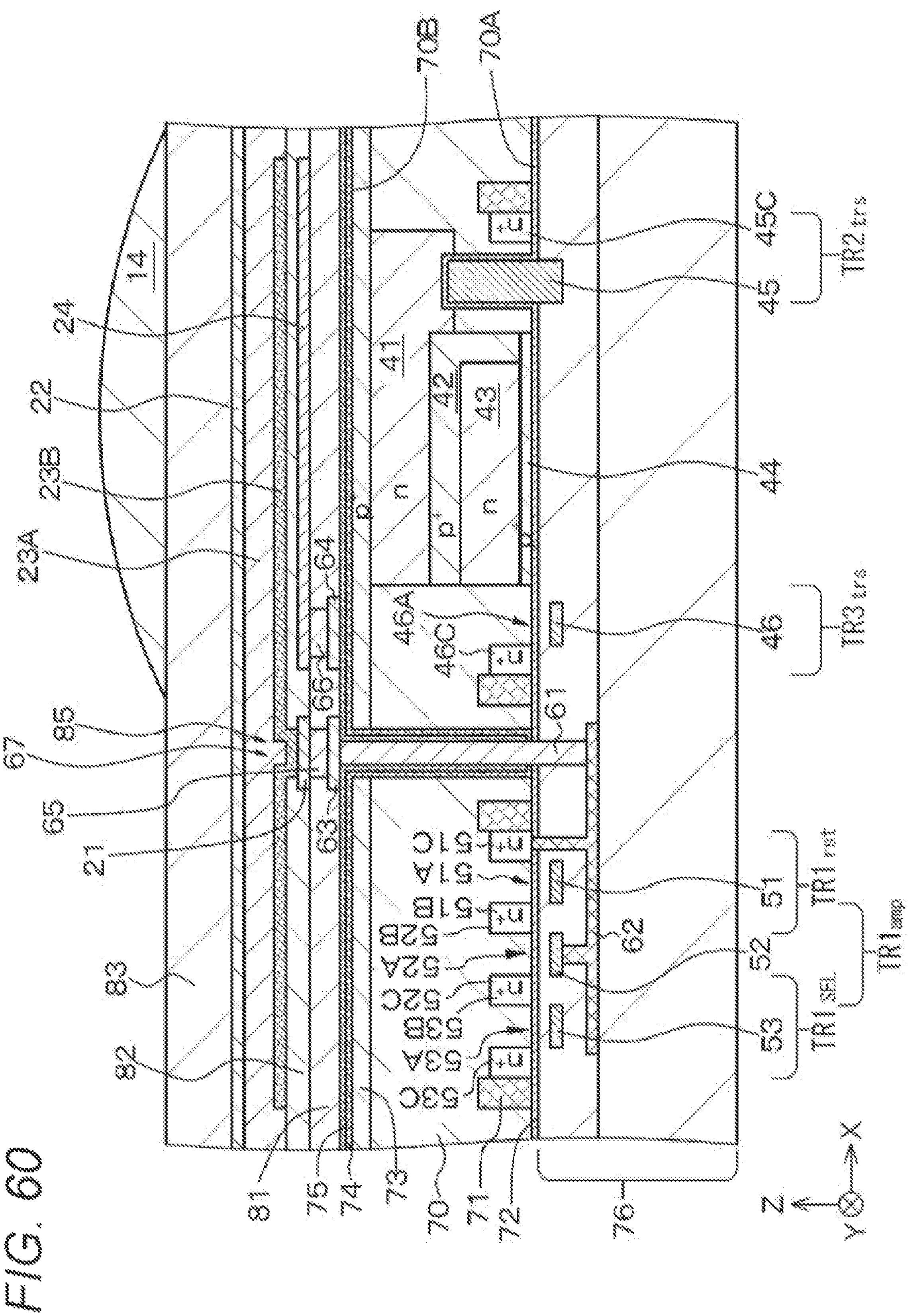
FIG. 60 is a schematic partial cross-sectional view of an imaging element-A included in imaging devices of Example 19 and Example 18.
Figure 61A:
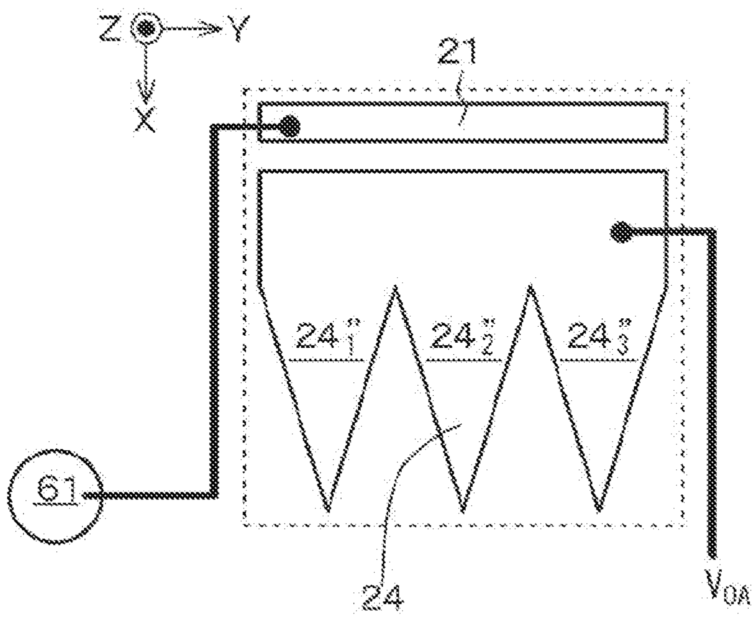
FIGS. 61A and 61B are schematic plan views of charge storage electrode segments in an imaging element-A included in the imaging device of Example 19.
Figure 61B:
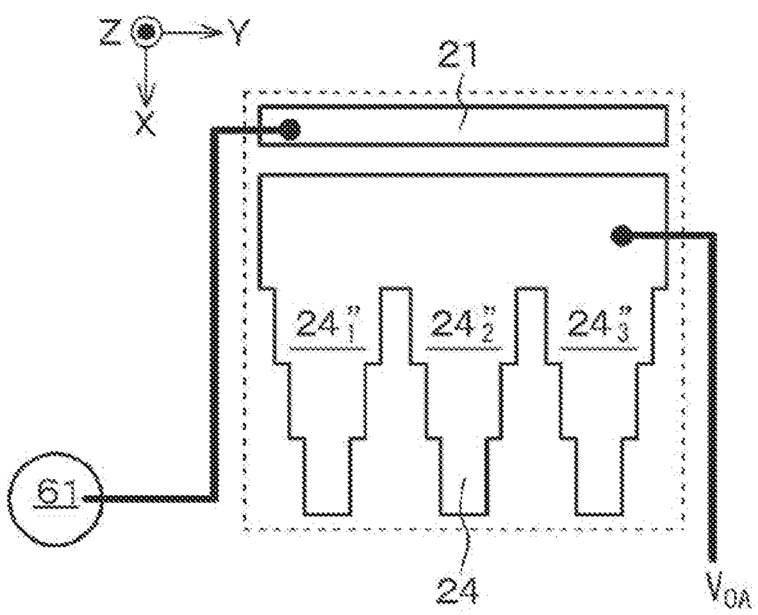

Example 19 relates to an imaging element of the sixth configuration. FIG. 60 shows a schematic partial cross-sectional view of an imaging element of Example 19. Further, FIGS. 61A and 61B are schematic plan views of charge storage electrode segments in Example 19. An imaging element of Example 19 includes a photoelectric conversion unit formed by stacking the first electrode 21, the oxide semiconductor material layer 23B, the organic semiconductor material layer 23A, and the second electrode 22, and the photoelectric conversion unit further includes the charge storage electrode 24 (24"$_1$, 24"$_2$, and 24"$_3$) that are disposed at a distance from the first electrode 21 and are positioned to face the oxide semiconductor material layer 23B via the insulating layer 82. Further, where the stacking direction of the charge storage electrode 24 (24"$_1$, 24"$_2$, and 24"$_3$), the insulating layer 82, the oxide semiconductor material layer 23B, and the organic semiconductor material layer 23A is the Z direction, and the direction away from the first electrode 21 is the X direction, the cross-sectional area of a stacked portion of the charge storage electrode 24 (24"$_1$, 24"$_2$, and 24"$_3$), the insulating layer 82, the oxide semiconductor material layer 23B, and the organic semiconductor material layer 23A taken along the Y-Z virtual plane varies depending on the distance from the first electrode 21.

Specifically, in an imaging element of Example 19, the thicknesses of cross-sections of stacked portions are constant, and the width of a cross-section of a stacked portion is narrower at a longer distance from the first electrode 21. Note that the widths may be narrowed continuously (see FIG. 61A) or may be narrowed stepwise (see FIG. 61B).

As described above, in an imaging element of Example 19, a kind of charge transfer gradient is formed, and the electric charges generated through photoelectric conversion can be transferred more easily and reliably, because cross-sectional areas of the stacked portions of the charge storage electrode 24 (24"$_1$, 24"$_2$, and 24"$_3$), the insulating layer 82, and the organic semiconductor material layer 23A taken along a Y-Z virtual plane vary depending on the distance from the first electrode.

Although the present disclosure has been described so far on the basis of preferred examples, the present disclosure is not limited to those examples. The structures, the configurations, the manufacturing conditions, the manufacturing methods, and the materials used for the stacked imaging elements, the imaging elements, and the imaging devices described in Examples are merely examples, and may be modified as appropriate. The imaging elements of the respective Examples may be combined as appropriate. For example, it is possible to combine an imaging element of Example 14, an imaging element of Example 15, an imaging element of Example 16, an imaging element of Example 17, and an imaging element of Example 18 in a desired manner. It is also possible to combine an imaging element of Example 14, an imaging element of Example 15, an imaging element of Example 16, an imaging element of Example 17, and an imaging element of Example 19 in a desired manner. The configuration and the structure of an imaging element of the present disclosure can be applied to a light emitting element, such as an organic EL element, for example. In the optical black region, a dummy imaging element may be arranged between an imaging element-B and an imaging element-A as in conventional cases.

In some cases, floating diffusion layers $FD_1$, $FD_2$, $FD_3$, 51C, 45C, and 46C can be shared.

Figure 62:
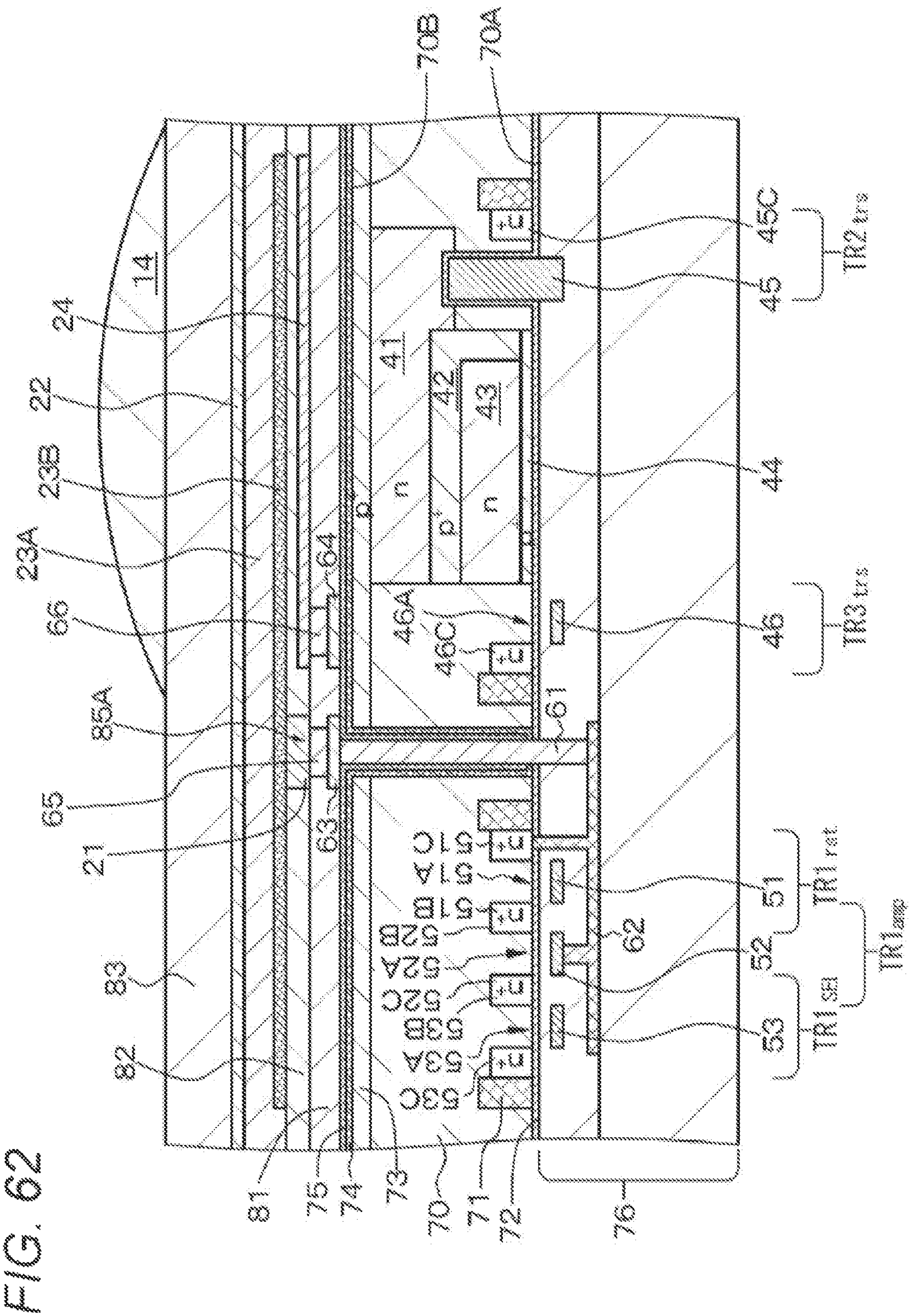
FIG. 62 is a schematic partial cross-sectional view of another modification of an imaging element-A included in the imaging device of Example 8.

As shown in FIG. 62, which shows a modification of an imaging element described in Example 8, the first electrode 21 may extend in an opening 85A formed in the insulating layer 82, and be connected to the oxide semiconductor material layer 23B, for example.

Figure 64:
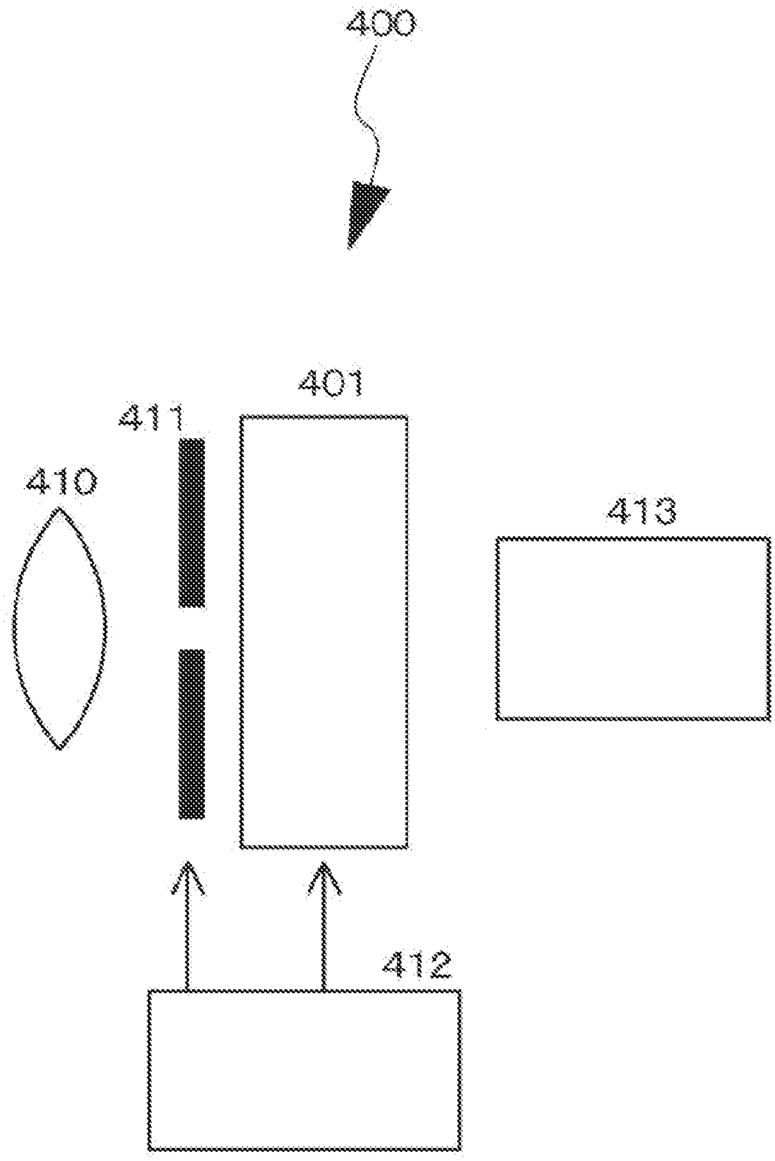
FIG. 64 is a conceptual diagram of an example using a solid-state imaging device formed with an imaging device or the like of the present disclosure in an electronic apparatus (a camera).

FIG. 64 is a conceptual diagram showing an example in which an imaging device of the present disclosure is used for an electronic apparatus (a camera) 400. The electronic apparatus 400 includes an imaging device 401, an optical lens 410, a shutter device 411, a drive circuit 412, and a signal processing circuit 413. The optical lens 410 gathers image light (incident light) from an object, and forms an image on the imaging surface of the imaging device 401. As a result, signal charges are stored in the imaging device 401 for a certain period of time. The shutter device 411 controls the light exposure period and the light blocking period for the imaging device 401. The drive circuit 412 supplies drive signals for controlling transfer operation and the like of the imaging device 401, and shutter operation of the shutter device 411. In accordance with a drive signal (a timing signal) supplied from the drive circuit 412, the imaging device 401 performs signal transfer. The signal processing circuit 413 performs various kinds of signal processing. Video signals subjected to the signal processing are stored into a storage medium such as a memory, or are output to a monitor. In such an electronic apparatus 400, it is possible to achieve miniaturization of the pixel size and improvement of the transfer efficiency in the imaging device 401. Thus, the electronic apparatus 400 having its pixel characteristics improved can be obtained. The electronic apparatus 400 to which the imaging device 401 can be applied is not necessarily a camera, but may be an imaging device such as a camera module for mobile devices such as a digital still camera and a portable telephone device.

In the example cases described in Examples, the present disclosure is applied to CMOS imaging devices in each of which unit pixels that detect signal charges corresponding to incident light quantities as physical quantities are arranged in a matrix. However, the present disclosure is not necessarily applied to such CMOS imaging devices, and may also be applied to CCD imaging devices. In the latter case, signal charges are transferred in a vertical direction by a vertical transfer register of a CCD structure, are transferred in a horizontal direction by a horizontal transfer register, and are amplified, so that pixel signals (image signals) are output. Further, the present disclosure is not necessarily applied to general imaging devices of a column type in which pixels are arranged in a two-dimensional matrix, and a column signal processing circuit is provided for each pixel row. Furthermore, the selection transistor may also be omitted in some cases.

Further, imaging elements in the present disclosure are not necessarily used in an imaging device that senses a distribution of visible incident light and captures the distribution as an image, but may also be used in an imaging device that captures a incident amount distribution of infrared rays, X-rays, particles, or the like as an image. Also, in a broad sense, the present disclosure may be applied to any imaging device (physical quantity distribution detection device), such as a fingerprint detection sensor that detects a distribution of other physical quantities such as pressure and capacitance and captures such a distribution as an image.

Further, the present disclosure is not limited to imaging devices that sequentially scan respective unit pixels in the imaging region by the row, and read pixel signals from the respective unit pixels. The present disclosure may also be applied to an imaging device of an X-Y address type that selects desired pixels one by one, and reads pixel signals from the selected pixels one by one. An imaging device may be in the form of a single chip, or may be in the form of a module that is formed by packaging an imaging region together with a drive circuit or an optical system, and has an imaging function.

Also, an imaging device may be incorporated into a camera system, such as a digital still camera or a video camera, or an electronic apparatus that has an imaging function, such as a portable telephone device.

The technology (the present technology) according to the present disclosure can be applied to various products. For example, the technology according to the present disclosure may be embodied as a device mounted on any type of mobile object, such as an automobile, an electrical vehicle, a hybrid electrical vehicle, a motorcycle, a bicycle, a personal mobility device, an airplane, a drone, a vessel, or a robot.

Figure 66:
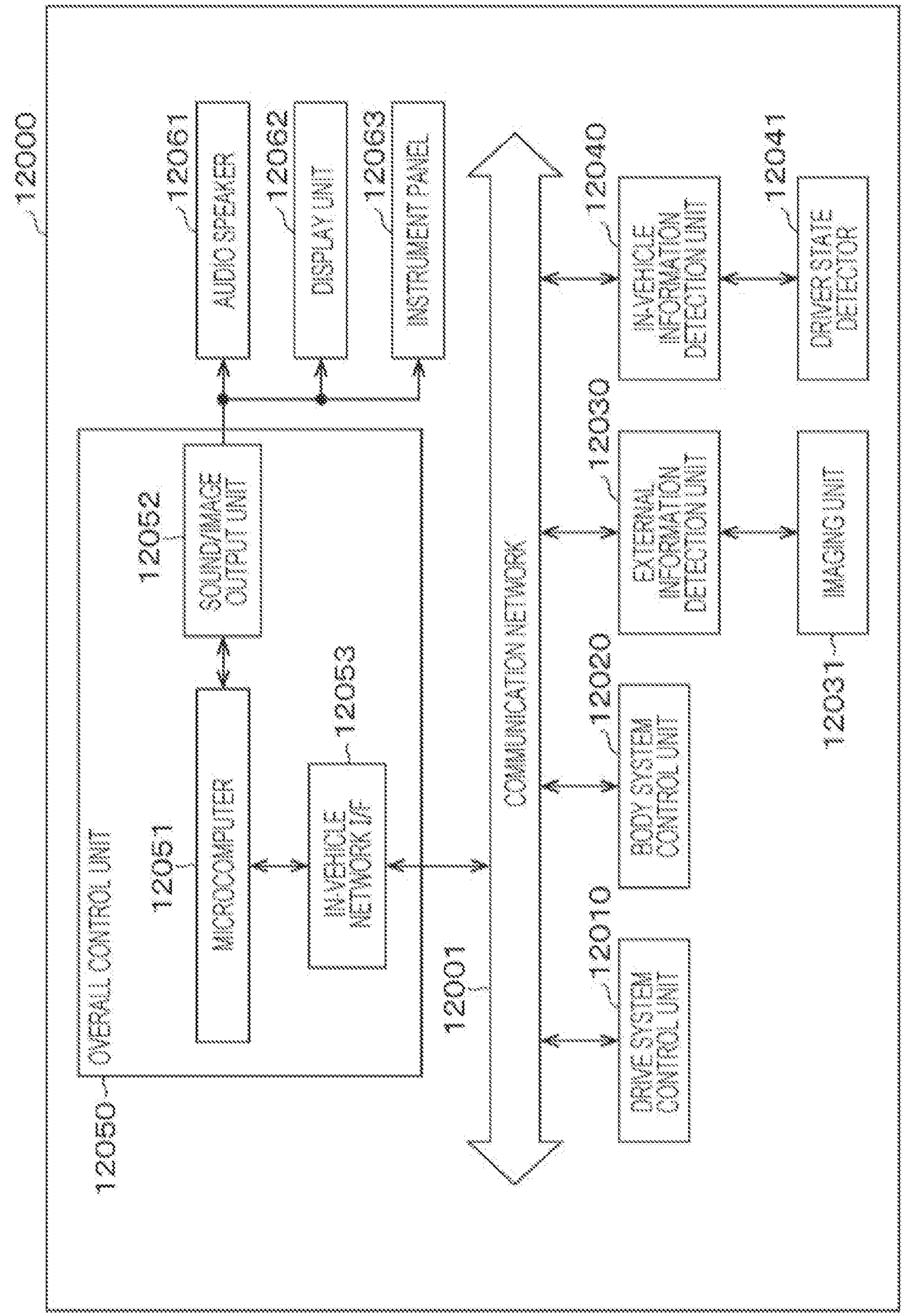
FIG. 66 is a block diagram schematically showing an example configuration of a vehicle control system.

FIG. 66 is a block diagram schematically showing an example configuration of a vehicle control system that is an example of a mobile structure control system to which the technology according to the present disclosure may be applied.

A vehicle control system 12000 includes a plurality of electronic control units connected via a communication network 12001. In the example shown in FIG. 66, the vehicle control system 12000 includes a drive system control unit 12010, a body system control unit 12020, an external information detection unit 12030, an in-vehicle information detection unit 12040, and an overall control unit 12050. Further, a microcomputer 12051, a sound/image output unit 12052, and an in-vehicle network interface (I/F) 12053 are shown as the functional components of the overall control unit 12050.

The drive system control unit 12010 controls operations of the devices related to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a headlamp, a backup lamp, a brake lamp, a turn signal lamp, a fog lamp, or the like. In this case, the body system control unit 12020 can receive radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information outside the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image. On the basis of the received image, the external information detection unit 12030 may perform an object detection process for detecting a person, a vehicle, an obstacle, a sign, characters on the road surface, or the like, or perform a distance detection process.

The imaging unit 12031 is an optical sensor that receives light, and outputs an electrical signal corresponding to the amount of received light. The imaging unit 12031 can output an electrical signal as an image, or output an electrical signal as distance measurement information. Further, the light to be received by the imaging unit 12031 may be visible light, or may be invisible light such as infrared rays.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, on the basis of detected information input from the driver state detector 12041, the in-vehicle information detection unit 12040 may calculate the degree of fatigue or the degree of concentration of the driver, or determine whether or not the driver is dozing off.

On the basis of the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010. For example, the microcomputer 12051 can perform cooperative control to achieve the functions of an advanced driver assistance system (ADAS), including vehicle collision avoidance or impact mitigation, follow-up running based on the distance between vehicles, vehicle velocity maintenance running, vehicle collision warning, vehicle lane deviation warning, or the like.

Further, the microcomputer 12051 can also perform cooperative control to conduct automatic driving or the like for autonomously running not depending on the operation of the driver, by controlling the driving force generation device, the steering mechanism, the braking device, or the like on the basis of information about the surroundings of the vehicle, the information having being acquired by the external information detection unit 12030 or the in-vehicle information detection unit 12040.

The microcomputer 12051 can also output a control command to the body system control unit 12020, on the basis of the external information acquired by the external information detection unit 12030. For example, the microcomputer 12051 controls the headlamp in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIG. 66, an audio speaker 12061, a display unit 12062, and an instrument panel 12063 are shown as output devices. The display unit 12062 may include an on-board display and/or a head-up display, for example.

Figure 67:
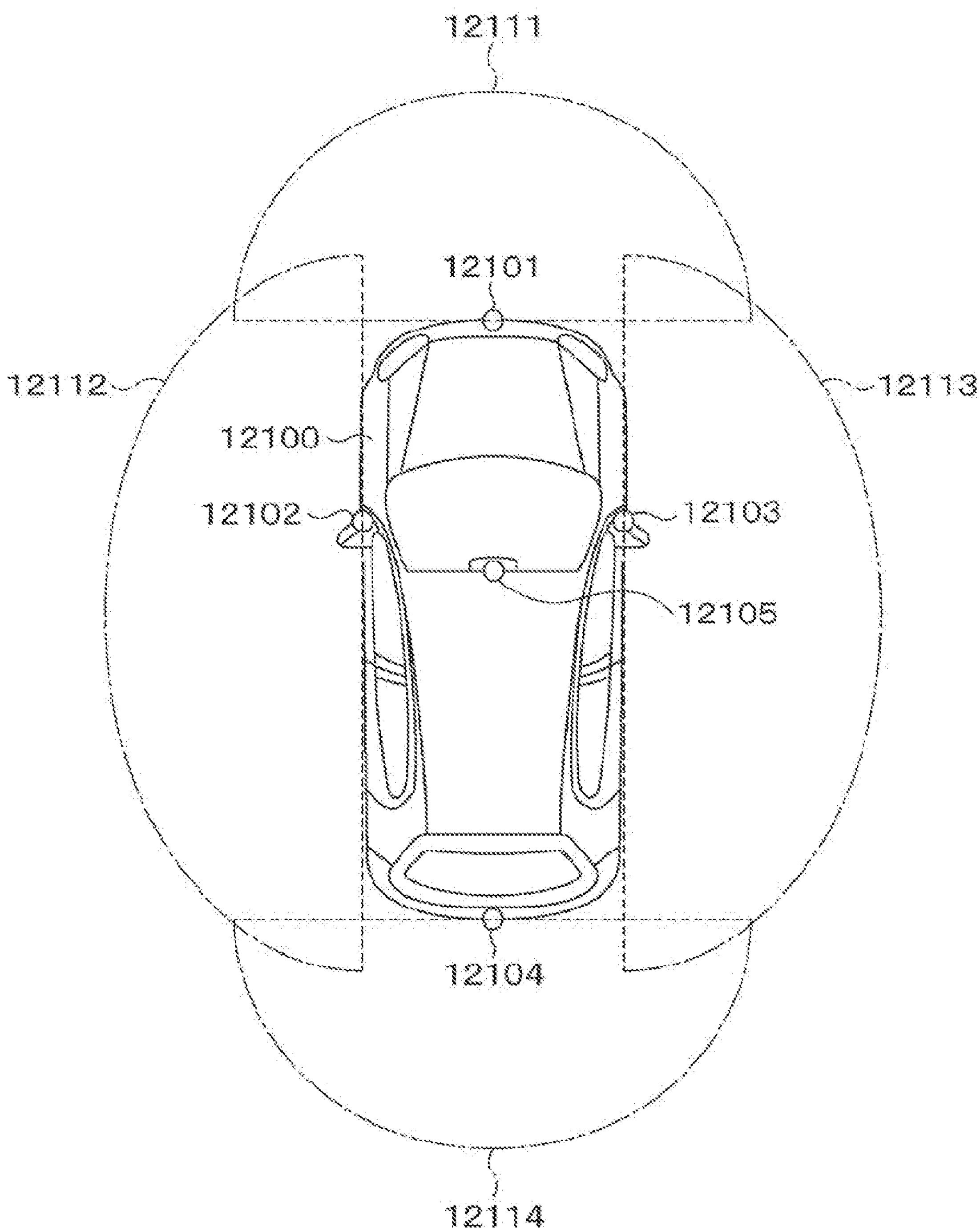
FIG. 67 is an explanatory diagram showing an example of installation positions of external information detectors and imaging units.

FIG. 67 is a diagram showing an example of installation positions of imaging units 12031.

In FIG. 67, a vehicle 12100 includes imaging units 12101, 12102, 12103, 12104, and 12105 as the imaging units 12031.

Imaging units 12101, 12102, 12103, 12104, and 12105 are provided at the following positions: the front end edge of a vehicle 12100, a side mirror, the rear bumper, a rear door, an upper portion of the front windshield inside the vehicle, and the like, for example. The imaging unit 12101 provided on the front end edge and the imaging unit 12105 provided on the upper portion of the front windshield inside the vehicle mainly capture images ahead of the vehicle 12100. The imaging units 12102 and 12103 provided on the side mirrors mainly capture images on the sides of the vehicle 12100. The imaging unit 12104 provided on the rear bumper or a rear door mainly captures images behind the vehicle 12100. The front images acquired by the imaging units 12101 and 12105 are mainly used for detection of a vehicle running in front of the vehicle 12100, a pedestrian, an obstacle, a traffic signal, a traffic sign, a lane, or the like.

Note that FIG. 67 shows an example of the imaging ranges of the imaging units 12101 through 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 through 12104 are superimposed on one another, so that an overhead image of the vehicle 12100 viewed from above is obtained.

At least one of the imaging units 12101 through 12104 may have a function of acquiring distance information. For example, at least one of the imaging units 12101 through 12104 may be a stereo camera including a plurality of imaging elements, or may be imaging elements having pixels for phase difference detection.

For example, on the basis of distance information obtained from the imaging units 12101 through 12104, the microcomputer 12051 calculates the distances to the respective three-dimensional objects within the imaging ranges 12111 through 12114, and temporal changes in the distances (the velocities relative to the vehicle 12100). In this manner, the three-dimensional object that is the closest three-dimensional object on the traveling path of the vehicle 12100 and is traveling at a predetermined velocity (0 km/h or higher, for example) in substantially the same direction as the vehicle 12100 can be extracted as the vehicle running in front of the vehicle 12100. Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, in accordance with the distance information obtained from the imaging units 12101 through 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. The microcomputer 12051 then determines collision risks indicating the risks of collision with the respective obstacles. If a collision risk is equal to or higher than a set value, and there is a possibility of collision, the microcomputer 12051 can output a warning to the driver via the audio speaker 12061 and the display unit 12062, or can perform driving support for avoiding collision by performing forced deceleration or avoiding steering via the drive system control unit 12010.

At least one of the imaging units 12101 through 12104 may be an infrared camera that detects infrared rays. For example, the microcomputer 12051 can recognize a pedestrian by determining whether or not a pedestrian exists in images captured by the imaging units 12101 through 12104. Such pedestrian recognition is carried out through a process of extracting feature points from the images captured by the imaging units 12101 through 12104 serving as infrared cameras, and a process of performing a pattern matching on the series of feature points indicating the outlines of objects and determining whether or not there is a pedestrian, for example. If the microcomputer 12051 determines that a pedestrian exists in the images captured by the imaging units 12101 through 12104, and recognizes a pedestrian, the sound/image output unit 12052 controls the display unit 12062 to display a rectangular contour line for emphasizing the recognized pedestrian in a superimposed manner. Further, the sound/image output unit 12052 may also control the display unit 12062 to display an icon or the like indicating the pedestrian at a desired position.

The technology according to the present disclosure may also be applied to an endoscopic surgery system, for example.

Figure 68:
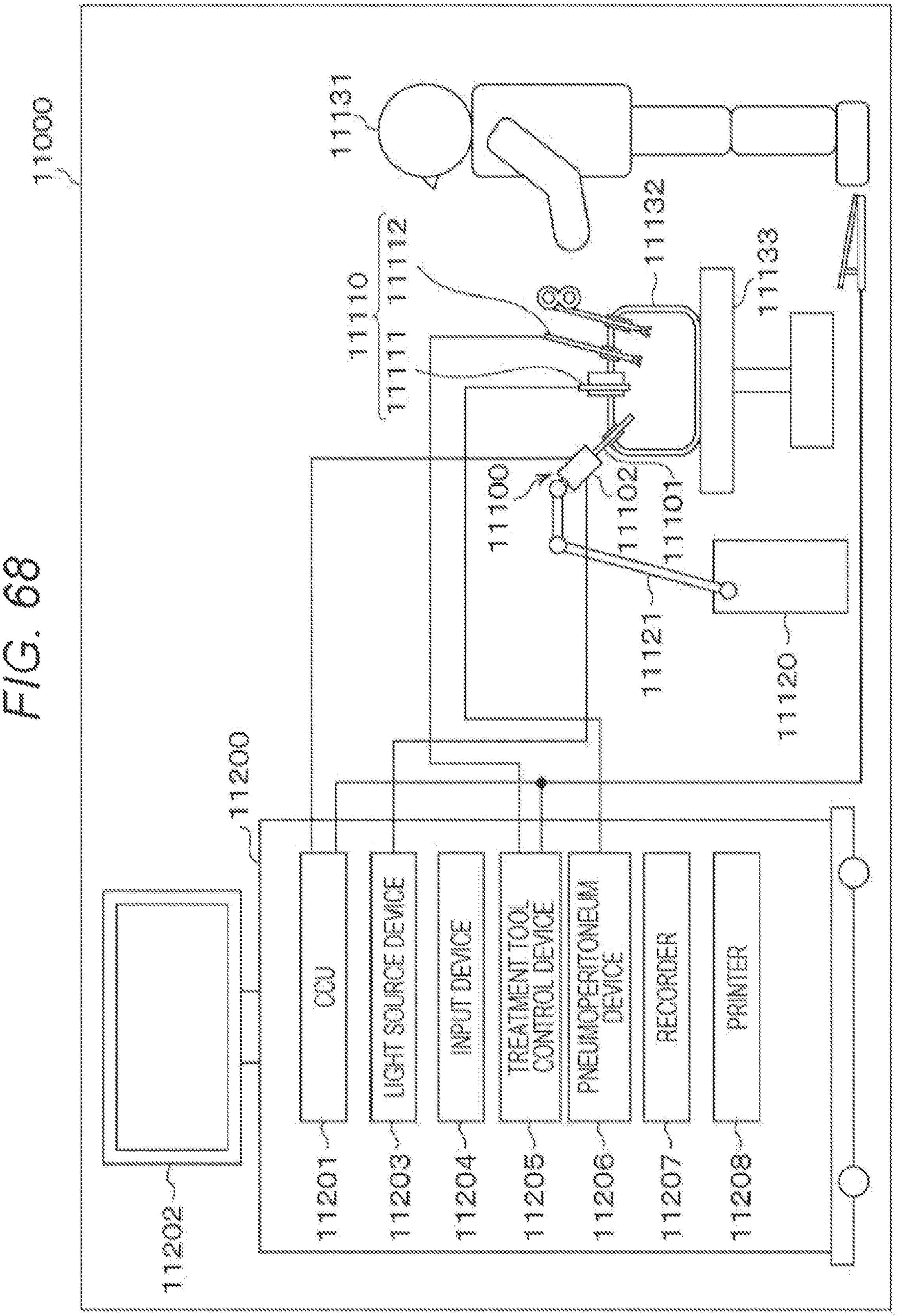
FIG. 68 is a diagram schematically showing an example configuration of an endoscopic surgery system.

FIG. 68 is a diagram schematically showing an example configuration of an endoscopic surgery system to which the technology (the present technology) according to the present disclosure may be applied.

FIG. 68 shows a situation where a surgeon (a physician) 11131 is performing surgery on a patient 11132 on a patient bed 11133, using an endoscopic surgery system 11000. As shown in the drawing, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various kinds of devices for endoscopic surgery are mounted.

The endoscope 11100 includes a lens barrel 11101 that has a region of a predetermined length from the top end to be inserted into a body cavity of the patient 11132, and a camera head 11102 connected to the base end of the lens barrel 11101. In the example shown in the drawing, the endoscope 11100 is designed as a so-called rigid scope having a rigid lens barrel 11101. However, the endoscope 11100 may be designed as a so-called flexible scope having a flexible lens barrel.

At the top end of the lens barrel 11101, an opening into which an objective lens is inserted is provided. A light source device 11203 is connected to the endoscope 11100, and the light generated by the light source device 11203 is guided to the top end of the lens barrel by a light guide extending inside the lens barrel 11101, and is emitted toward the current observation target in the body cavity of the patient 11132 via the objective lens. Note that the endoscope 11100 may be a forward-viewing endoscope, an oblique-viewing endoscope, or a side-viewing endoscope.

An optical system and imaging elements are provided inside the camera head 11102, and reflected light (observation light) from the current observation target is converged on the imaging elements by the optical system. The observation light is photoelectrically converted by the imaging element, and an electrical signal corresponding to the observation light, or an image signal corresponding to the observation image, is generated. The image signal is transmitted as RAW data to a camera control unit (CCU) 11201.

The CCU 11201 is formed with a central processing unit (CPU), a graphics processing unit (GPU), or the like, and collectively controls operations of the endoscope 11100 and a display device 11202. Further, the CCU 11201 receives an image signal from the camera head 11102, and subjects the image signal to various kinds of image processing, such as a development process (a demosaicing process), for example, to display an image based on the image signal.

Under the control of the CCU 11201, the display device 11202 displays an image based on the image signal subjected to the image processing by the CCU 11201.

The light source device 11203 is formed with a light source such as a light emitting diode (LED), for example, and supplies the endoscope 11100 with illuminating light for imaging the surgical site or the like.

An input device 11204 is an input interface to the endoscopic surgery system 11000. The user can input various kinds of information and instructions to the endoscopic surgery system 11000 via the input device 11204. For example, the user inputs an instruction or the like to change imaging conditions (such as the type of illuminating light, the magnification, and the focal length) for the endoscope 11100.

A treatment tool control device 11205 controls driving of the energy treatment tool 11112 for tissue cauterization, incision, blood vessel sealing, or the like. A pneumoperitoneum device 11206 injects a gas into a body cavity of the patient 11132 via the pneumoperitoneum tube 11111 to inflate the body cavity, for the purpose of securing the field of view of the endoscope 11100 and the working space of the surgeon. A recorder 11207 is a device capable of recording various kinds of information about the surgery. A printer 11208 is a device capable of printing various kinds of information relating to the surgery in various formats such as text, images, graphics, and the like.

Note that the light source device 11203 that supplies the endoscope 11100 with the illuminating light for imaging the surgical site can be formed with an LED, a laser light source, or a white light source that is a combination of an LED and a laser light source, for example. In a case where a white light source is formed with a combination of RGB laser light sources, the output intensity and the output timing of each color (each wavelength) can be controlled with high precision. Accordingly, the white balance of an image captured by the light source device 11203 can be adjusted. Alternatively, in this case, laser light from each of the RGB laser light sources may be emitted onto the current observation target in a time-division manner, and driving of the imaging elements of the camera head 11102 may be controlled in synchronization with the timing of the light emission. Thus, images corresponding to the respective RGB colors can be captured in a time-division manner. According to the method, a color image can be obtained without any color filter provided in the imaging elements.

Further, the driving of the light source device 11203 may also be controlled so that the intensity of light to be output is changed at predetermined time intervals. The driving of the imaging elements of the camera head 11102 is controlled in synchronism with the timing of the change in the intensity of the light, and images are acquired in a time-division manner and are then combined. Thus, a high dynamic range image with no black portions and no white spots can be generated.

Further, the light source device 11203 may also be designed to be capable of supplying light of a predetermined wavelength band compatible with special light observation. In special light observation, light of a narrower band than the illuminating light (or white light) at the time of normal observation is emitted, with the wavelength dependence of light absorption in body tissue being taken advantage of, for example. As a result, so-called narrowband light observation (narrowband imaging) is performed to image predetermined tissue such as a blood vessel in a mucosal surface layer or the like, with high contrast. Alternatively, in the special light observation, fluorescence observation for obtaining an image with fluorescence generated through emission of excitation light may be performed. In fluorescence observation, excitation light is emitted to body tissue so that the fluorescence from the body tissue can be observed (autofluorescence observation). Alternatively, a reagent such as indocyanine green (ICG) is locally injected into body tissue, and excitation light corresponding to the fluorescence wavelength of the reagent is emitted to the body tissue so that a fluorescent image can be obtained, for example. The light source device 11203 can be designed to be capable of supplying narrowband light and/or excitation light compatible with such special light observation.

Figure 69:
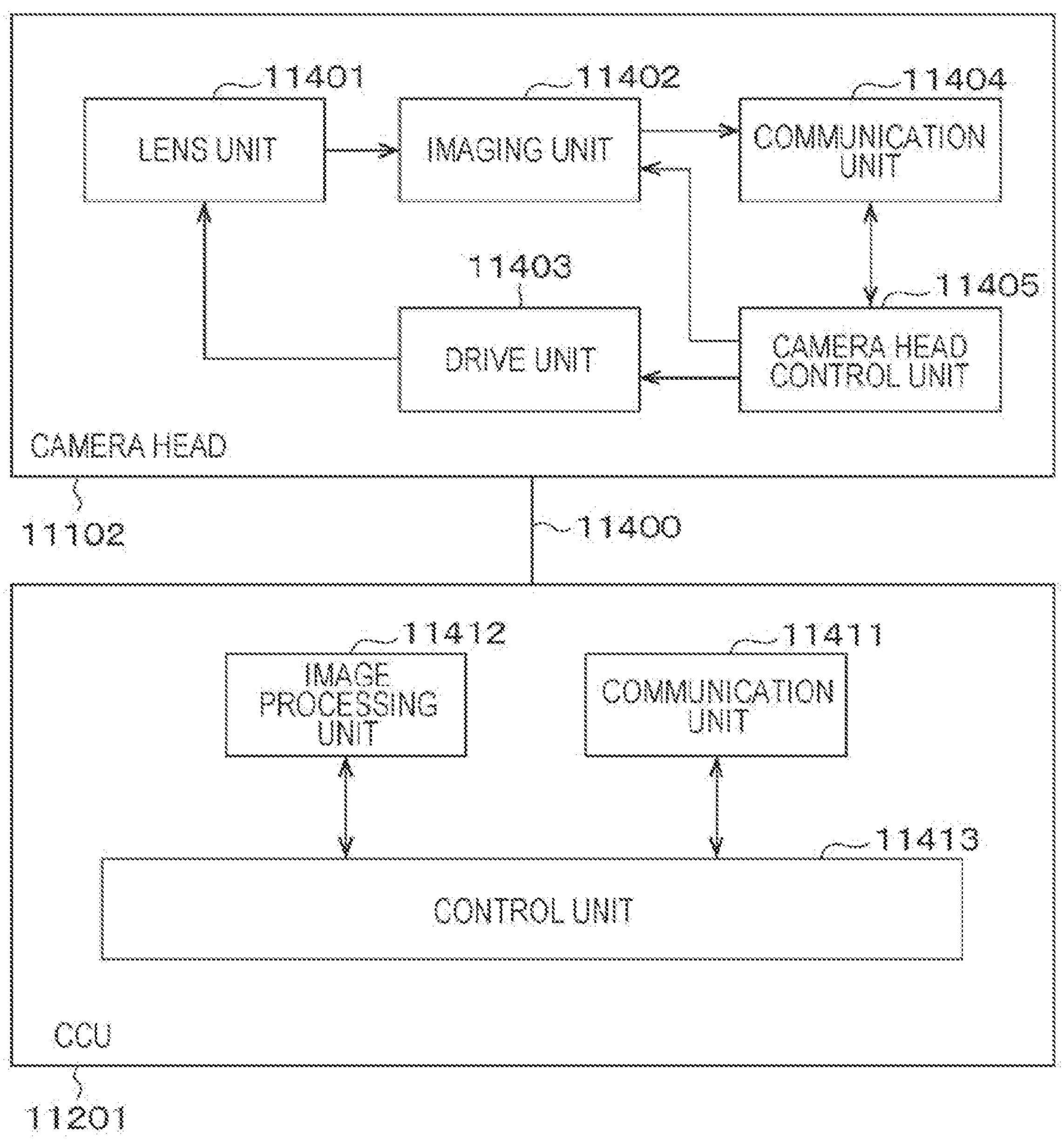
FIG. 69 is a block diagram showing an example of the functional configurations of a camera head and a CCU.

FIG. 69 is a block diagram showing an example of the functional configurations of the camera head 11102 and the CCU 11201 shown in FIG. 68.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at the connecting portion with the lens barrel 11101. Observation light captured from the top end of the lens barrel 11101 is guided to the camera head 11102, and enters the lens unit 11401. The lens unit 11401 is formed with a combination of a plurality of lenses including a zoom lens and a focus lens.

The imaging unit 11402 is formed with imaging elements. The imaging unit 11402 may be formed with one imaging element (a so-called single-plate type), or may be formed with a plurality of imaging elements (a so-called multiple-plate type). In a case where the imaging unit 11402 is of a multiple-plate type, for example, image signals corresponding to the respective RGB colors may be generated by the respective imaging elements, and be then combined to obtain a color image. Alternatively, the imaging unit 11402 may be designed to include a pair of imaging elements for acquiring right-eye and left-eye image signals compatible with three-dimensional (3D) display. As the 3D display is conducted, the surgeon 11131 can grasp more accurately the depth of the body tissue at the surgical site. Note that, in a case where the imaging unit 11402 is of a multiple-plate type, a plurality of lens units 11401 is provided for the respective imaging elements.

Further, the imaging unit 11402 is not necessarily provided in the camera head 11102. For example, the imaging unit 11402 may be provided immediately behind the objective lens in the lens barrel 11101.

The drive unit 11403 is formed with an actuator, and, under the control of the camera head control unit 11405, moves the zoom lens and the focus lens of the lens unit 11401 by a predetermined distance along the optical axis. With this arrangement, the magnification and the focal point of the image captured by the imaging unit 11402 can be adjusted as appropriate.

The communication unit 11404 is formed with a communication device for transmitting and receiving various kinds of information to and from the CCU 11201. The communication unit 11404 transmits the image signal obtained as RAW data from the imaging unit 11402 to the CCU 11201 via the transmission cable 11400.

The communication unit 11404 also receives a control signal for controlling the driving of the camera head 11102 from the CCU 11201, and supplies the control signal to the camera head control unit 11405. The control signal includes information about imaging conditions, such as information for specifying the frame rate of captured images, information for specifying the exposure value at the time of imaging, and/or information for specifying the magnification and the focal point of captured images, for example.

Note that the above imaging conditions such as the frame rate, the exposure value, the magnification, and the focal point may be appropriately specified by the user, or may be automatically set by the control unit 11413 of the CCU 11201 on the basis of an acquired image signal. In the latter case, the endoscope 11100 has a so-called auto-exposure (AE) function, an auto-focus (AF) function, and an auto-white-balance (AWB) function.

The camera head control unit 11405 controls the driving of the camera head 11102, on the basis of a control signal received from the CCU 11201 via the communication unit 11404.

The communication unit 11411 is formed with a communication device for transmitting and receiving various kinds of information to and from the camera head 11102. The communication unit 11411 receives an image signal transmitted from the camera head 11102 via the transmission cable 11400.

Further, the communication unit 11411 also transmits a control signal for controlling the driving of the camera head 11102, to the camera head 11102. The image signal and the control signal can be transmitted through electrical communication, optical communication, or the like.

The image processing unit 11412 performs various kinds of image processing on an image signal that is RAW data transmitted from the camera head 11102.

The control unit 11413 performs various kinds of control relating to display of an image of the surgical portion or the like captured by the endoscope 11100, and a captured image obtained through imaging of the surgical site or the like. For example, the control unit 11413 generates a control signal for controlling the driving of the camera head 11102.

Further, the control unit 11413 also causes the display device 11202 to display a captured image showing the surgical site or the like, on the basis of the image signal subjected to the image processing by the image processing unit 11412. In doing so, the control unit 11413 may recognize the respective objects shown in the captured image, using various image recognition techniques. For example, the control unit 11413 can detect the shape, the color, and the like of the edges of an object shown in the captured image, to recognize the surgical tool such as forceps, a specific body site, bleeding, the mist at the time of use of the energy treatment tool 11112, and the like. When causing the display device 11202 to display the captured image, the control unit 11413 may cause the display device 11202 to superimpose various kinds of surgery aid information on the image of the surgical site on the display, using the recognition result. As the surgery aid information is superimposed and displayed, and thus, is presented to the surgeon 11131, it becomes possible to reduce the burden on the surgeon 11131, and enable the surgeon 11131 to proceed with the surgery in a reliable manner.

The transmission cable 11400 connecting the camera head 11102 and the CCU 11201 is an electrical signal cable compatible with electric signal communication, an optical fiber compatible with optical communication, or a composite cable thereof.

Here, in the example shown in the drawing, communication is performed in a wired manner using the transmission cable 11400. However, communication between the camera head 11102 and the CCU 11201 may be performed in a wireless manner.

Note that the endoscopic surgery system has been described as an example herein, but the technology according to the present disclosure may be applied to a microscopic surgery system or the like, for example.

Note that the present disclosure may also be embodied in the configurations described below.

[A01] <<Imaging device: first embodiment>>

An imaging device including:

an effective pixel region that includes a plurality of imaging elements-A, amplifies signal charges generated by photoelectric conversion, and reads the signal charges into a drive circuit; and an optical black region that includes a plurality of imaging elements-B, surrounds the effective pixel region, and outputs optical black that serves as a reference for black level, in which the photoelectric conversion layer forming the plurality of imaging elements-A and the plurality of imaging elements-B is a common photoelectric conversion layer, the common photoelectric conversion layer is located on an outer side of the optical black region, and extends toward an outer edge region surrounding the optical black region, and an outer edge electrode is disposed in the outer edge region.

[A02] The imaging device according to [A01], in which the outer edge electrode is positioned to face the common photoelectric conversion layer via an insulating layer.

[A03] The imaging device according to [A02], in which a potential having the same sign as the signal charges is applied to the outer edge electrode.

[A04] The imaging device according to [A03], in which a potential having the same sign as the signal charges is constantly applied to the outer edge electrode during an operation of the imaging device.

[A05] The imaging device according to [A01], in which the outer edge electrode is connected to the common photoelectric conversion layer.

[A06] The imaging device according to [A01], in which the outer edge electrode includes a first outer edge electrode positioned to face the common photoelectric conversion layer via an insulating layer, and a second outer edge electrode that is disposed on an outer side of the first outer edge electrode and is connected to the common photoelectric conversion layer.

[A07] The imaging device according to any one of [A01] to [A06], in which the outer edge electrode surrounds the optical black region.

[A08] The imaging device according to [A07], in which the outer edge electrode surrounding the optical black region has a continuous form.

[A09] The imaging device according to [A07], in which the outer edge electrode surrounding the optical black region has a discontinuous form.

[A10] The imaging device according to any one of [A01] to [A09], in which each of the imaging elements-A and the imaging elements-B includes a photoelectric conversion unit in which a first electrode, the photoelectric conversion layer, and a second electrode are stacked, the photoelectric conversion unit further includes a charge storage electrode that is disposed at a distance from the first electrode and is positioned to face the photoelectric conversion layer via an insulating layer, the photoelectric conversion layer forming the imaging elements-A and the photoelectric conversion layer forming the imaging elements-B are formed with the common photoelectric conversion layer, the second electrode forming the imaging elements-A and the second electrode forming the imaging elements-B are formed with a common second electrode, and light enters from the common second electrode side.

[A11] The imaging device according to [A10], in which the outer edge electrode is disposed on the side of the first electrode with respect to the common photoelectric conversion layer.

[A12] The imaging device according to [A10], in which the outer edge electrode is disposed on the side of the second electrode with respect to the common photoelectric conversion layer.

[A13] <<Imaging device: second embodiment>>

An imaging device including:

an effective pixel region that includes a plurality of imaging elements-A, amplifies signal charges generated by photoelectric conversion, and reads the signal charges into a drive circuit;

an optical black region that includes a plurality of imaging elements-B, surrounds the effective pixel region, and outputs optical black that serves as a reference for black level; and an outer edge region that includes a plurality of imaging elements-C, and surrounds the optical black region, in which a photoelectric conversion layer forming the plurality of imaging elements-A, the plurality of imaging elements-B, and the plurality of imaging elements-C is a common photoelectric conversion layer, and the imaging elements-C are always in an operating state during an operation of the imaging device.

[A14] The imaging device according to [A13], in which each of the imaging elements-A, the imaging elements-B, and the imaging elements-C includes a photoelectric conversion unit in which a first electrode, the photoelectric conversion layer, and a second electrode are stacked, the photoelectric conversion unit further includes a charge storage electrode that is disposed at a distance from the first electrode and is positioned to face the photoelectric conversion layer via an insulating layer, the photoelectric conversion layer forming the imaging elements-A, the photoelectric conversion layer forming the imaging elements-B, and the photoelectric conversion layer forming the imaging elements-C are formed with the common photoelectric conversion layer, the second electrode forming the imaging elements-A, the second electrode forming the imaging elements-B, and the second electrode forming the imaging elements-C are formed with a common second electrode, during an operation of the imaging device, a potential with a sign that is the opposite of the sign of the signal charges is constantly applied to the first electrodes forming the imaging elements-C, and, during an operation of the imaging device, a potential with the same sign as the sign of the signal charges is applied to the charge storage electrodes forming the imaging elements-C.

[A15] The imaging device according to [A13] or [A14], in which the thickness of an insulating layer forming the imaging elements-C is smaller than the thickness of an insulating layer forming the imaging elements-A and the imaging elements-B.

[B01] The imaging device according to [A10] or [A14], in which the photoelectric conversion unit further includes an insulating layer and a charge storage electrode that is disposed at a distance from the first electrode and is positioned to face the photoelectric conversion layer via the insulating layer.

[B01] The imaging device according to [A10] or [A14], further including a semiconductor substrate, in which the photoelectric conversion unit is disposed above the semiconductor substrate.

[B02] The imaging device according to [B01], in which the first electrode extends in an opening formed in the insulating layer, and is connected to the photoelectric conversion layer.

[B03] The imaging device according to [B01], in which the photoelectric conversion layer extends in an opening formed in the insulating layer, and is connected to the first electrode.

[B04] <<Control of the potentials of the first electrode and the charge storage electrode>>

The imaging device according to any one of [B01] to [B03], further including a control unit that is disposed in the semiconductor substrate, and includes a drive circuit, in which the first electrode and the charge storage electrode are connected to the drive circuit, in a charge accumulation period, the drive circuit applies a potential $V_{11}$ to the first electrode, and a potential $V_{12}$ to the charge storage electrode, to accumulate electric charges in the photoelectric conversion layer, and, in a charge transfer period, the drive circuit applies a potential $V_{21}$ to the first electrode, and a potential $V_{22}$ to the charge storage electrode, to read the electric charges accumulated in the photoelectric conversion layer into the control unit via the first electrode.

Here, the potential of the first electrode is higher than the potential of the second electrode, to satisfy the following:

$$V_{12} \geq V_{11}, \text{ and } V_{22} < V_{21}$$

[B05] <<Transfer control electrode>>

The imaging device according to any one of [B01] to [B04], further including a transfer control electrode that is disposed between the first electrode and the charge storage electrode, is disposed at a distance from the first electrode and the charge storage electrode, and is positioned to face the photoelectric conversion layer via the insulating layer.

[B06] <<Control of the potentials of the first electrode, the charge storage electrode, and the transfer control electrode>>

The imaging device according to [B05], further including a control unit that is disposed in the semiconductor substrate, and includes a drive circuit, in which the first electrode, the charge storage electrode, and the transfer control electrode are connected to the drive circuit, in a charge accumulation period, the drive circuit applies a potential $V_{11}$ to the first electrode, a potential $V_{12}$ to the charge storage electrode, and a potential $V_{13}$ to the transfer control electrode, to accumulate electric charges in the photoelectric conversion layer, and, in a charge transfer period, the drive circuit applies a potential $V_{21}$ to the first electrode, a potential $V_{22}$ to the charge storage electrode, and a potential $V_{23}$ to the transfer control electrode, to read the electric charges accumulated in the photoelectric conversion layer into the control unit via the first electrode.

Here, the potential of the first electrode is higher than the potential of the second electrode, to satisfy the following:

$$V_{12} > V_{13}, \text{ and } V_{22} \leq V_{23} \leq V_{21}$$

[B07] <<Charge emission electrode)

The imaging device according to any one of [B01] to [B06], further including a charge emission electrode that is connected to the photoelectric conversion layer, and is disposed at a distance from the first electrode and the charge storage electrode.

[B08] The imaging device according to [B07], in which the charge emission electrode is positioned to surround the first electrode and the charge storage electrode.

[B09] <<Control of the potentials of the first electrode, the charge storage electrode, and the charge emission electrode>>

The imaging device according to any one of [B10] to [B08], further including a control unit that is disposed in the semiconductor substrate, and includes a drive circuit, in which the first electrode, the charge storage electrode, and the charge emission electrode are connected to the drive circuit, in a charge accumulation period, the drive circuit applies a potential $V_{11}$ to the first electrode, a potential $V_{12}$ to the charge storage electrode, and a potential $V_{14}$ to the charge emission electrode, to accumulate electric charges in the photoelectric conversion layer, and, in a charge transfer period, the drive circuit applies a potential $V_{21}$ to the first electrode, a potential $V_{22}$ to the charge storage electrode, and a potential $V_{24}$ to the charge emission electrode, to read the electric charges accumulated in the photoelectric conversion layer into the control unit via the first electrode.

Here, the potential of the first electrode is higher than the potential of the second electrode, to satisfy the following:

$$V_{14} > V_{11}, \text{ and } V_{24} < V_{21}$$

[B10] <<Charge storage electrode segments>>

The imaging device according to any one of [B01] to [B09], in which the charge storage electrode is formed with a plurality of charge storage electrode segments.

[B11] The imaging device according to [B10], in which, when the potential of the first electrode is higher than the potential of the second electrode, the potential to be applied to the charge storage electrode segment located closest to the first electrode is higher than the potential to be applied to the charge storage electrode segment located farthest from the first electrode in a charge transfer period, and, when the potential of the first electrode is lower than the potential of the second electrode, the potential to be applied to the charge storage electrode segment located closest to the first electrode is lower than the potential to be applied to the charge storage electrode segment located farthest from the first electrode in a charge transfer period.

[B12] The imaging device according to any one of [B01] to [B11], in which at least a floating diffusion layer and an amplification transistor that constitute the control unit are disposed in the semiconductor substrate, and the first electrode is connected to the floating diffusion layer and the gate portion of the amplification transistor.

[B13] The imaging device according to [B12], in which a reset transistor and a selection transistor that constitute the control unit are further disposed in the semiconductor substrate, the floating diffusion layer is connected to one source/drain region of the reset transistor, and one source/drain region of the amplification transistor is connected to one source/drain region of the selection transistor, and the other source/drain region of the selection transistor is connected to a signal line.

[B14] The imaging device according to any one of [B01] to [B13], in which the size of the charge storage electrode is larger than that of the first electrode.

[B15] <<Imaging element: first configuration>>

The imaging device according to any one of [B01] to [B14], in which the photoelectric conversion unit is formed with N (N≥2) photoelectric conversion unit segments, the photoelectric conversion layer and the photoelectric conversion layer are formed with N photoelectric conversion layer segments, the insulating layer is formed with N insulating layer segments, the charge storage electrode is formed with N charge storage electrode segments, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the thicknesses of the insulating layer segments gradually vary from the first photoelectric conversion unit segment to the Nth photoelectric conversion unit segment.

[B16] <<Imaging element: second configuration>>

The imaging device according to any one of [B01] to [B14], in which the photoelectric conversion unit is formed with N (N≥2) photoelectric conversion unit segments, the photoelectric conversion layer and the photoelectric conversion layer are formed with N photoelectric conversion layer segments, the insulating layer is formed with N insulating layer segments, the charge storage electrode is formed with N charge storage electrode segments, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the thicknesses of the photoelectric conversion layer segments gradually vary from the first photoelectric conversion unit segment to the Nth photoelectric conversion unit segment.

[B17] <<Imaging element: third configuration>>

The imaging device according to any one of [B01] to [B14], in which the photoelectric conversion unit is formed with N (N≥2) photoelectric conversion unit segments, the photoelectric conversion layer and the photoelectric conversion layer are formed with N photoelectric conversion layer segments, the insulating layer is formed with N insulating layer segments, the charge storage electrode is formed with N charge storage electrode segments, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the material forming the insulating layer segment differs between adjacent photoelectric conversion unit segments.

[B18] <<Imaging element: fourth configuration>>

The imaging device according to any one of [B01] to [B14], in which the photoelectric conversion unit is formed with N (N≥2) photoelectric conversion unit segments, the photoelectric conversion layer and the photoelectric conversion layer are formed with N photoelectric conversion layer segments, the insulating layer is formed with N insulating layer segments, the charge storage electrode is formed with N charge storage electrode segments that are disposed at a distance from one another, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the material forming the charge storage electrode segment differs between adjacent photoelectric conversion unit segments.

[B19] <<Imaging element: fifth configuration>>

The imaging device according to any one of [B01] to [B14], in which the photoelectric conversion unit is formed with N (N≥2) photoelectric conversion unit segments, the photoelectric conversion layer and the photoelectric conversion layer are formed with N photoelectric conversion layer segments, the insulating layer is formed with N insulating layer segments, the charge storage electrode is formed with N charge storage electrode segments that are disposed at a distance from one another, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the areas of the charge storage electrode segments become gradually smaller from the first photoelectric conversion unit segment to the Nth photoelectric conversion unit segment.

[B20] <<Imaging element: sixth configuration>>

The imaging device according to any one of [B01] to [B14], in which, when the stacking direction of the charge storage electrode, the insulating layer, the photoelectric conversion layer, and the photoelectric conversion layer is the Z direction, and the direction away from the first electrode is the X direction, the cross-sectional area of a stacked portion of the charge storage electrode, the insulating layer, the photoelectric conversion layer, and the photoelectric conversion layer taken along a Y-Z virtual plane varies depending on the distance from the first electrode.

REFERENCE SIGNS LIST

10'$_1$, 10'$_2$, 10'$_3$ Photoelectric conversion unit segment
13 Various imaging element components located below interlayer insulating layer
14 On-chip microlens (OCL)
15 Light blocking layer
21, 121, 221 First electrode
22 Second electrode
23 Photoelectric conversion layer
23A Organic semiconductor material layer
23B Oxide semiconductor material layer
23'$_1$, 23'$_2$, 23'$_3$ Photoelectric conversion layer segment
24, 124, 224, 24"$_1$, 24"$_2$, 24"$_3$ Charge storage electrode
24A, 24B, 24C, 24'$_1$, 24'$_2$, 24'$_3$ Charge storage electrode segment
25 Transfer control electrode (charge transfer electrode)
26 Charge emission electrode
27, 227 Charge transfer control electrode
201 Outer edge electrode (third electrode potential barrier forming electrode)
211 Outer edge electrode (fourth electrode charge emission electrode)
201A, 211A Region in which outer edge electrode is disposed in outer edge region
31, 33, 41, 43 n-type semiconductor region
32, 34, 42, 44, 73 $p^+$-layer
35, 36, 45, 46 Gate portion of transfer transistor
51 Gate portion of reset transistor $TR1_{rst}$
51A Channel formation region of reset transistor $TR1_{rst}$
51B, 51C Source/drain region of reset transistor $TR1_{rst}$
52 Gate portion of amplification transistor $TR1_{amp}$
52A Channel formation region of amplification transistor $TR1_{amp}$
52B, 52C Source/drain region of amplification transistor $TR1_{amp}$
53 Gate portion of selection transistor $TR1_{sel}$
53A Channel formation region of selection transistor $TR1_{sel}$
53B, 53C Source/drain region of selection transistor $TR1_{sel}$
61 Contact hole portion
62 Wiring layer
63, 64, 68A Pad portion
65, 68B Connecting hole
66, 67, 69 Connecting portion
70 Semiconductor substrate
70A First surface (front surface) of semiconductor substrate
70B Second surface (back surface) of semiconductor substrate
71 Device separation region
72 Oxide film
74 $HfO_2$ film
75 Insulating material film
76, 81 Interlayer insulating layer
82 Insulating layer
82'$_1$, 82'$_2$, 82'$_3$ Insulating layer segment
83, 83A, 83B Insulating layer
85, 85A Opening
86 Second opening
300 Imaging device (solid-state imaging device)
301 Stacked imaging element
311 Imaging region
312 Vertical drive circuit
313 Column signal processing circuit
314 Horizontal drive circuit
315 Output circuit
316 Drive control circuit
317 Signal line (data output line)
318 Horizontal signal line
400 Electronic apparatus (camera)
401 Imaging device (solid-state imaging device)
410 Optical lens
411 Shutter device
412 Drive circuit
413 Signal processing circuit
$FD_1$, $FD_2$, $FD_3$, 45C, 46C Floating diffusion layer
$TR1_{trs}$, $TR2_{trs}$, $TR3_{trs}$ Transfer transistor
$TR1_{rst}$, $TR2_{rst}$, $TR3_{rst}$ Reset transistor
$TR1_{amp}$, $TR2_{amp}$, $TR3_{amp}$ Amplification transistor
$TR1_{sel}$, $TR3_{sel}$, $TR3_{sel}$ Selection transistor
$V_{DD}$ Power supply
$TG_1$, $TG_2$, $TG_3$ Transfer gate line
$RST_1$, $RST_2$, $RST_3$ Reset line
$SEL_1$, $SEL_2$, $SEL_3$ Selection line
VSL, $VSL_1$, $VSL_2$, $VSL_3$ Signal line (data output line)
$V_{OA}$, $V_{OT}$, $V_{OU}$ Wiring line

What is claimed is:

1. A light detecting device, comprising:

an effective pixel region that includes a plurality of light detecting elements-A, amplifies a signal charge generated by photoelectric conversion, and reads the signal charge into a drive circuit; and an optical black region that includes a plurality of light detecting elements-B, surrounds the effective pixel region, and outputs optical black that serves as a reference for black level, wherein a photoelectric conversion layer forming the plurality of light detecting elements-A and the plurality of light detecting elements-B is a common photoelectric conversion layer, wherein the common photoelectric conversion layer is located on an outer side of the optical black region, and extends toward an outer edge region surrounding the optical black region, wherein an outer edge electrode is disposed in the outer edge region and surrounds the optical black region, wherein a potential having a same sign as the signal charge is applied to the outer edge electrode, wherein the outer edge electrode is positioned to face the common photoelectric conversion layer via an insulating layer, and wherein the insulating layer is provided on a top surface of the outer edge electrode without extending below the top surface of the outer edge electrode.

2. The light detecting device according to claim 1, wherein a potential having the same sign as the signal charge is constantly applied to the outer edge electrode during an operation of the light detecting device.

3. The light detecting device according to claim 1, wherein the outer edge electrode includes a first outer edge electrode positioned to face the common photoelectric conversion layer via the insulating layer, and a second outer edge electrode that is disposed on an outer side of the first outer edge electrode and is connected to the common photoelectric conversion layer.

4. The light detecting device according to claim 1, wherein the outer edge electrode surrounding the optical black region has a continuous form.

5. The light detecting device according to claim 1, wherein the outer edge electrode surrounding the optical black region has a discontinuous form.

6. The light detecting device according to claim 1, wherein each of the light detecting elements-A and the light detecting elements-B includes a photoelectric conversion unit in which a first electrode, the photoelectric conversion layer, and a second electrode are stacked, the photoelectric conversion unit further includes a charge storage electrode that is disposed at a distance from the first electrode and is positioned to face the photoelectric conversion layer via an insulating layer, the photoelectric conversion layer forming the light detecting elements-A and the photoelectric conversion layer forming the light detecting elements-B are formed with the common photoelectric conversion layer, the second electrode forming the light detecting elements-A and the second electrode forming the light detecting elements-B are formed with a common second electrode, and light enters from the common second electrode side.

7. The light detecting device according to claim 6, wherein the outer edge electrode is disposed on a side of the first electrode with respect to the common photoelectric conversion layer.

8. The light detecting device according to claim 6, wherein the outer edge electrode is disposed on a side of the second electrode with respect to the common photoelectric conversion layer.

9. The light detecting device according to claim 1, wherein the common photoelectric conversion layer includes an oxide semiconductor material layer and an organic semiconductor material layer.

10. The light detecting device according to claim 9, wherein the oxide semiconductor material layer extends in the effective pixel region and the optical black region and not in the outer edge region surrounding the optical black region.

11. An electronic apparatus, comprising:

an optical system;

a light detecting device that receives light from the optical system, the light detecting device, comprising:

an effective pixel region that includes a plurality of light detecting elements-A, amplifies a signal charge generated by photoelectric conversion, and reads the signal charge into a drive circuit;

an optical black region that includes a plurality of light detecting elements-B, surrounds the effective pixel region, and outputs optical black that serves as a reference for black level, wherein a photoelectric conversion layer forming the plurality of light detecting elements-A and the plurality of light detecting elements-B is a common photoelectric conversion layer, wherein the common photoelectric conversion layer is located on an outer side of the optical black region, and extends toward an outer edge region surrounding the optical black region, wherein an outer edge electrode is disposed in the outer edge region and surrounds the optical black region, wherein a potential having a same sign as the signal charge is applied to the outer edge electrode, wherein the outer edge electrode is positioned to face the common photoelectric conversion layer via an insulating layer, and wherein the insulating layer is provided on a top surface of the outer edge electrode without extending below the top surface of the outer edge electrode;

and a signal processor that processes signals received from the light detecting device.

12. The electronic apparatus according to claim 11, wherein a potential having the same sign as the signal charge is constantly applied to the outer edge electrode during an operation of the light detecting device.

13. The electronic apparatus according to claim 11, wherein the outer edge electrode includes a first outer edge electrode positioned to face the common photoelectric conversion layer via the insulating layer, and a second outer edge electrode that is disposed on an outer side of the first outer edge electrode and is connected to the common photoelectric conversion layer.

14. The electronic apparatus according to claim 11, wherein the outer edge electrode surrounding the optical black region has a continuous form.

15. The electronic apparatus according to claim 11, wherein the outer edge electrode surrounding the optical black region has a discontinuous form.

16. The electronic apparatus according to claim 11, wherein each of the light detecting elements-A and the light detecting elements-B includes a photoelectric conversion unit in which a first electrode, the photoelectric conversion layer, and a second electrode are stacked, the photoelectric conversion unit further includes a charge storage electrode that is disposed at a distance from the first electrode and is positioned to face the photoelectric conversion layer via an insulating layer, the photoelectric conversion layer forming the light detecting elements-A and the photoelectric conversion layer forming the light detecting elements-B are formed with the common photoelectric conversion layer, the second electrode forming the light detecting elements-A and the second electrode forming the light detecting elements-B are formed with a common second electrode, and light enters from the common second electrode side.

17. The electronic apparatus according to claim 16, wherein the outer edge electrode is disposed on a side of the first electrode with respect to the common photoelectric conversion layer.

18. The electronic apparatus according to claim 16, wherein the outer edge electrode is disposed on a side of the second electrode with respect to the common photoelectric conversion layer.

19. The electronic apparatus according to claim 11, wherein the common photoelectric conversion layer includes an oxide semiconductor material layer and an organic semiconductor material layer.

20. The electronic apparatus according to claim 19, wherein the oxide semiconductor material layer extends in the effective pixel region and the optical black region and not in the outer edge region surrounding the optical black region.

* * * * *